(12) United States Patent
Kamimura

(10) Patent No.: US 11,079,677 B2
(45) Date of Patent: Aug. 3, 2021

(54) CHEMICAL LIQUID, CHEMICAL LIQUID STORAGE BODY, AND PATTERN FORMING METHOD

(71) Applicant: FUJIFILM Corporation, Tokyo (JP)

(72) Inventor: Tetsuya Kamimura, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 72 days.

(21) Appl. No.: 16/519,004

(22) Filed: Jul. 23, 2019

(65) Prior Publication Data

US 2019/0346764 A1    Nov. 14, 2019

Related U.S. Application Data

(63) Continuation of application No. PCT/JP2018/005115, filed on Feb. 14, 2018.

(30) Foreign Application Priority Data

Feb. 20, 2017   (JP) .............................. JP2017-028790

(51) Int. Cl.
   *G03F 7/038*      (2006.01)
   *G03F 7/004*      (2006.01)
   (Continued)

(52) U.S. Cl.
   CPC ............ *G03F 7/038* (2013.01); *G03F 7/0048* (2013.01); *G03F 7/16* (2013.01); *G03F 7/2041* (2013.01); *G03F 7/2047* (2013.01); *G03F 7/32* (2013.01)

(58) Field of Classification Search
   CPC .......... G03F 7/038; G03F 7/0048; G03F 7/16; G03F 7/2041; G03F 7/2047; G03F 7/32; G03F 7/0397; G03F 7/325; H01L 21/027
   (Continued)

(56) References Cited

U.S. PATENT DOCUMENTS 5,248,393 A   9/1993  Schumacher et al.
5,296,009 A   3/1994  Duke
               (Continued)

FOREIGN PATENT DOCUMENTS

CN   102061228    5/2011
CN   102227682    10/2011
               (Continued)

OTHER PUBLICATIONS

"Office Action of Japan Counterpart Application", dated Sep. 8, 2020, with English translation thereof, p. 1-p. 6.
(Continued)

*Primary Examiner* — Caleen O Sullivan
(74) *Attorney, Agent, or Firm* — JCIPRNET

(57) ABSTRACT

An object of the present invention is to provide a chemical liquid which makes it difficult for a defect to occur on a substrate after development. Another object of the present invention is to provide a chemical liquid storage body and a pattern forming method.
The chemical liquid of the according to an embodiment of the present invention contains a main agent which is formed of one kind of organic solvent or formed of a mixture of two or more kinds of organic solvents, an impurity metal, and a surfactant, in which a vapor pressure of the main agent is 60 to 1,340 Pa at 25° C., the impurity metal contains particles containing one kind of metal selected from the group consisting of Fe, Cr, Ni, and Pb, in a case where the chemical liquid contains one kind of particles, a content of the particles in the chemical liquid is 0.001 to 30 mass ppt with respect to a total mass of the chemical liquid, and in a case where the chemical liquid contains two or more kinds of particles, a content of each kind of the particles in the chemical liquid is 0.001 to 30 mass ppt with respect to the total mass of the chemical liquid.

20 Claims, 1 Drawing Sheet

(51) Int. Cl.
   *G03F 7/20* (2006.01)
   *G03F 7/16* (2006.01)
   *G03F 7/32* (2006.01)

(58) Field of Classification Search
   USPC .............................................. 430/270.1, 311
   See application file for complete search history.

(56) References Cited

U.S. PATENT DOCUMENTS

| | | | |
|---|---|---|---|
| 5,670,028 | A | 9/1997 | Inaba et al. |
| 5,824,451 | A | 10/1998 | Aoai et al. |
| 6,155,540 | A | 12/2000 | Takamatsu et al. |
| 6,476,162 | B1 | 11/2002 | Nishimura et al. |
| 7,419,945 | B2 | 9/2008 | Hsu |
| 8,709,704 | B2 | 4/2014 | Kamimura et al. |
| 10,859,914 | B2 | 12/2020 | Hatakeyama et al. |
| 2004/0053800 | A1 | 3/2004 | Zhang et al. |
| 2007/0010409 | A1 | 1/2007 | Zhang et al. |
| 2007/0010412 | A1 | 1/2007 | Zhang et al. |
| 2010/0028803 | A1 | 2/2010 | Sugimoto et al. |
| 2010/0304313 | A1 | 12/2010 | Zhang et al. |
| 2018/0087010 | A1 | 3/2018 | Takahashi et al. |
| 2020/0015676 | A1 | 1/2020 | Glik et al. |

FOREIGN PATENT DOCUMENTS

| | | |
|---|---|---|
| JP | S6341514 | 2/1988 |
| JP | H0739701 | 2/1995 |
| JP | H11180704 | 7/1999 |
| JP | 2002363128 | 12/2002 |
| JP | 2004114392 | 4/2004 |
| JP | 2007324393 | 12/2007 |
| JP | 4030265 | 1/2008 |
| JP | 2008308500 | 12/2008 |
| JP | 4272013 | 6/2009 |
| JP | 2009191051 | 8/2009 |
| JP | 2015030700 | 2/2015 |
| JP | 2016073922 | 5/2016 |
| TW | 201631399 | 9/2016 |
| TW | 201640227 | 11/2016 |
| WO | 9946309 | 9/1999 |
| WO | 2016181753 | 11/2016 |

OTHER PUBLICATIONS

"Office Action of U.S. Appl. No. 16/170,100", dated Jun. 16, 2020, pp. 1-21.
Atlantis Rail Systems, "What is Electropolishing?," May 2018, pp. 1-2.
Swaglok, "Comparing Testing Methods for Stainless Steel Corrosion Resistance," accessed Jun. 2020, Available at: https://www.swagelok.de/~/media/Distributor%20Media/A-B/Badger/Services/Resources/Comparing-Testing-Methods-for-Stainless-Steel-Corrosion-Resistance-Badger.ashx.
Encyclopedia of Chemical Engineering Equipment, "Distillation Columns," Mar. 2014, pp. 1-14.
"Office Action of Korea Related Application", dated Feb. 18, 2020, with English translation thereof, p. 1-p. 28.
R.Abejón, et al., "Ultrapurification of hydrogen peroxide solution from ionic metals impurities to semiconductor grade by reverse osmosis," Separation and Purification Technology, vol. 76, Sep. 2010, pp. 44-51.
Written Opinion, dated Aug. 1, 2017 from the International Bureau in counterpart International application No. PCT/JP2017/016270.
International Preliminary Report on Patentability and Translation of Written Opinion, dated Oct. 30, 2018 from the International Bureau in counterpart International application No. PCT/JP2017/016270.
"International Search Report (Form PCT/ISA/210) of PCT/JP2017/016270," dated Aug. 1, 2017, with English translation thereof, pp. 1-5.
"Office Action of Japan Related Application", dated Aug. 20, 2019, with English translation thereof, p. 1-p. 14.
"International Search Report (Form PCT/ISA/210) of PCT/JP2018/005115," dated May 22, 2018, with English translation thereof, pp. 1-6.
"Written Opinion of the International Searching Authority (Form PCT/ISA/237) of PCT/JP2018/005115," dated May 22, 2018, with English translation thereof, pp. 1-16.
Office Action of Taiwan Counterpart Application, with English translation thereof, dated Mar. 29, 2021, pp. 1-13.
Office Action of Korean Counterpart Application, with English translation thereof, dated Jun. 3, 2021, pp. 1-16.

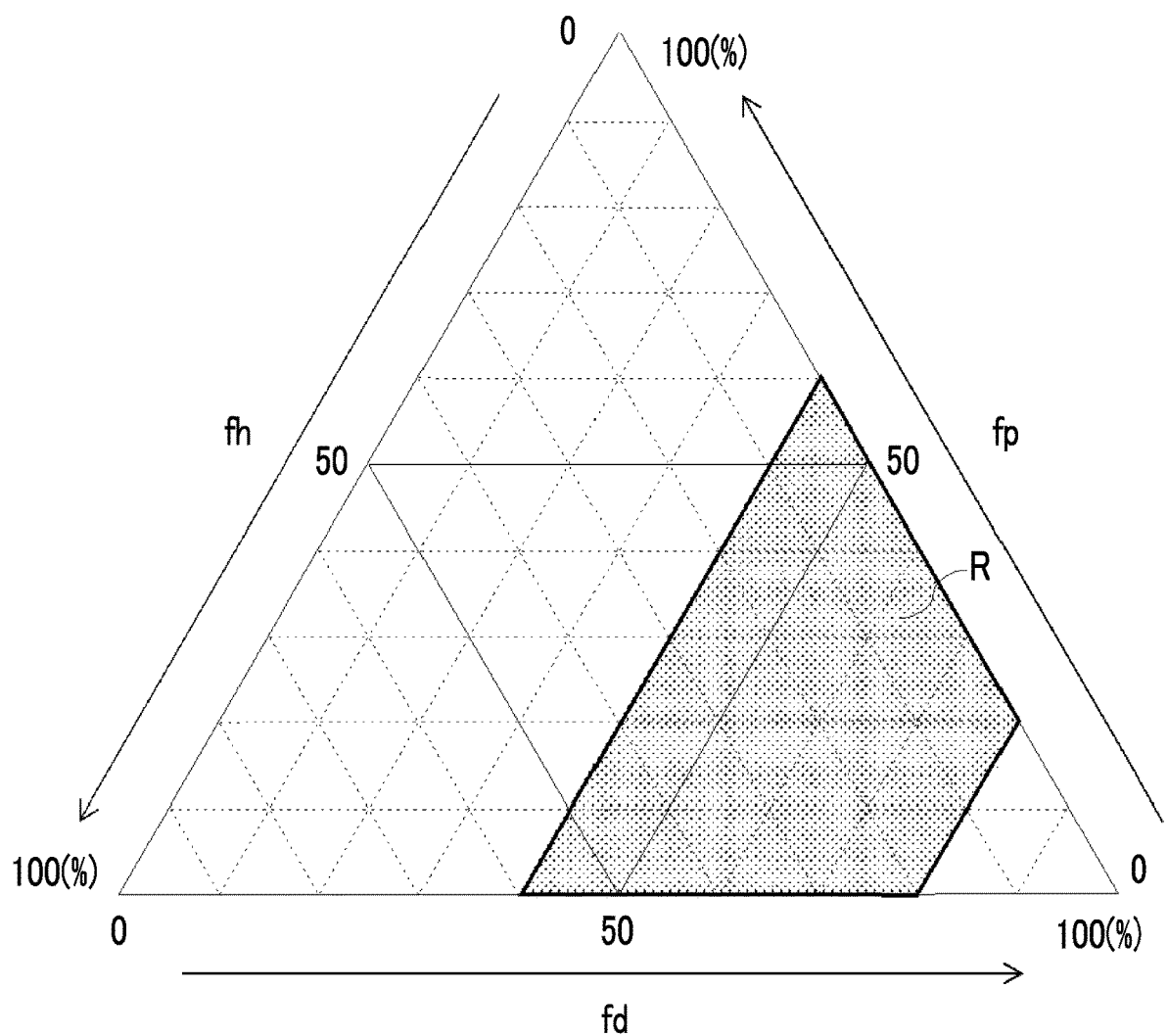

CHEMICAL LIQUID, CHEMICAL LIQUID STORAGE BODY, AND PATTERN FORMING METHOD

CROSS-REFERENCE TO RELATED APPLICATIONS

This application is a Continuation of PCT International Application No. PCT/JP2018/005115 filed on Feb. 14, 2018, which claims priority under 35 U.S.C. § 119(a) to Japanese Patent Application No. 2017-028790 filed on Feb. 20, 2017. The above application is hereby expressly incorporated by reference, in its entirety, into the present application.

BACKGROUND OF THE INVENTION

1. Field of the Invention

The present invention relates to a chemical liquid, a chemical liquid storage body, and a pattern forming method.

2. Description of the Related Art

During the photolithography process in a semiconductor device manufacturing process, a substrate such as a semiconductor wafer (hereinafter, referred to as "wafer" as well) is coated with an actinic ray-sensitive or radiation-sensitive resin composition (hereinafter, referred to as "resist composition" as well) so as to form an actinic ray-sensitive or radiation-sensitive film (hereinafter, referred to as "resist film" as well). Furthermore, steps of exposing the formed resist film, developing the exposed resist film so as to form a predetermined pattern, and the like are sequentially performed, and in this way, a resist pattern is formed on the wafer.

In recent years, as semiconductor devices have been further scaled down, the inhibition of the occurrence of a defect in the photolithography process has been required. Specifically, there has been a demand for a chemical liquid that can further inhibit the occurrence of a defect on a wafer after development.

In JP2007-324393A, a solvent is described which is obtained by mixing together a solvent having low volatility and a solvent having low surface tension at a predetermined ratio.

SUMMARY OF THE INVENTION

The inventors of the present invention used the solvent described in JP2007-324393A as a prewet solution and a developer. As a result, the inventors have found that in both cases, a defect easily occurs on a substrate after development.

An object of the present invention is to provide a chemical liquid which makes it difficult for a defect to occur on a substrate after development (hereinafter, the above properties will be described as "having an excellent defect inhibition performance" as well). Another object of the present invention is to provide a chemical liquid storage body and a pattern forming method.

In the present specification, the defect inhibition performance means a defect inhibition performance measured by the method described in Examples.

In order to achieve the aforementioned objects, the inventors of the present invention carried out an intensive examination. As a result, the inventors have found that the objects can be achieved by the following constitution.

[1] A chemical liquid containing a main agent which is formed of one kind of organic solvent or a mixture of two or more kinds of organic solvents, an impurity metal, and a surfactant, in which a vapor pressure of the main agent is 60 to 1,340 Pa at 25° C., the impurity metal contains particles containing one kind of metal selected from the group consisting of Fe, Cr, Ni, and Pb, in a case where the chemical liquid contains one kind of the particles, a content of the particles in the chemical liquid is 0.001 to 30 mass ppt with respect to the total mass of the chemical liquid, and in a case where the chemical liquid contains two or more kinds of the particles, a content of each kind of the particles in the chemical liquid is 0.001 to 30 mass ppt with respect to a total mass of the chemical liquid.

[2] The chemical liquid described in [1], in which the impurity metal contains one kind of metal selected from the group consisting of Fe, Cr, Ni, and Pb, in a case where the chemical liquid contains one kind of the metal, a content of the metal in the chemical liquid is 0.001 to 100 mass ppt with respect to the total mass of the chemical liquid, and in a case where the chemical liquid contains two or more kinds of the metals, a content of each of the metals in the chemical liquid is 0.001 to 100 mass ppt with respect to the total mass of the chemical liquid.

[3] The chemical liquid described in [1] or [2], in which a surface tension of the main agent is 25 to 40 mN/m at 25° C.

[4] The chemical liquid described in any one of [1] to [3], in which the organic solvent in the main agent is in an area surrounded by the following 4 points in a ternary diagram with apexes each showing a contribution rate of a dispersion element in Hansen solubility parameters of organic solvents, a contribution rate of a dipole-dipole force element in Hansen solubility parameters of organic solvents, and a contribution rate of a hydrogen bond element in Hansen solubility parameters of organic solvents.

First point: a contribution rate of a dispersion element=40%, a contribution rate of a dipole-dipole force element=60%, and a contribution rate of a hydrogen bond element=0% Second point: a contribution rate of a dispersion element=40%, a contribution rate of a dipole-dipole force element=0%, and a contribution rate of a hydrogen bond element=60%

Third point: a contribution rate of a dispersion element=80%, a contribution rate of a dipole-dipole force element=0%, and a contribution rate of a hydrogen bond element=20%

Fourth point: a contribution rate of a dispersion element=80%, a contribution rate of a dipole-dipole force element=20%, and a contribution rate of a hydrogen bond element=0%

[5] The chemical liquid described in any one of [1] to [4], in which the organic solvent contains at least one kind of compound selected from the group consisting of propylene glycol monomethyl ether, cyclopentanone, butyl acetate, propylene glycol monomethyl ether acetate, cyclohexanone, ethyl lactate, 2-hydroxymethyl isobutyrate, cyclopentanone dimethyl acetal, γ-butyrolactone, dimethyl sulfoxide, ethylene carbonate, propylene carbonate, 1-methyl-2-pyrrolidone, isoamyl acetate, 4-methyl-2-pentanol, diethylene glycol monomethyl ether, dimethyl ether, diethyl ether, diethylene glycol monoisobutyl ether, diglyme, diethylene glycol diethyl ether, triethylene glycol dimethyl ether, tetraethylene glycol dimethyl ether, triethylene glycol butyl methyl ether, diethylene glycol monobutyl ether, anisole, 1,4-dimethoxybenzene, 1,2-dimethoxybenzene, 1,3-dimethoxybenzene, 1,4-diphenoxybenzene, 4-methoxytoluene, phenetole, and 3-methoxymethyl propionate.

[6] The chemical liquid described in any one of [1] to [5], in which a content mass ratio of a content of the surfactant to a total content of the particles in the impurity metal is $1\times10^8$ to $1\times10^{12}$.

[7] The chemical liquid described in any one of [1] to [6], in which the number of objects to be counted having a size equal to or greater than 100 nm that are counted by a light scattering-type liquid-borne particle counter is 1 to 100/mL.

[8] The chemical liquid described in any one of [1] to [7], further containing water, in which a content of the water in the chemical liquid is 0.01% to 1.0% by mass.

[9] The chemical liquid described in any one of [1] to [8], further containing an organic impurity, in which a content of the organic impurity in the chemical liquid is 1 to 10,000 mass ppm.

[10] The chemical liquid described in [9], in which the organic impurity contains a high-boiling-point component having a boiling point equal to or higher than 300° C., and a total content of the high-boiling-point component is 0.1 to 30 mass ppm with respect to the total mass of the chemical liquid.

[11] The chemical liquid described in [10], in which a content mass ratio of a content of the surfactant to a content of the high-boiling-point component is 1 to $1\times10^4$.

[12] The chemical liquid described in any one of [1] to [11], in which the surfactant is at least one kind of compound selected from the group consisting of acetylene glycol, polyoxyethylene alkyl ether, polyoxyethylene alkyl amine, a glycerin fatty acid ester, a sorbitan fatty acid ester, alkyl betaine, a quaternary ammonium salt, polyoxyethylene allyl phenyl ether phosphate, and polyoxyethylene allyl phenyl ether sulfate.

[13] The chemical liquid described in [12], in which the surfactant is at least one kind of compound selected from the group consisting of acetylene glycol, polyoxyethylene alkyl ether, and polyoxyethylene alkyl amine.

[14] The chemical liquid described in any one of [1] to [13] that is used in at least one kind of chemical agent selected from the group consisting of a prewet solution and a developer.

[15] A chemical liquid storage body comprising a container and the chemical liquid described in any one of [1] to [14] that is stored in the container, in which a liquid contact portion contacting the chemical liquid in the container is formed of a nonmetallic material or stainless steel.

[16] The chemical liquid storage body described in [15], in which the nonmetallic material is at least one kind of material selected from the group consisting of a polyethylene resin, a polypropylene resin, a polyethylene-polypropylene resin, polytetrafluoroethylene, a polytetrafluoroethylene-perfluoroalkyl vinyl ether copolymer, a polytetrafluoroethylene-hexafluoropropylene copolymer resin, a polytetrafluoroethylene-ethylene copolymer resin, a chlorotrifluoro ethylene-ethylene copolymer resin, a vinylidene fluoride resin, a chlorotrifluoroethylene copolymer resin, and a vinyl fluoride resin.

[17] A pattern forming method including a pre-wetting step of coating a substrate with the chemical liquid described in any one of [1] to [14] so as to obtain a pre-wetted substrate, a resist film forming step of forming a resist film on the pre-wetted substrate by using an actinic ray-sensitive or radiation-sensitive resin composition, an exposure step of exposing the resist film, and a development step of developing the exposed resist film by using a developer, in which the actinic ray-sensitive or radiation-sensitive resin composition contains a resin including at least one kind of repeating unit selected from the group consisting of a repeating unit represented by Formula (a), a repeating unit represented by Formula (b), a repeating unit represented by Formula (c), a repeating unit represented by Formula (d), and a repeating unit represented by Formula (e).

[18] The pattern forming method described in [17], in which the chemical liquid with which the substrate is coated in the pre-wetting step satisfies the following conditions 1 and 2 at 25° C.

Condition 1: Rsq1 calculated by Equation 1 based on a proton spin-spin relaxation time measured for a chemical liquid and a first test solution formed of a resin and the chemical liquid by using a pulsed nuclear magnetic resonance-type particle interface characteristic evaluator is higher than 0.001.

$$Rsq1=(\tau 0/\tau 1)-1 \qquad \text{(Equation 1)}$$

In Equation 1, $\tau 0$ represents a spin-spin relaxation time of the chemical liquid, and $\tau 1$ represents a spin-spin relaxation time of the first test solution.

Condition 2: SRsq calculated by Equation 2 based on a proton spin-spin relaxation time measured for a second test solution, which is formed of the resin and the chemical liquid and in which the content of the resin is different from the content of the resin in the first test solution, and the first test solution by using a pulsed nuclear magnetic resonance-type particle interface characteristic evaluator is higher than −1.

$$SRsq=(Rsq2-Rsq1)/(c2-c1) \qquad \text{(Equation 2)}$$

In Equation 2, Rsq1 represents a value calculated by Equation 1, and Rsq2 represents a value calculated by Equation 3. c1 and c2 represent a mass-based content of the resin in the first test solution and the second test solution respectively. The unit of the mass-based content is % by mass, and c2>c1.

$$Rsq2=(\tau 0/\tau 2)-1 \qquad \text{(Equation 3)}$$

In Equation 3, $\tau 0$ has the same definition as $\tau 0$ in Equation 1, and $\tau 2$ represents a spin-spin relaxation time of the second test solution.

According to the present invention, it is possible to provide a chemical liquid which has an excellent defect inhibition performance (hereinafter, described as "having the effects of the present invention" as well). Furthermore, according to the present invention, it is possible to provide a chemical liquid storage body and a pattern forming method.

BRIEF DESCRIPTION OF THE DRAWINGS

FIG. 1 is a ternary diagram with apexes each showing a contribution rate of a dispersion element in Hansen solubility parameters, a contribution rate of a dipole-dipole force element in Hansen solubility parameters, and a contribution rate of a hydrogen bond element in Hansen solubility parameters.

DESCRIPTION OF THE PREFERRED EMBODIMENTS

Hereinafter, the present invention will be specifically described.

The following constituents will be described based on typical embodiments of the present invention in some cases, but the present invention is not limited to the embodiments.

In the present specification, a range of numerical values described using "to" means a range including the numerical values listed before and after "to" as a lower limit and an upper limit respectively.

In the present invention, "preparation" means not only the preparation of a specific material by means of synthesis or mixing but also the preparation of a predetermined substance by means of purchase and the like.

In the present invention, "ppm" means "parts-per-million ($10^{-6}$)", "ppb" means "parts-per-billion ($10^{-9}$)", "ppt" means "parts-per-trillion ($10^{-12}$)", and "ppq" means "parts-per-quadrillion ($10^{-15}$)".

In the present invention, 1 Å (angstrom) equals 0.1 nm.

In the present invention, regarding the description of a group (atomic group), in a case where whether the group is substituted or unsubstituted is not described, as long as the effects of the present invention are not impaired, the group includes a group which does not have a substituent and a group which has a substituent. For example, "hydrocarbon group" includes not only a hydrocarbon group which does not have a substituent (unsubstituted hydrocarbon group) but also a hydrocarbon group which has a substituent (substituted hydrocarbon group). The same is true for each compound.

Furthermore, in the present invention, "radiation" means, for example, far ultraviolet rays, extreme ultraviolet (EUV), X-rays, electron beams, and the like. In addition, in the present invention, light means actinic rays or radiation. In the present invention, unless otherwise specified, "exposure" includes not only exposure, far ultraviolet rays, X-rays, and EUV, and the like, but also lithography by particle beams such as Electron beams or ion beams.

Chemical Liquid (First Embodiment)

The chemical liquid according to a first embodiment of the present invention is a chemical liquid containing a main agent which is formed of one kind of organic solvent, and a surfactant, in which a vapor pressure of the main agent is 60 to 1,340 Pa at 25° C., the metal contains particles containing one kind of metal selected from the group consisting of Fe, Cr, Ni, and Pb, in a case where the chemical liquid contains one kind of the particles, a content of the particles in the chemical liquid is 0.001 to 30 mass ppt with respect to the total mass of the chemical liquid, and in a case where the chemical liquid contains two or more kinds of the particles, a content of each kind of the particles in the chemical liquid is 0.001 to 30 mass ppt with respect to the total mass of the chemical liquid.

The inventors of the present invention assume that the chemical liquid may bring about the effects of the present invention by the following mechanism, although the mechanism is not clear.

The chemical liquid according to the embodiment of the present invention contains an impurity metal, the impurity metal contains particles containing one kind of metal selected from the group consisting of Fe, Cr, Ni, and Pb. In a case where the chemical liquid contains one kind of the particles, a content of the particles in the chemical liquid is 0.001 to 30 mass ppt with respect to the total mass of the chemical liquid, and in a case where the chemical liquid contains two or more kinds of the particles, a content of each kind of the particles in the chemical liquid is 0.001 to 30 mass ppt with respect to the total mass of the chemical liquid.

In a case where such a chemical liquid is used as a prewet solution and/or a developer, because the content of particles which tend to cause residues after development is small, residues hardly occur after development. Meanwhile, because the amount of particles contained in the chemical liquid is equal to or greater than 0.001 mass ppt, the particles are easily aggregated with each other, and residues hardly occur after development.

Furthermore, the chemical liquid according to the embodiment of the present invention contains a surfactant. In a case where the chemical liquid according to the embodiment of the present invention is used as a prewet solution, the occurrence of a phenomenon (solvent shock), in which a component (particularly, an actinic ray-sensitive or radiation-sensitive resin) of a resist composition is precipitated due to the difference in components between the resist composition with which a substrate is coated after a pre-wetting step and a prewet solution, is inhibited. Consequently, residues hardly occur after development. In addition, in a case where the chemical liquid according to the embodiment of the present invention is used as a developer, insoluble matters of a resist composition can be effectively dissolved in the developer. As a result, residues hardly occur after development.

Hereinafter, the components contained in the chemical liquid and the physical properties of the chemical liquid will be described.

[Main Agent]

The chemical liquid contains a main agent formed of one kind of organic solvent. The content of the main agent in the chemical liquid is not particularly limited, but is preferably 97.0% to 99.0% by mass with respect to the total mass of the chemical liquid in general.

The vapor pressure of the main agent is 60 to 1,340 Pa at 25° C.

In the present embodiment, the vapor pressure of the main agent means a vapor pressure of one kind of the organic solvent at 25° C.

The type of the organic solvent is not particularly limited, and examples thereof include known organic solvents.

Examples of the organic solvents include alkylene glycol monoalkyl ether carboxylate, alkylene glycol monoalkyl ether, a lactic acid alkyl ester, alkoxyalkyl propionate, cyclic lactone (preferably having 4 to 10 carbon atoms), a monoketone compound which may have a ring (preferably having 4 to 10 carbon atoms), alkylene carbonate, alkoxyalkyl acetate, alkyl pyruvate, and the like.

Furthermore, as the organic solvents, those described in JP2016-057614A, JP2014-219664A, JP2016-138219A, and JP2015-135379A may be used.

It is preferable that the organic solvent contains at least one kind of compound selected from the group (hereinafter, referred to as "specific organic solvent" as well) consisting of propylene glycol monomethyl ether (PGME), cyclopentanone (CyPn), butyl acetate (nBA), propylene glycol monomethyl ether acetate (PGMEA), cyclohexanone (CyHx), ethyl lactate (EL), 2-hydroxymethyl isobutyrate (HBM), cyclopentanone dimethyl acetal (DBCPN), γ-butyrolactone (GBL), dimethyl sulfoxide (DMSO), ethylene carbonate (EC), propylene carbonate (PC), 1-methyl-2-pyrrolidone (NMP), isoamyl acetate (iAA), 4-methyl-2-pentanol (MIBC), diethylene glycol monomethyl ether (DEGME), dimethyl ether (DME), diethyl ether (DEE), diethylene glycol monoisobutyl ether (DEGIBE), diglyme (DEGDME), diethylene glycol diethyl ether (DEGDEE), triethylene glycol dimethyl ether (TriEGDME), tetraethylene glycol dimethyl ether (TetraEGDME), triethylene glycol butyl methyl ether (TEGMBE), diethylene glycol monobutyl ether (DEGMBE), anisole, 1,4-dimethoxybenzene (14-DMB), 1,2-dimethoxybenzene (12-DMB), 1,3-dimethoxybenzene (13-DMB), 1,4-diphenoxybenzene, 4-methoxytoluene, phenetole, and 3-methoxymethyl propionate (MMP). It is more preferable that the organic solvent is formed of the specific organic solvent. In a case where the organic solvent contains the specific organic solvent, the chemical liquid has further improved uniformity.

[Impurity Metal]

<Particles Containing One Kind of Metal Selected from Group Consisting of Fe, Cr, Ni, and Pb>

The chemical liquid contains an impurity metal. Particularly, the chemical liquid contains particles containing one kind of metal selected from the group consisting of Fe, Cr, Ni, and Pb.

In the present specification, the impurity metal means a metal component in the chemical liquid that can be measured using a single particle inductively coupled plasma emission mass spectrometer. With this device, it is possible to separately measure the content and the total content of an impurity metal as particles (particle-like impurity metal) and an impurity metal other than that (for example, ions and the like). In the present specification, "the content of an impurity metal" simply means the total content. The chemical liquid may contain both the particles containing one kind of metal selected from the group consisting of Fe, Cr, Ni, and Pb and an impurity metal other than that (for example, ions and the like).

In the present specification, the particles containing one kind of metal selected from the group consisting of Fe, Cr, Ni, and Pb mean a particle-like metal component in the chemical liquid that can be measured using a single particle inductively coupled plasma emission mass spectrometer. In the present specification, the impurity metal can be measured, by the method described in Examples by using Agilent 8800 triple quadrupole inductively coupled plasma mass spectrometry (ICP-MS, for semiconductor analysis, option #200) manufactured by Agilent Technologies, Inc.

In a case where the chemical liquid contains one kind of particles containing one kind of the metal selected from the group consisting of Fe, Cr, Ni, and Pb, the content of the particles in the chemical liquid is 0.001 to 30 mass ppt with respect to the total mass of the chemical liquid. In a case where the chemical liquid contains two or more kinds of the particles, the content of each kind of the particles in the chemical liquid is 0.001 to 30 mass ppt with respect to the total mass of the chemical liquid.

Particularly, it is preferable that the chemical liquid contains particles containing Fe, particles containing Cr, particles containing Ni, and particles containing Pb, and the content of particles of each of the above metals is 0.001 to 30 mass ppt.

In the chemical liquid, a content mass ratio of the content of the surfactant to the total content of the particles of the impurity metal (including particles containing an impurity metal other than the particles containing one kind of metal selected from the group consisting of Fe, Cr, Ni, and Pb) (content of surfactant/total content of particles) is not particularly limited. The content mass ratio is preferably $1\times10^6$ to $1\times10^{15}$, and more preferably $1\times10^8$ to $1\times10^{12}$. In a case where the content mass ratio is within a range of $1\times10^8$ to $1\times10^{12}$, the chemical liquid has a further improved ashing residue removing performance and a further improved post-chemical-mechanical polishing (p-CMP) defect inhibition performance.

The size of the particles containing one kind of metal selected from the group consisting of Fe, Cr, Ni, and Pb is not particularly limited. Generally, the average primary particle diameter thereof is preferably equal to or smaller than 20 nm. The lower limit thereof is not particularly limited, but is preferably equal to or greater than 5 nm in general. In the present specification, the average primary particle diameter means an average primary particle diameter obtained by evaluating diameters, expressed as diameters of circles, of 400 particles by using a transmission electron microscope (TEM) and calculating the arithmetic mean thereof.

<Content of Impurity Metal (Total Amount of Particles and Impurity Metal Other than Particles)>

It is preferable that the chemical liquid of the present embodiment further contains one kind of impurity metal (for example, an impurity metal as an ion or the like) selected from the group consisting of Fe, Cr, Ni, and Pb.

The content of one kind of the impurity metal selected from the group consisting of Fe, Cr, Ni, and Pb is not particularly limited. In a case where the chemical liquid contains one kind of the impurity metal selected from the group consisting of Fe, Cr, Ni, and Pb, the content of one kind of the impurity metal (total amount of particles and an impurity metal other than the particles in the chemical liquid) in the chemical liquid is preferably 0.001 to 100 mass ppt with respect to the total mass of the chemical liquid. In a case where the chemical liquid contains two or more kinds of impurity metals, the content of each of the impurity metals is preferably 0.001 to 100 mass ppt with respect to the total mass of the chemical liquid.

In a case where the content of the impurity metal is within the above range, the chemical liquid has a further improved defect inhibition performance. Particularly, it is considered that in a case where the content of the impurity metal is equal to or greater than 0.001 mass ppt, and a substrate is coated with the chemical liquid, the impurity metal atoms may be more easily aggregated with each other, and consequently, the number of defects may be further reduced.

The impurity metal may be added to the chemical liquid or may be unintentionally mixed into the chemical liquid in the manufacturing process of the chemical liquid. Examples of the case where the impurity metal is unintentionally mixed into the chemical liquid in the manufacturing process of the chemical liquid include a case where the impurity metal is contained in a raw material (for example, an organic solvent) used for manufacturing the chemical liquid, a case where the impurity metal is mixed into the chemical liquid in the manufacturing process of the chemical liquid (for example, contamination), and the like. However, the present invention is not limited to these.

[Surfactant]

The chemical liquid according to the present embodiment contains a surfactant.

As the surfactant, known surfactants can be used without particular limitation.

The content of the surfactant in the chemical liquid is not particularly limited. Generally, the content of the surfactant with respect to the total solid content in the chemical liquid is preferably 0.01 to 50,000 mass ppm, more preferably 1 to 30,000 mass ppm, and even more preferably 10 to 10,000 mass ppm.

In a case where the content of the surfactant in the chemical liquid is 10 to 10,000 mass ppm, the chemical liquid has a further improved defect inhibition performance. One kind of surfactant may be used singly, or two or more kinds of surfactants may be used in combination. In a case where two or more kinds of surfactants are used in combination, the total content thereof is preferably within the above range.

The molecular weight of the surfactant is not particularly limited. In view of obtaining a chemical liquid having further improved effects of the present invention, the molecular weight of the surfactant is preferably 1 to 3,000. In the present specification, a surfactant having a molecular weight of 1 to 3,000 is particularly referred to as "low-molecular weight" surfactant.

Examples of the surfactant include an ionic surfactant and a nonionic surfactant. Examples of the ionic surfactant include an anionic surfactant, a cationic surfactant, and an amphoteric surfactant.

As the anionic surfactant, polyoxyethylene allyl phenyl ether phosphate, polyoxyalkylene allyl phenyl ether, and the like are preferable.

As the cationic surfactant, for example, an alkyl amine salt, a quaternary ammonium salt, and the like are preferable.

As the amphoteric surfactant, for example, alkyl betaine, amine oxide, and the like are preferable.

As the nonionic surfactant, for example, acetylene glycol, polyoxyethylene alkyl ether, polyoxyethylene alkyl amine, a glycerin fatty acid ester, a sorbitan fatty acid ester, and the like are preferable.

As the surfactant, a fluorine-containing surfactant is also preferable. Specific examples of the fluorine-containing surfactant include SURFLON S-651 (nonionic) manufactured by AGC SEIMI CHEMICAL CO., LTD., and the like.

It is preferable that the acetylene glycol has a structure represented by the following formula.

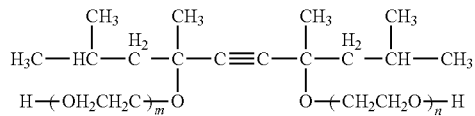

In the above formula, m and n each independently represent an integer equal to or greater than 1. Each of m and n is preferably equal to or greater than 1. Generally, each of m and n is preferably equal to or smaller than 20. Examples of commercial products of the acetylene glycol include "SURFYNOL" manufactured by Nissin Chemical Co., Ltd., "ACETYLENOL" manufactured by Kawaken Fine Chemicals Co., Ltd., and the like.

It is preferable that the polyoxyethylene alkyl ether has a structure represented by the following formula.

$$RO-(CH_2CH_2O)_n-H$$

In the above formula, n represents an integer equal to or greater than 1. n is preferably equal to or greater than 1. Generally, n is preferably equal to or smaller than 20. R represents an alkyl group. The alkyl group may be a linear, branched, or cyclic alkyl group, or may have a structure obtained by combining these. The number of carbon atoms in the alkyl group is not particularly limited, but is preferably 1 to 20 in general. Examples of commercial products thereof include "EMULGEN" manufactured by Kao Corporation, and the like.

It is preferable that the polyoxyethylene alkyl amine has a structure represented by the following formula.

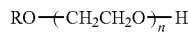

In the above formula, m represents an integer equal to or greater than 1. m is preferably equal to or greater than 1. Generally, m is preferably equal to or smaller than 20. R represents an alkyl group. The alkyl group may be a linear, branched, or cyclic alkyl group, or may have a structure obtained by combining these. The number of carbon atoms in the alkyl group is not particularly limited, but is preferably 1 to 20 in general. Examples of commercial products thereof include AMIET manufactured by Kao Corporation, and the like.

It is preferable that the glycerin fatty acid ester has a structure represented by the following formula.

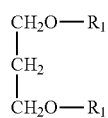

In the above formula, $R_1$ each independently represents a hydrogen atom or $-COR_2$. $R_2$ represents an alkyl group. Two $R_1$'s do not simultaneously represent a hydrogen atom. Examples of commercial products thereof include "RHEODOL MS-50" manufactured by Kao Corporation, and the like.

As the sorbitan fatty acid ester, a compound obtained by esterifying 1,4-anhydrosorbitol or 1,5-anhydrosorbitol is preferable. Examples of commercial products thereof include "RHEODOL SP-S20" manufactured by Kao Corporation, and the like.

It is preferable that the alkyl betaine has a structure represented by the following structure.

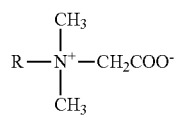

In the above formula, R represents an alkyl group. The alkyl group may be a linear, branched, or cyclic alkyl group, or may have a structure obtained by combining these. The number of carbon atoms in the alkyl group is not particularly limited, but is preferably 1 to 20 in general. Examples of commercial products thereof include "ANHITOL" manufactured by Kao Corporation, and the like.

It is preferable that the quaternary ammonium salt has the following structure.

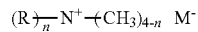

In the above formula, n represents 1 or 2, and R represents an alkyl group. The alkyl group may be a linear, branched, or cyclic alkyl group, or may have a structure obtained by combining these. The number of carbon atoms in the alkyl group is not particularly limited, but is preferably 1 to 20 in general. In a case where there is a plurality of R's, the R's may be the same as or different from each other. M represents a halogen atom, and is preferably a chlorine atom. Examples of commercial products thereof include "PIONIN B-111" manufactured by TAKEMOTO OIL & FAT Co., Ltd., and the like.

Examples of commercial products of the polyoxyethylene allyl phenyl ether phosphate include NEWKALGEN FS-3 manufactured by TAKEMOTO OIL & FAT Co., Ltd.

Examples of commercial products of the polyoxyalkylene allyl phenyl ether sulfate include polyoxyalkylene allyl phenyl ether sulfate manufactured by TAKEMOTO OIL & FAT Co., Ltd., and the like.

Examples of commercial products of the surfactant include SURFYNOL 420 (trade name, manufactured by Nissin Chemical Co., Ltd.), EMULGEN 102, AMIET 102, RHEODOL MS-50, RHEODOL SP-S20, and ANHITOL 24B (trade names, manufactured by Kao Corporation.), and NEWKALGEN FS-3, NEWKALGEN FS-7, and PIONIN B-111 (trade names, manufactured by TAKEMOTO OIL & FAT Co., Ltd.), but the present invention is not limited to these.

In view of obtaining a chemical liquid having further improved effects of the present invention, the surfactant is preferably at least one kind of compound selected from the group consisting of acetylene glycol, polyoxyethylene alkyl ether, polyoxyethylene alkyl amine, a glycerin fatty acid ester, a sorbitan fatty acid ester, alkyl betaine, a quaternary ammonium salt, polyoxyethylene allyl phenyl ether sulfate, and polyoxyethylene allyl phenyl ether phosphate, more preferably at least one kind of compound selected from the group consisting of acetylene glycol, polyoxyethylene alkyl ether, polyoxyethylene alkyl amine, a glycerin fatty acid ester, and a sorbitan fatty acid ester, even more preferably at least one kind of compound selected from the group consisting of acetylene glycol, polyoxyethylene alkyl ether, and polyoxyethylene alkyl amine, and most preferably acetylene glycol.

Particularly, in a case where the surfactant contained in the chemical liquid is formed of acetylene glycol, polyoxyethylene alkyl ether, or polyoxyethylene alkyl amine, the chemical liquid has a particularly excellent defect inhibition performance.

[Optional Component]

As long as the effects of the present invention are exhibited, the chemical liquid may contain optional components other than the above components. Examples of the optional components include an organic impurity and water.

<Water>

It is preferable that the chemical liquid contains water. As the water, for example, distilled water, deionized water, pure water, and the like can be used without particular limitation. The water is not included in the organic impurity which will be described later.

Water may be added to the chemical liquid or may be unintentionally mixed into the chemical liquid in the manufacturing process of the chemical liquid. Examples of the case where water is unintentionally mixed into the chemical liquid in the manufacturing process of the chemical liquid include a case where water is contained in a raw material (for example, an organic solvent) used for manufacturing the chemical liquid, a case where water is mixed into the chemical liquid in the manufacturing process of the chemical liquid (for example, contamination), and the like. However, the present invention is not limited to these.

The content of water in the chemical liquid is not particularly limited. Generally, the content of water with respect to the total mass of the chemical liquid is preferably 0.05% to 2.0% by mass, and more preferably 0.1% to 1.5% by mass.

In a case where the content of water in the chemical liquid is 0.1% to 1.5% by mass, the chemical liquid has further improved defect inhibition performance.

In a case where the content of water is equal to or greater than 0.1% by mass, the impurity metal is not easily eluted. In a case where the content of water is equal to or smaller than 1.5% by mass, water is inhibited from becoming the cause of a defect.

In the present specification, the content of water in the chemical liquid means a moisture content measured using a device which adopts the Karl Fischer moisture measurement method as the principle of measurement. The measurement method performed by the device is as described in Examples.

<Organic Impurity>

It is preferable that the chemical liquid contains an organic impurity.

In the present specification, the organic impurity means an organic compound which is different from the organic solvent and the surfactant contained in the chemical liquid and is contained in the chemical liquid in an amount equal to or smaller than 10,000 mass ppm with respect to the total mass of the chemical liquid. That is, in the present specification, an organic compound, which is contained in the chemical liquid in an amount equal to or smaller than 10,000 mass ppm with respect to the total mass of the chemical liquid and is different from a surfactant, corresponds to an organic impurity but does not correspond to an organic solvent.

In a case where the chemical liquid contains a plurality of kinds of organic compounds, and each of the organic compounds is contained in the chemical liquid in an amount equal to or smaller than 10,000 mass ppm as described above, each of the organic compounds corresponds to the organic impurity.

The organic impurity may be added to the chemical liquid or may be unintentionally mixed into the chemical liquid in the manufacturing process of the chemical liquid. Examples of the case where the organic impurity is unintentionally mixed into the chemical liquid in the manufacturing process of the chemical liquid include a case where the organic impurity is contained in a raw material (for example, an organic solvent) used for manufacturing the chemical liquid, a case where the organic impurity is mixed into the chemical liquid in the manufacturing process of the chemical liquid (for example, contamination), and the like. However, the present invention is not limited to these.

The total content of the organic impurity in the chemical liquid is not particularly limited. Generally, the upper limit of the total content of the organic impurity with respect to the total mass of the chemical liquid is preferably equal to or smaller than 10,000 mass ppm, more preferably equal to or smaller than 8,000 mass ppm, even more preferably equal to or smaller than 3,000 mass ppm, particularly preferably equal to or smaller than 2,500 mass ppm, and most preferably equal to or smaller than 300 mass ppm. Furthermore, generally, the lower limit of the total content of the organic impurity with respect to the total mass of the chemical liquid is preferably equal to or greater than 1 mass ppm, and more preferably equal to or greater than 10 mass ppm. In a case where the total content of the organic impurity is equal to or greater than 1 mass ppm and equal to or smaller than 10,000 mass ppm, the chemical liquid has a further improved defect inhibition performance.

One kind of organic impurity may be used singly, or two or more kinds of organic impurities may be used in combination. In a case where two or more kinds of organic impurities are used in combination, the total content thereof is preferably within the above range.

The total content of the organic impurity in the chemical liquid can be measured using gas chromatography mass spectrometry (GCMS). The measurement conditions and the like are as described in Examples.

As the organic impurity, known organic compounds can be used without particular limitation.

The number of carbon atoms in the organic compound is not particularly limited. However, in view of making the chemical liquid have further improved effects of the present invention, the number of carbon atoms in the organic compound is preferably equal to or greater than 8, and more preferably equal to or greater than 12. The upper limit of the number of carbon atoms is not particularly limited, but is preferably equal to or smaller than 30 in general.

Examples of the organic impurity include byproducts generated at the time of synthesizing the organic solvent and/or unreacted raw materials (hereinafter, referred to as "byproduct and the like" as well), and the like.

Examples of the byproduct and the like include compounds represented by Formulae I to V, and the like.

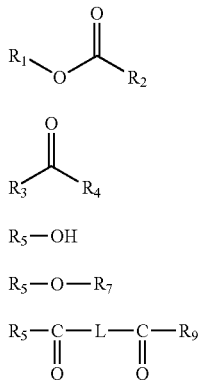

In Formula I, $R_1$ and $R_2$ each independently represent an alkyl group or a cycloalkyl group. Alternatively, $R_1$ and $R_2$ form a ring by being bonded to each other.

As the alkyl group or the cycloalkyl group represented by $R_1$ and $R_2$, an alkyl group having 1 to 12 carbon atoms or a cycloalkyl group having 6 to 12 carbon atoms is preferable, and an alkyl group having 1 to 8 carbon atoms or a cycloalkyl group having 6 to 8 carbon atoms is more preferable.

The ring formed of $R_1$ and $R_2$ bonded to each other is a lactone ring, preferably a 4- to 9-membered lactone ring, and more preferably a 4- to 6-membered lactone ring.

It is preferable that $R_1$ and $R_2$ satisfy a relationship in which the number of carbon atoms in the compound represented by Formula I becomes equal to or greater than 8.

In Formula II, $R_3$ and $R_4$ each independently represent a hydrogen atom, an alkyl group, an alkenyl group, a cycloalkyl group, or a cycloalkenyl group. Alternatively, $R_3$ and $R_4$ form a ring by being bonded to each other. Here, $R_3$ and $R_4$ do not simultaneously represent a hydrogen atom.

As the alkyl group represented by $R_3$ and $R_4$, for example, an alkyl group having 1 to 12 carbon atoms is preferable, and an alkyl group having 1 to 8 carbon atoms is more preferable.

As the alkenyl group represented by $R_3$ and $R_4$, for example, an alkenyl group having 2 to 12 carbon atoms is preferable, and an alkenyl group having 2 to 8 carbon atoms is more preferable.

As the cycloalkyl group represented by $R_3$ and $R_4$, for example, a cycloalkyl group having 6 to 12 carbon atoms is preferable, and a cycloalkyl group having 6 to 8 carbon atoms is more preferable.

As the cycloalkenyl group represented by $R_3$ and $R_4$, for example, a cycloalkenyl group having 3 to 12 carbon atoms is preferable, and a cycloalkenyl group having 6 to 8 carbon atoms is more preferable.

The ring formed of $R_3$ and $R_4$ bonded to each other is a cyclic ketone structure which may be a saturated cyclic ketone or an unsaturated cyclic ketone. The cyclic ketone is preferably a 6- to 10-membered ring, and more preferably a 6- to 8-membered ring.

It is preferable that $R_3$ and $R_4$ satisfy a relationship in which the number of carbon atoms in the compound represented by Formula II becomes equal to or greater than 8.

In Formula III, $R_5$ represents an alkyl group or a cycloalkyl group.

As the alkyl group represented by $R_5$, an alkyl group having 6 or more carbon atoms is preferable, an alkyl group having 6 to 12 carbon atoms is more preferable, and an alkyl group having 6 to 10 carbon atoms is even more preferable.

The alkyl group may have an ether bond in the chain thereof or may have a substituent such as a hydroxy group.

As the cycloalkyl group represented by $R_5$, a cycloalkyl group having 6 or more carbon atoms is preferable, a cycloalkyl group having 6 to 12 carbon atoms is more preferable, and a cycloalkyl group having 6 to 10 carbon atoms is even more preferable.

In Formula IV, $R_6$ and $R_7$ each independently represent an alkyl group or a cycloalkyl group. Alternatively, $R_6$ and $R_7$ form a ring by being bonded to each other.

As the alkyl group represented by $R_6$ and $R_7$, an alkyl group having 1 to 12 carbon atoms is preferable, and an alkyl group having 1 to 8 carbon atoms is more preferable.

As the cycloalkyl group represented by $R_6$ and $R_7$, a cycloalkyl group having 6 to 12 carbon atoms is preferable, and a cycloalkyl group having 6 to 8 carbon atoms is more preferable.

The ring formed of $R_6$ and $R_7$ bonded to each other is a cyclic ether structure. The cyclic ether structure is preferably a 4- to 8-membered ring, and more preferably a 5- to 7-membered ring.

It is preferable that $R_6$ and $R_7$ satisfy a relationship in which the number of carbon atoms in the compound represented by Formula IV becomes equal to or greater than 8.

In Formula V, $R_8$ and $R_9$ each independently represent an alkyl group or a cycloalkyl group. Alternatively, $R_8$ and $R_9$ form a ring by being bonded to each other. L represents a single bond or an alkylene group.

As the alkyl group represented by $R_8$ and $R_9$, an alkyl group having 6 to 12 carbon atoms is preferable, and an alkyl group having 6 to 10 carbon atoms is more preferable.

As the cycloalkyl group represented by $R_8$ and $R_9$, a cycloalkyl group having 6 to 12 carbon atoms is preferable, and a cycloalkyl group having 6 to 10 carbon atoms is more preferable.

The ring formed of $R_8$ and $R_9$ bonded to each other is a cyclic diketone structure. The cyclic diketone structure is preferably a 6- to 12-membered ring, and more preferably a 6- to 10-membered ring.

As the alkylene group represented by L, for example, an alkylene group having 1 to 12 carbon atoms is preferable, and an alkylene group having 1 to 10 carbon atoms is more preferable.

$R_8$, $R_9$, and L satisfy a relationship in which the number of carbon atoms in the compound represented by Formula V becomes equal to or greater than 8.

The organic impurity is not particularly limited. However, in a case where the organic solvents are an amide compound, an imide compound, and a sulfoxide compound, in an aspect, examples of the organic impurity include an amide compound, an imide compound, and a sulfoxide compound having 6 or more carbon atoms. Examples of the organic impurity also include the following compounds.

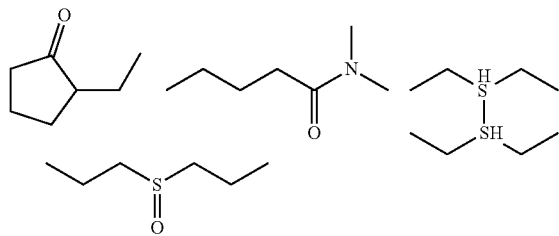

(High-Boiling-Point Component)

It is preferable that the organic impurity contains a high-boiling-point component having a boiling point equal to or higher than 300° C. The content of the high-boiling-point component with respect to the total mass of the chemical liquid is preferably 0.1 to 30 mass ppm. In a case where the content of the high-boiling-point component in the chemical liquid is within the above range, the chemical liquid has further improved effects of the present invention.

In the chemical liquid according to the present embodiment, a content mass ratio of the content of the surfactant to the content of the high-boiling-point component is not particularly limited. Generally, the content mass ratio is preferably 0.01 to $1\times10^6$, and more preferably 1 to $1\times10^4$.

In a case where the content mass ratio is within a range of 1 to $1\times10^4$, the chemical liquid has further improved effects of the present invention.

[Physical Properties of Chemical Liquid or the Like]

In view of obtaining further improved effects of the present invention, it is preferable that the chemical liquid or the main agent (hereinafter, referred to as "chemical liquid or the like" as well) satisfies physical properties relating to each of the following items.

<Surface Tension>

The surface tension at 25° C. of the main agent contained in the chemical liquid according to the present embodiment is not particularly limited. Generally, the surface tension is preferably 25 to 44 mN/m. In view of making the chemical liquid have further improved effects of the present invention, the surface tension is more preferably 28 to 40 mN/m.

In a case where the surface tension of the main agent is 28 to 40 mN/m at 25° C., the chemical liquid has a further improved resist saving performance (particularly, film thickness controllability). In the present specification, the resist saving performance means a resist saving performance which can be evaluated by the method described in Examples.

The surface tension of the main agent according to the present embodiment means a surface tension of one kind of the aforementioned organic solvent at 25° C. The surface tension of the organic solvent means a surface tension measured using a surface tensiometer (trade name "CBVP-Z" manufactured by Kyowa Interface Science Co., LTD., or a device equivalent to CBVP-Z).

<Contribution Rate of Hansen Solubility Parameters>

It is preferable that the organic solvent as a main agent contained in the chemical liquid according to the present embodiment is in an area surrounded by the following 4 points in a ternary diagram with apexes each showing a contribution rate of a dispersion element in Hansen solubility parameters of the organic solvents described above, a contribution rate of a dipole-dipole force element in Hansen solubility parameters of the organic solvents described above, and a contribution rate of a hydrogen bond element in Hansen solubility parameters of the organic solvents described above. The chemical liquid containing the organic solvent having the above characteristics as a main agent exhibits further improved affinity with a resist composition.

First point: a contribution rate of a dispersion element=40%, a contribution rate of a dipole-dipole force element=60%, and a contribution rate of a hydrogen bond element=0%

Second point: a contribution rate of a dispersion element=40%, a contribution rate of a dipole-dipole force element=0%, and a contribution rate of a hydrogen bond element=60%

Third point: a contribution rate of a dispersion element=80%, a contribution rate of a dipole-dipole force element=0%, and a contribution rate of a hydrogen bond element=20%

Fourth point: a contribution rate of a dispersion element=80%, a contribution rate of a dipole-dipole force element=20%, and a contribution rate of a hydrogen bond element=0%

In the present specification, Hansen solubility parameters mean those described in "Hansen Solubility Parameters: A Users Handbook" (Second Edition, pp. 1-310, CRC Press, 2007), and the like. That is, Hansen solubility parameters describe solubility by using multi-dimensional vectors (a dispersion element ($\delta$d), a dipole-dipole force element ($\delta$p), and a hydrogen bond element ($\delta$h)). These three parameters can be considered as coordinates of points in a three-dimensional space called Hansen space. The unit of each of the elements of the Hansen solubility parameters is $(MPa)^{0.5}$.

In the present specification, a contribution rate (fd) of the dispersion element in Hansen solubility parameters, a contribution rate (fp) of the dipole-dipole force element in Hansen solubility parameters, and a contribution rate (fh) of the hydrogen bond element in Hansen solubility parameters can be calculated using Equations (1) to (3).

$$fd=\delta d/(\delta d+\delta p+\delta h)\times 100 \text{(unit: \%)} \qquad \text{Equation (1):}$$

$$fp=\delta p/(\delta d+\delta p+\delta h)\times 100 \text{(unit: \%)} \qquad \text{Equation (2):}$$

$$fh=\delta h/(\delta d+\delta p+\delta h)\times 100 \text{(unit: \%)} \qquad \text{Equation (3):}$$

FIG. 1 is a ternary diagram with apexes each showing a contribution rate of a dispersion element in Hansen solubility parameters of organic solvents, a contribution rate of a dipole-dipole force element in Hansen solubility parameters of organic solvents, and a contribution rate of a hydrogen bond element in Hansen solubility parameters of organic solvents.

In FIG. 1, the portion represented by an area R is an area surrounded by the following 4 points.

First point: a contribution rate of a dispersion element=40%, a contribution rate of a dipole-dipole force element=60%, and a contribution rate of a hydrogen bond element=0%

Second point: a contribution rate of a dispersion element=40%, a contribution rate of a dipole-dipole force element=0%, and a contribution rate of a hydrogen bond element=60%

Third point: a contribution rate of a dispersion element=80%, a contribution rate of a dipole-dipole force element=0%, and a contribution rate of a hydrogen bond element=20%

Fourth point: a contribution rate of a dispersion element=80%, a contribution rate of a dipole-dipole force element=20%, and a contribution rate of a hydrogen bond element=0%

Examples of the organic solvents, which are in the area R surrounded by the 4 points in the ternary diagram with apexes each showing a contribution rate of a dispersion element in Hansen solubility parameters, a contribution rate of a dipole-dipole force element in Hansen solubility parameters, and a contribution rate of a hydrogen bond element in Hansen solubility parameters, include the following organic solvents. In the present paragraph, the numbers described in the bracket following the name of the organic solvent represent (the contribution rate of the dispersion element: fd, the contribution rate of the dipole-dipole force element: fp, the contribution rate of the hydrogen bond element: fh) respectively.

nBA (60.6, 17.2, 22.2), NMP (48.0, 32.8, 19.2), EL (55.5, 19.8, 24.7), PGMEA (56.5, 19.8, 23.7), PGME (46.6, 32.1, 21.3), isoamyl acetate (63.2, 15.8, 21.0), MIBC (51.5, 14.5, 34.0), IPA (43.0, 18.0, 39.0), CyHx (61.0, 21.6, 17.5), CyPn (62.0, 20.9, 17.1), cyclohexane (61, 21.5, 17.5), PC (42.9, 39.5, 17.6), DMSO (40.9, 36.4, 22.7), GBL (42.9, 39.5, 17.6), HBM (46.0, 20.0, 34.0), DBCPN (65.4, 18.1, 16.5).

<Number of Coarse Particles>

In view of making the chemical liquid have further improved effects of the present invention, in the chemical liquid, the number of objects to be counted having a size equal to or greater than 100 nm (0.1 μm) that are counted by a light scattering-type liquid-borne particle counter is preferably 1 to 100/mL.

In the present specification, the objects to be counted having a size equal to or greater than 100 nm that are counted by a light scattering-type liquid-borne particle counter are referred to as "coarse particles" as well.

In a case where the number of coarse particles in the chemical liquid is 1 to 100/mL, the chemical liquid has further improved resist saving performance (particularly, uniformity).

Examples of the coarse particles include particles of dirt, dust, organic solids, inorganic solids, and the like contained in a raw material (for example, an organic solvent) used for manufacturing the chemical liquid, dirt, dust, solids (formed of organic substances, inorganic substances, and/or metals) incorporated as contaminants into the chemical liquid while the chemical liquid is being prepared, and the like. However, the present invention is not limited to these.

The coarse particles also include a colloidized impurity containing metal atoms. The metal atoms are not particularly limited. However, in a case where the content of at least one kind of metal atom selected from the group consisting of Na, K, Ca, Fe, Cu, Mg, Mn, Li, Al, Cr, Ni, Zn, and Pb (preferably Fe, Cr, Ni, and Pb) is particularly small (for example, in a case where the content of each of the aforementioned metal atoms in the organic solvent is equal to or smaller than 1,000 mass ppt), the impurity containing these metal atoms is easily colloidized.

Chemical Liquid (Second Embodiment)

The chemical liquid according to a second embodiment of the present invention is a chemical liquid containing a main agent formed of a mixture of two or more kinds of organic solvents, an impurity metal, and a surfactant, in which a vapor pressure of the main agent is 60 to 1,340 Pa at 25° C., the impurity metal contains particles containing one kind of metal selected from the group consisting of Fe, Cr, Ni, and Pb, in a case where the chemical liquid contains one kind of the particles, a content of the particles in the chemical liquid is 0.001 to 30 mass ppt with respect to the total mass of the chemical liquid, and in a case where the chemical liquid contains two or more kinds of the particles, a content of each kind of the particles in the chemical liquid is 0.001 to 30 mass ppt with respect to the total mass of the chemical liquid.

Hereinafter, the components contained in the chemical liquid and the physical properties of the chemical liquid will be described.

[Main Agent]

The chemical liquid contains a main agent formed of a mixture of two or more kinds of organic solvents.

The content of the main agent in the chemical liquid is not particularly limited, but is preferably 97.0% to 99.0% by mass with respect to the total mass of the chemical liquid in general.

The vapor pressure of the main agent is 60 to 1,340 Pa at 25° C.

The vapor pressure of the main agent according to the present embodiment means a vapor pressure of a mixture of organic solvents at 25° C. The vapor pressure of the mixture of organic solvents at 25° C. is calculated by the following method.

First, by using the chemical liquid as a sample, the type and content of each of the organic solvents contained in the chemical liquid are measured using gas chromatography mass spectrometry. In the present specification, an organic solvent means an organic compound whose content in the chemical liquid is greater than 10,000 mass ppm with respect to the total mass of the chemical liquid.

The measurement conditions for the gas chromatography mass spectrometry are as described in Examples.

The mixture is constituted with the organic solvents detected by the aforementioned method. Based on the vapor pressure at 25° C. of each of the organic solvents contained in the mixture and the molar fraction of each of the organic solvents in the mixture, the vapor pressure of the mixture is calculated by the following equation. In the present specification, a sign "Σ" means sum.

(Vapor pressure of mixture)=Σ((vapor pressure of each of organic solvents at 25° C.)×(molar fraction of each of organic solvents in mixture))   Equation:

The type of the aforementioned organic solvents is not particularly limited, and examples thereof include known organic solvents.

Examples of the organic solvents include alkylene glycol monoalkyl ether carboxylate, alkylene glycol monoalkyl ether, a lactic acid alkyl ester, alkoxyalkyl propionate, cyclic lactone (preferably having 4 to 10 carbon atoms), a monoketone compound which may have a ring (preferably having 4 to 10 carbon atoms), alkylene carbonate, alkoxyalkyl acetate, alkyl pyruvate, and the like.

Furthermore, as the organic solvents, those described in JP2016-057614A, JP2014-219664A, JP2016-138219A, and JP2015-135379A may also be used.

It is preferable that the organic solvents are selected from the group consisting of propylene glycol monomethyl ether (PGME), cyclopentanone (CyPn), butyl acetate (nBA), propylene glycol monomethyl ether acetate (PGMEA), cyclohexanone (CyHx), ethyl lactate (EL), 2-hydroxymethyl isobutyrate (HBM), cyclopentanone dimethyl acetal (DBCPN), γ-butyrolactone (GBL), dimethyl sulfoxide (DMSO), ethylene carbonate (EC), propylene carbonate (PC), 1-methyl-2-pyrrolidone (NMP), isoamyl acetate (iAA), 4-methyl-2-pentanol (MIBC), diethylene glycol monomethyl ether (DEGME), dimethyl ether (DME), diethyl ether (DEE), diethylene glycol monoisobutyl ether (DEGIBE), diglyme (DEGDME), diethylene glycol diethyl ether (DEGDEE), triethylene glycol dimethyl ether (TriEGDME), tetraethylene glycol dimethyl ether (TetraEGDME), triethylene glycol butyl methyl ether (TEGMBE), diethylene glycol monobutyl ether (DEGMBE), anisole, 1,4-dimethoxybenzene (14-DMB), 1,2-dimethoxybenzene (12-DMB), 1,3-dimethoxybenzene (13-DMB), 1,4-diphenoxybenzene, 4-methoxytoluene, phenetole, and 3-methoxymethyl propionate (MMP). In a case where the mixture of organic solvents contains the above organic solvents, the chemical liquid exhibits further improved affinity with a resist composition.

The combination of organic solvents contained in the mixture is not particularly limited as long as the vapor pressure is within a predetermined range. Specifically, the following combination may be adopted, for example.

Examples of the mixture of organic solvents include (PGME/PGMEA), (PGME/CyHx), (PGME/EL), (PGME/HBM), (PGME/DBCPN), (PGME/GBL), (PGME/DMSO), (PGME/EC), (PGME/PC), (PGME/NMP), (CyPn/PGMEA), (CyPn/CyHx), (CyPn/EL), (CyPn/HBM), (CyPn/DBCPN), (CyPn/GBL), (CyPn/DMSO), (CyPn/EC), (CyPn/PC), (CyPn/NMP), (nBA/PGMEA), (nBA/CyHx), (nBA/EL), (nBA/HBM), (nBA/DBCPN), (nBA/GBL), (nBA/DMSO), (nBA/EC), (nBA/PC), (nBA/NMP), (PGMEA/GBL), (PGMEA/DMSO), (PGMEA/EC), (PGMEA/PC), (PGMEA/NMP), (CyHx/GBL), (CyHx/DMSO), (CyHx/EC), (CyHx/PC), (CyHx/NMP), (EL/GBL), (EL/DMSO), (EL/EC), (EL/PC), (EL/NMP), (HBM/GBL), (HBM/DMSO), (HBM/PC), (HBM/PC), (HBM/NMP), (DBCPN/GBL), (DBCPN/DMSO), (DBCPN/EC), (DBCPN/PC), (DBCPN/NMP), (PGME/PGMEA/GBL), (PGME/PGMEA/DMSO), (PGME/PGMEA/EC), (PGME/PGMEA/PC), (PGME/PGMEA/NMP), (PGME/CyHx/GBL), (PGME/CyHx/DMSO), (PGME/CyHx/EC), (PGME/CyHx/PC), (PGME/CyHx/NMP), (PGME/EL/GBL), (PGME/EL/DMSO), (PGME/EL/EC), (PGME/EL/PC), (PGME/EL/NMP), (PGME/HBM/GBL), (PGME/HBM/DMSO), (PGME/HBM/EC), (PGME/HBM/PC), (PGME/HBM/NMP), (PGME/DBCPN/GBL), (PGME/DBCPN/DMSO), (PGME/DBCPN/EC), (PGME/DBCPN/PC), (PGME/DBCPN/NMP), (CyPn/PGMEA/GBL), (CyPn/PGMEA/DMSO), (CyPn/PGMEA/EC), (CyPn/PGMEA/PC), (CyPn/PGMEA/NMP), (CyPn/CyHx/GBL), (CyPn/CyHx/DMSO), (CyPn/CyHx/EC), (CyPn/CyHx/PC), (CyPn/CyHx/NMP), (CyPn/EL/GBL), (CyPn/EL/DMSO), (CyPn/EL/EC), (CyPn/EL/PC), (CyPn/EL/NMP), (CyPn/HBM/GBL), (CyPn/HBM/DMSO), (CyPn/HBM/PC), (CyPn/HBM/PC), (CyPn/HBM/NMP), (CyPn/DBCPN/GBL), (CyPn/DBCPN/DMSO), (CyPn/DBCPN/EC), (CyPn/DBCPN/PC), (CyPn/DBCPN/NMP), (nBA/PGMEA/GBL), (nBA/PGMEA/DMSO), (nBA/PGMEA/EC), (nBA/PGMEA/PC), (nBA/PGMEA/NMP), (nBA/CyHx/GBL), (nBA/CyHx/DMSO), (nBA/CyHx/EC), (nBA/CyHx/PC), (nBA/CyHx/NMP), (nBA/EL/GBL), (nBA/EL/DMSO), (nBA/EL/PC), (nBA/EL/PC), (nBA/EL/NMP), (nBA/HBM/GBL), (nBA/HBM/DMSO), (nBA/HBM/EC), (nBA/HBM/EC), (nBA/HBM/NMP), (nBA/DBCPN/GBL), (nBA/DBCPN/DMSO), (nBA/DBCPN/EC), (nBA/DBCPN/PC), (nBA/DBCPN/NMP), (CyHx/IPA), (nBA/dodecane), (nBA/i AA), (nBA/MIBC), (PGME/DEGME), (PGME/DME), (PGME/DEE), (PGME/DEGIBE), (PGME/DEGDME), (PGME/DEGDEE), (PGME/TriEGDME), (PGME/TetraEGDME), (PGME/TEGMBE), (PGME/DEGMBE), (PGME/Anisole), (PGME/14-DMB), (PGME/12-DMB), (PGME/13-DMB), (PGME/14-Diphenoxybenzene), (PGME/4-Methoxytoluene), (PGME/Phenetole), (CyPn/DEGME), (CyPn/DME), (CyPn/DEE), (CyPn/DEGIBE), (CyPn/DEGDME), (CyPn/DEGDEE), (CyPn/TriEGDME), (CyPn/TetraEGDME), (CyPn/TEGMBE), (CyPn/DEGMBE), (CyPn/Anisole), (CyPn/14-DMB), (CyPn/12-DMB), (CyPn/13-DMB), (CyPn/14-Diphenoxybenzene), (CyPn/4-Methoxytoluene), (CyPn/Phenetole), (nBA/DEGME), (nBA/DME), (nBA/DEE), (nBA/DEGIBE), (nBA/DEGDME), (nBA/DEGDEE), (nBA/TriEGDME), (nBA/TetraEGDME), (nBA/TEGMBE), (nBA/DEGMBE), (nBA/Anisole), (nBA/14-DMB), (nBA/12-DMB), (nBA/13-DMB), (nBA/14-Diphenoxybenzene), (nBA/4-Methoxytoluene), (nBA/Phenetole), (DEGME/PGMEA), (DME/PGMEA), (DEE/PGMEA), (DEGIBE/PGMEA), (DEGDME/PGMEA), (DEGDEE/PGMEA), (TriEGDME/PGMEA), (TetraEGDME/PGMEA), (TEGMBE/PGMEA), (DEGMBE/PGMEA), (Anisole/PGMEA), (14-DMB/PGMEA), (12-DMB/PGMEA), (13-DMB/PGMEA), (14-Diphenoxybenzene/PGMEA), (4-Methoxytoluene/PGMEA), (Phenetole/PGMEA), (DEGME/CyHx), (DME/CyHx), (DEE/CyHx), (DEGIBE/CyHx), (DEGDME/CyHx), (DEGDEE/CyHx), (TriEGDME/CyHx), (TetraEGDME/CyHx), (TEGMBE/CyHx), (DEGMBE/CyHx), (Anisole/CyHx), (14-DMB/CyHx), (12-DMB/CyHx), (13-DMB/CyHx), (14-Diphenoxybenzene/CyHx), (4-Methoxytoluene/CyHx), (Phenetole/CyHx), (DEGME/EL), (DME/EL), (DEE/EL), (DEGIBE/EL), (DEGDME/EL), (DEGDEE/EL), (TriEGDME/EL), (TetraEGDME/EL), (TEGMBE/EL), (DEGMBE/EL), (Anisole/EL), (14-DMB/EL), (12-DMB/EL), (13-DMB/EL), (14-Diphenoxybenzene/EL), (4-Methoxytoluene/EL), (Phenetole/EL), (DEGME/HBM), (DME/HBM), (DEE/HBM), (DEGIBE/HBM), (DEGDME/HBM), (DEGDEE/HBM), (TriEGDME/HBM), (TetraEGDME/HBM), (TEGMBE/HBM), (DEGMBE/HBM), (Anisole/HBM), (14-DMB/HBM), (12-DMB/HBM), (13-DMB/HBM), (14-Diphenoxybenzene/HBM), (4-Methoxytoluene/HBM), (Phenetole/HBM), (DEGME/DBCPN), (DME/DBCPN), (DEE/DBCPN), (DEGIBE/DBCPN), (DEGDME/DBCPN), (DEGDEE/DBCPN), (TriEGDME/DBCPN), (TetraEGDME/DBCPN), (TEGMBE/DBCPN), (DEGMBE/DBCPN), (Anisole/DBCPN), (14-DMB/DBCPN), (12-DMB/DBCPN), (13-DMB/DBCPN), (14-Diphenoxybenzene/DBCPN), (4-Methoxytoluene/DBCPN), (Phenetole/DBCPN), (DEGME/PGMEA/GBL), (DME/PGMEA/GBL), (DEE/PGMEA/GBL), (DEGIBE/PGMEA/GBL), (DEGDME/PGMEA/GBL), (DEGDEE/PGMEA/GBL), (TriEGDME/PGMEA/GBL), (TetraEGDME/PGMEA/GBL), (TEGMBE/PGMEA/GBL), (DEGMBE/PGMEA/GBL), (Anisole/PGMEA/GBL), (14-DMB/PGMEA/GBL), (12-DMB/PGMEA/GBL), (13-DMB/PGMEA/GBL), (14-Diphenoxybenzene/PGMEA/GBL), (4-Methoxytoluene/PGMEA/GBL), (Phenetole/PGMEA/GBL), (DEGME/PGMEA/DMSO), (DME/PGMEA/DMSO), (DEE/PGMEA/DMSO), (DEGIBE/PGMEA/DMSO), (DEGDME/PGMEA/DMSO), (DEGDEE/PGMEA/DMSO), (TriEGDME/PGMEA/DMSO), (TetraEGDME/PGMEA/DMSO), (TEGMBE/PGMEA/DMSO), (DEGMBE/PGMEA/DMSO), (Anisole/PGMEA/DMSO), (14-DMB/PGMEA/DMSO), (12-DMB/PGMEA/DMSO), (13-DMB/PGMEA/DMSO), (14-

Diphenoxybenzene/PGMEA/DMSO), (4-Methoxytoluene/ PGMEA/DMSO), (Phenetole/PGMEA/DMSO), (DEGIBE/ PGMEA/EC), (DEGDME/PGMEA/EC), (DEGDEE/ PGMEA/EC), (TriEGDME/PGMEA/EC), (TetraEGDME/ PGMEA/EC), (TEGMBE/PGMEA/EC), (DEGMBE/ PGMEA/EC), (Anisole/PGMEA/EC), (14-DMB/PGMEA/ EC), (12-DMB/PGMEA/EC), (13-DMB/PGMEA/EC), (14- Diphenoxybenzene/PGMEA/EC), (4-Methoxytoluene/ PGMEA/EC), (Phenetole/PGMEA/EC), (DEGME/ PGMEA/PC), (DME/PGMEA/PC), (DEE/PGMEA/PC), (DEGIBE/PGMEA/PC), (DEGDME/PGMEA/PC), (DE-GDEE/PGMEA/PC), (TriEGDME/PGMEA/PC), (Tetra-EGDME/PGMEA/PC), (TEGMBE/PGMEA/PC), (DE-GMBE/PGMEA/PC), (Anisole/PGMEA/PC), (14-DMB/ PGMEA/PC), (12-DMB/PGMEA/PC), (13-DMB/PGMEA/ PC), (14-Diphenoxybenzene/PGMEA/PC), (4-Methoxytoluene/PGMEA/PC), (Phenetole/PGMEA/PC), (DEGME/PGMEA/NMP), (DME/PGMEA/NMP), (DEE/ PGMEA/NMP), (DEGIBE/PGMEA/NMP), (DEGDME/ PGMEA/NMP), (DEGDEE/PGMEA/NMP), (TriEGDME/ PGMEA/NMP), (TetraEGDME/PGMEA/NMP), (TEGMBE/PGMEA/NMP), (DEGMBE/PGMEA/NMP), (Anisole/PGMEA/NMP), (14-DMB/PGMEA/NMP), (12-DMB/PGMEA/NMP), (13-DMB/PGMEA/NMP), (14-Di-phenoxybenzene/PGMEA/NMP), (4-Methoxytoluene/PG-MEA/NMP), (Phenetole/PGMEA/NMP), (DEGME/ Anisole/nBA), (DME/Anisole/nBA), (DEE/Anisole/nBA), (DEGIBE/Anisole/nBA), (DEGDME/Anisole/nBA), (DE-GDEE/Anisole/nBA), (TriEGDME/Anisole/nBA), (Tetra-EGDME/Anisole/nBA), (TEGMBE/Anisole/nBA), (DE-GMBE/Anisole/nBA), (DEGME/14-DMB/nBA), (DME/ 14-DMB/nBA), (DEE/14-DMB/nBA), (DEGIBE/14-DMB/ nBA), (DEGDME/14-DMB/nBA), (DEGDEE/14-DMB/ nBA), (TriEGDME/14-DMB/nBA), (TetraEGDME/14-DMB/nBA), (TEGMBE/14-DMB/nBA), (DEGMBE/14-DMB/nBA), (DEGME/12-DMB/nBA), (DME/12-DMB/ nBA), (DEE/12-DMB/nBA), (DEGIBE/12-DMB/nBA), (DEGDME/12-DMB/nBA), (DEGDEE/12-DMB/nBA), (TriEGDME/12-DMB/nBA), (TetraEGDME/12-DMB/ nBA), (TEGMBE/12-DMB/nBA), (DEGMBE/12-DMB/ nBA), (DEGME/13-DMB/nBA), (DME/13-DMB/nBA), (DEE/13-DMB/nBA), (DEGIBE/13-DMB/nBA), (DE-GDME/13-DMB/nBA), (DEGDEE/13-DMB/nBA), (Tr-iEGDME/13-DMB/nBA), (TetraEGDME/13-DMB/nBA), (TEGMBE/13-DMB/nBA), (DEGMBE/13-DMB/nBA), (DEGME/14-Diphenoxybenzene/nBA), (DME/14-Diphe-noxybenzene/nBA), (DEE/14-Diphenoxybenzene/nBA), (DEGIBE/14-Diphenoxybenzene/nBA), (DEGDME/14-Di-phenoxybenzene/nBA), (DEGDEE/14-Diphenoxybenzene/ nBA), (TriEGDME/14-Diphenoxybenzene/nBA), (Tetra-EGDME/14-Diphenoxybenzene/nBA), (TEGMBE/14-Diphenoxybenzene/nBA), (DEGMBE/14-Diphenoxybenzene/nBA), (DEGME/4-Methoxytoluene/ nBA), (DME/4-Methoxytoluene/nBA), (DEE/4-Methoxytoluene/nBA), (DEGIBE/4-Methoxytoluene/nBA), (DEGDME/4-Methoxytoluene/nBA), (DEGDEE/4-Methoxytoluene/nBA), (TriEGDME/4-Methoxytoluene/ nBA), (TetraEGDME/4-Methoxytoluene/nBA), (TEGMBE/ 4-Methoxytoluene/nBA), (DEGMBE/4-Methoxytoluene/ nBA), (DEGME/Phenetole/nBA), (DME/Phenetole/nBA), (DEE/Phenetole/nBA), (DEGIBE/Phenetole/nBA), (DE-GDME/Phenetole/nBA), (DEGDEE/Phenetole/nBA), (Tr-iEGDME/Phenetole/nBA), (TetraEGDME/Phenetole/nBA), (TEGMBE/Phenetole/nBA), (DEGMBE/Phenetole/nBA), (MMP/PGME), (MMP/nBA), (MMP/PGMEA), (MMP/ EL), (MMP/GBL), (MMP/DMSO), (MMP/PC), and the like. However, the present invention is not limited to these.

In the above list, what is written in each bracket represents the composition of a mixture, and the items separated by "I" represent the type of the organic solvent contained in the mixture.

[Impurity Metal]

The chemical liquid according to the present embodiment contains an impurity metal. Particularly, the chemical liquid contains particles containing one kind of metal selected from the group consisting of Fe, Cr, Ni, and Pb.

The definition, the aspect, and the like of the impurity metal are as described above regarding the impurity metal contained in the chemical liquid according to the first embodiment, the content of the impurity metal, and the like.

[Surfactant]

The chemical liquid according to the present embodiment contains a surfactant.

The definition, the aspect, and the like of the surfactant are as described above regarding the surfactant contained in the chemical liquid according to the first embodiment, the content of the surfactant, and the like.

[Optional Components]

As long as the effects of the present invention are exhibited, the chemical liquid according to the present embodiment may contain optional components other than the above components. Examples of the optional components include an organic impurity, water, and the like. The definition, aspect, and the like of the organic impurity, water, and the like are as described above regarding the organic impurity and water contained in the chemical liquid according to the first embodiment, the content of the organic impurity and water, and the like.

[Physical Properties of Chemical Liquid or the Like]

In view of obtaining further improved effects of the present invention, it is preferable that the chemical liquid or the like according to the present embodiment satisfies physical properties relating to each of the following items.

<Surface Tension>

The surface tension at 25° C. of the main agent contained in the chemical liquid according to the present embodiment is not particularly limited. Generally, the surface tension is preferably 25 to 44 mN/m. In view of making the chemical liquid have further improved effects of the present invention, the surface tension is more preferably 28 to 40 mN/m.

In a case where the main agent has a surface tension of 28 to 40 mN/m at 25° C., the chemical liquid has a further improved resist saving performance (particularly, film thickness controllability).

The surface tension at 25° C. of the main agent according to the present embodiment means a surface tension of the mixture of organic solvents constituting the main agent that is calculated by the following method.

First, by using the chemical liquid as a sample, the type and content of each of the organic solvents contained in the chemical liquid are measured using gas chromatography mass spectrometry.

The measurement conditions for the gas chromatography mass spectrometry are as described in Examples.

The mixture of organic solvents is formed of organic solvents detected by the aforementioned method. Based on the surface tension at 25° C. of each of the organic solvents contained in the mixture and a molar fraction of each of the organic solvents in the mixture, the surface tension of the mixture is calculated by the following equation. The surface tension at 25° C. of the mixture of organic solvents calculated as above is adopted as a surface tension of the main agent at 25° C.

(Surface tension of mixture)=Σ((surface tension of each of organic solvents at 25° C.)×(molar fraction of each of organic solvents in mixture))   Equation: 5

<Contribution Rate of Hansen Solubility Parameters>

The main agent contained in the chemical liquid according to the present embodiment is formed of the mixture of organic solvents. It is preferable that all of the organic solvents constituting the mixture of organic solvents are in an area surrounded by the following 4 points in a ternary diagram with apexes each showing a contribution rate of a dispersion element in Hansen solubility parameters of the organic solvents described above, a contribution rate of a dipole-dipole force element in Hansen solubility parameters of the organic solvents described above, and a contribution rate of a hydrogen bond element in Hansen solubility parameters of the organic solvents described above. The chemical liquid containing the mixture of organic solvents having the characteristics as a main agent exhibits further improved affinity with a resist composition.

First point: a contribution rate of a dispersion element=40%, a contribution rate of a dipole-dipole force element=60%, and a contribution rate of a hydrogen bond element=0%

Second point: a contribution rate of a dispersion element=40%, a contribution rate of a dipole-dipole force element=0%, and a contribution rate of a hydrogen bond element=60%

Third point: a contribution rate of a dispersion element=80%, a contribution rate of a dipole-dipole force element=0%, and a contribution rate of a hydrogen bond element=20%

Fourth point: a contribution rate of a dispersion element=80%, a contribution rate of a dipole-dipole force element=20%, and a contribution rate of a hydrogen bond element=0%

The definition of Hansen solubility parameters, how to calculate Hansen solubility parameters, specific examples of organic solvents in the above range, and the like are as described above regarding the physical properties of the chemical liquid or the like according to the first embodiment.

<Number of Coarse Particles>

In view of making the chemical liquid have further improved effects of the present invention, in the chemical liquid, the number of objects to be counted (number of coarse particles) having a size equal to or greater than 100 nm (0.1 μm) that are counted by a light scattering-type liquid-borne particle counter is preferably 1 to 100/mL. The definition of the number of coarse particles, how to measure the number of coarse particles, and the aspect thereof are as described above regarding the physical properties of the chemical liquid or the like according to the first embodiment.

[Manufacturing Method of Chemical Liquid]

As the manufacturing method of the chemical liquid according to the embodiment of the present invention, known manufacturing methods can be used without particular limitation. Particularly, in view of more simply obtaining the chemical liquid, a manufacturing method of a chemical liquid having the following steps performed in the following order is preferable. Hereinafter, each of the steps will be specifically described.

(1) Step of preparing main agent or the like for preparing main agent or organic solvent (2) Purification step of purifying main agent or organic solvent In a case where an organic solvent is prepared in the step of preparing a main agent or the like, the manufacturing method may further have the following step.

(3) Mixing step of mixing together two or more kinds of organic solvents so as to obtain mixture The manufacturing method of the chemical liquid may have the above steps in the aforementioned order or have the purification step after the mixing step. In the manufacturing method of the chemical liquid, each of the above steps may be performed once or performed plural times. In this case, each of the steps (1) to (3) performed plural times may be consecutively or intermittently carried out. For example, the manufacturing method of the chemical liquid, in which each of the steps (1) to (3) performed plural times is intermittently carried out, may adopt an aspect in which other steps are performed between the steps (1) to (3) performed plural times. Examples thereof include a manufacturing method of a chemical liquid in which the steps (1), (2), (3), (2) are performed in this order.

<(1) Step of Preparing Main Agent or the Like>

The step of preparing a main agent or the like is a step of preparing a main agent or an organic solvent (the organic solvent may be a mixture of organic solvents, hereinafter, referred to as "main agent or the like" as well). The method for preparing the main agent or the like is not particularly limited, and examples thereof include methods such as preparing an organic solvent as a main agent, organic solvents to be incorporated into the mixture of organic solvents, a mixture of organic solvents, or the like by means of purchase or the like, and obtaining an organic solvent by means of reacting raw materials.

As main agent or the like, it is preferable to prepare a substance in which the content of the aforementioned impurity metals and/or the aforementioned organic impurity is small (for example, a substance in which the content of organic solvents is equal to or greater than 99% by mass). Examples of commercial products of such organic solvents include those called "high-purity grade products".

As the method for obtaining organic solvents by reacting raw materials, known methods can be used without particular limitation. Examples thereof include a method for obtaining organic solvents by reacting a single raw material or a plurality of raw materials in the presence of a catalyst.

More specifically, examples of the method include a method for obtaining butyl acetate by reacting acetic acid and n-butanol in the presence of sulfuric acid; a method for obtaining propylene glycol 1-monomethyl ether 2-acetate (PGMEA) by reacting propylene oxide, methanol, and acetic acid in the presence of sulfuric acid; a method for obtaining ethyl lactate by reacting lactic acid and ethanol; and the like.

<(2) Purification Step of Purifying Main Agent or Organic Solvent>

The purification step is a step of purifying the obtained main agent and the like by the step (1). According to the manufacturing method of the chemical liquid having the purification step, it is easy to obtain a chemical liquid having desired physical properties.

As the purification method of the main agent and the like, known methods can be used without particular limitation. It is preferable that the purification method of the main agent and the like includes at least one kind of step selected from the group consisting of the steps described below. Hereinafter, each of the steps will be specifically described.

In the purification step, each of the following steps may be performed once or plural times. Furthermore, the order of the following steps is not particularly limited.

Distillation step

Component adjustment step (Distillation Step)

It is preferable that (2) purification step includes a distillation step. The distillation step means a step of distilling the main agent and the like so as to obtain a main agent and the like having undergone distillation (hereinafter, referred to as "purified substance" as well). As the distillation method, known methods can be used without particular limitation.

Particularly, in view of more simply obtaining a purified substance and making it more difficult for impurities to be unintentionally mixed into the purified substance in the distillation step, it is preferable to obtain the purified substance by using the following purification device.

Purification Device

As an aspect of the purification device which can be used in the distillation step, for example, a purification device can be exemplified which has a distillation column for obtaining a purified substance, in which at least a portion of a liquid contact portion (for example, an interior wall, a pipe line, or the like) of the distillation column is formed of at least one kind of material (hereinafter, referred to as "corrosion-resistance material" as well) selected from the group consisting of a nonmetallic material and an electropolished metallic material.

The proportion of the area of the liquid contact portion of the purification device that is formed of the corrosion-resistance material is preferably equal to or higher than 50%, more preferably equal to or higher than 70%, and even more preferably equal to or higher than 90%. It is preferable that substantially the entirety of the liquid contact portion is formed of the corrosion-resistance material.

Examples of the aspect in which the liquid contact portion of the purification device is formed of the corrosion-resistance material include a case where the purification device is formed of the corrosion-resistance material, a case where the purification device has a base material and a coating layer which is formed of the corrosion-resistance material and disposed on the base material so as to cover at least a portion of the surface of the base material, and the like.

As the nonmetallic material, known materials can be used without particular limitation.

Examples of the nonmetallic material include at least one kind of material selected from the group consisting of a polyethylene resin, a polypropylene resin, a polyethylene-polypropylene resin, polytetrafluoroethylene, a polytetrafluoroethylene-perfluoroalkyl vinyl ether copolymer, a polytetrafluoroethylene-hexafluoropropylene copolymer resin, a polytetrafluoroethylene-ethylene copolymer resin, a chlorotrifluoro ethylene-ethylene copolymer resin, a vinylidene fluoride resin, a chlorotrifluoroethylene copolymer resin, and a vinyl fluoride resin. However, the present invention is not limited to these.

As the metallic material, known materials can be used without particular limitation.

Examples of the metallic material include a metallic material in which the total content of chromium and nickel with respect to the total mass of the metallic material is greater than 25% by mass. The total content of chromium and nickel is more preferably equal to or greater than 30% by mass. The upper limit of the total content of chromium and nickel in the metallic material is not particularly limited, but is preferably equal to or smaller than 90% by mass in general.

Examples of the metallic material include stainless steel, a nickel-chromium alloy, and the like.

As the stainless steel, known stainless steel can be used without particular limitation. Among these, an alloy with a nickel content equal to or higher than 8% by mass is preferable, and austenite-based stainless steel with a nickel content equal to or higher than 8% by mass is more preferable. Examples of the austenite-based stainless steel include Steel Use Stainless (SUS) 304 (Ni content: 8% by mass, Cr content: 18% by mass), SUS304L (Ni content: 9% by mass, Cr content: 18% by mass), SUS316 (Ni content: 10% by mass, Cr content: 16% by mass), SUS316L (Ni content: 12% by mass, Cr content: 16% by mass), and the like.

As the nickel-chromium alloy, known nickel-chromium alloys can be used without particular limitation. Among these, a nickel-chromium alloy is preferable in which the nickel content is 40% to 75% by mass and the chromium content is 1% to 30% by mass.

Examples of the nickel-chromium alloy include HASTELLOY (trade name, the same is true for the following description), MONEL (trade name, the same is true for the following description), INCONEL (trade name, the same is true for the following description), and the like. More specifically, examples thereof include HASTELLOY C-276 (Ni content: 63% by mass, Cr content: 16% by mass), HASTELLOY C(Ni content: 60% by mass, Cr content: 17% by mass), HASTELLOY C-22 (Ni content: 61% by mass, Cr content: 22% by mass), and the like.

Furthermore, if necessary, the nickel-chromium alloy may further contain boron, silicon, tungsten, molybdenum, copper, cobalt, and the like in addition to the aforementioned alloy.

As the method for electropolishing the metallic material, known methods can be used without particular limitation. For example, it is possible to use the methods described in paragraphs "0011" to "0014" in JP2015-227501A, paragraphs "0036" to "0042" in JP2008-264929A, and the like.

Presumably, in a case where the metallic material is electropolished, the chromium content in a passive layer on the surface thereof may become higher than the chromium content in the parent phase. Presumably, for this reason, from the distillation column in which the liquid contact portion is formed of an electropolished metallic material, the metal impurity containing metal atoms may not easily flow into the organic solvent, and hence a purified substance with a reduced impurity content can be obtained.

The metallic material may have undergone buffing. As the buffing method, known methods can be used without particular limitation. The size of abrasive grains used for finishing the buffing is not particularly limited, but is preferably equal to or smaller than #400 because such grains make it easy to further reduce the surface asperity of the metallic material. The buffing is preferably performed before the electropolishing.

Purification Device (Another Aspect)

As another aspect of the purification device which can be used in the distillation step, a purification device can be exemplified which comprises a reaction portion for obtaining a reactant (organic solvent) by reacting raw materials, the distillation column described above, and a transfer pipe line which connects the reaction portion and the distillation column to each other so as to transfer the reactant to the distillation column from the reaction portion.

The reaction portion has a function of obtaining a reactant, which is an organic solvent, by reacting the supplied raw materials (if necessary, in the presence of a catalyst). As the reaction portion, known reaction portions can be used without particular limitation.

Examples of the reaction portion include an aspect comprising a reactor to which raw materials are supplied and in which a reaction proceeds, a stirring portion provided in the interior of the reactor, a lid portion joined to the reactor, an injection portion for injecting the raw materials into the reactor, and a reactant outlet portion for taking the reactant out of the reactor. By continuously or non-continuously injecting the raw materials into the reaction portion and reacting the injected raw materials (in the presence of a catalyst), a reactant (organic solvent) can be obtained.

If desired, the reaction portion may also include a reactant isolation portion, a temperature adjustment portion, a sensor portion including a level gauge, a manometer, and a thermometer, and the like.

It is preferable that the liquid contact portion (for example, the interior wall of the liquid contact portion of the reactor, or the like) of the reaction portion is formed of at least one kind of material selected from the group consisting of a nonmetallic material and an electropolished metallic material. The aspect of each of the aforementioned materials is as described above.

The proportion of the area of the liquid contact portion of the reaction portion that is formed of the corrosion-resistance material is preferably equal to or higher than 50%, more preferably equal to or higher than 70%, and even more preferably equal to or higher than 90%. It is preferable that substantially the entirety of the liquid contact portion is formed of the corrosion-resistance material.

Examples of the aspect in which the liquid contact portion of the reaction portion is formed of the corrosion-resistance material include a case where the reaction portion is formed of the corrosion-resistance material, a case where the reaction portion has a base material and a coating layer which is formed of the corrosion-resistance material and disposed on the base material so as to cover at least a portion of the surface of the base material, and the like.

In a case where the purification device including the reaction portion is used, a purified substance with a further reduced impurity content can be obtained.

In the purification device according to the above aspect, the reaction portion and the distillation column are connected to each other through the transfer pipe line. Because the reaction portion and the distillation column are connected to each other through the transfer pipe line, the transfer of the reactant to the distillation column from the reaction portion is carried out in a closed system, and impurities including a metal impurity are inhibited from being mixed into the reactant from the environment. Accordingly, a purified substance with a further reduced impurity content can be obtained.

As the transfer pipe line, known transfer pipe lines can be used without particular limitation. As the transfer pipe line, an aspect comprising a pipe, a pump, a valve, and the like can be exemplified.

It is preferable that the liquid contact portion of the transfer pipe line is formed of at least one kind of material selected from the group consisting of a nonmetallic material and an electropolished metallic material. The aspect of each of the aforementioned materials is as described above.

In a case where the purification device comprising the transfer pipe line is used, it is possible to more simply obtain a purified substance with a further reduced impurity content.

(Component Adjustment Step)

It is preferable that (2) purification step described above includes a component adjustment step.

The component adjustment step is a step of adjusting the content of the impurity metal, the organic impurity, water, and the like contained in the reactant, the purified substance, the main agent, the organic solvents, and the mixture of two or more kinds of organic solvents (hereinafter, referred to as "substance to be purified").

As the method for adjusting the content of the impurity metal, the organic impurity, water, and the like contained in the substance to be purified, known methods can be used without particular limitation.

Examples of the method for adjusting the content of the impurity metal, the organic impurity, water, and the like contained in the substance to be purified include a method for adding an impurity metal, an organic impurity, water, and the like in a predetermined amount to the substance to be purified, a method for removing an impurity metal, an organic impurity, water, and the like from the substance to be purified, and the like.

As the method for removing an impurity metal, an organic impurity, and water, and the like from the substance to be purified, known methods can be used without particular limitation.

As the method for removing an impurity metal, an organic impurity, water, and the lie from the substance to be purified, for example, a method for filtering the substance to be purified through a filter (hereinafter, a step of performing the filtering will be referred to as "filtering step") is preferable. The method for passing the substance to be purified through a filter is not particularly limited, and examples thereof include a method for disposing a filter unit comprising a filter and a filter housing in the middle of a transfer pipe line transferring the substance to be purified and passing the substance to be purified through the filter unit with or without applying pressure thereto.

As the filter, known filters can be used without particular limitation.

Filtering Step

It is preferable that the component adjustment step includes a filtering step.

As the filter used in the filtering step, known filters can be used without particular limitation.

Examples of the material of the filter used in the filtering step include a fluororesin such as polytetrafluoroethylene (PTFE), a polyamide-based resin such as nylon, a polyolefin resin (including a polyolefin resin with high density and ultra-high molecular weight) such as polyethylene and polypropylene (PP), and the like. Among these, a polyamide-based resin, PTFE, and polypropylene (including high-density polypropylene) are preferable. In a case where filters formed of these materials are used, foreign substances with high polarity, which readily become the cause of a particle defect, can be effectively removed, and the content of the metal component (impurity metal) can be efficiently reduced.

The lower limit of the critical surface tension of the filter is preferably equal to or higher than 70 mN/m. The upper limit thereof is preferably equal to or lower than 95 mN/m. The critical surface tension of the filter is more preferably equal to or higher than 75 mN/m and equal to or lower than 85 mN/m.

The value of the critical surface tension is the nominal value from manufacturers. In a case where a filter having critical surface tension within the above range is used, foreign substances with high polarity, which readily become the cause of a particle defect, can be effectively removed, and the amount of the metal component (metal impurity) can be efficiently reduced.

The pore size of the filter is preferably about 0.001 to 1.0 µm, more preferably about 0.01 to 0.5 µm, and even more preferably about 0.01 to 0.1 µm. In a case where the pore size of the filter is within the above range, it is possible to inhibit the clogging of the filter and to reliably remove minute foreign substances contained in the substance to be purified.

At the time of using the filter, different filters may be combined. At this time, filtering carried out using a first filter may be performed once or performed two or more times. In a case where filtering is performed two or more times by using different filters in combination, the filters may be of the same type or different types, but it is preferable that the filters are of different types. Typically, it is preferable that at least one of the pore size or the constituent material varies between the first filter and the second filter.

It is preferable that the pore size for the second filtering and the next filtering is the same as or smaller than the pore size for the first filtering. Furthermore, first filters having different pore sizes within the above range may be combined. As the pore size mentioned herein, the nominal values form filter manufacturers can be referred to. A commercial filter can be selected from various filters provided from, for example, Pall Corporation Japan, Advantec Toyo Kaisha, Ltd., Nihon Entegris KK (former MICRONICS JAPAN CO., LTD.), KITZ MICRO FILTER CORPORATION, or the like. In addition, it is possible to use "P-NYLON FILTER (pore size: 0.02 µm, critical surface tension: 77 mN/m)" made of polyamide; (manufactured by Pall Corporation Japan), "PE.CLEAN FILTER (pore size: 0.02 µm)" made of high-density polyethylene; (manufactured by Pall Corporation Japan), and "PE.CLEAN FILTER (pore size: 0.01 µm)" made of high-density polyethylene; (manufactured by Pall Corporation Japan).

For example, from the viewpoint of allowing the chemical liquid to bring about desired effects and from the viewpoint of inhibiting the increase of the impurity metal (particularly, particles containing one kind of metal selected from the group consisting of Fe, Cr, Ni, and Pb) during the storage of the purified chemical liquid, provided that an interaction radius in the Hansen solubility parameter space (HSP) derived from the material of the filter used for filtering is R0, and that a radius of a sphere in the Hansen space derived from the mixture of two or more kinds of organic solvents contained in the substance to be purified is Ra, it is preferable that the substance to be purified and the material of the filter used for filtering are combined such that the substance to be purified and the filter have a relationship satisfying a relational expression of (Ra/R0) 1, and the substance to be purified is preferably filtered through a filter material satisfying the relational expression, although the combination of the substance to be purified and the filter is not particularly limited. (Ra/R0) is preferably equal to or smaller than 0.98, and more preferably equal to or smaller than 0.95. The lower limit of (Ra/R0) is preferably equal to or greater than 0.5, more preferably equal to or greater than 0.6, and even more preferably 0.7. In a case where (Ra/R0) is within the above range, the increase in the content of the impurity metal in the chemical liquid during long-term storage is inhibited, although the mechanism is unclear.

The combination of the filter and the substance to be purified is not particularly limited, and examples thereof include those described in US2016/0089622.

As a second filter, a filter formed of the same material as the aforementioned first filter can be used. Furthermore, a filter having the same pore size as the aforementioned first filter can be used. In a case where a filter having a pore size smaller than that of the first filter is used as the second filter, a ratio between the pore size of the second filter and the pore size of the first filter (pore size of second filter/pore size of first filter) is preferably 0.01 to 0.99, more preferably 0.1 to 0.9, and even more preferably 0.2 to 0.9. In a case where the pore size of the second filter is within the above range, fine foreign substances mixed into the substance to be purified are more reliably removed.

The filtering pressure affects the filtering accuracy. Therefore, it is preferable that the pulsation of pressure at the time of filtering is as low as possible.

In the manufacturing method of a chemical liquid, the filtering speed is not particularly limited. However, in view of obtaining a chemical liquid having further improved effects of the present invention, the filtering speed is preferably equal to or higher than 1.0 L/min/m$^2$, more preferably equal to or higher than 0.75 L/min/m$^2$, and even more preferably equal to or higher than 0.6 L/min/m$^2$.

For the filter, an endurable differential pressure for assuring the filter performance (assuring that the filter will not be broken) is set. In a case where the endurable differential pressure is high, by increasing the filtering pressure, the filtering speed can be increased. That is, it is preferable that the upper limit of the filtering speed is generally equal to or lower than 10.0 L/min/m$^2$ although the upper limit usually depends on the endurable differential pressure of the filter.

In the manufacturing method of a chemical liquid, in view of obtaining a chemical liquid having further improved effects of the present invention, the filtering pressure is preferably 0.001 to 1.0 MPa, more preferably 0.003 to 0.5 MPa, and even more preferably 0.005 to 0.3 MPa. Particularly, in a case where a filter having a small pore size is used, by increasing the filtering pressure, it is possible to efficiently reduce the amount of particle-like foreign substances or impurities dissolved in the substance to be purified. In a case where a filter having a pore size smaller than 20 nm is used, the filtering pressure is particularly preferably 0.005 to 0.3 MPa.

The smaller the pore size of the filtration filter, the lower the filtering speed. However, for example, in a case where a plurality of filtration filters of the same type are connected to each other in parallel, the filtering area is enlarged, and the filtering pressure is reduced. Therefore, in this way, the reduction in the filtering speed can be compensated.

It is more preferable that the filtering step includes the following steps. In the filtering step, each of the following steps may be performed once or plural times. Furthermore, the order of the following steps is not particularly limited.

1. Particle removing step
2. Metal ion removing step
3. Organic impurity removing step
4. Ion exchange step Hereinafter, each of the steps will be described.

Particle Removing Step

The particle removing step is a step of removing the coarse particles and/or the impurity metal (particularly, particles containing one kind of metal selected from the group consisting of Fe, Cr, Ni, and Pb) in the substance to be purified by using a particle removing filter. As the particle removing filter, known particle removing filters can be used without particular limitation.

Examples of the particle removing filter include a filter having a pore size equal to or smaller than 20 nm. In a case where the substance to be purified is filtered using the above filter, the coarse particles can be removed from the substance to be purified (the aspect of the coarse particles is as described above) by a filtering effect (sifting effect).

The pore size of the filter is preferably 1 to 15 nm, and more preferably 1 to 12 nm. In a case where the pore size of the filter is equal to or smaller than 15 nm, finer coarse particles can be removed. In a case where the pore size of the filter is equal to or greater than 1 nm, the filtering efficiency is improved.

The pore size of the filter affects the minimum size of particles that can be removed by the filter. For example, in a case where the pore size of the filter is 20 nm, particles having a diameter equal to or greater than 20 nm can be removed by sifting action (in a case where a filter cake is accumulated on the filter, particles smaller than the above can also be captured).

Examples of the material of the filter include nylon such as 6-nylon and 6,6-nylon, polyethylene, polypropylene, polystyrene, polyimide, polyamide imide, a fluororesin, and the like.

The polyimide and/or polyamide imide may contain at least one group selected from the group consisting of a carboxy group, a salt-type carboxy group, and a —NH— bond. A fluororesin and polyimide and/or polyamide imide have excellent solvent resistance. Furthermore, from the viewpoint of adsorbing metal ions, nylon such as 6-nylon and 6,6-nylon are particularly preferable.

A filter unit may be constituted with a plurality of filters described above. That is, the filter unit may further comprise a filter having a pore size equal to or greater than 50 nm (for example, a microfiltration membrane for removing fine particles having a pore size equal to or greater than 50 nm). In a case where fine particles are present in the substance to be purified in addition to the colloidized impurity, particularly, the colloidized impurity containing metal atoms such as iron or aluminum, by filtering the substance to be purified by using a filter having a pore size equal to or greater than 50 nm (for example, a microfiltration membrane for removing fine particles having a pore size equal to or greater than 50 nm) before filtering the substance to be purified by using a filter having a pore size equal to or smaller than 20 nm (for example, a microfiltration membrane having a pore size equal to or smaller than 20 nm), the filtering efficiency of the filter having a pore size equal to or smaller than 20 nm (for example, a microfiltration membrane having a pore size equal to or smaller than 20 nm) is improved, and the coarse particle removing performance is further improved.

Metal Ion Removing Step

It is preferable that the filtering step further includes a metal ion removing step.

As the metal ion removing step, a step of passing the substance to be purified through a metal ion adsorption filter is preferable. The method for passing the substance to be purified through the metal ion adsorption filter is not particularly limited, and examples thereof include a method for disposing a metal ion adsorption filter unit comprising a metal ion adsorption filter and a filter housing in the middle of a transfer pipe line transferring the substance to be purified and passing the substance to be purified through the metal ion adsorption filter unit with or without applying pressure thereto.

The metal ion adsorption filter is not particularly limited, and examples thereof include known metal ion adsorption filters.

The metal ion adsorption filter is preferably a filter which can perform ion exchange. Herein, the metal ions to be adsorbed are not particularly limited. However, a metal ion containing one kind of element selected from the group consisting of Fe, Cr, Ni, and Pb is preferable, and metal ions containing Fe, Cr, Ni, and Pb are preferable, because these readily become the cause of a defect in a semiconductor device.

From the viewpoint of improving the metal ion adsorption performance, it is preferable that the metal ion adsorption filter has an acid group on the surface thereof. Examples of the acid group include a sulfo group, a carboxy group, and the like.

Examples of the base material (material) constituting the metal ion adsorption filter include cellulose, diatomite, nylon, polyethylene, polypropylene, polystyrene, a fluororesin, and the like. From the viewpoint of the metal ion adsorption efficiency, nylon is preferable.

The metal ion adsorption filter may be constituted with material including polyimide and/or polyamide imide. Examples of the metal ion adsorption filter include the polyimide and/or polyamide imide porous membrane described in JP2016-155121A.

The polyimide and/or polyamide imide porous membrane may contain at least one group selected from the group consisting of a carboxy group, a salt-type carboxy group, and a —NH— bond. In a case where the metal ion adsorption filter is formed of a fluororesin, polyimide, and/or polyamide imide, the filter has further improved solvent resistance.

Organic Impurity Removing Step

It is preferable that the filtering step includes an organic impurity removing step. As the organic impurity removing step, a step of passing the substance to be purified through an organic impurity adsorption filter is preferable. The method for passing the substance to be purified through the organic impurity adsorption filter is not particularly limited, and examples thereof include a method for disposing a filter unit comprising an organic impurity adsorption filter and a filter housing storing the organic impurity adsorption filter in the middle of a transfer pipe line transferring the substance to be purified and passing the organic solvent through the filter unit with or without applying pressure thereto.

The organic impurity adsorption filter is not particularly limited, and examples thereof include known organic impurity adsorption filters.

In view of improving the organic impurity adsorption performance, it is preferable that the organic impurity adsorption filter has the skeleton of an organic substance, which can interact with the organic impurity, on the surface thereof (in other words, it is preferable that the surface of the organic impurity adsorption filter is modified with the skeleton of an organic substance which can interact with the organic impurity). Examples of the skeleton of an organic substance which can interact with the organic impurity include a chemical structure which can react with the organic impurity so as to make the organic impurity trapped in the organic impurity adsorption filter. More specifically, in a case where the organic impurity contains long-chain n-alkyl alcohol (structural isomer in a case where long-chain 1-alkyl alcohol is used as an organic solvent), examples of the skeleton of an organic substance include an alkyl group. Furthermore, in a case where the organic impurity includes dibutylhydroxytoluene (BHT), examples of the skeleton of an organic substance include a phenyl group.

Examples of the base material (material) constituting the organic impurity adsorption filter include cellulose supporting active carbon, diatomite, nylon, polyethylene, polypropylene, polystyrene, a fluororesin, and the like.

Furthermore, as the organic impurity adsorption filter, it is possible to use the filters obtained by fixing active carbon to non-woven cloth that are described in JP2002-273123A and JP2013-150979A.

For the organic impurity adsorption filter, in addition to the chemical adsorption described above (adsorption using the organic impurity adsorption filter having the skeleton of an organic substance, which can interact with the organic impurity, on the surface thereof), a physical adsorption method can be used.

For example, in a case where the organic impurity contains BHT, the structure of BHT is larger than 10 angstroms (=1 nm). Accordingly, in a case where an organic impurity adsorption filter having a pore size of 1 nm is used, BHT cannot pass through the pore of the filter. That is, by being physically trapped by the filter, BHT is removed from the substance to be purified. In this way, for removing an organic impurity, not only a chemical interaction but also a physical removing method can be used. Here, in this case, a filter having a pore size equal to or greater than 3 nm is used as "particle removing filter", and a filter having a pore size less than 3 nm is used as "organic impurity adsorption filter".

Ion Exchange Step

The filtering step may further include an ion exchange step.

As the ion exchange step, a step of passing the substance to be purified through an ion exchange unit is preferable. The method for passing the substance to be purified through the ion exchange unit is not particularly limited, and examples thereof include a method for disposing an ion exchange unit in the middle of a transfer pipe line transferring the substance to be purified and passing the organic solvent through the ion exchange unit with or without applying pressure thereto.

As the ion exchange unit, known ion exchange units can be used without particular limitation. Examples of the ion exchange unit include an ion exchange unit including a tower-like container storing an ion exchange resin, an ion adsorption membrane, and the like.

Examples of an aspect of the ion exchange step include a step in which a cation exchange resin or an anion exchange resin provided as a single bed is used as an ion exchange resin, a step in which a cation exchange resin and an anion exchange resin provided as a dual bed are used as an ion exchange resin, and a step in which a cation exchange resin and an anion exchange resin provided as a mixed bed are used as an ion exchange resin.

In order to reduce the amount of moisture eluted from the ion exchange resin, as the ion exchange resin, it is preferable to use a dry resin which does not contain moisture as far as possible. As the dry resin, commercial products can be used, and examples thereof include 15JS-HG.DRY (trade name, dry cation exchange resin, moisture: equal to or smaller than 2%) and MSPS2-1.DRY (trade name, mixed bed resin, moisture: equal to or smaller than 10%) manufactured by ORGANO CORPORATION, and the like.

It is preferable that the ion exchange step is performed before the distillation step described above or before a moisture adjustment step which will be described later.

As another aspect of the ion exchange step, a step of using an ion adsorption membrane can be exemplified.

In a case where the ion adsorption membrane is used, a treatment can be performed at a high flow rate. The ion adsorption membrane is not particularly limited, and examples thereof include NEOSEPTA (trade name, manufactured by ASTOM Corporation), and the like.

It is preferable that the ion exchange step is performed after the distillation step described above. In a case where the ion exchange step is performed, it is possible to remove the impurities accumulated in the purification device in a case where the impurities leak or to remove substances eluted from a pipe made of stainless steel (SUS) or the like used as a transfer pipe line.

Moisture Adjustment Step

The moisture adjustment step is a step of adjusting the content of water contained in the substance to be purified. The method for adjusting the content of water is not particularly limited, and examples thereof include method for adding water to the substance to be purified and a method for removing water from the substance to be purified.

As the method for removing water, known dehydration methods can be used without particular limitation.

Examples of the method for removing water include a dehydration membrane, a water adsorbent insoluble in an organic solvent, an aeration purging device using dried inert gas, a heating device, a vacuum heating device, and the like.

In a case where the dehydration membrane is used, membrane dehydration by pervaporation (PV) or vapor permeation (VP) is performed. The dehydration membrane is constituted as a permeable membrane module, for example. As the dehydration membrane, it is possible to use a membrane formed of a polymeric material such as a polyimide-based material, a cellulose-based material, and a polyvinyl alcohol-based material or an inorganic material such as zeolite.

The water adsorbent is used by being added to the substance to be purified. Examples of the water adsorbent include zeolite, diphosphorus pentoxide, silica gel, calcium chloride, sodium sulfate, magnesium sulfate, anhydrous zinc chloride, fuming sulfuric acid, soda lime, and the like.

In a case where zeolite (particularly, MOLECULAR SIEVE (trade name) manufactured by Union Showa K. K.) is used in the dehydration treatment, olefins can also be removed.

The component adjustment step described above is preferably performed under a sealed condition in an inert gas atmosphere in which water is less likely to be mixed into the substance to be purified.

Furthermore, in order to inhibit the mixing of moisture as much as possible, each of the treatments is preferably performed in an inert gas atmosphere in which a dew-point temperature is equal to or lower than −70° C. This is because in the inert gas atmosphere at a temperature equal to or lower than −70° C., the concentration of moisture in a gas phase is equal to or lower than 2 mass ppm, and hence the likelihood that moisture will be mixed into the organic solvent is reduced.

The manufacturing method of a chemical liquid may include, in addition to the above steps, the adsorptive purification treatment step for metal components using silicon carbide described in WO2012/043496A.

It is preferable that the filtering step described above is performed before each of the above steps, although the present invention is not particularly limited to this aspect. In a case where the filtering step is performed as above, the obtained effects of the present invention become more apparent. The filtering step is referred to as pre-filtering in some cases.

It is preferable that in the device and members (filter and the like) relating to manufacturing, the liquid contact portion contacting the chemical liquid is washed before the manufacturing of the chemical liquid. As a liquid used for washing, an organic solvent with few impurities is preferable. For example, a high-grade liquid used for semiconductors, an organic solvent obtained by further purifying the high-grade liquid, the aforementioned chemical liquid, a liquid obtained by diluting the chemical liquid, and the like are preferable. It is preferable that the manufacturing of the chemical liquid is started after the liquid for washing or impurities, which may be incorporated into the chemical liquid to be manufactured, are washed until the amount thereof becomes equal to or smaller than a desired amount.

<(3) Mixing Step>

The mixing step is a step of mixing together two or more kinds of organic solvents so as to obtain a mixture. As the mixing method, known mixing methods can be used without particular limitation. In the mixing step, components other than the aforementioned organic solvents may also be mixed together. The order of mixing the components is not particularly limited. In the chemical liquid manufacturing process, (3) mixing step may be performed before or after (2) purification step.

<Other Steps>

As long as the effects of the present invention are exhibited, the manufacturing method of a chemical liquid may include other steps in addition to the organic solvent preparation step and the purification step. Those other steps are not particularly limited, and examples thereof include an electricity removing step.

(Electricity Removing Step)

The electricity removing step is a step of removing electricity from the substance to be purified such that the charge potential of the substance to be purified is reduced.

As the electricity removing method, known electricity removing methods can be used without particular limitation. Examples of the electricity removing method include a method for bringing the substance to be purified into contact with a conductive material.

The contact time for which the substance to be purified is brought into contact with a conductive material is preferably 0.001 to 60 seconds, more preferably 0.001 to 1 second, and even more preferably 0.01 to 0.1 seconds. Examples of the conductive material include stainless steel, gold, platinum, diamond, glassy carbon, and the like.

Examples of the method for bringing the substance to be purified into contact with a conductive material include a method for disposing a grounded mesh formed of a conductive material in the interior of a pipe line and passing the substance to be purified through the mesh, and the like.

It is preferable that the electricity removing step is performed before at least one step selected from the group consisting of the organic solvent preparation step and the purification step.

<Container>

The chemical liquid may be temporarily stored in a container until the chemical liquid is used. As the container for storing the chemical liquid, known containers can be used without particular limitation.

As the container storing the chemical liquid, a container for a semiconductor is preferable which has a high internal cleanliness and hardly causes elution of impurities.

Examples of the usable container specifically include a "CLEAN BOTTLE" series manufactured by AICELLO CORPORATION, "PURE BOTTLE" manufactured by KODAMA PLASTICS Co., Ltd., and the like, but the container is not limited to these.

As the storage container, for the purpose of preventing mixing of impurities into the raw materials and/or the chemical liquid (contamination), it is preferable to use a multilayer bottle in which the liquid contact portion in the container has a 6-layer structure formed of 6 kinds of resins or a multilayer bottle in which the liquid contact portion in the container has a 7-layer structure formed of 7 kinds of resins. Examples of these containers include the containers described in JP2015-123351A, but the present invention is not limited thereto.

It is preferable that the liquid contact portion of the container is formed of a nonmetallic material or stainless steel.

Examples of the nonmetallic material include the materials exemplified above as nonmetallic materials used in the liquid contact portion of the distillation column.

Particularly, in a case where a container in which the liquid contact portion is formed of a fluororesin among the above materials is used, the occurrence of a problem such as elution of an ethylene or propylene oligomer can be further inhibited than in a case where a container in which the liquid contact portion is formed of a polyethylene resin, a polypropylene resin, or a polyethylene-polypropylene resin is used.

Specific examples of the container in which the liquid contact portion is formed of a fluororesin include FluoroPure PFA composite drum manufactured by Entegris, Inc., and the like. Furthermore, it is possible to use the containers described on p. 4 in JP1991-502677A (JP-H03-502677A), p. 3 in WO2004/016526A, p. 9 and p. 16 in WO99/046309A, and the like. In a case where the nonmetallic material is used for the liquid contact portion, it is preferable to inhibit the elution of the nonmetallic material into the chemical liquid.

For the container, the liquid contact portion contacting the chemical liquid is preferably formed of stainless steel, and more preferably formed of electropolished stainless steel.

The proportion of the area of the liquid contact portion of the container that is formed of the aforementioned material is preferably equal to or higher than 50%, more preferably equal to or higher than 70%, and even more preferably equal to or higher than 90%. It is preferable that substantially the entirety of the liquid contact portion is formed of the aforementioned material.

Examples of the aspect in which the liquid contact portion of the container is formed of the aforementioned material include a case where the container is formed of the aforementioned material, a case where the container has a base material and a coating layer which is formed of the corrosion-resistance material and disposed on the base material so as to cover at least a portion of the surface of the base material, and the like.

In a case where the chemical liquid is stored in such a container, it is more difficult for the impurity metal and/or the organic impurity to be eluted into the chemical liquid stored in the container.

The aspect of the stainless steel is as described above as the material of the liquid contact portion of the distillation column. The aspect of the electropolished stainless steel is as described above as well.

The content mass ratio of a content of Cr atoms to a content of Fe atoms (hereinafter, referred to as "Cr/Fe" as well) in the stainless steel forming the liquid contact portion of the container is not particularly limited. However, generally, Cr/Fe is preferably 0.5 to 4. Particularly, in view of making it more difficult for the impurity metal and/or the organic impurity to be eluted into the chemical liquid stored in the container, Cr/Fe is more preferably higher than 0.5 and lower than 3.5. In a case where Cr/Fe is higher than 0.5, the elution of a metal from the interior of the container can be inhibited. In a case where Cr/Fe is lower than 3.5, the exfoliation of an inner container causing particles and the like hardly occurs.

The method for adjusting Cr/Fe in the stainless steel is not particularly limited, and examples thereof include a method of adjusting the content of Cr atoms in the stainless steel, a method of performing electropolishing such that the chromium content in a passive layer on a polished surface becomes higher than the chromium content in the parent phase, and the like.

It is preferable that the interior of the aforementioned container is washed before the solution is stored into the container. As a liquid used for washing, the chemical liquid itself or a liquid obtained by diluting the chemical liquid is preferable. After being manufactured, the chemical liquid may be bottled using a container such as a gallon bottle or a quart bottle, transported, and stored. The gallon bottle may be formed of a glass material or other materials.

In order to prevent the change of the components in the solution during storage, purging may be performed in the interior of the container by using an inert gas (nitrogen, argon, or the like) having a purity equal to or higher than 99.99995% by volume. Particularly, a gas with small moisture content is preferable. The temperature at the time of transport and storage may be room temperature. However, in order to prevent alteration, the temperature may be controlled within a range of −20° C. to 30° C.

(Clean Room)

It is preferable that all of the manufacturing of the chemical liquid, the opening and/or washing of the container, the handling including storage of the solution, the treatment and analysis, and the measurement are performed in a clean room. It is preferable that the clean room meets the 14644-1 clean room standard. The clean room preferably meets any of International Organization for Standardization (ISO) class 1, ISO class 2, ISO class 3, or ISO class 4, more preferably meets ISO class 1 or ISO class 2, and even more preferably meets ISO class 1.

[Use of Chemical Liquid]

The chemical liquid according to the above embodiment is preferably used for manufacturing semiconductors. Specifically, in a semiconductor device manufacturing process including a lithography step, an etching step, an ion implantation step, a peeling step, and the like, the chemical liquid is used for treating an organic substance after each step is finished or before the next step is started. Specifically, the chemical liquid is suitably used as a prewet solution, a developer, a rinsing solution, a peeling solution, and the like. For example, the chemical liquid can also be used for rinsing at the time of edge line of semiconductor substrates before and after coating with resist.

Furthermore, the chemical liquid can also be used as a diluent of a resin contained in a resist solution (which will be described later). In addition, the chemical liquid may be diluted with another organic solvent and/or water, and the like.

The chemical liquid can also be suitably used for other uses in addition to the manufacturing of semiconductors. The chemical liquid can be used as a developer or a rinsing solution of polyimide, a resist for a sensor, a resist for a lens, and the like.

In addition, the chemical liquid can also be used as a solvent for medical uses or for washing. Particularly, the chemical liquid can be suitably used for washing containers, piping, substrates (for example, a wafer and glass), and the like.

Particularly, the chemical liquid according to the above embodiment is more preferably used as at least one kind of chemical agent selected from the group consisting of a prewet solution and a developer. That is, it is preferable that the chemical liquid according to the above embodiment is used as a prewet solution and/or a developer.

[Chemical Liquid Storage Body]

The chemical liquid storage body according to an embodiment of the present invention comprises a container and the chemical liquid stored in the container, in which a liquid contact portion contacting the chemical liquid in the container is formed of a nonmetallic material or stainless steel (preferably electropolished stainless steel).

The proportion of the area of the liquid contact portion of the container that is formed of the aforementioned material is preferably equal to or higher than 50%, more preferably equal to or higher than 70%, and even more preferably equal to or higher than 90%. It is preferable that substantially the entirety of the container is formed of the aforementioned material.

Examples of the aspect in which the liquid contact portion of the container is formed of the aforementioned material include a case where the container is formed of the aforementioned material, a case where the container has a base material and a coating layer which is formed of the aforementioned material and disposed on the base material so as to cover at least a portion of the surface of the base material, and the like.

The nonmetallic material is not particularly limited, but is preferably at least one kind of nonmetallic material selected from the group consisting of a polyethylene resin, a polypropylene resin, a polyethylene-polypropylene resin, polytetrafluoroethylene, a polytetrafluoroethylene-perfluoroalkyl vinyl ether copolymer, a polytetrafluoroethylene-hexafluoropropylene copolymer resin, a polytetrafluoroethylene-ethylene copolymer resin, a chlorotrifluoro ethylene-ethylene copolymer resin, a vinylidene fluoride resin, a chlorotrifluoroethylene copolymer resin, and a vinyl fluoride resin. In a case where the chemical liquid storage body formed of the above nonmetallic material is stored for a long period of time, it is more difficult for the impurity metal and/or the organic impurity and the like to be eluted into the chemical liquid.

As the stainless steel, known stainless steel can be used without particular limitation. The aspect of the stainless steel is as described above regarding the material of the liquid contact portion of the purification device.

[Pattern Forming Method]

It is preferable that the chemical liquid is used for forming a resist pattern (hereinafter, simply referred to as "pattern") used for manufacturing semiconductors. The pattern forming method in which the chemical liquid is used is not particularly limited, and examples thereof include known pattern forming methods.

Particularly, it is preferable that the pattern forming method includes the following steps.

(A) Pre-wetting step of coating substrate with chemical liquid so as to obtained pre-wetted substrate (B) Resist film forming step of forming resist film on pre-wetted substrate by using actinic ray-sensitive or radiation-sensitive resin composition (C) Exposure step of exposing resist film (D) Development step of developing exposed resist film by using developer Hereinafter, the aspect of each of the steps will be described.

[(A) Pre-wetting step]

The pre-wetting step is a step of coating a substrate with the chemical liquid.

As the substrate, known substrates used for manufacturing semiconductors can be used without particular limitation. Examples of the substrate include an inorganic substrate such as silicon, $SiO_2$, or SiN, a coating-type inorganic substrate such as Spin On Glass (SOG), and the like, but the substrate is not limited to these.

Furthermore, the substrate may be a substrate with an antireflection film comprising an antireflection film. As the antireflection film, known organic or inorganic antireflection films can be used without particular limitation.

As the method for coating the substrate with the chemical liquid, known coating methods can be used without particular limitation. Particularly, as the coating method, spin coating is preferable because this method makes it possible to form a uniform resist film by using smaller amounts of the actinic ray-sensitive or radiation-sensitive resin composition in the resist film forming step which will be described later.

The thickness of a chemical liquid layer formed on the substrate by using the chemical liquid is not particularly limited. Generally, the thickness of the chemical liquid layer is preferably 0.001 to 10 μm, and more preferably 0.005 to 5 μm.

Provided that a resist solution, with which the substrate is to be coated, is a resist for ArF immersion exposure, and that the surface tension of the resist solution is 28.8 mN/m, although the surface tension of the mixture in the chemical liquid is not particularly limited, it is preferable to supply the chemical liquid to the wafer as a prewet solution by making the surface tension of the chemical liquid become higher than the surface tension of the resist solution.

Generally, the chemical liquid is supplied to the wafer by a method of moving a prewet nozzle to a position above the central portion of the wafer. Then, by opening or closing a valve, the chemical liquid is supplied to the wafer.

In a state where the wafer stands still, a predetermined amount of the chemical liquid is supplied to the central portion of the wafer from the prewet nozzle. Then, the wafer is rotated at a first speed V1 which is, for example, about 500 rotation per minute (rpm) such that the chemical liquid on the wafer spreads over the entire surface of the wafer. As a result, the entire surface of the wafer is wet with the chemical liquid.

Thereafter, the valve of a line connected to a resist solution is opened. As a result, the resist solution starts to be jetted from a resist nozzle, and the resist solution starts to be supplied to the central portion of the wafer. In this way, (B) resist film forming step (which will be described later) is started. In the resist film forming step, from the first speed V1, the rotation speed of the wafer is increased to a high speed which is a second speed V2 of about 2,000 to 4,000 rpm for example. The wafer rotating at the first speed V1 before the start of the resist film forming step is then gradually accelerated such that the speed continuously and smoothly changes. At this time, the acceleration of the rotation of the wafer is gradually increased from zero, for example. At the time when the resist film forming step ends, the acceleration of the rotation of the wafer is reduced such that the rotation speed of the wafer W smoothly reaches the second speed V2. In this way, during the resist film forming step, the rotation speed of the wafer changes such that the transition from the first speed V1 to the second speed V2 is represented by an S-shaped curve. In the resist film forming step, due to the centrifugal force, the resist solution supplied to the central portion of the wafer spreads over the entire surface of the wafer, whereby the surface of the wafer is coated with the resist solution.

The technique for saving resist by changing the rotation speed of a wafer at the time of resist coating is specifically described in JP2008-131495.

The chemical liquid may be recycled. That is, the chemical liquid used in the pre-wetting step can be recovered and reused in the pre-wetting step for other wafers.

In a case where the chemical liquid is recycled, it is preferable to adjust the content of the impurity metal, the organic impurity, water, and the like contained in the recovered chemical liquid. The preparation method is as described above regarding the manufacturing method of the chemical liquid.

<Affinity Between Chemical Liquid and Resin>

Regarding the affinity between the chemical liquid used in the pre-wetting step and the resin contained in the actinic ray-sensitive or radiation-sensitive resin composition which will be described later, there is no particular limitation. However, in view of making it possible to form a more uniform resist film by using smaller amounts of the actinic ray-sensitive or radiation-sensitive resin composition, it is preferable that the chemical liquid and the resin contained in the actinic ray-sensitive or radiation-sensitive resin composition satisfy the following relationship.

The chemical liquid and the resin preferably satisfy the following condition 1 and condition 2 at 25° C. In a case where the chemical liquid satisfies the following condition 1 and condition 2 at 25° C., it is possible to form a more uniform resist film by using smaller amounts of the actinic ray-sensitive or radiation-sensitive resin composition.

(Condition 1)

Rsq1 calculated by Equation 1 based on a proton spin-spin relaxation time measured for a chemical liquid and a first test solution formed of a resin and the chemical liquid by using a pulsed nuclear magnetic resonance-type particle interface characteristic evaluator is higher than 0.001.

$$Rsq1 = (\tau 0/\tau 1) - 1 \qquad \text{(Equation 1)}$$

In Equation 1, τ0 represents a spin-spin relaxation time of the chemical liquid, and τ1 represents a spin-spin relaxation time of the first test solution. The resin contained in the first test solution is regarded as being dissolved in the chemical liquid.

Details of Condition 1 will be described.

First, the pulsed nuclear magnetic resonance-type particle interface characteristic evaluator is an evaluator adopting a method of observing the state of spin (magnetism) of a target. Examples of the pulsed nuclear magnetic resonance-type particle interface characteristic evaluator include "Acorn Area" manufactured by Xigo Nanotools, and the like.

The aforementioned evaluator measures a time (spin-spin relaxation time) taken for a measurement target to return to the normal state immediately after the application of energy thereto (excitation state). In the test solution (first test solution) in which the resin is dissolved in the chemical liquid, the spin-spin relaxation time changes by being affected by the type of organic solvent in the chemical liquid contacting the resin and the like.

It is unclear why the above change occurs. Presumably, this is because the amount of molecules of the organic solvent contacting the resin affects the spin-spin relaxation time.

It is considered that the amount of molecules of the organic solvent contacting the resin may change by being affected by the surface area of the resin, the wettability between the organic solvent and the resin, and the like. That is, presumably, the amount of the organic solvent molecules may reflect the strength of the interaction between the resin and the chemical liquid.

Rsq1 calculated by Equation 1 based on a proton spin-spin relaxation time is a parameter showing the compatibility between a resin and a chemical liquid.

$$Rsq1=(\tau0/\tau1)-1 \qquad \text{(Equation 1)}$$

In a case where Rsq1 is higher than 0.001, the chemical liquid and the resin exhibit higher compatibility. The upper limit of Rsq1 is not particularly limited, but is preferably equal to or lower than 10.0 in general.

(Condition 2)

SRsq calculated by Equation 2 based on a proton spin-spin relaxation time measured for a second test solution, which is formed of the resin and the chemical liquid and in which the content of the resin is different from the content of the resin in the first test solution, and the first test solution by using a pulsed nuclear magnetic resonance-type particle interface characteristic evaluator is higher than −1.

$$SRsq=(Rsq2-Rsq1)/(c2-c1) \qquad \text{(Equation 2)}$$

In Equation 2, Rsq1 represents a value calculated by Equation 1, and Rsq2 represents a value calculated by Equation 3. c1 and c2 represent the mass-based content of the resin in the first test solution and the second test solution respectively. The unit of the mass-based content is % by mass. The resin contained in the first test solution and the second test solution is regarded as being dissolved in the chemical liquid.

$$Rsq2=(\tau0/\tau2)-1 \qquad \text{(Equation 3)}$$

In Equation 3, $\tau0$ has the same definition as $\tau0$ in Equation 1, and $\tau2$ represents a spin-spin relaxation time of the second test solution.

Details of Condition 2 will be described.

In Equation 2, c1 and c2 represent the content of the resin (% by mass) in the first test solution and the second test solution respectively, and c2>c1. As long as the resin is thoroughly dissolved in the first test solution and the second test solution, c1 and c2 are not particularly limited. For example, c1 may be 0.5% by mass, and c2 may be 3.0% by mass.

SRsq represents a rate of change of Rsq in a predetermined concentration range (c2−c1). SRsq is preferably higher than −1, and more preferably equal to or higher than 0. The upper limit of SRsq is not particularly limited, but is preferably equal to or lower than 10 in general. In a case where SRsq is higher than −1, the resin tends to remain more homogeneously dispersed in the chemical liquid, and it becomes more difficult for the resin to be aggregated.

[(B) Resist Film Forming Step]

The resist film forming step is a step of forming a resist film on the pre-wetted substrate (substrate comprising a chemical liquid layer) by using an actinic ray-sensitive or radiation-sensitive resin composition. Hereinafter, first, aspects of the actinic ray-sensitive or radiation-sensitive resin composition will be described.

<Actinic Ray-Sensitive or Radiation-Sensitive Resin Composition>

As the actinic ray-sensitive or radiation-sensitive resin composition which can be used in the resist film forming step, known actinic ray-sensitive or radiation-sensitive resin compositions can be used without particular limitation.

It is preferable that the actinic ray-sensitive or radiation-sensitive resin composition contains a resin (hereinafter, referred to as "acid-decomposable resin" as well in the present specification), which contains a repeating unit containing a group generating a polar group (a carboxy group, a phenolic hydroxyl group, or the like) by being decomposed by the action of an acid, and a compound (hereinafter, referred to as "photoacid generator" as well in the present specification) which generates an acid by the irradiation of actinic rays or radiation.

Hereinafter, first, preferred aspects of the resin containing a repeating unit containing an acid-decomposable group (hereinafter, referred to as "acid-decomposable resin" as well in the present specification) and the photoacid generator will be described.

(Acid-Decomposable Resin)

It is preferable that the actinic ray-sensitive or radiation-sensitive resin composition contains a resin including a repeating unit selected from the group consisting of a repeating unit represented by Formula (a), a repeating unit represented by Formula (b), a repeating unit represented by Formula (c), a repeating unit represented by Formula (d), and a repeating unit represented by Formula (e) (hereinafter, this resin will be referred to as "resin represented by Formula (I)" as well).

The resin represented by Formula (I) is a resin whose solubility in a developer (chemical liquid which will be described later), which contains an organic solvent as a main component is reduced, by the action of an acid. The resin contains an acid-decomposable group. In the chemical liquid, the resin represented by Formula (I) is excellently dissolved. Therefore, the chemical liquid makes it easy to obtain a uniform resist film by using smaller amounts of the resist composition. Hereinafter, the resin represented by Formula (I) will be described.

Resin Represented by Formula (I)

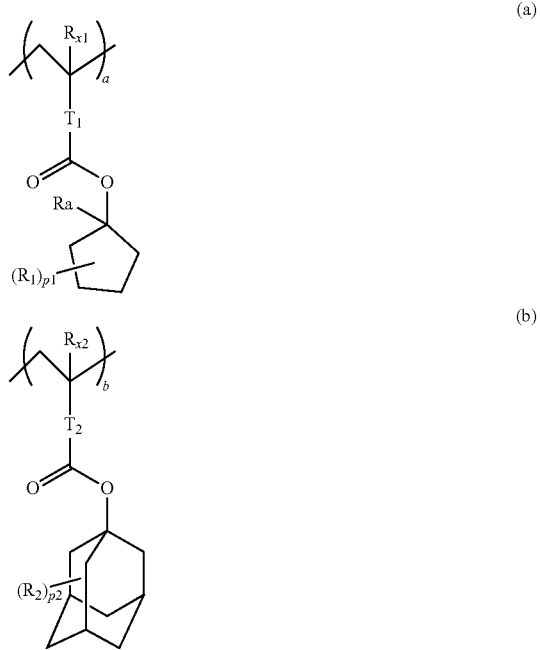

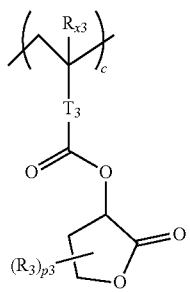

(c)

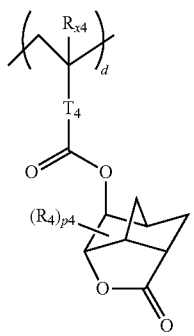

(d)

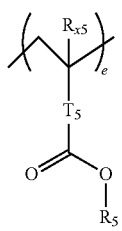

(e)

Formula (I) is constituted with a repeating unit (a) (repeating unit represented by Formula (a)), a repeating unit (b) (repeating unit represented by Formula (b)), a repeating unit (c) (repeating unit represented by Formula (c)), a repeating unit (d) (repeating unit represented by Formula (d)), and a repeating unit (e) (repeating unit represented by Formula (e)).

In Formula (I), $R_{X1}$ to $R_{X5}$ each independently represent a hydrogen atom or an alkyl group which may have a substituent.

$R_1$ to $R_4$ each independently represent a monovalent substituent, and p1 to p4 each independently represent 0 or a positive integer.

$R_5$ represents a linear or branched alkyl group.

$T_1$ to $T_5$ each independently represent a single bond or a divalent linking group.

$R_5$ represents a monovalent organic group.

a to e each represent mol %. a to e each independently represent a number included in a range of $0 \leq a \leq 100$, $0 \leq b \leq 100$, $0 \leq c < 100$, $0 \leq d < 100$, and $0 \leq e < 100$. Here, $a+b+c+d+e=100$, and $a+b \neq 0$.

In Formula (I), the repeating unit (e) has a structure different from all of the repeating units (a) to (d).

Examples of the alkyl group represented by $R_{x1}$ to $R_{x5}$ that may have a substituent include a methyl group and a group represented by —$CH_2$—$R_{11}$. $R_{11}$ represents a halogen atom (a fluorine atom or the like), a hydroxyl group, or a monovalent organic group.

$R_{x1}$ to $R_{x5}$ preferably each independently represent a hydrogen atom, a methyl group, a trifluoromethyl group, or a hydroxymethyl group.

Examples of the divalent linking group represented by $T_1$ to $T_5$ in Formula (I) include an alkylene group, a —COO-Rt- group, a —O-Rt- group, and the like. In the formula, Rt represents an alkylene group or a cycloalkylene group.

$T_1$ to $T_5$ preferably each independently represent a single bond or a —COO-Rt- group. Rt is preferably an alkylene group having 1 to 5 carbon atoms, and more preferably a —$CH_2$— group, a —$(CH_2)_2$— group, or a —$(CH_2)_3$— group.

In Formula (I), $R_a$ represents a linear or branched alkyl group. Examples thereof include a methyl group, an ethyl group, a t-butyl group, and the like. Among these, a linear or branched alkyl group having 1 to 4 carbon atoms is preferable.

In Formula (I), $R_1$ to $R_4$ each independently represent a monovalent substituent. $R_1$ to $R_4$ are not particularly limited, and examples thereof include a hydroxyl group, a cyano group, and a linear or branched alkyl or cycloalkyl group having a hydroxyl group, a cyano group, and the like.

In Formula (I), $p_1$ to $p_4$ each independently represent 0 or a positive integer. The upper limit of $p_1$ to $p_4$ equals the number of hydrogen atoms which can be substituted in each repeating unit.

In Formula (I), $R_5$ represents a monovalent organic group. $R_5$ is not particularly limited, and examples thereof include a monovalent organic group having a sultone structure, a monovalent organic group having a cyclic ether such as tetrahydrofuran, dioxane, 1,4-thioxane, dioxolane, and 2,4,6-trioxabicyclo[3.3.0]octane, and an acid-decomposable group (for example, an adamantyl group quaternized by the substitution of carbon in a position bonded to a —COO group with an alkyl group).

The repeating unit (b) in Formula (I) is preferably formed of the monomer described in paragraphs "0014" to "0018" in JP2016-138219A.

In Formula (I), a to e each represent mol %. a to e each independently represent a number included in a range of $0 \leq a \leq 100$, $0 \leq b \leq 100$, $0 \leq c < 100$, $0 \leq d < 100$, and $0 \leq e < 100$. Here, $a+b+c+d+e=100$, and $a+b \neq 0$.

In Formula (I), a+b (the content of the repeating unit having an acid-decomposable group with respect to all the repeating units) is preferably 20 to 90 mol %, more preferably 25 to 85 mol %, and even more preferably 30 to 80 mol %.

Furthermore, in Formula (I), c+d (the content of the repeating unit having a lactone structure with respect to all the repeating units) is preferably 3 to 80 mol %, and more preferably 3 to 60 mol %.

One kind of each of the repeating unit (a) to repeating unit (e) may be used singly, or two or more kinds of each of the repeating unit (a) to repeating unit (e) may be used in combination. In a case where two or more kinds of repeating units are used in combination, the total content of each repeating unit is preferably within the above range.

The weight-average molecular weight (Mw) of the resin represented by Formula (I) is preferably 1,000 to 200,000 in general, more preferably 2,000 to 20,000, and even more preferably 3,000 to 15,000. The weight-average molecular weight is determined by Gel Permeation Chromatography (GPC) by using tetrahydrofuran (THF) as a developing solvent, and expressed in terms of polystyrene.

In the actinic ray-sensitive or radiation-sensitive resin composition, the content of the resin represented by Formula (I) based on the total solid content of the actinic ray-sensitive or radiation-sensitive resin composition is preferably 30% to 99% by mass in general, and more preferably 50% to 95% by mass.

(Photoacid Generator)

It is preferable that the actinic ray-sensitive or radiation-sensitive resin composition contains a photoacid generator. As the photoacid generator, known photoacid generators can be used without particular limitation.

The content of the photoacid generator in the actinic ray-sensitive or radiation-sensitive resin composition is not particularly limited. However, generally, the content of the photoacid generator with respect to the total solid content of the actinic ray-sensitive or radiation-sensitive resin composition is preferably 0.1% to 20% by mass, and more preferably 0.5% to 20% by mass. One kind of photoacid generator may be used singly, or two or more kinds of photoacid generators may be used in combination. In a case where two or more kinds of photoacid generators are used in combination, the total content thereof is preferably within the above range.

Examples of the photoacid generator include the compounds described in JP2016-057614A, JP2014-219664A, JP2016-138219A, and JP2015-135379A.

(Quencher)

The actinic ray-sensitive or radiation-sensitive resin composition may contain a quencher. As the quencher, known quenchers can be used without particular limitation.

The quencher is a basic compound and has a function of inhibiting the acid-decomposable resin from being unintentionally decomposed in an unexposed area by the acid spread from an exposed area.

The content of the quencher in the actinic ray-sensitive or radiation-sensitive resin composition is not particularly limited. However, generally, the content of the quencher with respect to the total solid content of the actinic ray-sensitive or radiation-sensitive resin composition is preferably 0.1% to 15% by mass, and more preferably 0.5% to 8% by mass. One kind of quencher may be used singly, or two or more kinds of quenchers may be used in combination. In a case where two or more kinds of quenchers are used in combination, the total content thereof is preferably within the above range.

Examples of the quencher include the compounds described in JP2016-057614A, JP2014-219664A, JP2016-138219A, and JP2015-135379A.

(Hydrophobic Resin)

The actinic ray-sensitive or radiation-sensitive resin composition may contain a hydrophobic resin. As the hydrophobic resin, known hydrophobic resins can be used without particular limitation.

The hydrophobic resin has functions such as the control of static/dynamic contact angle formed between water and the resist film surface, the improvement of immersion liquid followability, and/or the inhibition of outgas.

In the present specification, it is preferable to design the hydrophobic resin such that the resin is localized within the interface of a resist film. However, unlike a surfactant, the hydrophobic resin does not need to have a hydrophilic group in a molecule and may not make a contribution to the homogeneous mixing of a polar substance with a nonpolar substance.

The content of the hydrophobic resin in the actinic ray-sensitive or radiation-sensitive resin composition is not particularly limited. Generally, it is preferable that the content of the hydrophobic resin with respect to the total solid content in the actinic ray-sensitive or radiation-sensitive resin composition is 0.01% to 10% by mass. One kind of hydrophobic resin may be used singly, or two or more kinds of hydrophobic resins may be used in combination. In a case where two or more kinds of hydrophobic resins are used in combination, the total content thereof is preferably within the above range.

(Organic Solvent)

The actinic ray-sensitive or radiation-sensitive resin composition may contain an organic solvent. As the organic solvent, known organic solvents can be used without particular limitation.

The organic solvent to be incorporated into the actinic ray-sensitive or radiation-sensitive resin composition may be the same as or different from the organic solvent to be incorporated into the mixture in the chemical liquid described above.

The content of the organic solvent in the actinic ray-sensitive or radiation-sensitive resin composition is not particularly limited. However, generally, it is preferable that the organic solvent is incorporated into the composition such that the total solid content of the actinic ray-sensitive or radiation-sensitive resin composition is adjusted to be 0.5% to 10% by mass. One kind of organic solvent may be used singly, or two or more kinds of organic solvents may be used in combination. In a case where two or more kinds of organic solvents are used in combination, the total content thereof is preferably within the above range.

Examples of the organic solvent include the solvents described in JP2016-057614A, JP2014-219664A, JP2016-138219A, and JP2015-135379A.

(Other Additives)

If necessary, the actinic ray-sensitive or radiation-sensitive resin composition may additionally contain a surfactant, an acid proliferation agent, a dye, a plasticizer, a photosensitizer, a light absorber, an alkali-soluble resin other than the above resins, and/or a dissolution inhibitor.

[(C) Exposure Step]

The exposure step is a step of exposing the resist film. As the method for exposing the resist film, known methods can be used without particular limitation.

Examples of the method for exposing the resist film include a method of irradiating the resist film with actinic rays or radiation through a predetermined mask. In a case where the method of irradiating the resist film with electron beams is used, the resist film may be irradiated without the intervention of a mask (this is referred to as "direct imaging" as well in some cases).

The actinic rays or the radiation used for exposure is not particularly limited, and examples thereof include a KrF excimer laser, an ArF excimer laser, Extreme Ultra Violet (EUV), Electron Beam (EB), and the like. Among these, EUV or EB is preferable. The exposure may be immersion exposure.

<Post Exposure Bake (PEB) Step>

It is preferable that the aforementioned pattern forming method additionally includes a Post Exposure Bake (PEB) step of baking the exposed resist film between the exposure step and the development step. By the baking, the reaction in the exposed portion is accelerated, and either or both of sensitivity and pattern shape are further improved.

The heating temperature is preferably 80° C. to 150° C., more preferably 80° C. to 140° C., and even more preferably 80° C. to 130° C.

The heating time is preferably 30 to 1,000 seconds, more preferably 60 to 800 seconds, and even more preferably 60 to 600 seconds.

The heating can be performed by means comprising a general exposure.development machine, or may be performed using a hot plate or the like.

[(D) Development Step]

The development step is a step of developing the exposed resist film (hereinafter, referred to as "resist film obtained after exposure" as well) by using a developer.

As the development method, known development methods can be used without particular limitation. Examples of the development method include dipping method, a puddle method, a spray method, a dynamic dispense method, and the like.

Furthermore, the aforementioned pattern forming method may additionally include a step of substituting the developer with another solvent so as to stop the development after the development step.

The development time is not particularly limited, but is preferably 10 to 300 seconds in general and more preferably 10 to 120 seconds. The temperature of the developer is preferably 0° C. to 50° C., and more preferably 15° C. to 35° C. In the pattern forming method, the development step may be performed at least once or plural times.

<Developer>

As the developer, known developers can be used without particular limitation. Examples of the developer include an alkaline developer and a developer containing an organic solvent (organic developer).

In the development step, both the development using a developer containing an organic solvent and development using an alkaline developer may be performed (so-called double development may be performed).

The chemical liquid according to the embodiment of the present invention can also be used as a developer.

<Rinsing Step>

It is preferable that the aforementioned pattern forming method additionally includes a rinsing step after the development step. The rinsing step is a step of washing the wafer, which comprises the resist film obtained after development, by using a rinsing solution.

As the washing method, known washing methods can be used without particular limitation. Examples thereof include a rotation jetting method, a dipping method, a spray method, and the like.

Among these, it is preferable to use the rotation jetting method in which the wafer is washed and then rotated at a rotation speed of 2,000 to 4,000 rpm such that the rinsing solution is removed from the substrate.

The rinsing time is preferably 10 to 300 seconds in general, more preferably 10 to 180 seconds, and even more preferably 20 to 120 seconds. The temperature of the rinsing solution is preferably 0° C. to 50° C., and more preferably 15° C. to 35° C.

(Rinsing Solution)

In a case where the wafer comprising the resist film is rinsed after the development using an alkaline developer, as the rinsing solution, pure water is preferable. The rinsing solution may be pure water containing a surfactant.

In a case where the wafer comprising the resist film is rinsed after the development using an organic developer, as the rinsing solution, a rinsing solution containing an organic solvent is preferable. As the organic solvent contained in the rinsing solution, for example, at least one kind of organic solvent selected from the group consisting of a hydrocarbon-based solvent, a ketone-based solvent, an ester-based solvent, an alcohol-based solvent, an amide-based solvent, and an ether-based solvent is preferable, at least one kind of organic solvent selected from the group consisting of a hydrocarbon-based solvent, an ether-based solvent, and a ketone-based solvent is more preferable, and at least one kind of organic solvent selected from the group consisting of a hydrocarbon-based solvent and an ether-based solvent is even more preferable.

In a case where the developer containing an organic solvent is used in the development step, the aforementioned pattern forming method may include the rinsing step after the development step. However, from the viewpoint of throughput (productivity), the pattern forming method may not include the rinsing step.

As the pattern forming method that does not include a rinsing step, for example, the description in paragraphs "0014" to "0086" in JP2015-216403A can be cited, and the contents thereof are incorporated into the present specification.

As the rinsing solution, methyl isobutyl carbinol (MIBC) or the same liquid (particularly, butyl acetate) as the developer is also preferable.

The chemical liquid according to the embodiment of the present invention can also be used as a rinsing solution.

<Other Steps>

The aforementioned pattern forming method may include other steps in addition to the steps described above. Examples of those other steps include a washing step using a supercritical fluid, a heating step, and the like.

(Removing Step Using Supercritical Fluid)

A removing step using a supercritical fluid is a step of removing the developer and/or the rinsing solution having adhered to the pattern surface by using a supercritical fluid after the development treatment and/or the rinsing treatment.

(Heating Step)

The heating step is a step of heating the resist film so as to remove the solvent remaining in the pattern after the development step, the rinsing step, or the removing step using a supercritical fluid.

The heating temperature is not particularly limited, but is preferably 40° C. to 160° C. in general, more preferably 50° C. to 150° C., and even more preferably 50° C. to 110° C.

The heating time is not particularly limited, but is preferably 15 to 300 seconds in general and more preferably 15 to 180 seconds.

(BARC Composition Coating Step)

The aforementioned pattern forming method may include a step of coating the wafer with a Bottom of Anti-Reflection Coating (BARC) composition before (B) resist film forming step. Furthermore, the BARC composition coating step may additionally include a step of removing the BARC composition, with which the edge portions of the wafer are unintentionally coated, by using the chemical liquid according to the embodiment described above.

EXAMPLES

Hereinafter, the present invention will be more specifically described based on examples. The materials, the amount and proportion of the materials used, the details of treatments, the procedure of treatments, and the like shown in the following examples can be appropriately modified as long as the gist of the present invention is maintained. Accordingly, the scope of the present invention is not limited to the following examples.

[Preparation of Organic Solvent]

In order to manufacture chemical liquids of examples and comparative examples, the following organic solvents were prepared. As each of the organic solvents, a high-purity grade with purity equal to or higher than 99% by mass was used. The abbreviation for each organic solvent is shown in the bracket.

Propylene glycol monomethyl ether (PGME)
Cyclopentanone (CyPn)
Butyl acetate (nBA)
Propylene glycol monomethyl ether acetate (PGMEA)
Cyclohexanone (CyHx)
Ethyl lactate (EL)
2-Hydroxymethyl isobutyrate (HBM)
Cyclopentanone dimethyl acetal (DBCPN)
Propylene carbonate (PC)
γ-Butyrolactone (GBL)
Dimethyl sulfoxide (DMSO)
Ethylene carbonate (EC)
1-Methyl-2-pyrrolidone (NMP)
Dodecane
Isoamyl acetate (iAA)
4-Methyl-2-pentanol (MIBC)
Diethylene glycol monomethyl ether (DEGME)
Dimethyl ether (DME)
Diethyl ether (DEE)
Diethylene glycol monoisobutyl ether (DEGIBE)
Diglyme (DEGDME)
Diethylene glycol diethyl ether (DEGDEE)
Triethylene glycol dimethyl ether (TriEGDME)
Tetraethylene glycol dimethyl ether (TetraEGDME)
Triethylene glycol butyl methyl ether (TEGMBE)
Diethylene glycol monobutyl ether (DEGMBE)
Anisole
1,4-Dimethoxybenzene (14-DMB)
1,2-Dimethoxybenzene (12-DMB)
1,3-Dimethoxybenzene (13-DMB)
1,4-Diphenoxybenzene (described as 14-DPB in Table 1)
4-Methoxytoluene (described as 4-MTT in Table 1)
Phenetole (described as PNT in Table 1)
3-Methoxymethyl propionate (MMP)

[Preparation of Chemical Liquid]

A main agent to be used for preparing each chemical liquid was prepared as the organic solvent of the type described in Table 1 or as a mixture thereof. In a case where a mixture of organic solvents was used as the main agent, the mixture was obtained by mixing together the organic solvents at a mass ratio described in Table 1. The surfactant described in Table 1 was added to the obtained main agent such that the content of the surfactant became as described in Table 1. The obtained mixture was purified by the following method, thereby preparing a chemical liquid. For the purification, a device was used in which a stainless steel tank having a coating layer formed of polytetrafluoroethylene (PTFE) in a liquid contact portion was connected to a plurality of filter units through a circulation pipe line. Furthermore, a pump was disposed in the middle of the circulation pipe line. The liquid contact portion of each of the circulation pipe line and the pump was formed of polytetrafluoroethylene. Furthermore, filters disposed in the following order from the tank side were used.

Specifically, the symbols in the column of Surfactant in Table 1 represent the following surfactants.

A: "SURFYNOL 420", nonionic, acetylene glycol, low molecular weight

B: "EMULGEN 102", nonionic, polyoxyethylene alkyl ether, low molecular weight

C: "AMIET 102", nonionic, polyoxyethylene alkyl amine, low molecular weight

D: "RHEODOL MS-50", nonionic, glycerin fatty acid ester (glycerol monostearate), low molecular weight E: "RHEODOL SP-S20", nonionic, sorbitan fatty acid ester (sorbitan distearate), low molecular weight F: "SURFLON S-651", nonionic, fluorine-containing surfactant, low molecular weight G: "NEWKALGEN FS-3", anionic, polyoxyethylene allyl phenyl ether phosphate (polyoxyethylene allyl phenyl ether phosphate amine salt), low molecular weight H: "NEWKALGEN FS-7", polyoxyethylene allyl phenyl ether sulfate (polyoxyalkylene allyl phenyl ether sulfate.Na), anionic, low molecular weight I: "PIONIN B-111", quaternary ammonium salt (lauryl trimethylammonium chloride), cationic, low molecular weight J: "ANHITOL 24B", amphoteric, alkyl betaine (lauryl dimethyl aminoacetic acid betaine), low molecular weight First metal ion adsorption filter (15 nm IEX PTFE manufactured by Entegris, Inc. (filter made of PTFE having a pore size of 15 nm including a base material having a sulfo group on the surface thereof))

Particle removing filter (12 nm PTFE manufactured by Entegris, Inc. (filter made of PTFE for removing particles having a size of 12 nm))

Second metal ion adsorption filter (15 nm IEX PTFE manufactured by Entegris, Inc. (filter made of PTFE having a pore size of 15 nm including a base material having a sulfo group on the surface thereof))

Organic impurity adsorption filter (special filter A (filter described in JP2013-150979A obtained by fixing active carbon to non-woven cloth))

The downstream side of the organic impurity adsorption filter was provided with moisture adjustment means containing MOLECULAR SIEVE 3A (manufactured by Union Showa K. K., dehydrating agent).

A tank was filled with the organic solvent of the type described in Table 1 or a mixed solution thereof, and the organic solvent or the mixed solution was circulated plural times in a pipe line including the filter and the moisture adjustment means described above, thereby obtaining each of the chemical liquids described in Table 1.

[Measurement of Content of Each Component Contained in Chemical Liquid, and the Like]

For measuring the content of each component contained in the chemical liquid, the following method was used. All of the following measurements were performed in a clean room that met the level equal to or lower than International Organization for Standardization (ISO) Class 2. In order to improve the measurement accuracy, at the time of measuring each component, in a case where the content of the component was found to be equal to or smaller than a detection limit by general measurement, the organic solvent was concentrated by 1/100 in terms of volume for performing the measurement, and the content was calculated by converting the concentration into the content of the organic solvent not yet being concentrated. The results are summarized in Table 1.

<Organic Solvent and Organic Impurity>

The content of the organic solvent and the organic impurity in each of the chemical liquids was measured using a gas chromatography mass spectrometry (trade name "GCMS-2020", manufactured by Shimadzu Corporation, the measurement conditions were as described below). Based on the obtained measurement results, the high-boiling-point component in the organic impurity was sorted out, and the content thereof was also determined.

(Measurement Condition)

Capillary column: InertCap 5MS/NP 0.25 mmI.D.×30 m df=0.25 μm

Sample introduction method: slit 75 kPa constant pressure

Vaporizing chamber temperature: 230° C.

Column oven temperature: 80° C. (2 min)-500° C. (13 min) heating rate 15° C./min
Carrier gas: helium
Septum purge flow rate: 5 mL/min
Split ratio: 25:1
Interface temperature: 250° C.
Ion source temperature: 200° C.
Measurement mode: Scan m/z=85~500
Amount of sample introduced: 1 µL
<Water>

The content of water contained in each of the chemical liquids was measured using a Karl Fischer moisture meter (trade name "MKC-710M", manufactured by KYOTO ELECTRONICS MANUFACTURING CO., LTD., Karl Fischer coulometric titration method).

<Impurity Metal>

The content of the impurity metal contained in each of the chemical liquids was measured using Agilent 8800 triple quadrupole ICP-MS (for semiconductor analysis, option #200). According to this measurement method, the particles, which are in each of the chemical liquids and contain one kind of metal selected from the group consisting of Fe, Cr, Ni, and Pb, and an impurity metal other than that (for example, ions and the like) can be sorted out, and the content of the particles and the impurity metal can be measured.

Measurement Condition
As a sample introduction system, a quartz torch, a coaxial perfluoroalkoxyalkane (PFA) nebulizer (for self-suction), and a platinum interface cone were used. The measurement parameters of cool plasma conditions are as below.
Output of Radio Frequency (RF) (W): 600
Flow rate of carrier gas (L/min): 0.7
Flow rate of makeup gas (L/min): 1
Sampling depth (mm): 18

[Physical Properties of Main Agent and the Like]

The physical properties of the main agent and the like were measured or calculated by the following method.

<Surface Tension of Main Agent>

Based on a surface tension at 25° C. of each of the organic solvents contained in the main agent and a molar fraction of each of the organic solvents in the mixture, the surface tension of the main agent was calculated. In a case where a single organic solvent was used as a main agent, the surface tension of the organic solvent was regarded as the surface tension of the main agent.

The surface tension at 25° C. of the organic solvents contained in each of the main agents was measured using a surface tensiometer (trade name "CBVP-Z" manufactured by Kyowa Interface Science Co., LTD.). The calculated values of the surface tension of the main agents are shown in Table 1.

<Hansen Solubility Parameter>

The hydrogen bond element, the dispersion element, and the dipole-dipole force element as Hansen solubility parameters of each of the organic solvents were calculated using Hansen Solubility Parameter in Practice (HSPiP). The calculated values are shown in Table 1. The Hansen solubility parameters of the organic solvents were plotted on a ternary diagram, and whether the parameters are within a predetermined range was checked. The checked results were sorted as below and described in the column of "HP" in Table 1. fd represents the contribution rate of the dispersion element, fp represents the contribution rate of the dipole-dipole force element, and fh represents the contribution rate of the hydrogen bond element. The organic solvent for which "1" is described in the column of "HP" satisfies the condition described above, and the organic solvent for which "0" is described in the column of "HP" does not satisfy the condition described above.

1: In a case where the contribution rates (fd, fp, fh) of Hansen solubility parameters of an organic solvent are plotted on a ternary diagram, the organic solvent is within a range surrounded by 4 points of (40, 60, 0), (40, 0, 60), (80, 0, 20), and (80, 20, 0).

0: In a case where the contribution rates (fd, fp, fh) of Hansen solubility parameters of an organic solvent are plotted on a ternary diagram, the organic solvent is not within a range surrounded by 4 points of (60, 40, 0), (40, 0, 60), (80, 0, 20), and (80, 20, 0).

<Vapor Pressure>

The vapor pressure of the main agent was calculated by summing up the product of a vapor pressure (Pa) of each of the organic solvents constituting the main agent at 25° C. and the molar fraction of each of the organic solvents in the main agent. The calculated values are shown in Table 1. In a case where the main agent was formed of a single organic solvent, the vapor pressure of the organic solvent was regarded as the vapor pressure of the main agent.

<Number of Coarse Particles>

The number of coarse particles contained in each of the chemical liquids was measured by the following method.

For the prepared chemical liquid, by using a light scattering-type liquid-borne particle counter (manufactured by RION Co., Ltd., model number: KS-18F, light source: semiconductor laser-excited solid-state laser (wavelength: 532 nm, rated power: 500 mW), flow rate: 10 mL/min, the measurement principle is based on a dynamic light scattering method), the number of particles having a size equal to or greater than 100 nm contained in 1 mL of the chemical liquid was counted 5 times, and the average thereof was adopted as the number of coarse particles.

The light scattering-type liquid-borne particle counter was used after being calibrated using a Polystyrene Latex (PSL) standard particle solution. The measurement results are shown in Table 1.

[Preparation of Actinic Ray-Sensitive or Radiation-Sensitive Resin Composition]

By the following method, actinic ray-sensitive or radiation-sensitive resin (resist) compositions were prepared. By mixing together components and then filtering the mixture through a polyethylene filter having a pore size of 0.03 µm, the resist compositions were prepared. Hereinafter, each of the actinic ray-sensitive or radiation-sensitive resin compositions 1 to 4 will be described.

<Resist Composition 1>

Acid-decomposable resin (resin represented by the following formula (weight-average molecular weight (Mw): 7,500): the numerical value described for each repeating unit means mol %.): 100 parts by mass

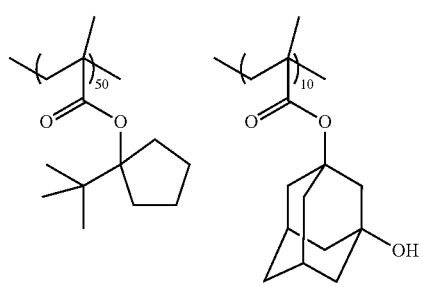

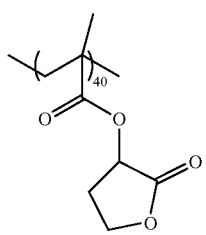

Photoacid generator shown below: 8 parts by mass

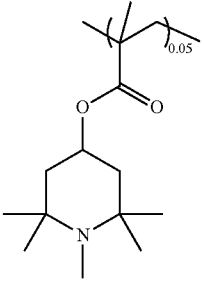

Hydrophobic resins shown below: 4 parts by mass (the mass ratio is 0.5:0.5 from left to right).

Between the following hydrophobic resins, the hydrophobic resin on the left side has a weight-average molecular weight (Mw) of 7,000, and the hydrophobic resin on the right side has a weight-average molecular weight (Mw) of 8,000. In each of the hydrophobic resins, the numerical value described for each repeating unit means molar ratio.

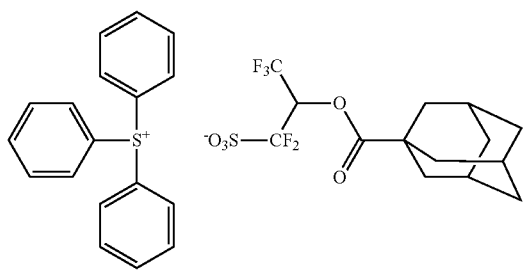

Quenchers shown below: 5 parts by mass (the mass ratio is 0.1:0.3:0.3:0.2 from left to right).

Among the following quenchers, a polymer-type quencher has a weight-average molecular weight (Mw) of 5,000. The numerical value described for each repeating unit means molar ratio.

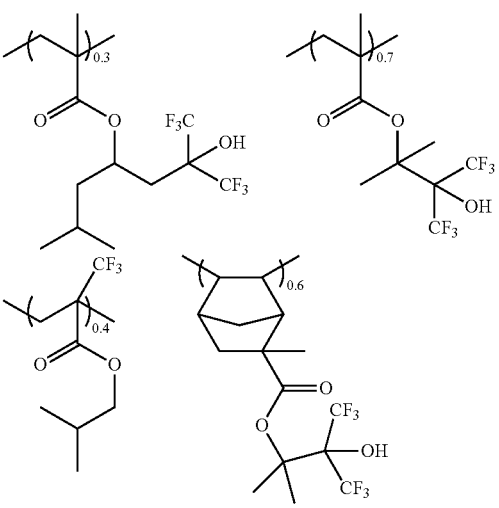

Solvent:
PGMEA: 3 parts by mass
CyHx: 600 parts by mass
γ-Butyrolactone (GBL): 100 parts by mass <Resist Composition 2>

Acid-decomposable resin (resin represented by the following formula (weight-average molecular weight (Mw): 8,000): the numerical value described for each repeating unit means mol %.): 100 parts by mass

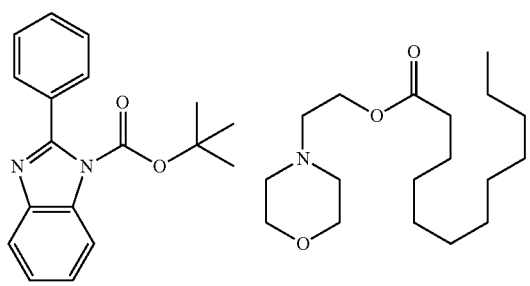

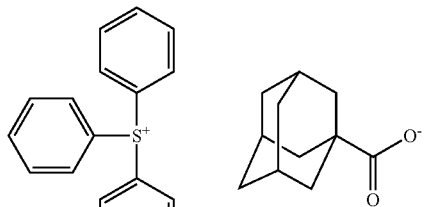

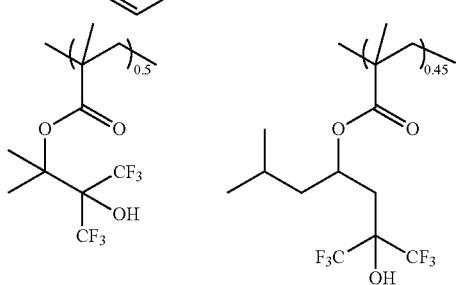

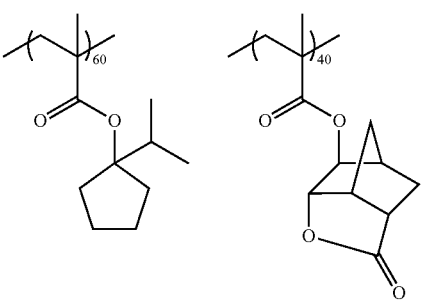

Photoacid generators shown below: 12 parts by mass (the mass ratio is 0.5:0.5 from left to right)

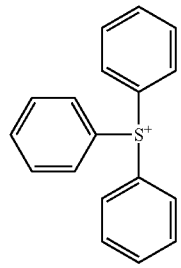
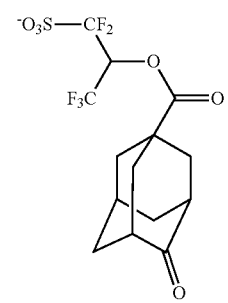

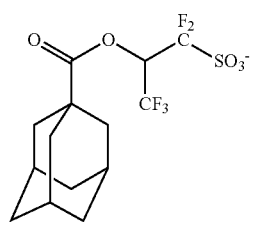
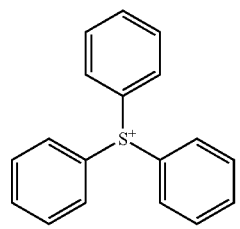

Quenchers shown below: 5 parts by mass (mass ratio is 0.3:0.7 from left to right.)

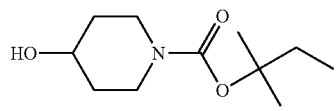

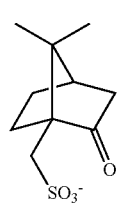
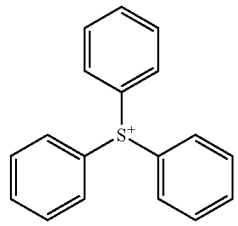

Hydrophobic resins shown below: 5 parts by mass (the mass ratio is 0.8:0.2 from top to bottom).

Between the following hydrophobic resins, the upper hydrophobic resin has a weight-average molecular weight (Mw) of 8,000, and the lower hydrophobic resin has a weight-average molecular weight (Mw) of 6,000. In each of the hydrophobic resins, the numerical value described for each repeating unit means molar ratio.

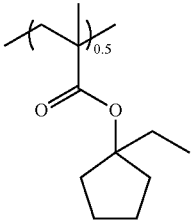
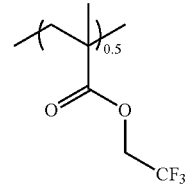

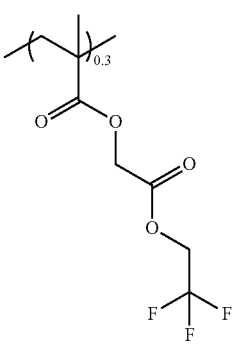
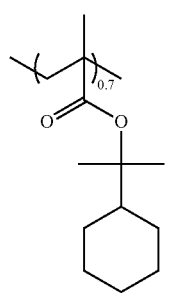

Solvent:
PGMEA: 3 parts by mass
CyHx: 600 parts by mass
γ-Butyrolactone (GBL): 100 parts by mass <Resist Composition 3>

Acid-decomposable resin (resin represented by the following formula (weight-average molecular weight (Mw): 8,000): the numerical value described for each repeating unit means mol %.): 100 parts by mass

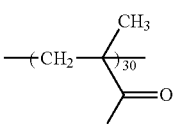
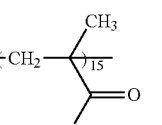

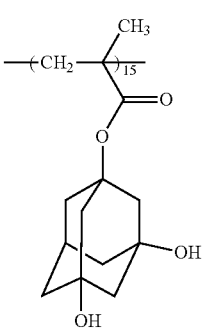
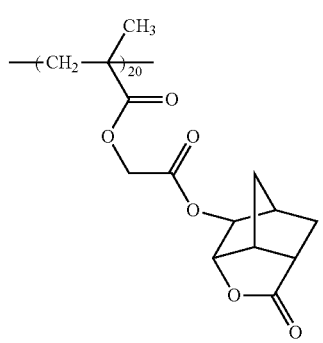

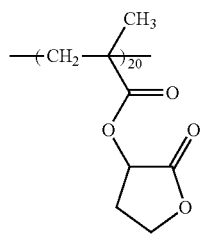

Photoacid generator shown below: 15 parts by mass

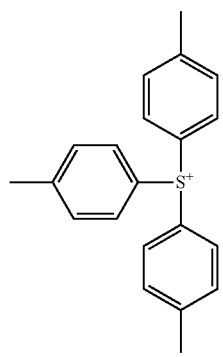

Quenchers shown below: 7 parts by mass (the mass ratio is 1:1 from left to right.)

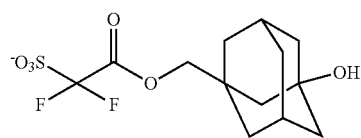

Hydrophobic resins shown below: 20 parts by mass (the mass ratio is 3:7 from top to bottom).

Between the following hydrophobic resins, the upper hydrophobic resin has a weight-average molecular weight (Mw) of 10,000, and the lower hydrophobic resin has a weight-average molecular weight (Mw) of 7,000. In the lower hydrophobic resin, the molar ratio of each of the repeating units is 0.67 and 0.33 from left to right.

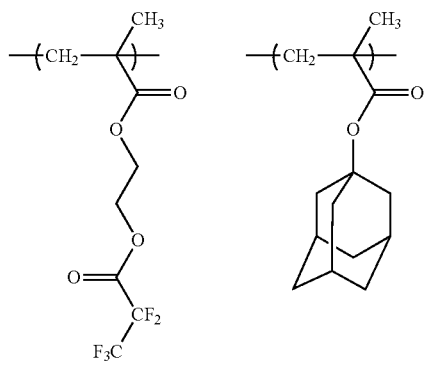

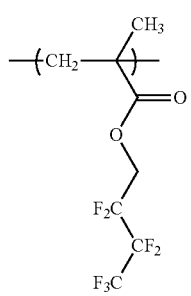

Solvent:
PGMEA: 50 parts by mass
PGME: 100 parts by mass
2-Heptanone: 100 parts by mass
γ-Butyrolactone (GBL): 500 parts by mass <Resist Composition 4>

Acid-decomposable resin (resin represented by the following formula (weight-average molecular weight (Mw): 6,500): the numerical value described for each repeating unit means mol %.): 80 parts by mass

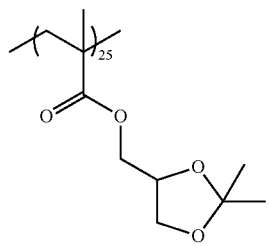

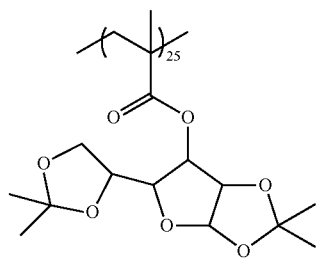

-continued

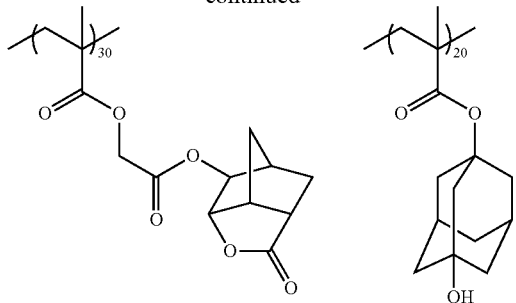

Photoacid generator shown below: 15 parts by mass

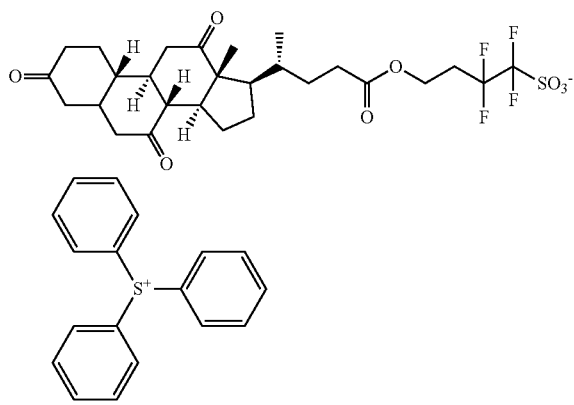

Quencher shown below: 5 parts by mass

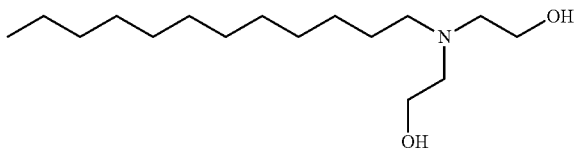 [SMILES: CCCCCCCCCCCCN(CCO)CCO]

Hydrophobic resin shown below (weight-average molecular weight (Mw): 5,000): 60 parts by mass

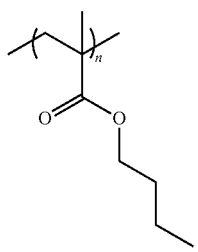

Solvent:
PGMEA: 70 parts by mass
HBM: 100 parts by mass
CyHx: 700 parts by mass

The weight-average molecular weight (Mw) of each of the resins contained in the above actinic ray-sensitive or radiation-sensitive resin compositions 1 to 4 is a value determined by a GPC method by using tetrahydrofuran (THF) as a developing solvent and expressed in terms of polystyrene.

Specifically, the following device was used.
Device: HLC-8120 manufactured by Tosoh Corporation
Column: TSK gel Multipore HXL-M manufactured by Tosoh Corporation

[Affinity between chemical liquid and acid-decomposable resin]

The affinity between each of the chemical liquids and the resin was measured using a pulsed nuclear magnetic resonance-type particle interface characteristic evaluator (trade name: include "Acorn Area", manufactured by Xigo Nanotools).

As a first test solution, a solution was used which was obtained by dissolving the acid-decomposable resin contained in each of the actinic ray-sensitive or radiation-sensitive resin compositions in each of the chemical liquids at 0.5%.

As a second test solution, a solution was used which was obtained by dissolving the acid-decomposable resin contained in each of the actinic ray-sensitive or radiation-sensitive resin compositions in each of the chemical liquids at 3.0%.

For each of the solutions, $\tau 0$, $\tau 1$, and $\tau 2$ were determined under the condition of 25° C., and Rsq1 and SRsq were calculated. The results were classified based on the following standards, and shown in Table 1.

Rsg1
A: Rsq1 was higher than 0.001.
B: Rsq1 was equal to or lower than 0.001.
SRsq
A: SRsq was higher than −1.
B: SRsq was equal to or lower than −1.

[Resist Saving Performance of Resist Composition]

The resist saving performance of the resist composition after the coating of the chemical liquid were evaluated by the following method. In the present specification, having excellent resist saving performance means that the uniformity and the film thickness controllability are excellent.

<Uniformity>

First, as a control, a silicon wafer comprising an antireflection film and having a diameter of about 30 cm (12 inches) was directly coated with the resist composition. The coating was performed using a spin coater (trade name: "LITHIUS", manufactured by Tokyo Electron Limited.). The obtained resist film was baked at 90° C. For the baked resist film, a 59-point map was measured using a film thickness measurement apparatus Lambda Ace manufactured by SCREEN Holdings Co., Ltd. so as to confirm that no coating mottle occurred. For checking the coating mottle, 59 circular measurement spots were extracted from the resist film to be measured, the thickness of the resist film was measured at each of the measurement spots, and the measured thicknesses were two-dimensionally arranged for the respective measurement spots and observed. At this time, in a case where no unevenness was found in the resist film thickness, it was considered that there was no coating mottle.

Then, another silicon wafer comprising an antireflection film and having a diameter of about 30 cm (12 inches) was prepared, and each of the chemical liquids was added dropwise thereto. Thereafter, the wafer was coated with the same amount of the resist composition used for the control, and baked at 90° C. The obtained resist film was observed by the same method as described above so as to confirm that no coating mottle occurred. Subsequently, the same test as above was performed by reducing the amount of the used resist composition such that the amount of the resist composition became 50% by mass and 30% by mass of the amount of the resist composition used for the control, and whether the coating mottle occurred was investigated.

The results were evaluated based on the following standards, and shown in Table 1.

A: Even though the amount of the used resist composition was reduced and became 30% by mass and 50% by mass of the amount of the resist composition used for the control, no coating mottle occurred.

B: Even though the amount of the used resist composition was reduced and became 50% by mass of the amount of the resist composition used for the control, no coating mottle occurred. However, in a case where the amount of the used resist composition was reduced and became 30% by mass of the amount of the resist composition used for the control, a coating mottle occurred.

C: In a case where the amount of the used resist composition was reduced and became 30% by mass and 50% by mass of the amount of the resist composition used for the control, a coating mottle occurred.

<Film Thickness Controllability>

Each of the chemical liquids was added dropwise to a silicon wafer comprising an antireflection film and having a diameter of about 30 cm (12 inches). Then, the wafer was directly coated with the aforementioned resist composition such that the thickness of the obtained resist film became 8.5 nm. The coating was performed using a spin coater (trade name: "LITHIUS", manufactured by Tokyo Electron Limited.). The obtained resist film was baked at 90° C. For the baked resist film, a 59-point map was measured using a film thickness measurement apparatus Lambda Ace manufactured by SCREEN Holdings Co., Ltd., and a standard deviation (hereinafter, referred to as "σ" as well) of the thickness of the resist film was determined. Subsequently, from the standard deviation, 3σ was determined. The results were evaluated based on the following standards, and shown in Table 1.

A: 3σ was less than 0.15 nm.
B: 3σ was equal to or greater than 0.15 nm and less than 0.2 nm.
C: 3σ was equal to or greater than 0.2 nm.

[Defect Inhibition Performance of Chemical Liquid]

The defect inhibition performance of the chemical liquid was evaluated by the following method.

First, an antireflection film was formed on a silicon wafer. Then, each of the chemical liquids was added dropwise onto the antireflection film. Thereafter, the silicon wafer was coated with the resist composition 1 by appropriately adjusting the rotation speed such that the thickness of the obtained resist film became 8.5 nm. For coating, a spin coater (trade name "LITHIUS", manufactured by Tokyo Electron Limited.) was used. The obtained resist film was baked at 90° C.

Subsequently, the obtained wafer was subjected to exposure at 25 mJ/cm$^2$ by using an ArF excimer laser scanner (NA 0.75) and then heated for 60 seconds at 120° C.

Thereafter, the wafer was developed for 60 seconds by using butyl acetate and then rinsed with MIBC for 20 seconds, thereby obtaining a resist pattern having a pitch of 60 nm and a line width of 45 nm.

Then, by using a pattern defect device (for example, a MULTIPURPOSE Scanning Electron Microscope (SEM) "Inspago" RS6000 series manufactured by Hitachi-High Technologies Corporation), the number of defects on the pattern of the wafer on which the resist pattern was formed was measured. The results were evaluated based on the following standards.

Evaluation Standards

AA: The number of defects was equal to or smaller than 30.
A: The number of defects was greater than 30 and equal to or smaller than 50.
B: The number of defects was greater than 50 and equal to or smaller than 100.
C: The number of defects was greater than 100 and equal to or smaller than 150.
D: The number of defects was greater than 150.

[Developability]

By the same method as the method used for evaluating the defect inhibition performance of the chemical liquid, resist patterns were formed using the resist compositions 1 to 4. Then, by using a critical dimension-scanning electron microscope (S9380II manufactured by Hitachi, LTD.), the top surface of the line pattern and the space portion were observed. Based on the width of a line pattern formed in a shape preferred for practical use without breaking, the developability was evaluated. The smaller the dimension of the formed pattern, the better the performance. In the following evaluation standards, L/S less than 80 nm means that a pattern in which each of the line and the space has a width of 80 nm can be formed.

Evaluation Standards

A: L/S was less than 80 nm.
B: L/S was equal to or greater than 80 nm and less than 120 nm.
C: L/S was equal to or greater than 120 nm and less than 150 nm.
D: L/S was equal to or greater than 150 nm.

[Evaluation of Ashing Residue Removing Performance]

A silicon wafer was coated with the resist composition 1, exposed, and heated, thereby preparing a wafer comprising a solidified resist film. Then, by using a plasma gas, ashing removal was performed on the resist film, and the resist film was washed using each of the chemical liquids described in Table 1 as a rinsing solution, thereby removing ashing residues. Thereafter, by using SP-2 (manufactured by KLA-Tencor Corporation), the number of defects on the washed wafer was counted.

Evaluation Standards

A: The number of defects was equal to or smaller than 50.
B: The number of defects was greater than 50 and equal to or smaller than 80.
C: The number of defects was greater than 80 and equal to or smaller than 100.
D: The number of defects was greater than 100.

[Evaluation of p-CMP Defect Inhibition Performance]

The surface of SEMATECH 845 (copper wiring, barrier metal: TaN, oxide film: TEOS; manufactured by SEMATECH Co., Ltd.) having a diameter of 12 inches was planarized by being polished with CSL 9044C (slurry manufactured by FUJIFILM Planar Solutions, LLC), and then finished up with polishing by using BSL 8178C (slurry manufactured by FUJIFILM Planar Solutions, LLC).

Thereafter, the wafer was washed with Clean 100 (manufactured by Wako Pure Chemical Industries, Ltd.), and then each of the chemical liquids was used as a rinsing solution. Subsequently, by using a pattern defect device (ComPLUS manufactured by Applied Materials, Inc.), the number of defects on the pattern of the wafer, on which the resist pattern described above (formed on SEMATECH 845) was formed, was measured. The results were evaluated based on the following standards.

Evaluation Standards

A: The number of defects was equal to or smaller than 50.
B: The number of defects was greater than 50 and equal to or smaller than 80.
C: The number of defects was greater than 80 and equal to or smaller than 100.
D: The number of defects was greater than 100.

TABLE 1

| [Table 1-1-1] | Type | Content (% by mass) | Molar mass (g/mol) | Vapor pressure (Pa) | Surface tension (mN/m) | fd | fp | fh | HP |
|---|---|---|---|---|---|---|---|---|---|
| Example 1 | CyHx | 100 | 98.14 | 507 | 34.1 | 61.0 | 21.6 | 17.5 | 1 |
| Example 2 | PGMEA | 100 | 132.16 | 493 | 27.9 | 56.5 | 19.8 | 23.7 | 1 |
| Example 3 | EL | 100 | 118.13 | 187 | 29.8 | 55.5 | 19.8 | 24.7 | 1 |
| Example 4 | MMP | 100 | 118.13 | 320 | 33.6 | 53.0 | 22.0 | 25.0 | 1 |
| Example 5 | nBA | 100 | 116.2 | 1,200 | 24.8 | 60.5 | 17.2 | 22.2 | 1 |
| Example 6 | PGME | 30 | 90.1 | 1,453 | 27.6 | 43.2 | 28.8 | 28.0 | 1 |
| Example 7 | PGME | 30 | 90.1 | 1,453 | 27.6 | 43.2 | 28.8 | 28.0 | 1 |
| Example 8 | PGME | 30 | 90.1 | 1,453 | 27.6 | 43.2 | 28.8 | 28.0 | 1 |
| Example 9 | PGME | 30 | 90.1 | 1,453 | 27.6 | 43.2 | 28.8 | 28.0 | 1 |
| Example 10 | PGME | 30 | 90.1 | 1,453 | 27.6 | 43.2 | 28.8 | 28.0 | 1 |
| Example 11 | PGME | 50 | 90.1 | 1,453 | 27.6 | 43.2 | 28.8 | 28.0 | 1 |
| Example 12 | PGME | 50 | 90.1 | 1,453 | 27.6 | 43.2 | 28.8 | 28.0 | 1 |
| Example 13 | PGME | 50 | 90.1 | 1,453 | 27.6 | 43.2 | 28.8 | 28.0 | 1 |
| Example 14 | PGME | 50 | 90.1 | 1,453 | 27.6 | 43.2 | 28.8 | 28.0 | 1 |
| Example 15 | PGME | 50 | 90.1 | 1,453 | 27.6 | 43.2 | 28.8 | 28.0 | 1 |
| Example 16 | CyPn | 30 | 84.1 | 1,520 | 33.8 | 60.0 | 21.8 | 18.2 | 1 |
| Example 17 | CyPn | 30 | 84.1 | 1,520 | 33.8 | 60.0 | 21.8 | 18.2 | 1 |
| Example 18 | CyPn | 30 | 84.1 | 1,520 | 33.8 | 60.0 | 21.8 | 18.2 | 1 |
| Example 19 | CyPn | 30 | 84.1 | 1,520 | 33.8 | 60.0 | 21.8 | 18.2 | 1 |
| Example 20 | CyPn | 30 | 84.1 | 1,520 | 33.8 | 60.0 | 21.8 | 18.2 | 1 |
| Example 21 | CyPn | 50 | 84.1 | 1,520 | 33.8 | 60.0 | 21.8 | 18.2 | 1 |
| Example 22 | CyPn | 50 | 84.1 | 1,520 | 33.8 | 60.0 | 21.8 | 18.2 | 1 |
| Example 23 | CyPn | 50 | 84.1 | 1,520 | 33.8 | 60.0 | 21.8 | 18.2 | 1 |
| Example 24 | CyPn | 50 | 84.1 | 1,520 | 33.8 | 60.0 | 21.8 | 18.2 | 1 |
| Example 25 | CyPn | 50 | 84.1 | 1,520 | 33.8 | 60.0 | 21.8 | 18.2 | 1 |
| Example 26 | nBA | 30 | 116.2 | 1,200 | 24.8 | 60.5 | 17.2 | 22.2 | 1 |
| Example 27 | nBA | 30 | 116.2 | 1,200 | 24.8 | 60.5 | 17.2 | 22.2 | 1 |
| Example 28 | nBA | 30 | 116.2 | 1,200 | 24.8 | 60.5 | 17.2 | 22.2 | 1 |
| Example 29 | nBA | 30 | 116.2 | 1,200 | 24.8 | 60.5 | 17.2 | 22.2 | 1 |
| Example 30 | nBA | 30 | 116.2 | 1,200 | 24.8 | 60.5 | 17.2 | 22.2 | 1 |
| Example 31 | nBA | 30 | 116.2 | 1,200 | 24.8 | 60.5 | 17.2 | 22.2 | 1 |
| Example 32 | nBA | 30 | 116.2 | 1,200 | 24.8 | 60.5 | 17.2 | 22.2 | 1 |
| Example 33 | nBA | 30 | 116.2 | 1,200 | 24.8 | 60.5 | 17.2 | 22.2 | 1 |

TABLE 2

| [Table 1-1-2] | Type | Content (% by mass) | Molar mass (g/mol) | Vapor pressure (Pa) | Surface tension (mN/m) | fd | fp | fh | HP |
|---|---|---|---|---|---|---|---|---|---|
| Example 1 | | | | | | | | | |
| Example 2 | | | | | | | | | |
| Example 3 | | | | | | | | | |
| Example 4 | | | | | | | | | |
| Example 5 | | | | | | | | | |
| Example 6 | PGMEA | 70 | 132.16 | 493 | 27.9 | 56.5 | 19.8 | 23.7 | 1 |
| Example 7 | CyHx | 70 | 98.14 | 507 | 34.1 | 61.0 | 21.6 | 17.5 | 1 |
| Example 8 | EL | 70 | 118.13 | 187 | 29.8 | 55.5 | 19.8 | 24.7 | 1 |
| Example 9 | HBM | 70 | 118.13 | 267 | 29.1 | 46.0 | 20.1 | 34.0 | 1 |
| Example 10 | DBCPN | 70 | 130.18 | 400 | 30.2 | 65.4 | 18.1 | 16.5 | 1 |
| Example 11 | GBL | 50 | 86.08 | 147 | 44.1 | 42.9 | 39.5 | 17.6 | 1 |
| Example 12 | DMSO | 50 | 78.13 | 13 | 43.6 | 40.9 | 36.4 | 22.7 | 1 |
| Example 13 | EC | 50 | 88.06 | 67 | 41.5 | 42.0 | 47.0 | 11.0 | 1 |

TABLE 2-continued

| | Components of chemical liquid Main agent Organic solvent | | | | | | | |
|---|---|---|---|---|---|---|---|---|
| [Table 1-1-2] Type | Content (% by mass) | Molar mass (g/mol) | Vapor pressure (Pa) | Surface tension (mN/m) | fd | fp | fh | HP |
| Example 14 PC | 50 | 102.09 | 53 | 40.9 | 47.5 | 42.8 | 9.7 | 1 |
| Example 15 NMP | 50 | 99.13 | 40 | 41.3 | 48.0 | 32.8 | 19.2 | 1 |
| Example 16 PGMEA | 70 | 132.16 | 493 | 27.9 | 56.5 | 19.8 | 23.7 | 1 |
| Example 17 CyHx | 70 | 98.14 | 507 | 34.1 | 61.0 | 21.6 | 17.5 | 1 |
| Example 18 EL | 70 | 118.13 | 187 | 29.8 | 55.5 | 19.8 | 24.7 | 1 |
| Example 19 HBM | 70 | 118.13 | 267 | 29.1 | 46.0 | 20.1 | 34.0 | 1 |
| Example 20 DBCPN | 70 | 130.18 | 400 | 30.2 | 65.4 | 18.1 | 16.5 | 1 |
| Example 21 GBL | 50 | 86.08 | 147 | 44.1 | 42.9 | 39.5 | 17.6 | 1 |
| Example 22 DMSO | 50 | 78.13 | 13 | 43.6 | 40.9 | 36.4 | 22.7 | 1 |
| Example 23 EC | 50 | 88.06 | 67 | 41.5 | 42.0 | 47.0 | 11.0 | 1 |
| Example 24 PC | 50 | 102.09 | 53 | 40.9 | 47.5 | 42.8 | 9.7 | 1 |
| Example 25 NMP | 50 | 99.13 | 40 | 41.3 | 48.0 | 32.8 | 19.2 | 1 |
| Example 26 PGMEA | 70 | 132.16 | 493 | 27.9 | 56.5 | 19.8 | 23.7 | 1 |
| Example 27 CyHx | 70 | 98.14 | 507 | 34.1 | 61.0 | 21.6 | 17.5 | 1 |
| Example 28 EL | 70 | 118.13 | 187 | 29.8 | 55.5 | 19.8 | 24.7 | 1 |
| Example 29 HBM | 70 | 118.13 | 267 | 29.1 | 46.0 | 20.1 | 34.0 | 1 |
| Example 30 DBCPN | 70 | 130.18 | 400 | 30.2 | 65.4 | 18.1 | 16.5 | 1 |
| Example 31 GBL | 70 | 86.08 | 147 | 44.1 | 42.9 | 39.5 | 17.6 | 1 |
| Example 32 DMSO | 70 | 78.13 | 13 | 43.6 | 40.9 | 36.4 | 22.7 | 1 |
| Example 33 EC | 70 | 88.06 | 67 | 41.5 | 42.0 | 47.0 | 11.0 | 1 |

TABLE 3

| | Components of chemical liquid Main agent Organic solvent | | | | | | | | | |
|---|---|---|---|---|---|---|---|---|---|---|
| [Table 1-1-3] Type | Content (% by mass) | Molar mass (g/mol) | Vapor pressure (Pa) | Surface tension (mN/m) | fd | fp | fh | HP | Vapor pressure (Pa) | Surface tension (mN/m) |
| Example 1 | | | | | | | | | 507 | 34.1 |
| Example 2 | | | | | | | | | 493 | 27.9 |
| Example 3 | | | | | | | | | 187 | 29.8 |
| Example 4 | | | | | | | | | 320 | 33.6 |
| Example 5 | | | | | | | | | 1,200 | 24.8 |
| Example 6 | | | | | | | | | 864 | 27.8 |
| Example 7 | | | | | | | | | 808 | 32.0 |
| Example 8 | | | | | | | | | 642 | 29.0 |
| Example 9 | | | | | | | | | 693 | 28.6 |
| Example 10 | | | | | | | | | 803 | 29.2 |
| Example 11 | | | | | | | | | 785 | 36.0 |
| Example 12 | | | | | | | | | 682 | 36.2 |
| Example 13 | | | | | | | | | 752 | 34.6 |
| Example 14 | | | | | | | | | 797 | 33.8 |
| Example 15 | | | | | | | | | 780 | 34.1 |
| Example 16 | | | | | | | | | 906 | 30.3 |
| Example 17 | | | | | | | | | 844 | 34.0 |
| Example 18 | | | | | | | | | 688 | 31.3 |
| Example 19 | | | | | | | | | 738 | 30.9 |
| Example 20 | | | | | | | | | 847 | 31.6 |
| Example 21 | | | | | | | | | 841 | 38.9 |
| Example 22 | | | | | | | | | 739 | 38.9 |
| Example 23 | | | | | | | | | 810 | 37.6 |
| Example 24 | | | | | | | | | 857 | 37.0 |
| Example 25 | | | | | | | | | 841 | 37.2 |
| Example 26 | | | | | | | | | 725 | 26.9 |
| Example 27 | | | | | | | | | 691 | 31.6 |
| Example 28 | | | | | | | | | 494 | 28.3 |
| Example 29 | | | | | | | | | 550 | 27.8 |
| Example 30 | | | | | | | | | 660 | 28.4 |
| Example 31 | | | | | | | | | 401 | 39.4 |
| Example 32 | | | | | | | | | 279 | 39.4 |
| Example 33 | | | | | | | | | 345 | 37.4 |

TABLE 4

| [Table 1-1-4] | Components of chemical liquid Main agent Content (% by mass) | Components of chemical liquid Surfactant Type | Components of chemical liquid Surfactant Content (mass ppm) | Impurity metal Total content of impurity metal (mass ppt) Fe | Cr | Ni | Pb | Others | Total |
|---|---|---|---|---|---|---|---|---|---|
| Example 1 | Balance | A | 100 | 0.004 | 0.002 | 0.006 | 0.002 | 0.042 | 0.056 |
| Example 2 | Balance | F | 100 | 0.004 | 0.002 | 0.006 | 0.002 | 0.042 | 0.056 |
| Example 3 | Balance | C | 50 | 0.004 | 0.002 | 0.004 | 0.004 | 0.042 | 0.056 |
| Example 4 | Balance | A | 100 | 0.006 | 0.002 | 0.006 | 0.004 | 0.054 | 0.072 |
| Example 5 | Balance | B | 100 | 0.006 | 0.002 | 0.006 | 0.004 | 0.054 | 0.072 |
| Example 6 | Balance | A | 100 | 0.004 | 0.002 | 0.006 | 0.002 | 0.042 | 0.056 |
| Example 7 | Balance | E | 100 | 0.004 | 0.004 | 0.006 | 0.002 | 0.048 | 0.064 |
| Example 8 | Balance | G | 50 | 0.004 | 0.002 | 0.004 | 0.004 | 0.042 | 0.056 |
| Example 9 | Balance | D | 100 | 0.002 | 0.002 | 0.006 | 0.002 | 0.036 | 0.048 |
| Example 10 | Balance | E | 100 | 0.006 | 0.002 | 0.008 | 0.002 | 0.054 | 0.072 |
| Example 11 | Balance | B | 100 | 0.006 | 0.002 | 0.004 | 0.002 | 0.042 | 0.056 |
| Example 12 | Balance | C | 100 | 0.004 | 0.002 | 0.006 | 0.002 | 0.042 | 0.056 |
| Example 13 | Balance | H | 100 | 0.006 | 0.002 | 0.004 | 0.004 | 0.048 | 0.064 |
| Example 14 | Balance | A | 300 | 0.004 | 0.004 | 0.008 | 0.002 | 0.054 | 0.072 |
| Example 15 | Balance | I | 50 | 0.004 | 0.006 | 0.006 | 0.004 | 0.06 | 0.08 |
| Example 16 | Balance | A | 100 | 0.008 | 0.002 | 0.008 | 0.002 | 0.06 | 0.08 |
| Example 17 | Balance | J | 1,000 | 0.004 | 0.004 | 0.004 | 0.004 | 0.048 | 0.064 |
| Example 18 | Balance | D | 100 | 0.004 | 0.002 | 0.006 | 0.004 | 0.048 | 0.064 |
| Example 19 | Balance | B | 100 | 0.004 | 0.004 | 0.004 | 0.002 | 0.042 | 0.056 |
| Example 20 | Balance | A | 100 | 0.004 | 0.004 | 0.006 | 0.004 | 0.054 | 0.072 |
| Example 21 | Balance | J | 300 | 0.004 | 0.004 | 0.006 | 0.004 | 0.054 | 0.072 |
| Example 22 | Balance | E | 100 | 0.004 | 0.002 | 0.006 | 0.004 | 0.048 | 0.064 |
| Example 23 | Balance | A | 100 | 0.004 | 0.004 | 0.006 | 0.002 | 0.048 | 0.064 |
| Example 24 | Balance | G | 50 | 0.006 | 0.004 | 0.004 | 0.004 | 0.054 | 0.072 |
| Example 25 | Balance | A | 1,000 | 0.004 | 0.002 | 0.006 | 0.002 | 0.042 | 0.056 |
| Example 26 | Balance | I | 300 | 0.008 | 0.006 | 0.004 | 0.002 | 0.06 | 0.08 |
| Example 27 | Balance | D | 100 | 0.006 | 0.004 | 0.004 | 0.004 | 0.054 | 0.072 |
| Example 28 | Balance | J | 100 | 0.004 | 0.002 | 0.008 | 0.002 | 0.048 | 0.064 |
| Example 29 | Balance | A | 100 | 0.006 | 0.004 | 0.006 | 0.004 | 0.06 | 0.08 |
| Example 30 | Balance | A | 50 | 0.004 | 0.002 | 0.004 | 0.004 | 0.042 | 0.056 |
| Example 31 | Balance | E | 50 | 0.006 | 0.002 | 0.006 | 0.002 | 0.048 | 0.064 |
| Example 32 | Balance | A | 100 | 0.004 | 0.004 | 0.006 | 0.004 | 0.054 | 0.072 |
| Example 33 | Balance | C | 1,000 | 0.006 | 0.002 | 0.006 | 0.002 | 0.048 | 0.064 |

TABLE 5

| [Table 1-1-5] | Components of chemical liquid Impurity metal Content of particles containing following impurity metal (mass ppt) Fe | Cr | Ni | Pb | Others | Total | Organic impurity Content (mass ppm) Total | Organic impurity Content (mass ppm) High-boiling-point component | Water Content (% by mass) |
|---|---|---|---|---|---|---|---|---|---|
| Example 1 | 0.002 | 0.001 | 0.003 | 0.001 | 0.015 | 0.022 | 250 | 1.0 | 0.10% |
| Example 2 | 0.002 | 0.001 | 0.003 | 0.001 | 0.015 | 0.022 | 300 | 1.2 | 0.10% |
| Example 3 | 0.002 | 0.001 | 0.002 | 0.002 | 0.017 | 0.024 | 180 | 0.7 | 0.10% |
| Example 4 | 0.003 | 0.001 | 0.004 | 0.001 | 0.018 | 0.027 | 324 | 1.3 | 0.10% |
| Example 5 | 0.003 | 0.001 | 0.004 | 0.001 | 0.018 | 0.027 | 227 | 0.9 | 0.10% |
| Example 6 | 0.002 | 0.001 | 0.003 | 0.001 | 0.015 | 0.022 | 204 | 0.8 | 0.10% |
| Example 7 | 0.002 | 0.002 | 0.003 | 0.001 | 0.016 | 0.024 | 102 | 0.4 | 0.10% |
| Example 8 | 0.002 | 0.001 | 0.002 | 0.002 | 0.017 | 0.024 | 276 | 1.1 | 0.10% |
| Example 9 | 0.001 | 0.001 | 0.003 | 0.001 | 0.019 | 0.025 | 165 | 0.7 | 0.10% |
| Example 10 | 0.003 | 0.001 | 0.004 | 0.001 | 0.018 | 0.027 | 198 | 0.8 | 0.10% |
| Example 11 | 0.003 | 0.001 | 0.002 | 0.001 | 0.017 | 0.024 | 119 | 0.5 | 0.10% |
| Example 12 | 0.002 | 0.001 | 0.003 | 0.001 | 0.015 | 0.022 | 238 | 1.0 | 0.10% |
| Example 13 | 0.003 | 0.001 | 0.002 | 0.002 | 0.016 | 0.024 | 214 | 0.9 | 0.10% |
| Example 14 | 0.002 | 0.002 | 0.004 | 0.001 | 0.018 | 0.027 | 150 | 0.6 | 0.10% |
| Example 15 | 0.002 | 0.003 | 0.003 | 0.002 | 0.021 | 0.031 | 135 | 0.5 | 0.10% |
| Example 16 | 0.004 | 0.001 | 0.004 | 0.001 | 0.019 | 0.029 | 67 | 0.3 | 0.10% |
| Example 17 | 0.002 | 0.002 | 0.002 | 0.002 | 0.02 | 0.028 | 182 | 0.7 | 0.10% |
| Example 18 | 0.002 | 0.001 | 0.003 | 0.002 | 0.016 | 0.024 | 109 | 0.4 | 0.10% |
| Example 19 | 0.002 | 0.002 | 0.002 | 0.001 | 0.015 | 0.022 | 131 | 0.5 | 0.10% |
| Example 20 | 0.002 | 0.002 | 0.003 | 0.002 | 0.016 | 0.025 | 79 | 0.3 | 0.10% |
| Example 21 | 0.002 | 0.002 | 0.003 | 0.002 | 0.017 | 0.026 | 157 | 0.6 | 0.10% |
| Example 22 | 0.002 | 0.001 | 0.003 | 0.002 | 0.016 | 0.024 | 142 | 0.6 | 0.10% |
| Example 23 | 0.002 | 0.002 | 0.003 | 0.001 | 0.017 | 0.025 | 99 | 0.4 | 0.10% |

TABLE 5-continued

| | Components of chemical liquid | | | | | | | | |
|---|---|---|---|---|---|---|---|---|---|
| | Impurity metal | | | | | | Organic impurity Content (mass ppm) | | Water |
| | Content of particles containing following impurity metal (mass ppt) | | | | | | High-boiling- | | Content |
| [Table 1-1-5] | Fe | Cr | Ni | Pb | Others | Total | Total | point component | (% by mass) |
| Example 24 | 0.003 | 0.002 | 0.002 | 0.002 | 0.015 | 0.024 | 89 | 0.4 | 0.10% |
| Example 25 | 0.002 | 0.001 | 0.003 | 0.001 | 0.016 | 0.023 | 45 | 0.2 | 0.10% |
| Example 26 | 0.004 | 0.003 | 0.002 | 0.001 | 0.016 | 0.026 | 121 | 0.5 | 0.10% |
| Example 27 | 0.003 | 0.002 | 0.002 | 0.002 | 0.013 | 0.022 | 145 | 0.6 | 0.10% |
| Example 28 | 0.002 | 0.001 | 0.004 | 0.001 | 0.014 | 0.022 | 174 | 0.7 | 0.10% |
| Example 29 | 0.003 | 0.002 | 0.003 | 0.002 | 0.015 | 0.025 | 104 | 0.4 | 0.10% |
| Example 30 | 0.002 | 0.001 | 0.002 | 0.002 | 0.016 | 0.023 | 208 | 0.8 | 0.10% |
| Example 31 | 0.002 | 0.001 | 0.003 | 0.001 | 0.015 | 0.022 | 187 | 0.7 | 0.10% |
| Example 32 | 0.002 | 0.002 | 0.003 | 0.001 | 0.016 | 0.024 | 131 | 0.5 | 0.10% |
| Example 33 | 0.002 | 0.001 | 0.002 | 0.002 | 0.017 | 0.024 | 118 | 0.5 | 0.10% |

TABLE 6

| | Physical properties of chemical liquid | | | Evaluation | | | | | | |
|---|---|---|---|---|---|---|---|---|---|---|
| | | | | | | Type of resist composition | | | | |
| | | | | | | Resist saving performance | | | | |
| | Number of coarse particles | Content of surfactant/total content of | Content of surfactant/content of high-boiling- | Defect inhibition | Affinity | | | Film thickness | | |
| [Table 1-1-6] | (number/ml) | particles | point component | performance | Rsq1 | SRsq | Uniformity | controllability | Developability |
| Example 1 | 5 | $4.5 \times 10^9$ | $1.0 \times 10^2$ | AA | 1 | A | A | A | A | A |
| Example 2 | 6 | $4.5 \times 10^9$ | $8.3 \times 10^1$ | A | 1 | A | A | A | A | A |
| Example 3 | 4 | $2.1 \times 10^9$ | $6.9 \times 10^1$ | AA | 1 | A | A | A | A | A |
| Example 4 | 6 | $3.7 \times 10^9$ | $7.7 \times 10^1$ | AA | 1 | A | A | A | A | A |
| Example 5 | 5 | $3.7 \times 10^9$ | $1.1 \times 10^2$ | AA | 1 | A | A | A | C | A |
| Example 6 | 4 | $4.5 \times 10^9$ | $1.2 \times 10^2$ | AA | 1 | A | A | A | A | A |
| Example 7 | 2 | $4.2 \times 10^9$ | $2.4 \times 10^2$ | A | 1 | A | A | A | A | A |
| Example 8 | 6 | $2.1 \times 10^9$ | $4.5 \times 10^1$ | A | 1 | A | A | A | A | A |
| Example 9 | 3 | $4.0 \times 10^9$ | $1.5 \times 10^2$ | A | 1 | A | A | A | A | A |
| Example 10 | 4 | $3.7 \times 10^9$ | $1.3 \times 10^2$ | A | 1 | A | A | A | A | A |
| Example 11 | 2 | $4.2 \times 10^9$ | $2.1 \times 10^2$ | AA | 1 | A | A | A | A | A |
| Example 12 | 5 | $4.5 \times 10^9$ | $1.1 \times 10^2$ | AA | 1 | A | A | A | A | A |
| Example 13 | 4 | $4.2 \times 10^9$ | $1.2 \times 10^2$ | A | 1 | A | A | A | A | A |
| Example 14 | 3 | $1.1 \times 10^{10}$ | $5.0 \times 10^2$ | AA | 1 | A | A | A | A | A |
| Example 15 | 3 | $1.6 \times 10^9$ | $9.3 \times 10^1$ | A | 1 | A | A | A | A | A |
| Example 16 | 1 | $3.4 \times 10^9$ | $3.7 \times 10^2$ | AA | 1 | A | A | A | A | A |
| Example 17 | 4 | $3.6 \times 10^{10}$ | $1.4 \times 10^3$ | A | 1 | A | A | A | A | A |
| Example 18 | 2 | $4.2 \times 10^9$ | $2.3 \times 10^2$ | A | 1 | A | A | A | A | A |
| Example 19 | 3 | $4.5 \times 10^9$ | $1.9 \times 10^2$ | AA | 1 | A | A | A | A | A |
| Example 20 | 2 | $4.0 \times 10^9$ | $3.2 \times 10^2$ | AA | 1 | A | A | A | A | A |
| Example 21 | 3 | $1.2 \times 10^{10}$ | $4.8 \times 10^2$ | A | 1 | A | A | A | A | A |
| Example 22 | 3 | $4.2 \times 10^9$ | $1.8 \times 10^2$ | A | 1 | A | A | A | A | A |
| Example 23 | 2 | $4.0 \times 10^9$ | $2.5 \times 10^2$ | AA | 1 | A | A | A | A | A |
| Example 24 | 2 | $2.1 \times 10^9$ | $1.4 \times 10^2$ | A | 1 | A | A | A | A | A |
| Example 25 | 0.9 | $4.3 \times 10^{10}$ | $5.6 \times 10^3$ | AA | 1 | A | A | B | A | A |
| Example 26 | 2 | $1.2 \times 10^{10}$ | $6.2 \times 10^2$ | A | 1 | A | A | A | A | A |
| Example 27 | 3 | $4.5 \times 10^9$ | $1.7 \times 10^2$ | A | 1 | A | A | A | A | A |
| Example 28 | 3 | $4.5 \times 10^9$ | $1.4 \times 10^2$ | A | 1 | A | A | A | A | A |
| Example 29 | 2 | $4.0 \times 10^9$ | $2.4 \times 10^2$ | AA | 1 | A | A | A | A | A |
| Example 30 | 4 | $2.2 \times 10^9$ | $6.0 \times 10^1$ | AA | 1 | A | A | A | A | A |
| Example 31 | 4 | $2.3 \times 10^9$ | $6.7 \times 10^1$ | A | 1 | A | A | A | A | A |
| Example 32 | 3 | $4.2 \times 10^9$ | $1.9 \times 10^2$ | AA | 1 | A | A | A | A | A |
| Example 33 | 2 | $4.2 \times 10^{10}$ | $2.1 \times 10^3$ | AA | 1 | A | A | A | A | A |

TABLE 7

| [Table 1-1-7] | Type of resist composition | Affinity Rsq1 | SRsq | Uniformity | Film thickness controllability | Developability | Type of resist composition | Affinity Rsq1 | SRsq | Uniformity | Film thickness controllability | Developability |
|---|---|---|---|---|---|---|---|---|---|---|---|---|
| Example 1  | 2 | A | A | A | A | A | 3 | A | A | A | A | A |
| Example 2  | 2 | A | A | A | A | A | 3 | A | A | A | A | A |
| Example 3  | 2 | A | A | A | A | A | 3 | A | A | A | A | A |
| Example 4  | 2 | A | A | A | A | A | 3 | A | A | A | A | A |
| Example 5  | 2 | A | A | A | C | A | 3 | A | A | A | C | A |
| Example 6  | 2 | A | A | A | A | A | 3 | A | A | A | A | A |
| Example 7  | 2 | A | A | A | A | A | 3 | A | A | A | A | A |
| Example 8  | 2 | A | A | A | A | A | 3 | A | A | A | A | A |
| Example 9  | 2 | A | A | A | A | A | 3 | A | A | A | A | A |
| Example 10 | 2 | A | A | A | A | A | 3 | A | A | A | A | A |
| Example 11 | 2 | A | A | A | A | A | 3 | A | A | A | A | A |
| Example 12 | 2 | A | A | A | A | A | 3 | A | A | A | A | A |
| Example 13 | 2 | A | A | A | A | A | 3 | A | A | A | A | A |
| Example 14 | 2 | A | A | A | A | A | 3 | A | A | A | A | A |
| Example 15 | 2 | A | A | A | A | A | 3 | A | A | A | A | A |
| Example 16 | 2 | A | A | A | A | A | 3 | A | A | A | A | A |
| Example 17 | 2 | A | A | A | A | A | 3 | A | A | A | A | A |
| Example 18 | 2 | A | A | A | A | A | 3 | A | A | A | A | A |
| Example 19 | 2 | A | A | A | A | A | 3 | A | A | A | A | A |
| Example 20 | 2 | A | A | A | A | A | 3 | A | A | A | A | A |
| Example 21 | 2 | A | A | A | A | A | 3 | A | A | A | A | A |
| Example 22 | 2 | A | A | A | A | A | 3 | A | A | A | A | A |
| Example 23 | 2 | A | A | A | A | A | 3 | A | A | A | A | A |
| Example 24 | 2 | A | A | A | A | A | 3 | A | A | A | A | A |
| Example 25 | 2 | A | A | B | A | A | 3 | A | A | B | A | A |
| Example 26 | 2 | A | A | A | A | A | 3 | A | A | A | A | A |
| Example 27 | 2 | A | A | A | A | A | 3 | A | A | A | A | A |
| Example 28 | 2 | A | A | A | A | A | 3 | A | A | A | A | A |
| Example 29 | 2 | A | A | A | A | A | 3 | A | A | A | A | A |
| Example 30 | 2 | A | A | A | A | A | 3 | A | A | A | A | A |
| Example 31 | 2 | A | A | A | A | A | 3 | A | A | A | A | A |
| Example 32 | 2 | A | A | A | A | A | 3 | A | A | A | A | A |
| Example 33 | 2 | A | A | A | A | A | 3 | A | A | A | A | A |

TABLE 8

| [Table 1-1-8] | Type of resist composition | Affinity Rsq1 | SRsq | Uniformity | Film thickness controllability | Developability | Evaluation of p-CMP defect inhibition performance | Evaluation of ashing residue removing performance |
|---|---|---|---|---|---|---|---|---|
| Example 1  | 4 | A | A | A | A | A | A | A |
| Example 2  | 4 | A | A | A | A | A | A | A |
| Example 3  | 4 | A | A | A | A | A | A | A |
| Example 4  | 4 | A | A | A | A | A | A | A |
| Example 5  | 4 | A | A | A | C | A | A | A |
| Example 6  | 4 | A | A | A | A | A | A | A |
| Example 7  | 4 | A | A | A | A | A | A | A |
| Example 8  | 4 | A | A | A | A | A | A | A |
| Example 9  | 4 | A | A | A | A | A | A | A |
| Example 10 | 4 | A | A | A | A | A | A | A |
| Example 11 | 4 | A | A | A | A | A | A | A |
| Example 12 | 4 | A | A | A | A | A | A | A |
| Example 13 | 4 | A | A | A | A | A | A | A |
| Example 14 | 4 | A | A | A | A | A | A | A |
| Example 15 | 4 | A | A | A | A | A | A | A |
| Example 16 | 4 | A | A | A | A | A | A | A |
| Example 17 | 4 | A | A | A | A | A | A | A |
| Example 18 | 4 | A | A | A | A | A | A | A |
| Example 19 | 4 | A | A | A | A | A | A | A |

TABLE 8-continued

| [Table 1-1-8] | Evaluation Type of resist composition | | | | | | |
|---|---|---|---|---|---|---|---|
| | Resist saving performance | | | | Evaluation of p-CMP defect inhibition performance | Evaluation of ashing residue removing performance |
| | Affinity | | | Film thickness controllability | Developability | | |
| | Rsq1 | SRsq | Uniformity | | | | |
| Example 20 | 4 | A | A | A | A | A | A | A |
| Example 21 | 4 | A | A | A | A | A | A | A |
| Example 22 | 4 | A | A | A | A | A | A | A |
| Example 23 | 4 | A | A | A | A | A | A | A |
| Example 24 | 4 | A | A | A | A | A | A | A |
| Example 25 | 4 | A | A | B | A | A | A | A |
| Example 26 | 4 | A | A | A | A | A | A | A |
| Example 27 | 4 | A | A | A | A | A | A | A |
| Example 28 | 4 | A | A | A | A | A | A | A |
| Example 29 | 4 | A | A | A | A | A | A | A |
| Example 30 | 4 | A | A | A | A | A | A | A |
| Example 31 | 4 | A | A | A | A | A | A | A |
| Example 32 | 4 | A | A | A | A | A | A | A |
| Example 33 | 4 | A | A | A | A | A | A | A |

TABLE 9

| [Table 1-2-1] | Components of chemical liquid Main agent Organic solvent | | | | | | | | |
|---|---|---|---|---|---|---|---|---|---|
| | Type | Content (% by mass) | Molar mass (g/mol) | Vapor pressure (Pa) | Surface tension (mN/m) | fd | fp | fh | HP |
| Example 34 | nBA | 30 | 116.2 | 1,200 | 24.8 | 60.5 | 17.2 | 22.2 | 1 |
| Example 35 | nBA | 30 | 116.2 | 1,200 | 24.8 | 60.5 | 17.2 | 22.2 | 1 |
| Example 36 | PGMEA | 80 | 132.16 | 493 | 27.9 | 56.5 | 19.8 | 23.7 | 1 |
| Example 37 | PGMEA | 80 | 132.16 | 493 | 27.9 | 56.5 | 19.8 | 23.7 | 1 |
| Example 38 | PGMEA | 80 | 132.16 | 493 | 27.9 | 56.5 | 19.8 | 23.7 | 1 |
| Example 39 | PGMEA | 80 | 132.16 | 493 | 27.9 | 56.5 | 19.8 | 23.7 | 1 |
| Example 40 | PGMEA | 80 | 132.16 | 493 | 27.9 | 56.5 | 19.8 | 23.7 | 1 |
| Example 41 | CyHx | 95 | 98.14 | 507 | 34.1 | 61.0 | 21.6 | 17.5 | 1 |
| Example 42 | CyHx | 95 | 98.14 | 507 | 34.1 | 61.0 | 21.6 | 17.5 | 1 |
| Example 43 | CyHx | 95 | 98.14 | 507 | 34.1 | 61.0 | 21.6 | 17.5 | 1 |
| Example 44 | CyHx | 95 | 98.14 | 507 | 34.1 | 61.0 | 21.6 | 17.5 | 1 |
| Example 45 | CyHx | 95 | 98.14 | 507 | 34.1 | 61.0 | 21.6 | 17.5 | 1 |
| Example 46 | EL | 80 | 118.13 | 187 | 29.8 | 55.5 | 19.8 | 24.7 | 1 |
| Example 47 | EL | 80 | 118.13 | 187 | 29.8 | 55.5 | 19.8 | 24.7 | 1 |
| Example 48 | EL | 80 | 118.13 | 187 | 29.8 | 55.5 | 19.8 | 24.7 | 1 |
| Example 49 | EL | 80 | 118.13 | 187 | 29.8 | 55.5 | 19.8 | 24.7 | 1 |
| Example 50 | EL | 80 | 118.13 | 187 | 29.8 | 55.5 | 19.8 | 24.7 | 1 |
| Example 51 | HBM | 80 | 118.13 | 267 | 29.1 | 46.0 | 20.1 | 34.0 | 1 |
| Example 52 | HBM | 80 | 118.13 | 267 | 29.1 | 46.0 | 20.1 | 34.0 | 1 |
| Example 53 | HBM | 80 | 118.13 | 267 | 29.1 | 46.0 | 20.1 | 34.0 | 1 |
| Example 54 | HBM | 80 | 118.13 | 267 | 29.1 | 46.0 | 20.1 | 34.0 | 1 |
| Example 55 | HBM | 80 | 118.13 | 267 | 29.1 | 46.0 | 20.1 | 34.0 | 1 |
| Example 56 | DBCPN | 80 | 130.18 | 400 | 30.2 | 65.4 | 18.1 | 16.5 | 1 |
| Example 57 | DBCPN | 80 | 130.18 | 400 | 30.2 | 65.4 | 18.1 | 16.5 | 1 |
| Example 58 | DBCPN | 80 | 130.18 | 400 | 30.2 | 65.4 | 18.1 | 16.5 | 1 |
| Example 59 | DBCPN | 80 | 130.18 | 400 | 30.2 | 65.4 | 18.1 | 16.5 | 1 |
| Example 60 | DBCPN | 80 | 130.18 | 400 | 30.2 | 65.4 | 18.1 | 16.5 | 1 |
| Example 61 | PGME | 20 | 90.1 | 1,453 | 27.6 | 43.2 | 28.8 | 28.0 | 1 |
| Example 62 | PGME | 20 | 90.1 | 1,453 | 27.6 | 43.2 | 28.8 | 28.0 | 1 |
| Example 63 | PGME | 20 | 90.1 | 1,453 | 27.6 | 43.2 | 28.8 | 28.0 | 1 |
| Example 64 | PGME | 20 | 90.1 | 1,453 | 27.6 | 43.2 | 28.8 | 28.0 | 1 |
| Example 65 | PGME | 20 | 90.1 | 1,453 | 27.6 | 43.2 | 28.8 | 28.0 | 1 |
| Example 66 | PGME | 20 | 90.1 | 1,453 | 27.6 | 43.2 | 28.8 | 28.0 | 1 |
| Example 67 | PGME | 20 | 90.1 | 1,453 | 27.6 | 43.2 | 28.8 | 28.0 | 1 |

TABLE 10

Components of chemical liquid
Main agent
Organic solvent

| [Table 1-2-2] | Type | Content (% by mass) | Molar mass (g/mol) | Vapor pressure (Pa) | Surface tension (mN/m) | fd | fp | fh | HP |
|---|---|---|---|---|---|---|---|---|---|
| Example 34 | PC | 70 | 102.09 | 53 | 40.9 | 47.5 | 42.8 | 9.7 | 1 |
| Example 35 | NMP | 70 | 99.13 | 40 | 41.3 | 48.0 | 32.8 | 19.2 | 1 |
| Example 36 | GBL | 20 | 86.08 | 147 | 44.1 | 42.9 | 39.5 | 17.6 | 1 |
| Example 37 | DMSO | 20 | 78.13 | 13 | 43.6 | 40.9 | 36.4 | 22.7 | 1 |
| Example 38 | EC | 20 | 88.06 | 67 | 41.5 | 42.0 | 47.0 | 11.0 | 1 |
| Example 39 | PC | 20 | 102.09 | 53 | 40.9 | 47.5 | 42.8 | 9.7 | 1 |
| Example 40 | NMP | 20 | 99.13 | 40 | 41.3 | 48.0 | 32.8 | 19.2 | 1 |
| Example 41 | GBL | 5 | 86.08 | 147 | 44.1 | 42.9 | 39.5 | 17.6 | 1 |
| Example 42 | DMSO | 5 | 78.13 | 13 | 43.6 | 40.9 | 36.4 | 22.7 | 1 |
| Example 43 | EC | 5 | 88.06 | 67 | 41.5 | 42.0 | 47.0 | 11.0 | 1 |
| Example 44 | PC | 5 | 102.09 | 53 | 40.9 | 47.5 | 42.8 | 9.7 | 1 |
| Example 45 | NMP | 5 | 99.13 | 40 | 41.3 | 48.0 | 32.8 | 19.2 | 1 |
| Example 46 | GBL | 20 | 86.08 | 147 | 44.1 | 42.9 | 39.5 | 17.6 | 1 |
| Example 47 | DMSO | 20 | 78.13 | 13 | 43.6 | 40.9 | 36.4 | 22.7 | 1 |
| Example 48 | EC | 20 | 88.06 | 67 | 41.5 | 42.0 | 47.0 | 11.0 | 1 |
| Example 49 | PC | 20 | 102.09 | 53 | 40.9 | 47.5 | 42.8 | 9.7 | 1 |
| Example 50 | NMP | 20 | 99.13 | 40 | 41.3 | 48.0 | 32.8 | 19.2 | 1 |
| Example 51 | GBL | 20 | 86.08 | 147 | 44.1 | 42.9 | 39.5 | 17.6 | 1 |
| Example 52 | DMSO | 20 | 78.13 | 13 | 43.6 | 40.9 | 36.4 | 22.7 | 1 |
| Example 53 | EC | 20 | 88.06 | 67 | 41.5 | 42.0 | 47.0 | 11.0 | 1 |
| Example 54 | PC | 20 | 102.09 | 53 | 40.9 | 47.5 | 42.8 | 9.7 | 1 |
| Example 55 | NMP | 20 | 99.13 | 40 | 41.3 | 48.0 | 32.8 | 19.2 | 1 |
| Example 56 | GBL | 20 | 86.08 | 147 | 44.1 | 42.9 | 39.5 | 17.6 | 1 |
| Example 57 | DMSO | 20 | 78.13 | 13 | 43.6 | 40.9 | 36.4 | 22.7 | 1 |
| Example 58 | EC | 20 | 88.06 | 67 | 41.5 | 42.0 | 47.0 | 11.0 | 1 |
| Example 59 | PC | 20 | 102.09 | 53 | 40.9 | 47.5 | 42.8 | 9.7 | 1 |
| Example 60 | NMP | 20 | 99.13 | 40 | 41.3 | 48.0 | 32.8 | 19.2 | 1 |
| Example 61 | PGMEA | 60 | 132.16 | 493 | 27.9 | 56.5 | 19.8 | 23.7 | 1 |
| Example 62 | PGMEA | 60 | 132.16 | 493 | 27.9 | 56.5 | 19.8 | 23.7 | 1 |
| Example 63 | PGMEA | 60 | 132.16 | 493 | 27.9 | 56.5 | 19.8 | 23.7 | 1 |
| Example 64 | PGMEA | 60 | 132.16 | 493 | 27.9 | 56.5 | 19.8 | 23.7 | 1 |
| Example 65 | PGMEA | 60 | 132.16 | 493 | 27.9 | 56.5 | 19.8 | 23.7 | 1 |
| Example 66 | CyHx | 60 | 98.14 | 507 | 34.1 | 61.0 | 21.6 | 17.5 | 1 |
| Example 67 | CyHx | 60 | 98.14 | 507 | 34.1 | 61.0 | 21.6 | 17.5 | 1 |

TABLE 11

Components of chemical liquid
Main agent

Organic solvent

| [Table 1-2-3] | Type | Content (% by mass) | Molar mass (g/mol) | Vapor pressure (Pa) | Surface tension (mN/m) | fd | fp | fh | HP | Vapor pressure (Pa) | Surface tension (mN/m) |
|---|---|---|---|---|---|---|---|---|---|---|---|
| Example 34 | | | | | | | | | | 367 | 36.5 |
| Example 35 | | | | | | | | | | 351 | 36.9 |
| Example 36 | | | | | | | | | | 397 | 32.4 |
| Example 37 | | | | | | | | | | 351 | 32.6 |
| Example 38 | | | | | | | | | | 377 | 31.6 |
| Example 39 | | | | | | | | | | 386 | 31.1 |
| Example 40 | | | | | | | | | | 380 | 31.2 |
| Example 41 | | | | | | | | | | 486 | 34.7 |
| Example 42 | | | | | | | | | | 476 | 34.7 |
| Example 43 | | | | | | | | | | 482 | 34.5 |
| Example 44 | | | | | | | | | | 485 | 34.4 |
| Example 45 | | | | | | | | | | 484 | 34.5 |
| Example 46 | | | | | | | | | | 176 | 33.5 |
| Example 47 | | | | | | | | | | 139 | 33.6 |
| Example 48 | | | | | | | | | | 157 | 32.7 |
| Example 49 | | | | | | | | | | 157 | 32.3 |
| Example 50 | | | | | | | | | | 153 | 32.4 |
| Example 51 | | | | | | | | | | 236 | 32.9 |
| Example 52 | | | | | | | | | | 197 | 33.1 |
| Example 53 | | | | | | | | | | 216 | 32.2 |
| Example 54 | | | | | | | | | | 219 | 31.7 |
| Example 55 | | | | | | | | | | 215 | 31.9 |

TABLE 11-continued

| | Components of chemical liquid | | | | | | | | | |
|---|---|---|---|---|---|---|---|---|---|---|
| | Main agent | | | | | | | | | |
| | Organic solvent | | | | | | | | | |
| [Table 1-2-3] | Type | Content (% by mass) | Molar mass (g/mol) | Vapor pressure (Pa) | Surface tension (mN/m) | fd | fp | fh | HP | Vapor pressure (Pa) | Surface tension (mN/m) |
| Example 56 | | | | | | | | | | 330 | 34.0 |
| Example 57 | | | | | | | | | | 286 | 34.1 |
| Example 58 | | | | | | | | | | 310 | 33.2 |
| Example 59 | | | | | | | | | | 316 | 32.8 |
| Example 60 | | | | | | | | | | 311 | 32.9 |
| Example 61 | GBL | 20 | 86.08 | 147 | 44.1 | 42.9 | 39.5 | 17.6 | 1 | 639 | 32.0 |
| Example 62 | DMSO | 20 | 78.13 | 13 | 43.6 | 40.9 | 36.4 | 22.7 | 1 | 590 | 32.1 |
| Example 63 | EC | 20 | 88.06 | 67 | 41.5 | 42.0 | 47.0 | 11.0 | 1 | 622 | 31.2 |
| Example 64 | PC | 20 | 102.09 | 53 | 40.9 | 47.5 | 42.8 | 9.7 | 1 | 639 | 30.7 |
| Example 65 | NMP | 20 | 99.13 | 40 | 41.3 | 48.0 | 32.8 | 19.2 | 1 | 632 | 30.9 |
| Example 66 | GBL | 20 | 86.08 | 147 | 44.1 | 42.9 | 39.5 | 17.6 | 1 | 625 | 34.9 |
| Example 67 | DMSO | 20 | 78.13 | 13 | 43.6 | 40.9 | 36.4 | 22.7 | 1 | 584 | 35.0 |

TABLE 12

| | Components of chemical liquid | | | Components of chemical liquid | | | | | |
|---|---|---|---|---|---|---|---|---|---|
| | Main agent | Surfactant | | Impurity metal | | | | | |
| | Content | | Content | Total content of impurity metal (mass ppt) | | | | | |
| [Table 1-2-4] | (% by mass) | Type | (mass ppm) | Fe | Cr | Ni | Pb | Others | Total |
| Example 34 | Balance | A | 50 | 0.004 | 0.004 | 0.004 | 0.002 | 0.042 | 0.056 |
| Example 35 | Balance | B | 100 | 0.006 | 0.002 | 0.006 | 0.004 | 0.054 | 0.072 |
| Example 36 | Balance | A | 100 | 0.004 | 0.004 | 0.006 | 0.004 | 0.054 | 0.072 |
| Example 37 | Balance | G | 100 | 0.006 | 0.004 | 0.006 | 0.002 | 0.054 | 0.072 |
| Example 38 | Balance | B | 100 | 0.008 | 0.006 | 0.004 | 0.002 | 0.06 | 0.08 |
| Example 39 | Balance | E | 100 | 0.004 | 0.004 | 0.006 | 0.006 | 0.06 | 0.08 |
| Example 40 | Balance | I | 50 | 0.004 | 0.002 | 0.006 | 0.002 | 0.042 | 0.056 |
| Example 41 | Balance | A | 1,000 | 0.006 | 0.004 | 0.004 | 0.002 | 0.048 | 0.064 |
| Example 42 | Balance | C | 100 | 0.004 | 0.002 | 0.006 | 0.004 | 0.048 | 0.064 |
| Example 43 | Balance | B | 100 | 0.006 | 0.004 | 0.004 | 0.002 | 0.048 | 0.064 |
| Example 44 | Balance | J | 50 | 0.004 | 0.002 | 0.006 | 0.002 | 0.042 | 0.056 |
| Example 45 | Balance | D | 100 | 0.006 | 0.004 | 0.006 | 0.004 | 0.06 | 0.08 |
| Example 46 | Balance | F | 100 | 0.004 | 0.004 | 0.004 | 0.002 | 0.042 | 0.056 |
| Example 47 | Balance | A | 50 | 0.006 | 0.004 | 0.006 | 0.002 | 0.054 | 0.072 |
| Example 48 | Balance | E | 1,000 | 0.006 | 0.002 | 0.006 | 0.006 | 0.06 | 0.08 |
| Example 49 | Balance | A | 300 | 0.004 | 0.002 | 0.004 | 0.002 | 0.036 | 0.048 |
| Example 50 | Balance | J | 100 | 0.006 | 0.004 | 0.006 | 0.002 | 0.054 | 0.072 |
| Example 51 | Balance | B | 100 | 0.004 | 0.002 | 0.006 | 0.004 | 0.048 | 0.064 |
| Example 52 | Balance | I | 100 | 0.004 | 0.004 | 0.004 | 0.002 | 0.042 | 0.056 |
| Example 53 | Balance | A | 50 | 0.006 | 0.002 | 0.006 | 0.002 | 0.048 | 0.064 |
| Example 54 | Balance | B | 100 | 0.004 | 0.004 | 0.006 | 0.006 | 0.06 | 0.08 |
| Example 55 | Balance | A | 1,000 | 0.004 | 0.002 | 0.004 | 0.002 | 0.036 | 0.048 |
| Example 56 | Balance | C | 100 | 0.004 | 0.004 | 0.004 | 0.002 | 0.042 | 0.056 |
| Example 57 | Balance | A | 100 | 0.006 | 0.002 | 0.006 | 0.004 | 0.054 | 0.072 |
| Example 58 | Balance | D | 100 | 0.004 | 0.004 | 0.004 | 0.002 | 0.042 | 0.056 |
| Example 59 | Balance | B | 100 | 0.008 | 0.002 | 0.006 | 0.002 | 0.054 | 0.072 |
| Example 60 | Balance | E | 100 | 0.004 | 0.004 | 0.004 | 0.004 | 0.048 | 0.064 |
| Example 61 | Balance | I | 50 | 0.006 | 0.002 | 0.006 | 0.002 | 0.048 | 0.064 |
| Example 62 | Balance | F | 100 | 0.006 | 0.002 | 0.006 | 0.004 | 0.054 | 0.072 |
| Example 63 | Balance | C | 100 | 0.008 | 0.004 | 0.004 | 0.002 | 0.054 | 0.072 |
| Example 64 | Balance | A | 50 | 0.004 | 0.002 | 0.006 | 0.002 | 0.042 | 0.056 |
| Example 65 | Balance | G | 100 | 0.004 | 0.002 | 0.006 | 0.004 | 0.048 | 0.064 |
| Example 66 | Balance | B | 100 | 0.006 | 0.002 | 0.004 | 0.002 | 0.042 | 0.056 |
| Example 67 | Balance | H | 100 | 0.004 | 0.006 | 0.004 | 0.002 | 0.048 | 0.064 |

TABLE 13

| | Components of chemical liquid | | | | | | | | |
|---|---|---|---|---|---|---|---|---|---|
| | Impurity metal | | | | | | Organic impurity Content (mass ppm) | | Water |
| | Content of particles containing following impurity metal (mass ppt) | | | | | | | High-boiling- | Content |
| [Table 1-2-5] | Fe | Cr | Ni | Pb | Others | Total | Total | point component | (% by mass) |
| Example 34 | 0.001 | 0.001 | 0.003 | 0.001 | 0.019 | 0.025 | 59 | 0.2 | 0.10% |
| Example 35 | 0.003 | 0.001 | 0.004 | 0.001 | 0.018 | 0.027 | 159 | 0.6 | 0.10% |
| Example 36 | 0.004 | 0.001 | 0.004 | 0.001 | 0.019 | 0.029 | 191 | 0.8 | 0.10% |
| Example 37 | 0.002 | 0.002 | 0.002 | 0.002 | 0.02 | 0.028 | 230 | 0.9 | 0.10% |
| Example 38 | 0.002 | 0.001 | 0.003 | 0.002 | 0.016 | 0.024 | 138 | 0.6 | 0.10% |
| Example 39 | 0.002 | 0.002 | 0.002 | 0.001 | 0.015 | 0.022 | 275 | 1.1 | 0.10% |
| Example 40 | 0.002 | 0.002 | 0.003 | 0.002 | 0.016 | 0.025 | 248 | 1.0 | 0.10% |
| Example 41 | 0.002 | 0.002 | 0.003 | 0.002 | 0.017 | 0.026 | 174 | 0.7 | 0.10% |
| Example 42 | 0.002 | 0.001 | 0.003 | 0.002 | 0.016 | 0.024 | 156 | 0.6 | 0.10% |
| Example 43 | 0.002 | 0.002 | 0.003 | 0.001 | 0.017 | 0.025 | 78 | 0.3 | 0.10% |
| Example 44 | 0.003 | 0.002 | 0.002 | 0.002 | 0.015 | 0.024 | 211 | 0.8 | 0.10% |
| Example 45 | 0.002 | 0.001 | 0.003 | 0.001 | 0.016 | 0.023 | 253 | 1.0 | 0.10% |
| Example 46 | 0.004 | 0.003 | 0.002 | 0.001 | 0.016 | 0.026 | 177 | 0.7 | 0.10% |
| Example 47 | 0.003 | 0.002 | 0.002 | 0.002 | 0.013 | 0.022 | 159 | 0.6 | 0.10% |
| Example 48 | 0.002 | 0.001 | 0.004 | 0.001 | 0.014 | 0.022 | 80 | 0.3 | 0.10% |
| Example 49 | 0.003 | 0.002 | 0.003 | 0.002 | 0.015 | 0.025 | 215 | 0.9 | 0.10% |
| Example 50 | 0.002 | 0.001 | 0.002 | 0.002 | 0.016 | 0.023 | 258 | 1.0 | 0.10% |
| Example 51 | 0.002 | 0.001 | 0.003 | 0.002 | 0.013 | 0.021 | 181 | 0.7 | 0.10% |
| Example 52 | 0.002 | 0.002 | 0.002 | 0.001 | 0.014 | 0.021 | 163 | 0.7 | 0.10% |
| Example 53 | 0.003 | 0.001 | 0.003 | 0.001 | 0.015 | 0.023 | 81 | 0.3 | 0.10% |
| Example 54 | 0.002 | 0.002 | 0.003 | 0.003 | 0.016 | 0.026 | 220 | 0.9 | 0.10% |
| Example 55 | 0.002 | 0.001 | 0.002 | 0.001 | 0.017 | 0.023 | 264 | 1.1 | 0.10% |
| Example 56 | 0.002 | 0.002 | 0.002 | 0.001 | 0.018 | 0.025 | 184 | 0.7 | 0.10% |
| Example 57 | 0.003 | 0.001 | 0.003 | 0.002 | 0.016 | 0.025 | 166 | 0.7 | 0.10% |
| Example 58 | 0.002 | 0.002 | 0.002 | 0.001 | 0.015 | 0.022 | 83 | 0.3 | 0.10% |
| Example 59 | 0.004 | 0.001 | 0.003 | 0.001 | 0.016 | 0.025 | 224 | 0.9 | 0.10% |
| Example 60 | 0.002 | 0.002 | 0.002 | 0.002 | 0.016 | 0.024 | 269 | 1.1 | 0.10% |
| Example 61 | 0.003 | 0.001 | 0.003 | 0.001 | 0.016 | 0.024 | 188 | 0.8 | 0.10% |
| Example 62 | 0.003 | 0.001 | 0.003 | 0.002 | 0.016 | 0.025 | 169 | 0.7 | 0.10% |
| Example 63 | 0.004 | 0.002 | 0.002 | 0.001 | 0.017 | 0.026 | 85 | 0.3 | 0.10% |
| Example 64 | 0.002 | 0.001 | 0.003 | 0.001 | 0.019 | 0.026 | 229 | 0.9 | 0.10% |
| Example 65 | 0.002 | 0.001 | 0.003 | 0.002 | 0.016 | 0.024 | 275 | 1.1 | 0.10% |
| Example 66 | 0.003 | 0.001 | 0.002 | 0.001 | 0.016 | 0.023 | 192 | 0.8 | 0.10% |
| Example 67 | 0.002 | 0.003 | 0.002 | 0.001 | 0.018 | 0.026 | 173 | 0.7 | 0.10% |

TABLE 14

| | Physical properties of chemical liquid | | | Evaluation | | | | | | |
|---|---|---|---|---|---|---|---|---|---|---|
| | | | | | | Type of resist composition | | | | |
| | Number of | Content of | Content of | | | | Resist saving performance | | | |
| | coarse particles | surfactant/total content of | surfactant/content of high-boiling- | Defect inhibition | | Affinity | | Film thickness | | |
| [Table 1-2-6] | (number/ml) | particles | point component | performance | | Rsq1 | SRsq | Uniformity | contollability | Developability |
| Example 34 | 1 | $2.0 \times 10^9$ | $2.1 \times 10^2$ | AA | 1 | A | A | A | A | A |
| Example 35 | 3 | $3.7 \times 10^9$ | $1.6 \times 10^2$ | AA | 1 | A | A | A | A | A |
| Example 36 | 4 | $3.4 \times 10^9$ | $1.3 \times 10^2$ | AA | 1 | A | A | A | A | A |
| Example 37 | 5 | $3.6 \times 10^9$ | $1.1 \times 10^2$ | A | 1 | A | A | A | A | A |
| Example 38 | 3 | $4.2 \times 10^9$ | $1.8 \times 10^2$ | AA | 1 | A | A | A | A | A |
| Example 39 | 6 | $4.5 \times 10^9$ | $9.1 \times 10^1$ | A | 1 | A | A | A | A | A |
| Example 40 | 5 | $2.0 \times 10^9$ | $5.0 \times 10^1$ | A | 1 | A | A | A | A | A |
| Example 41 | 3 | $3.8 \times 10^{10}$ | $1.4 \times 10^3$ | AA | 1 | A | A | A | A | A |
| Example 42 | 3 | $4.2 \times 10^9$ | $1.6 \times 10^2$ | AA | 1 | A | A | A | A | A |
| Example 43 | 2 | $4.0 \times 10^9$ | $3.2 \times 10^2$ | AA | 1 | A | A | A | A | A |
| Example 44 | 4 | $2.1 \times 10^9$ | $5.9 \times 10^1$ | A | 1 | A | A | A | A | A |
| Example 45 | 5 | $4.3 \times 10^9$ | $9.9 \times 10^1$ | A | 1 | A | A | A | A | A |
| Example 46 | 4 | $3.8 \times 10^9$ | $1.4 \times 10^2$ | A | 1 | A | A | A | A | A |
| Example 47 | 3 | $2.3 \times 10^9$ | $7.8 \times 10^1$ | AA | 1 | A | A | A | A | A |
| Example 48 | 2 | $4.5 \times 10^{10}$ | $3.1 \times 10^3$ | A | 1 | A | A | A | A | A |
| Example 49 | 4 | $1.2 \times 10^{10}$ | $3.5 \times 10^2$ | AA | 1 | A | A | A | A | A |
| Example 50 | 5 | $4.3 \times 10^9$ | $9.7 \times 10^1$ | A | 1 | A | A | A | A | A |

TABLE 14-continued

| [Table 1-2-6] | Physical properties of chemical liquid Number of coarse particles (number/ml) | Content of surfactant/total content of particles | Content of surfactant/content of high-boiling-point component | Evaluation Defect inhibition performance | Type of resist composition | Resist saving performance Affinity Rsq1 | SRsq | Uniformity | Film thickness contollability | Developability |
|---|---|---|---|---|---|---|---|---|---|---|
| Example 51 | 4 | $4.8 \times 10^9$ | $1.4 \times 10^2$ | AA | 1 | A | A | A | A | A |
| Example 52 | 3 | $4.8 \times 10^9$ | $1.5 \times 10^2$ | A | 1 | A | A | A | A | A |
| Example 53 | 2 | $2.2 \times 10^9$ | $1.5 \times 10^2$ | AA | 1 | A | A | A | A | A |
| Example 54 | 4 | $3.8 \times 10^9$ | $1.1 \times 10^2$ | AA | 1 | A | A | A | A | A |
| Example 55 | 5 | $4.3 \times 10^{10}$ | $9.5 \times 10^2$ | AA | 1 | A | A | A | A | A |
| Example 56 | 4 | $4.0 \times 10^9$ | $1.4 \times 10^2$ | AA | 1 | A | A | A | A | A |
| Example 57 | 3 | $4.0 \times 10^9$ | $1.5 \times 10^2$ | AA | 1 | A | A | A | A | A |
| Example 58 | 2 | $4.5 \times 10^9$ | $3.0 \times 10^2$ | A | 1 | A | A | A | A | A |
| Example 59 | 4 | $4.0 \times 10^9$ | $1.1 \times 10^2$ | AA | 1 | A | A | A | A | A |
| Example 60 | 5 | $4.2 \times 10^9$ | $9.3 \times 10^1$ | A | 1 | A | A | A | A | A |
| Example 61 | 4 | $2.1 \times 10^9$ | $6.6 \times 10^1$ | A | 1 | A | A | A | A | A |
| Example 62 | 3 | $4.0 \times 10^9$ | $1.5 \times 10^2$ | A | 1 | A | A | A | A | A |
| Example 63 | 2 | $3.8 \times 10^9$ | $3.0 \times 10^2$ | AA | 1 | A | A | A | A | A |
| Example 64 | 5 | $1.9 \times 10^9$ | $5.5 \times 10^1$ | AA | 1 | A | A | A | A | A |
| Example 65 | 5 | $4.2 \times 10^9$ | $9.1 \times 10^1$ | A | 1 | A | A | A | A | A |
| Example 66 | 4 | $4.3 \times 10^9$ | $1.3 \times 10^2$ | AA | 1 | A | A | A | A | A |
| Example 67 | 3 | $3.8 \times 10^9$ | $1.4 \times 10^2$ | A | 1 | A | A | A | A | A |

TABLE 15

| [Table 1-2-7] | Type of resist composition | Resist saving performance Affinity Rsq1 | SRsq | Uniformity | Film thickness controllability | Developability | Type of resist composition | Resist saving performance Affinity Rsq1 | SRsq | Uniformity | Film thickness controllability | Developability |
|---|---|---|---|---|---|---|---|---|---|---|---|---|
| Example 34 | 2 | A | A | A | A | A | 3 | A | A | A | A | A |
| Example 35 | 2 | A | A | A | A | A | 3 | A | A | A | A | A |
| Example 36 | 2 | A | A | A | A | A | 3 | A | A | A | A | A |
| Example 37 | 2 | A | A | A | A | A | 3 | A | A | A | A | A |
| Example 38 | 2 | A | A | A | A | A | 3 | A | A | A | A | A |
| Example 39 | 2 | A | A | A | A | A | 3 | A | A | A | A | A |
| Example 40 | 2 | A | A | A | A | A | 3 | A | A | A | A | A |
| Example 41 | 2 | A | A | A | A | A | 3 | A | A | A | A | A |
| Example 42 | 2 | A | A | A | A | A | 3 | A | A | A | A | A |
| Example 43 | 2 | A | A | A | A | A | 3 | A | A | A | A | A |
| Example 44 | 2 | A | A | A | A | A | 3 | A | A | A | A | A |
| Example 45 | 2 | A | A | A | A | A | 3 | A | A | A | A | A |
| Example 46 | 2 | A | A | A | A | A | 3 | A | A | A | A | A |
| Example 47 | 2 | A | A | A | A | A | 3 | A | A | A | A | A |
| Example 48 | 2 | A | A | A | A | A | 3 | A | A | A | A | A |
| Example 49 | 2 | A | A | A | A | A | 3 | A | A | A | A | A |
| Example 50 | 2 | A | A | A | A | A | 3 | A | A | A | A | A |
| Example 51 | 2 | A | A | A | A | A | 3 | A | A | A | A | A |
| Example 52 | 2 | A | A | A | A | A | 3 | A | A | A | A | A |
| Example 53 | 2 | A | A | A | A | A | 3 | A | A | A | A | A |
| Example 54 | 2 | A | A | A | A | A | 3 | A | A | A | A | A |
| Example 55 | 2 | A | A | A | A | A | 3 | A | A | A | A | A |
| Example 56 | 2 | A | A | A | A | A | 3 | A | A | A | A | A |
| Example 57 | 2 | A | A | A | A | A | 3 | A | A | A | A | A |
| Example 58 | 2 | A | A | A | A | A | 3 | A | A | A | A | A |
| Example 59 | 2 | A | A | A | A | A | 3 | A | A | A | A | A |
| Example 60 | 2 | A | A | A | A | A | 3 | A | A | A | A | A |
| Example 61 | 2 | A | A | A | A | A | 3 | A | A | A | A | A |
| Example 62 | 2 | A | A | A | A | A | 3 | A | A | A | A | A |
| Example 63 | 2 | A | A | A | A | A | 3 | A | A | A | A | A |
| Example 64 | 2 | A | A | A | A | A | 3 | A | A | A | A | A |
| Example 65 | 2 | A | A | A | A | A | 3 | A | A | A | A | A |

TABLE 15-continued

| [Table 1-2-7] | Type of resist composition | | | | | Type of resist composition | | | | | |
|---|---|---|---|---|---|---|---|---|---|---|---|
| | Resist saving performance | | | | | Resist saving performance | | | | | |
| | Affinity | | | Film thickness | | Affinity | | | Film thickness | | |
| | Rsq1 | SRsq | Uniformity | controllability | Developability | Rsq1 | SRsq | Uniformity | controllability | Developability |
| Example 66 | 2 | A | A | A | A | A | 3 | A | A | A | A | A |
| Example 67 | 2 | A | A | A | A | A | 3 | A | A | A | A | A |

TABLE 16

| [Table 1-2-8] | Evaluation Type of resist composition | | | | | Evaluation of p-CMP defect inhibition perofrmance | Evaluation of ashing residue removing performance |
|---|---|---|---|---|---|---|---|
| | Resist saving performance | | | | | | |
| | Affinity | | | Film thickness | | | |
| | Rsq1 | SRsq | Uniformity | controllability | Developability | | |
| Example 34 | 4 | A | A | A | A | A | A | A |
| Example 35 | 4 | A | A | A | A | A | A | A |
| Example 36 | 4 | A | A | A | A | A | A | A |
| Example 37 | 4 | A | A | A | A | A | A | A |
| Example 38 | 4 | A | A | A | A | A | A | A |
| Example 39 | 4 | A | A | A | A | A | A | A |
| Example 40 | 4 | A | A | A | A | A | A | A |
| Example 41 | 4 | A | A | A | A | A | A | A |
| Example 42 | 4 | A | A | A | A | A | A | A |
| Example 43 | 4 | A | A | A | A | A | A | A |
| Example 44 | 4 | A | A | A | A | A | A | A |
| Example 45 | 4 | A | A | A | A | A | A | A |
| Example 46 | 4 | A | A | A | A | A | A | A |
| Example 47 | 4 | A | A | A | A | A | A | A |
| Example 48 | 4 | A | A | A | A | A | A | A |
| Example 49 | 4 | A | A | A | A | A | A | A |
| Example 50 | 4 | A | A | A | A | A | A | A |
| Example 51 | 4 | A | A | A | A | A | A | A |
| Example 52 | 4 | A | A | A | A | A | A | A |
| Example 53 | 4 | A | A | A | A | A | A | A |
| Example 54 | 4 | A | A | A | A | A | A | A |
| Example 55 | 4 | A | A | A | A | A | A | A |
| Example 56 | 4 | A | A | A | A | A | A | A |
| Example 57 | 4 | A | A | A | A | A | A | A |
| Example 58 | 4 | A | A | A | A | A | A | A |
| Example 59 | 4 | A | A | A | A | A | A | A |
| Example 60 | 4 | A | A | A | A | A | A | A |
| Example 61 | 4 | A | A | A | A | A | A | A |
| Example 62 | 4 | A | A | A | A | A | A | A |
| Example 63 | 4 | A | A | A | A | A | A | A |
| Example 64 | 4 | A | A | A | A | A | A | A |
| Example 65 | 4 | A | A | A | A | A | A | A |
| Example 66 | 4 | A | A | A | A | A | A | A |
| Example 67 | 4 | A | A | A | A | A | A | A |

TABLE 17

| [Table 1-3-1] | Components of chemical liquid Main agent Organic solvent | | | | | | | | |
|---|---|---|---|---|---|---|---|---|---|
| | Type | Content (% by mass) | Molar mass (g/mol) | Vapor pressure (Pa) | Surface tension (mN/m) | fd | fp | fh | HP |
| Example 68 | PGME | 20 | 90.1 | 1,453 | 27.6 | 43.2 | 28.8 | 28.0 | 1 |
| Example 69 | PGME | 20 | 90.1 | 1,453 | 27.6 | 43.2 | 28.8 | 28.0 | 1 |
| Example 70 | PGME | 20 | 90.1 | 1,453 | 27.6 | 43.2 | 28.8 | 28.0 | 1 |
| Example 71 | PGME | 20 | 90.1 | 1,453 | 27.6 | 43.2 | 28.8 | 28.0 | 1 |
| Example 72 | PGME | 20 | 90.1 | 1,453 | 27.6 | 43.2 | 28.8 | 28.0 | 1 |

TABLE 17-continued

| [Table 1-3-1] | Type | Content (% by mass) | Molar mass (g/mol) | Vapor pressure (Pa) | Surface tension (mN/m) | fd | fp | fh | HP |
|---|---|---|---|---|---|---|---|---|---|
| Example 73 | PGME | 20 | 90.1 | 1,453 | 27.6 | 43.2 | 28.8 | 28.0 | 1 |
| Example 74 | PGME | 20 | 90.1 | 1,453 | 27.6 | 43.2 | 28.8 | 28.0 | 1 |
| Example 75 | PGME | 20 | 90.1 | 1,453 | 27.6 | 43.2 | 28.8 | 28.0 | 1 |
| Example 76 | PGME | 20 | 90.1 | 1,453 | 27.6 | 43.2 | 28.8 | 28.0 | 1 |
| Example 77 | PGME | 20 | 90.1 | 1,453 | 27.6 | 43.2 | 28.8 | 28.0 | 1 |
| Example 78 | PGME | 20 | 90.1 | 1,453 | 27.6 | 43.2 | 28.8 | 28.0 | 1 |
| Example 79 | PGME | 20 | 90.1 | 1,453 | 27.6 | 43.2 | 28.8 | 28.0 | 1 |
| Example 80 | PGME | 20 | 90.1 | 1,453 | 27.6 | 43.2 | 28.8 | 28.0 | 1 |
| Example 81 | PGME | 20 | 90.1 | 1,453 | 27.6 | 43.2 | 28.8 | 28.0 | 1 |
| Example 82 | PGME | 20 | 90.1 | 1,453 | 27.6 | 43.2 | 28.8 | 28.0 | 1 |
| Example 83 | PGME | 20 | 90.1 | 1,453 | 27.6 | 43.2 | 28.8 | 28.0 | 1 |
| Example 84 | PGME | 20 | 90.1 | 1,453 | 27.6 | 43.2 | 28.8 | 28.0 | 1 |
| Example 85 | PGME | 20 | 90.1 | 1,453 | 27.6 | 43.2 | 28.8 | 28.0 | 1 |
| Example 86 | CyPn | 20 | 84.1 | 1,520 | 33.8 | 60.0 | 21.8 | 18.2 | 1 |
| Example 87 | CyPn | 20 | 84.1 | 1,520 | 33.8 | 60.0 | 21.8 | 18.2 | 1 |
| Example 88 | CyPn | 20 | 84.1 | 1,520 | 33.8 | 60.0 | 21.8 | 18.2 | 1 |
| Example 89 | CyPn | 20 | 84.1 | 1,520 | 33.8 | 60.0 | 21.8 | 18.2 | 1 |
| Example 90 | CyPn | 20 | 84.1 | 1,520 | 33.8 | 60.0 | 21.8 | 18.2 | 1 |
| Example 91 | CyPn | 20 | 84.1 | 1,520 | 33.8 | 60.0 | 21.8 | 18.2 | 1 |
| Example 92 | CyPn | 20 | 84.1 | 1,520 | 33.8 | 60.0 | 21.8 | 18.2 | 1 |
| Example 93 | CyPn | 20 | 84.1 | 1,520 | 33.8 | 60.0 | 21.8 | 18.2 | 1 |
| Example 94 | CyPn | 20 | 84.1 | 1,520 | 33.8 | 60.0 | 21.8 | 18.2 | 1 |
| Example 95 | CyPn | 20 | 84.1 | 1,520 | 33.8 | 60.0 | 21.8 | 18.2 | 1 |
| Example 96 | CyPn | 20 | 84.1 | 1,520 | 33.8 | 60.0 | 21.8 | 18.2 | 1 |
| Example 97 | CyPn | 20 | 84.1 | 1,520 | 33.8 | 60.0 | 21.8 | 18.2 | 1 |
| Example 98 | CyPn | 20 | 84.1 | 1,520 | 33.8 | 60.0 | 21.8 | 18.2 | 1 |
| Example 99 | CyPn | 20 | 84.1 | 1,520 | 33.8 | 60.0 | 21.8 | 18.2 | 1 |
| Example 100 | CyPn | 20 | 84.1 | 1,520 | 33.8 | 60.0 | 21.8 | 18.2 | 1 |
| Example 101 | CyPn | 20 | 84.1 | 1,520 | 33.8 | 60.0 | 21.8 | 18.2 | 1 |

TABLE 18

| [Table 1-3-2] | Type | Content (% by mass) | Molar mass (g/mol) | Vapor pressure (Pa) | Surface tension (mN/m) | fd | fp | fh | HP |
|---|---|---|---|---|---|---|---|---|---|
| Example 68 | CyHx | 60 | 98.14 | 507 | 34.1 | 61.0 | 21.6 | 17.5 | 1 |
| Example 69 | CyHx | 60 | 98.14 | 507 | 34.1 | 61.0 | 21.6 | 17.5 | 1 |
| Example 70 | CyHx | 60 | 98.14 | 507 | 34.1 | 61.0 | 21.6 | 17.5 | 1 |
| Example 71 | EL | 60 | 118.13 | 187 | 29.8 | 55.5 | 19.8 | 24.7 | 1 |
| Example 72 | EL | 60 | 118.13 | 187 | 29.8 | 55.5 | 19.8 | 24.7 | 1 |
| Example 73 | EL | 60 | 118.13 | 187 | 29.8 | 55.5 | 19.8 | 24.7 | 1 |
| Example 74 | EL | 60 | 118.13 | 187 | 29.8 | 55.5 | 19.8 | 24.7 | 1 |
| Example 75 | EL | 60 | 118.13 | 187 | 29.8 | 55.5 | 19.8 | 24.7 | 1 |
| Example 76 | HBM | 60 | 118.13 | 267 | 29.1 | 46.0 | 20.1 | 34.0 | 1 |
| Example 77 | HBM | 60 | 118.13 | 267 | 29.1 | 46.0 | 20.1 | 34.0 | 1 |
| Example 78 | HBM | 60 | 118.13 | 267 | 29.1 | 46.0 | 20.1 | 34.0 | 1 |
| Example 79 | HBM | 60 | 118.13 | 267 | 29.1 | 46.0 | 20.1 | 34.0 | 1 |
| Example 80 | HBM | 60 | 118.13 | 267 | 29.1 | 46.0 | 20.1 | 34.0 | 1 |
| Example 81 | DBCPN | 60 | 130.18 | 400 | 30.2 | 65.4 | 18.1 | 16.5 | 1 |
| Example 82 | DBCPN | 60 | 130.18 | 400 | 30.2 | 65.4 | 18.1 | 16.5 | 1 |
| Example 83 | DBCPN | 60 | 130.18 | 400 | 30.2 | 65.4 | 18.1 | 16.5 | 1 |
| Example 84 | DBCPN | 60 | 130.18 | 400 | 30.2 | 65.4 | 18.1 | 16.5 | 1 |
| Example 85 | DBCPN | 60 | 130.18 | 400 | 30.2 | 65.4 | 18.1 | 16.5 | 1 |
| Example 86 | PGMEA | 60 | 132.16 | 493 | 27.9 | 56.5 | 19.8 | 23.7 | 1 |
| Example 87 | PGMEA | 60 | 132.16 | 493 | 27.9 | 56.5 | 19.8 | 23.7 | 1 |
| Example 88 | PGMEA | 60 | 132.16 | 493 | 27.9 | 56.5 | 19.8 | 23.7 | 1 |
| Example 89 | PGMEA | 60 | 132.16 | 493 | 27.9 | 56.5 | 19.8 | 23.7 | 1 |
| Example 90 | PGMEA | 60 | 132.16 | 493 | 27.9 | 56.5 | 19.8 | 23.7 | 1 |
| Example 91 | CyHx | 60 | 98.14 | 507 | 34.1 | 61.0 | 21.6 | 17.5 | 1 |
| Example 92 | CyHx | 60 | 98.14 | 507 | 34.1 | 61.0 | 21.6 | 17.5 | 1 |
| Example 93 | CyHx | 60 | 98.14 | 507 | 34.1 | 61.0 | 21.6 | 17.5 | 1 |
| Example 94 | CyHx | 60 | 98.14 | 507 | 34.1 | 61.0 | 21.6 | 17.5 | 1 |
| Example 95 | CyHx | 60 | 98.14 | 507 | 34.1 | 61.0 | 21.6 | 17.5 | 1 |

TABLE 18-continued

| [Table 1-3-2] | Type | Components of chemical liquid Main agent Organic solvent | | | | | | | |
|---|---|---|---|---|---|---|---|---|---|
| | | Content (% by mass) | Molar mass (g/mol) | Vapor pressure (Pa) | Surface tension (mN/m) | fd | fp | fh | HP |
| Example 96 | EL | 60 | 118.13 | 187 | 29.8 | 55.5 | 19.8 | 24.7 | 1 |
| Example 97 | EL | 60 | 118.13 | 187 | 29.8 | 55.5 | 19.8 | 24.7 | 1 |
| Example 98 | EL | 60 | 118.13 | 187 | 29.8 | 55.5 | 19.8 | 24.7 | 1 |
| Example 99 | EL | 60 | 118.13 | 187 | 29.8 | 55.5 | 19.8 | 24.7 | 1 |
| Example 100 | EL | 60 | 118.13 | 187 | 29.8 | 55.5 | 19.8 | 24.7 | 1 |
| Example 101 | HBM | 60 | 118.13 | 267 | 29.1 | 46.0 | 20.1 | 34.0 | 1 |

TABLE 19

| [Table 1-3-3] | Type | Components of chemical liquid Main agent Organic solvent | | | | | | | | | |
|---|---|---|---|---|---|---|---|---|---|---|---|
| | | Content (% by mass) | Molar mass (g/mol) | Vapor pressure (Pa) | Surface tension (mN/m) | fd | fp | fh | HP | Vapor pressure (Pa) | Surface tension (mN/m) |
| Example 68 | EC | 20 | 88.06 | 67 | 41.5 | 42.0 | 47.0 | 11.0 | 1 | 610 | 34.3 |
| Example 69 | PC | 20 | 102.09 | 53 | 40.9 | 47.5 | 42.8 | 9.7 | 1 | 624 | 34.0 |
| Example 70 | NMP | 20 | 99.13 | 40 | 41.3 | 48.0 | 32.8 | 19.2 | 1 | 619 | 34.1 |
| Example 71 | GBL | 20 | 86.08 | 147 | 44.1 | 42.9 | 39.5 | 17.6 | 1 | 469 | 32.7 |
| Example 72 | DMSO | 20 | 78.13 | 13 | 43.6 | 40.9 | 36.4 | 22.7 | 1 | 427 | 32.9 |
| Example 73 | EC | 20 | 88.06 | 67 | 41.5 | 42.0 | 47.0 | 11.0 | 1 | 452 | 32.1 |
| Example 74 | PC | 20 | 102.09 | 53 | 40.9 | 47.5 | 42.8 | 9.7 | 1 | 462 | 31.6 |
| Example 75 | NMP | 20 | 99.13 | 40 | 41.3 | 48.0 | 32.8 | 19.2 | 1 | 457 | 31.8 |
| Example 76 | GBL | 20 | 86.08 | 147 | 44.1 | 42.9 | 39.5 | 17.6 | 1 | 511 | 32.4 |
| Example 77 | DMSO | 20 | 78.13 | 13 | 43.6 | 40.9 | 36.4 | 22.7 | 1 | 468 | 32.5 |
| Example 78 | EC | 20 | 88.06 | 67 | 41.5 | 42.0 | 47.0 | 11.0 | 1 | 494 | 31.7 |
| Example 79 | PC | 20 | 102.09 | 53 | 40.9 | 47.5 | 42.8 | 9.7 | 1 | 506 | 31.2 |
| Example 80 | NMP | 20 | 99.13 | 40 | 41.3 | 48.0 | 32.8 | 19.2 | 1 | 500 | 31.4 |
| Example 81 | GBL | 20 | 86.08 | 147 | 44.1 | 42.9 | 39.5 | 17.6 | 1 | 591 | 33.1 |
| Example 82 | DMSO | 20 | 78.13 | 13 | 43.6 | 40.9 | 36.4 | 22.7 | 1 | 544 | 33.2 |
| Example 83 | EC | 20 | 88.06 | 67 | 41.5 | 42.0 | 47.0 | 11.0 | 1 | 574 | 32.4 |
| Example 84 | PC | 20 | 102.09 | 53 | 40.9 | 47.5 | 42.8 | 9.7 | 1 | 589 | 31.9 |
| Example 85 | NMP | 20 | 99.13 | 40 | 41.3 | 48.0 | 32.8 | 19.2 | 1 | 582 | 32.1 |
| Example 86 | GBL | 20 | 86.08 | 147 | 44.1 | 42.9 | 39.5 | 17.6 | 1 | 670 | 33.5 |
| Example 87 | DMSO | 20 | 78.13 | 13 | 43.6 | 40.9 | 36.4 | 22.7 | 1 | 621 | 33.6 |
| Example 88 | EC | 20 | 88.06 | 67 | 41.5 | 42.0 | 47.0 | 11.0 | 1 | 653 | 32.8 |
| Example 89 | PC | 20 | 102.09 | 53 | 40.9 | 47.5 | 42.8 | 9.7 | 1 | 671 | 32.3 |
| Example 90 | NMP | 20 | 99.13 | 40 | 41.3 | 48.0 | 32.8 | 19.2 | 1 | 664 | 32.5 |
| Example 91 | GBL | 20 | 86.08 | 147 | 44.1 | 42.9 | 39.5 | 17.6 | 1 | 652 | 36.2 |
| Example 92 | DMSO | 20 | 78.13 | 13 | 43.6 | 40.9 | 36.4 | 22.7 | 1 | 610 | 36.2 |
| Example 93 | EC | 20 | 88.06 | 67 | 41.5 | 42.0 | 47.0 | 11.0 | 1 | 638 | 35.6 |
| Example 94 | PC | 20 | 102.09 | 53 | 40.9 | 47.5 | 42.8 | 9.7 | 1 | 652 | 35.3 |
| Example 95 | NMP | 20 | 99.13 | 40 | 41.3 | 48.0 | 32.8 | 19.2 | 1 | 646 | 35.4 |
| Example 96 | GBL | 20 | 86.08 | 147 | 44.1 | 42.9 | 39.5 | 17.6 | 1 | 501 | 34.2 |
| Example 97 | DMSO | 20 | 78.13 | 13 | 43.6 | 40.9 | 36.4 | 22.7 | 1 | 459 | 34.3 |
| Example 98 | EC | 20 | 88.06 | 67 | 41.5 | 42.0 | 47.0 | 11.0 | 1 | 484 | 33.5 |
| Example 99 | PC | 20 | 102.09 | 53 | 40.9 | 47.5 | 42.8 | 9.7 | 1 | 496 | 33.1 |
| Example 100 | NMP | 20 | 99.13 | 40 | 41.3 | 48.0 | 32.8 | 19.2 | 1 | 490 | 33.3 |
| Example 101 | GBL | 20 | 86.08 | 147 | 44.1 | 42.9 | 39.5 | 17.6 | 1 | 543 | 33.8 |

TABLE 20

| [Table 1-3-4] | Components of chemical liquid Main agent Content (% by mass) | Components of chemical liquid Surfactant Type | Content (mass ppm) | Impurity metal Total content of impurity metal (mass ppt) | | | | | |
|---|---|---|---|---|---|---|---|---|---|
| | | | | Fe | Cr | Ni | Pb | Others | Total |
| Example 68 | Balance | D | 100 | 0.006 | 0.002 | 0.006 | 0.002 | 0.048 | 0.064 |
| Example 69 | Balance | J | 1,000 | 0.004 | 0.004 | 0.004 | 0.002 | 0.042 | 0.056 |
| Example 70 | Balance | A | 300 | 0.006 | 0.004 | 0.004 | 0.006 | 0.06 | 0.08 |
| Example 71 | Balance | E | 100 | 0.004 | 0.002 | 0.006 | 0.002 | 0.042 | 0.056 |
| Example 72 | Balance | B | 100 | 0.004 | 0.002 | 0.004 | 0.002 | 0.036 | 0.048 |
| Example 73 | Balance | A | 100 | 0.006 | 0.004 | 0.006 | 0.002 | 0.054 | 0.072 |
| Example 74 | Balance | I | 100 | 0.004 | 0.002 | 0.004 | 0.004 | 0.042 | 0.056 |
| Example 75 | Balance | A | 50 | 0.004 | 0.004 | 0.006 | 0.002 | 0.048 | 0.064 |
| Example 76 | Balance | B | 100 | 0.006 | 0.002 | 0.008 | 0.002 | 0.054 | 0.072 |
| Example 77 | Balance | D | 100 | 0.004 | 0.004 | 0.006 | 0.002 | 0.048 | 0.064 |
| Example 78 | Balance | C | 100 | 0.004 | 0.002 | 0.01 | 0.004 | 0.06 | 0.08 |
| Example 79 | Balance | A | 100 | 0.006 | 0.004 | 0.006 | 0.002 | 0.054 | 0.072 |
| Example 80 | Balance | E | 50 | 0.004 | 0.004 | 0.008 | 0.002 | 0.054 | 0.072 |
| Example 81 | Balance | E | 100 | 0.004 | 0.002 | 0.006 | 0.006 | 0.054 | 0.072 |
| Example 82 | Balance | A | 100 | 0.006 | 0.002 | 0.008 | 0.002 | 0.054 | 0.072 |
| Example 83 | Balance | E | 50 | 0.006 | 0.006 | 0.006 | 0.004 | 0.066 | 0.088 |
| Example 84 | Balance | E | 100 | 0.004 | 0.004 | 0.008 | 0.002 | 0.054 | 0.072 |
| Example 85 | Balance | A | 100 | 0.004 | 0.006 | 0.006 | 0.002 | 0.054 | 0.072 |
| Example 86 | Balance | G | 50 | 0.006 | 0.004 | 0.004 | 0.002 | 0.048 | 0.064 |
| Example 87 | Balance | D | 100 | 0.004 | 0.002 | 0.004 | 0.004 | 0.042 | 0.056 |
| Example 88 | Balance | H | 1,000 | 0.004 | 0.004 | 0.006 | 0.002 | 0.048 | 0.064 |
| Example 89 | Balance | A | 100 | 0.006 | 0.006 | 0.004 | 0.002 | 0.054 | 0.072 |
| Example 90 | Balance | I | 100 | 0.008 | 0.004 | 0.006 | 0.004 | 0.066 | 0.088 |
| Example 91 | Balance | J | 1,000 | 0.004 | 0.004 | 0.006 | 0.002 | 0.048 | 0.064 |
| Example 92 | Balance | A | 300 | 0.006 | 0.004 | 0.004 | 0.002 | 0.048 | 0.064 |
| Example 93 | Balance | B | 100 | 0.004 | 0.002 | 0.006 | 0.004 | 0.048 | 0.064 |
| Example 94 | Balance | E | 100 | 0.006 | 0.002 | 0.008 | 0.002 | 0.054 | 0.072 |
| Example 95 | Balance | A | 100 | 0.004 | 0.006 | 0.006 | 0.002 | 0.054 | 0.072 |
| Example 96 | Balance | F | 100 | 0.004 | 0.004 | 0.006 | 0.004 | 0.054 | 0.072 |
| Example 97 | Balance | E | 1,000 | 0.004 | 0.004 | 0.004 | 0.002 | 0.042 | 0.056 |
| Example 98 | Balance | A | 100 | 0.006 | 0.004 | 0.006 | 0.004 | 0.06 | 0.08 |
| Example 99 | Balance | C | 50 | 0.004 | 0.002 | 0.004 | 0.002 | 0.036 | 0.048 |
| Example 100 | Balance | A | 100 | 0.006 | 0.002 | 0.006 | 0.002 | 0.048 | 0.064 |
| Example 101 | Balance | B | 100 | 0.004 | 0.002 | 0.004 | 0.002 | 0.036 | 0.048 |

TABLE 21

| [Table 1-3-5] | Components of chemical liquid Impurity metal Content of particles containing following impurity metal (mass ppt) | | | | | | Organic impurity Content (mass ppm) Total | High-boiling-point component | Water Content (% by mass) |
|---|---|---|---|---|---|---|---|---|---|
| | Fe | Cr | Ni | Pb | Others | Total | | | |
| Example 68 | 0.003 | 0.001 | 0.003 | 0.001 | 0.016 | 0.024 | 86 | 0.3 | 0.10% |
| Example 69 | 0.002 | 0.002 | 0.002 | 0.001 | 0.017 | 0.024 | 233 | 0.9 | 0.10% |
| Example 70 | 0.003 | 0.002 | 0.002 | 0.003 | 0.021 | 0.031 | 280 | 1.1 | 0.10% |
| Example 71 | 0.002 | 0.001 | 0.003 | 0.001 | 0.018 | 0.025 | 196 | 0.8 | 0.10% |
| Example 72 | 0.002 | 0.001 | 0.002 | 0.001 | 0.02 | 0.026 | 177 | 0.7 | 0.10% |
| Example 73 | 0.003 | 0.002 | 0.003 | 0.001 | 0.018 | 0.027 | 88 | 0.4 | 0.10% |
| Example 74 | 0.002 | 0.001 | 0.002 | 0.002 | 0.02 | 0.027 | 238 | 1.0 | 0.10% |
| Example 75 | 0.002 | 0.002 | 0.003 | 0.001 | 0.019 | 0.027 | 286 | 1.1 | 0.10% |
| Example 76 | 0.003 | 0.001 | 0.004 | 0.001 | 0.016 | 0.025 | 200 | 0.8 | 0.10% |
| Example 77 | 0.002 | 0.002 | 0.003 | 0.001 | 0.016 | 0.024 | 180 | 0.7 | 0.10% |
| Example 78 | 0.002 | 0.001 | 0.005 | 0.002 | 0.017 | 0.027 | 90 | 0.4 | 0.10% |
| Example 79 | 0.003 | 0.002 | 0.003 | 0.001 | 0.019 | 0.028 | 243 | 1.0 | 0.10% |
| Example 80 | 0.002 | 0.002 | 0.004 | 0.001 | 0.016 | 0.025 | 292 | 1.2 | 0.10% |
| Example 81 | 0.002 | 0.001 | 0.003 | 0.003 | 0.016 | 0.025 | 204 | 0.8 | 0.10% |
| Example 82 | 0.003 | 0.001 | 0.004 | 0.001 | 0.013 | 0.022 | 184 | 0.7 | 0.10% |
| Example 83 | 0.003 | 0.003 | 0.003 | 0.002 | 0.014 | 0.025 | 92 | 0.4 | 0.10% |
| Example 84 | 0.002 | 0.002 | 0.004 | 0.001 | 0.015 | 0.024 | 248 | 1.0 | 0.10% |
| Example 85 | 0.002 | 0.003 | 0.003 | 0.001 | 0.016 | 0.025 | 298 | 1.2 | 0.10% |
| Example 86 | 0.003 | 0.002 | 0.002 | 0.001 | 0.017 | 0.025 | 209 | 0.8 | 0.10% |
| Example 87 | 0.002 | 0.001 | 0.002 | 0.002 | 0.018 | 0.025 | 188 | 0.8 | 0.10% |
| Example 88 | 0.002 | 0.002 | 0.003 | 0.001 | 0.021 | 0.029 | 94 | 0.4 | 0.10% |
| Example 89 | 0.003 | 0.003 | 0.002 | 0.001 | 0.017 | 0.026 | 253 | 1.0 | 0.10% |

TABLE 21-continued

| | Components of chemical liquid | | | | | | | |
|---|---|---|---|---|---|---|---|---|
| | Impurity metal Content of particles containing following impurity metal (mass ppt) | | | | | | Organic impurity Content (mass ppm) High-boiling-point | Water Content |
| [Table 1-3-5] | Fe | Cr | Ni | Pb | Others | Total | Total component | (% by mass) |
| Example 90 | 0.004 | 0.002 | 0.003 | 0.002 | 0.016 | 0.027 | 304 1.2 | 0.10% |
| Example 91 | 0.002 | 0.002 | 0.003 | 0.001 | 0.019 | 0.027 | 213 0.9 | 0.10% |
| Example 92 | 0.003 | 0.002 | 0.002 | 0.001 | 0.017 | 0.025 | 192 0.8 | 0.10% |
| Example 93 | 0.002 | 0.001 | 0.003 | 0.002 | 0.016 | 0.024 | 96 0.4 | 0.10% |
| Example 94 | 0.003 | 0.001 | 0.004 | 0.001 | 0.019 | 0.028 | 259 1.0 | 0.10% |
| Example 95 | 0.002 | 0.003 | 0.003 | 0.001 | 0.016 | 0.025 | 310 1.2 | 0.10% |
| Example 96 | 0.002 | 0.002 | 0.003 | 0.002 | 0.017 | 0.026 | 217 0.9 | 0.10% |
| Example 97 | 0.002 | 0.002 | 0.002 | 0.001 | 0.018 | 0.025 | 195 0.8 | 0.10% |
| Example 98 | 0.003 | 0.002 | 0.003 | 0.002 | 0.016 | 0.026 | 98 0.4 | 0.10% |
| Example 99 | 0.002 | 0.001 | 0.002 | 0.001 | 0.016 | 0.022 | 264 1.1 | 0.10% |
| Example 100 | 0.003 | 0.001 | 0.003 | 0.001 | 0.013 | 0.021 | 317 1.3 | 0.10% |
| Example 101 | 0.002 | 0.001 | 0.002 | 0.001 | 0.014 | 0.02 | 222 0.9 | 0.10% |

TABLE 22

| | Physical properties of chemical liquid Number of coarse particles | Content of surfactant/ total content of | Content of surfactant/content of high-boiling-point | Evaluation | | | | | | |
|---|---|---|---|---|---|---|---|---|---|---|
| | | | | | | | Type of resist composition | | | |
| | | | | Defect inhibition | | | Resist saving performance | | | |
| | | | | | | | Affinity | | Film thickness | |
| [Table 1-3-6] | (number/ml) | particles | component | performance | | Rsq1 | SRsq | Uniformity | controllability | Developability |
| Example 68 | 2 | $4.2 \times 10^9$ | $2.9 \times 10^2$ | A | 1 | A | A | A | A | A |
| Example 69 | 5 | $4.2 \times 10^{10}$ | $1.1 \times 10^3$ | A | 1 | A | A | A | A | A |
| Example 70 | 6 | $9.7 \times 10^9$ | $2.7 \times 10^2$ | AA | 1 | A | A | A | A | A |
| Example 71 | 4 | $4.0 \times 10^9$ | $1.3 \times 10^2$ | A | 1 | A | A | A | A | A |
| Example 72 | 4 | $3.8 \times 10^9$ | $1.4 \times 10^2$ | AA | 1 | A | A | A | A | A |
| Example 73 | 2 | $3.7 \times 10^9$ | $2.8 \times 10^2$ | AA | 1 | A | A | A | A | A |
| Example 74 | 5 | $3.7 \times 10^9$ | $1.0 \times 10^2$ | A | 1 | A | A | A | A | A |
| Example 75 | 6 | $1.9 \times 10^9$ | $4.4 \times 10^1$ | AA | 1 | A | A | A | A | A |
| Example 76 | 4 | $4.0 \times 10^9$ | $1.2 \times 10^2$ | AA | 1 | A | A | A | A | A |
| Example 77 | 4 | $4.2 \times 10^9$ | $1.4 \times 10^2$ | A | 1 | A | A | A | A | A |
| Example 78 | 2 | $3.7 \times 10^9$ | $2.8 \times 10^2$ | AA | 1 | A | A | A | A | A |
| Example 79 | 5 | $3.6 \times 10^9$ | $1.0 \times 10^2$ | AA | 1 | A | A | A | A | A |
| Example 80 | 6 | $2.0 \times 10^9$ | $4.3 \times 10^1$ | A | 1 | A | A | A | A | A |
| Example 81 | 4 | $4.0 \times 10^9$ | $1.2 \times 10^2$ | A | 1 | A | A | A | A | A |
| Example 82 | 4 | $4.5 \times 10^9$ | $1.4 \times 10^2$ | AA | 1 | A | A | A | A | A |
| Example 83 | 2 | $2.0 \times 10^9$ | $1.4 \times 10^2$ | A | 1 | A | A | A | A | A |
| Example 84 | 5 | $4.2 \times 10^9$ | $1.0 \times 10^2$ | A | 1 | A | A | A | A | A |
| Example 85 | 6 | $4.0 \times 10^9$ | $8.4 \times 10^1$ | AA | 1 | A | A | A | A | A |
| Example 86 | 4 | $2.0 \times 10^9$ | $6.0 \times 10^1$ | A | 1 | A | A | A | A | A |
| Example 87 | 4 | $4.0 \times 10^9$ | $1.3 \times 10^2$ | A | 1 | A | A | A | A | A |
| Example 88 | 2 | $3.4 \times 10^{10}$ | $2.7 \times 10^3$ | A | 1 | A | A | A | A | A |
| Example 89 | 5 | $3.8 \times 10^9$ | $9.9 \times 10^1$ | AA | 1 | A | A | A | A | A |
| Example 90 | 6 | $3.7 \times 10^9$ | $8.2 \times 10^1$ | A | 1 | A | A | A | A | A |
| Example 91 | 4 | $3.7 \times 10^{10}$ | $1.2 \times 10^3$ | A | 1 | A | A | A | A | A |
| Example 92 | 4 | $1.2 \times 10^{10}$ | $3.9 \times 10^2$ | AA | 1 | A | A | A | A | A |
| Example 93 | 2 | $4.2 \times 10^9$ | $2.6 \times 10^2$ | AA | 1 | A | A | A | A | A |
| Example 94 | 5 | $3.6 \times 10^9$ | $9.7 \times 10^1$ | A | 1 | A | A | A | A | A |
| Example 95 | 6 | $4.0 \times 10^9$ | $8.1 \times 10^1$ | AA | 1 | A | A | A | A | A |
| Example 96 | 4 | $3.8 \times 10^9$ | $1.2 \times 10^2$ | A | 1 | A | A | A | A | A |
| Example 97 | 4 | $4.0 \times 10^{10}$ | $1.3 \times 10^3$ | A | 1 | A | A | A | A | A |
| Example 98 | 2 | $3.8 \times 10^9$ | $2.6 \times 10^2$ | AA | 1 | A | A | A | A | A |
| Example 99 | 5 | $2.3 \times 10^9$ | $4.7 \times 10^1$ | AA | 1 | A | A | A | A | A |
| Example 100 | 6 | $4.8 \times 10^9$ | $7.9 \times 10^1$ | AA | 1 | A | A | A | A | A |
| Example 101 | 4 | $5.0 \times 10^9$ | $1.1 \times 10^2$ | AA | 1 | A | A | A | A | A |

TABLE 23

| [Table 1-3-7] | | Evaluation | | | | | | | | | | |
|---|---|---|---|---|---|---|---|---|---|---|---|---|
| | | Type of resist composition | | | | | Type of resist composition | | | | | |
| | | | Resist saving performance | | | | | | Resist saving performance | | | |
| | | Affinity | | | Film thickness | | | Affinity | | | Film thickness | |
| | | Rsq1 | SRsq | Uniformity | controllability | Developablity | | Rsq1 | SRsq | Uniformity | controllability | Developability |
| Example 68 | 2 | A | A | A | A | A | 3 | A | A | A | A | A |
| Example 69 | 2 | A | A | A | A | A | 3 | A | A | A | A | A |
| Example 70 | 2 | A | A | A | A | A | 3 | A | A | A | A | A |
| Example 71 | 2 | A | A | A | A | A | 3 | A | A | A | A | A |
| Example 72 | 2 | A | A | A | A | A | 3 | A | A | A | A | A |
| Example 73 | 2 | A | A | A | A | A | 3 | A | A | A | A | A |
| Example 74 | 2 | A | A | A | A | A | 3 | A | A | A | A | A |
| Example 75 | 2 | A | A | A | A | A | 3 | A | A | A | A | A |
| Example 76 | 2 | A | A | A | A | A | 3 | A | A | A | A | A |
| Example 77 | 2 | A | A | A | A | A | 3 | A | A | A | A | A |
| Example 78 | 2 | A | A | A | A | A | 3 | A | A | A | A | A |
| Example 79 | 2 | A | A | A | A | A | 3 | A | A | A | A | A |
| Example 80 | 2 | A | A | A | A | A | 3 | A | A | A | A | A |
| Example 81 | 2 | A | A | A | A | A | 3 | A | A | A | A | A |
| Example 82 | 2 | A | A | A | A | A | 3 | A | A | A | A | A |
| Example 83 | 2 | A | A | A | A | A | 3 | A | A | A | A | A |
| Example 84 | 2 | A | A | A | A | A | 3 | A | A | A | A | A |
| Example 85 | 2 | A | A | A | A | A | 3 | A | A | A | A | A |
| Example 86 | 2 | A | A | A | A | A | 3 | A | A | A | A | A |
| Example 87 | 2 | A | A | A | A | A | 3 | A | A | A | A | A |
| Example 88 | 2 | A | A | A | A | A | 3 | A | A | A | A | A |
| Example 89 | 2 | A | A | A | A | A | 3 | A | A | A | A | A |
| Example 90 | 2 | A | A | A | A | A | 3 | A | A | A | A | A |
| Example 91 | 2 | A | A | A | A | A | 3 | A | A | A | A | A |
| Example 92 | 2 | A | A | A | A | A | 3 | A | A | A | A | A |
| Example 93 | 2 | A | A | A | A | A | 3 | A | A | A | A | A |
| Example 94 | 2 | A | A | A | A | A | 3 | A | A | A | A | A |
| Example 95 | 2 | A | A | A | A | A | 3 | A | A | A | A | A |
| Example 96 | 2 | A | A | A | A | A | 3 | A | A | A | A | A |
| Example 97 | 2 | A | A | A | A | A | 3 | A | A | A | A | A |
| Example 98 | 2 | A | A | A | A | A | 3 | A | A | A | A | A |
| Example 99 | 2 | A | A | A | A | A | 3 | A | A | A | A | A |
| Example 100 | 2 | A | A | A | A | A | 3 | A | A | A | A | A |
| Example 101 | 2 | A | A | A | A | A | 3 | A | A | A | A | A |

TABLE 24

| [Table 1-3-8] | | Evaluation | | | | | Evaluation of p-CMP defect inhibition performance | Evaluation of ashing residue removing performance |
|---|---|---|---|---|---|---|---|---|
| | | Type of resist composition | | | | | | |
| | | Resist saving performance | | | | | | |
| | | Affinity | | | Film thickness | | | |
| | | Rsq1 | SRsq | Uniformity | controllability | Developability | | |
| Example 68 | 4 | A | A | A | A | A | A | A |
| Example 69 | 4 | A | A | A | A | A | A | A |
| Example 70 | 4 | A | A | A | A | A | A | A |
| Example 71 | 4 | A | A | A | A | A | A | A |
| Example 72 | 4 | A | A | A | A | A | A | A |
| Example 73 | 4 | A | A | A | A | A | A | A |
| Example 74 | 4 | A | A | A | A | A | A | A |
| Example 75 | 4 | A | A | A | A | A | A | A |
| Example 76 | 4 | A | A | A | A | A | A | A |
| Example 77 | 4 | A | A | A | A | A | A | A |
| Example 78 | 4 | A | A | A | A | A | A | A |
| Example 79 | 4 | A | A | A | A | A | A | A |
| Example 80 | 4 | A | A | A | A | A | A | A |
| Example 81 | 4 | A | A | A | A | A | A | A |
| Example 82 | 4 | A | A | A | A | A | A | A |
| Example 83 | 4 | A | A | A | A | A | A | A |
| Example 84 | 4 | A | A | A | A | A | A | A |
| Example 85 | 4 | A | A | A | A | A | A | A |
| Example 86 | 4 | A | A | A | A | A | A | A |
| Example 87 | 4 | A | A | A | A | A | A | A |

TABLE 24-continued

| [Table 1-3-8] | | Evaluation Type of resist composition | | | | Evaluation of p-CMP defect inhibition performance | Evaluation of ashing residue removing performance |
|---|---|---|---|---|---|---|---|
| | | Affinity | | Resist saving performance | | | |
| | | Rsq1 | SRsq | Film thickness Uniformity | controllability | Developability | | |

| [Table 1-3-8] | | Rsq1 | SRsq | Uniformity | controllability | Developability | performance | performance |
|---|---|---|---|---|---|---|---|---|
| Example 88 | 4 | A | A | A | A | A | A | A |
| Example 89 | 4 | A | A | A | A | A | A | A |
| Example 90 | 4 | A | A | A | A | A | A | A |
| Example 91 | 4 | A | A | A | A | A | A | A |
| Example 92 | 4 | A | A | A | A | A | A | A |
| Example 93 | 4 | A | A | A | A | A | A | A |
| Example 94 | 4 | A | A | A | A | A | A | A |
| Example 95 | 4 | A | A | A | A | A | A | A |
| Example 96 | 4 | A | A | A | A | A | A | A |
| Example 97 | 4 | A | A | A | A | A | A | A |
| Example 98 | 4 | A | A | A | A | A | A | A |
| Example 99 | 4 | A | A | A | A | A | A | A |
| Example 100 | 4 | A | A | A | A | A | A | A |
| Example 101 | 4 | A | A | A | A | A | A | A |

TABLE 25

| [Table 1-4-1] | Type | Components of chemical liquid Main agent Organic solvent | | | | | | | |
|---|---|---|---|---|---|---|---|---|---|
| | | Content (% by mass) | Molar mass (g/mol) | Vapor pressure (Pa) | Surface tension (mN/m) | fd | fp | fh | HP |
| Example 102 | CyPn | 20 | 84.1 | 1,520 | 33.8 | 60.0 | 21.8 | 18.2 | 1 |
| Example 103 | CyPn | 20 | 84.1 | 1,520 | 33.8 | 60.0 | 21.8 | 18.2 | 1 |
| Example 104 | CyPn | 20 | 84.1 | 1,520 | 33.8 | 60.0 | 21.8 | 18.2 | 1 |
| Example 105 | CyPn | 20 | 84.1 | 1,520 | 33.8 | 60.0 | 21.8 | 18.2 | 1 |
| Example 106 | CyPn | 20 | 84.1 | 1,520 | 33.8 | 60.0 | 21.8 | 18.2 | 1 |
| Example 107 | CyPn | 20 | 84.1 | 1,520 | 33.8 | 60.0 | 21.8 | 18.2 | 1 |
| Example 108 | CyPn | 20 | 84.1 | 1,520 | 33.8 | 60.0 | 21.8 | 18.2 | 1 |
| Example 109 | CyPn | 20 | 84.1 | 1,520 | 33.8 | 60.0 | 21.8 | 18.2 | 1 |
| Example 110 | CyPn | 20 | 84.1 | 1,520 | 33.8 | 60.0 | 21.8 | 18.2 | 1 |
| Example 111 | nBA | 20 | 116.2 | 1,200 | 24.8 | 60.5 | 17.2 | 22.2 | 1 |
| Example 112 | nBA | 20 | 116.2 | 1,200 | 24.8 | 60.5 | 17.2 | 22.2 | 1 |
| Example 113 | nBA | 20 | 116.2 | 1,200 | 24.8 | 60.5 | 17.2 | 22.2 | 1 |
| Example 114 | nBA | 20 | 116.2 | 1,200 | 24.8 | 60.5 | 17.2 | 22.2 | 1 |
| Example 115 | nBA | 20 | 116.2 | 1,200 | 24.8 | 60.5 | 17.2 | 22.2 | 1 |
| Example 116 | nBA | 20 | 116.2 | 1,200 | 24.8 | 60.5 | 17.2 | 22.2 | 1 |
| Example 117 | nBA | 20 | 116.2 | 1,200 | 24.8 | 60.5 | 17.2 | 22.2 | 1 |
| Example 118 | nBA | 20 | 116.2 | 1,200 | 24.8 | 60.5 | 17.2 | 22.2 | 1 |
| Example 119 | nBA | 20 | 116.2 | 1,200 | 24.8 | 60.5 | 17.2 | 22.2 | 1 |
| Example 120 | nBA | 20 | 116.2 | 1,200 | 24.8 | 60.5 | 17.2 | 22.2 | 1 |
| Example 121 | nBA | 20 | 116.2 | 1,200 | 24.8 | 60.5 | 17.2 | 22.2 | 1 |
| Example 122 | nBA | 20 | 116.2 | 1,200 | 24.8 | 60.5 | 17.2 | 22.2 | 1 |
| Example 123 | nBA | 20 | 116.2 | 1,200 | 24.8 | 60.5 | 17.2 | 22.2 | 1 |
| Example 124 | nBA | 20 | 116.2 | 1,200 | 24.8 | 60.5 | 17.2 | 22.2 | 1 |
| Example 125 | nBA | 20 | 116.2 | 1,200 | 24.8 | 60.5 | 17.2 | 22.2 | 1 |
| Example 126 | nBA | 20 | 116.2 | 1,200 | 24.8 | 60.5 | 17.2 | 22.2 | 1 |
| Example 127 | nBA | 20 | 116.2 | 1,200 | 24.8 | 60.5 | 17.2 | 22.2 | 1 |
| Example 128 | nBA | 20 | 116.2 | 1,200 | 24.8 | 60.5 | 17.2 | 22.2 | 1 |
| Example 129 | nBA | 20 | 116.2 | 1,200 | 24.8 | 60.5 | 17.2 | 22.2 | 1 |
| Example 130 | nBA | 20 | 116.2 | 1,200 | 24.8 | 60.5 | 17.2 | 22.2 | 1 |
| Example 131 | nBA | 20 | 116.2 | 1,200 | 24.8 | 60.5 | 17.2 | 22.2 | 1 |
| Example 132 | nBA | 20 | 116.2 | 1,200 | 24.8 | 60.5 | 17.2 | 22.2 | 1 |
| Example 133 | nBA | 20 | 116.2 | 1,200 | 24.8 | 60.5 | 17.2 | 22.2 | 1 |

TABLE 26

Components of chemical liquid
Main agent
Organic solvent

| [Table 1-4-2] | Type | Content (% by mass) | Molar mass (g/mol) | Vapor pressure (Pa) | Surface tension (mN/m) | fd | fp | fh | HP |
|---|---|---|---|---|---|---|---|---|---|
| Example 102 | HBM | 60 | 118.13 | 267 | 29.1 | 46.0 | 20.1 | 34.0 | 1 |
| Example 103 | HBM | 60 | 118.13 | 267 | 29.1 | 46.0 | 20.1 | 34.0 | 1 |
| Example 104 | HBM | 60 | 118.13 | 267 | 29.1 | 46.0 | 20.1 | 34.0 | 1 |
| Example 105 | HBM | 60 | 118.13 | 267 | 29.1 | 46.0 | 20.1 | 34.0 | 1 |
| Example 106 | DBCPN | 60 | 130.18 | 400 | 30.2 | 65.4 | 18.1 | 16.5 | 1 |
| Example 107 | DBCPN | 60 | 130.18 | 400 | 30.2 | 65.4 | 18.1 | 16.5 | 1 |
| Example 108 | DBCPN | 60 | 130.18 | 400 | 30.2 | 65.4 | 18.1 | 16.5 | 1 |
| Example 109 | DBCPN | 60 | 130.18 | 400 | 30.2 | 65.4 | 18.1 | 16.5 | 1 |
| Example 110 | DBCPN | 60 | 130.18 | 400 | 30.2 | 65.4 | 18.1 | 16.5 | 1 |
| Example 111 | PGMEA | 60 | 132.16 | 493 | 27.9 | 56.5 | 19.8 | 23.7 | 1 |
| Example 112 | PGMEA | 60 | 132.16 | 493 | 27.9 | 56.5 | 19.8 | 23.7 | 1 |
| Example 113 | PGMEA | 60 | 132.16 | 493 | 27.9 | 56.5 | 19.8 | 23.7 | 1 |
| Example 114 | PGMEA | 60 | 132.16 | 493 | 27.9 | 56.5 | 19.8 | 23.7 | 1 |
| Example 115 | PGMEA | 60 | 132.16 | 493 | 27.9 | 56.5 | 19.8 | 23.7 | 1 |
| Example 116 | CyHx | 60 | 98.14 | 507 | 34.1 | 61.0 | 21.6 | 17.5 | 1 |
| Example 117 | CyHx | 60 | 98.14 | 507 | 34.1 | 61.0 | 21.6 | 17.5 | 1 |
| Example 118 | CyHx | 60 | 98.14 | 507 | 34.1 | 61.0 | 21.6 | 17.5 | 1 |
| Example 119 | CyHx | 60 | 98.14 | 507 | 34.1 | 61.0 | 21.6 | 17.5 | 1 |
| Example 120 | CyHx | 60 | 98.14 | 507 | 34.1 | 61.0 | 21.6 | 17.5 | 1 |
| Example 121 | EL | 60 | 118.13 | 187 | 29.8 | 55.5 | 19.8 | 24.7 | 1 |
| Example 122 | EL | 60 | 118.13 | 187 | 29.8 | 55.5 | 19.8 | 24.7 | 1 |
| Example 123 | EL | 60 | 118.13 | 187 | 29.8 | 55.5 | 19.8 | 24.7 | 1 |
| Example 124 | EL | 60 | 118.13 | 187 | 29.8 | 55.5 | 19.8 | 24.7 | 1 |
| Example 125 | EL | 60 | 118.13 | 187 | 29.8 | 55.5 | 19.8 | 24.7 | 1 |
| Example 126 | HBM | 60 | 118.13 | 267 | 29.1 | 46.0 | 20.1 | 34.0 | 1 |
| Example 127 | HBM | 60 | 118.13 | 267 | 29.1 | 46.0 | 20.1 | 34.0 | 1 |
| Example 128 | HBM | 60 | 118.13 | 267 | 29.1 | 46.0 | 20.1 | 34.0 | 1 |
| Example 129 | HBM | 60 | 118.13 | 267 | 29.1 | 46.0 | 20.1 | 34.0 | 1 |
| Example 130 | HBM | 60 | 118.13 | 267 | 29.1 | 46.0 | 20.1 | 34.0 | 1 |
| Example 131 | DBCPN | 60 | 130.18 | 400 | 30.2 | 65.4 | 18.1 | 16.5 | 1 |
| Example 132 | DBCPN | 60 | 130.18 | 400 | 30.2 | 65.4 | 18.1 | 16.5 | 1 |
| Example 133 | DBCPN | 60 | 130.18 | 400 | 30.2 | 65.4 | 18.1 | 16.5 | 1 |

TABLE 27

Components of chemical liquid
Main agent
Organic solvent

| [Table 1-4-3] | Type | Content (% by mass) | Molar mass (g/mol) | Vapor pressure (Pa) | Surface tension (mN/m) | fd | fp | fh | HP | Vapor pressure (Pa) | Surface tension (mN/m) |
|---|---|---|---|---|---|---|---|---|---|---|---|
| Example 102 | DMSO | 20 | 78.13 | 13 | 43.6 | 40.9 | 36.4 | 22.7 | 1 | 499 | 33.9 |
| Example 103 | EC | 20 | 88.06 | 67 | 41.5 | 42.0 | 47.0 | 11.0 | 1 | 526 | 33.1 |
| Example 104 | PC | 20 | 102.09 | 53 | 40.9 | 47.5 | 42.8 | 9.7 | 1 | 539 | 32.7 |
| Example 105 | NMP | 20 | 99.13 | 40 | 41.3 | 48.0 | 32.8 | 19.2 | 1 | 533 | 32.9 |
| Example 106 | GBL | 20 | 86.08 | 147 | 44.1 | 42.9 | 39.5 | 17.6 | 1 | 623 | 34.6 |
| Example 107 | DMSO | 20 | 78.13 | 13 | 43.6 | 40.9 | 36.4 | 22.7 | 1 | 575 | 34.7 |
| Example 108 | EC | 20 | 88.06 | 67 | 41.5 | 42.0 | 47.0 | 11.0 | 1 | 606 | 33.9 |
| Example 109 | PC | 20 | 102.09 | 53 | 40.9 | 47.5 | 42.8 | 9.7 | 1 | 622 | 33.5 |
| Example 110 | NMP | 20 | 99.13 | 40 | 41.3 | 48.0 | 32.8 | 19.2 | 1 | 615 | 33.6 |
| Example 111 | GBL | 20 | 86.08 | 147 | 44.1 | 42.9 | 39.5 | 17.6 | 1 | 541 | 31.7 |
| Example 112 | DMSO | 20 | 78.13 | 13 | 43.6 | 40.9 | 36.4 | 22.7 | 1 | 492 | 31.9 |
| Example 113 | EC | 20 | 88.06 | 67 | 41.5 | 42.0 | 47.0 | 11.0 | 1 | 522 | 30.9 |
| Example 114 | PC | 20 | 102.09 | 53 | 40.9 | 47.5 | 42.8 | 9.7 | 1 | 536 | 30.3 |
| Example 115 | NMP | 20 | 99.13 | 40 | 41.3 | 48.0 | 32.8 | 19.2 | 1 | 530 | 30.5 |
| Example 116 | GBL | 20 | 86.08 | 147 | 44.1 | 42.9 | 39.5 | 17.6 | 1 | 542 | 34.8 |
| Example 117 | DMSO | 20 | 78.13 | 13 | 43.6 | 40.9 | 36.4 | 22.7 | 1 | 500 | 34.9 |
| Example 118 | EC | 20 | 88.06 | 67 | 41.5 | 42.0 | 47.0 | 11.0 | 1 | 526 | 34.2 |
| Example 119 | PC | 20 | 102.09 | 53 | 40.9 | 47.5 | 42.8 | 9.7 | 1 | 538 | 33.8 |
| Example 120 | NMP | 20 | 99.13 | 40 | 41.3 | 48.0 | 32.8 | 19.2 | 1 | 532 | 33.9 |
| Example 121 | GBL | 20 | 86.08 | 147 | 44.1 | 42.9 | 39.5 | 17.6 | 1 | 368 | 32.5 |
| Example 122 | DMSO | 20 | 78.13 | 13 | 43.6 | 40.9 | 36.4 | 22.7 | 1 | 326 | 32.7 |
| Example 123 | EC | 20 | 88.06 | 67 | 41.5 | 42.0 | 47.0 | 11.0 | 1 | 349 | 31.8 |
| Example 124 | PC | 20 | 102.09 | 53 | 40.9 | 47.5 | 42.8 | 9.7 | 1 | 356 | 31.3 |
| Example 125 | NMP | 20 | 99.13 | 40 | 41.3 | 48.0 | 32.8 | 19.2 | 1 | 351 | 31.5 |

TABLE 27-continued

| [Table 1-4-3] | Type | Content (% by mass) | Molar mass (g/mol) | Vapor pressure (Pa) | Surface tension (mN/m) | fd | fp | fh | HP | Vapor pressure (Pa) | Surface tension (mN/m) |
|---|---|---|---|---|---|---|---|---|---|---|---|
| Example 126 | GBL | 20 | 86.08 | 147 | 44.1 | 42.9 | 39.5 | 17.6 | 1 | 412 | 32.1 |
| Example 127 | DMSO | 20 | 78.13 | 13 | 43.6 | 40.9 | 36.4 | 22.7 | 1 | 369 | 32.3 |
| Example 128 | EC | 20 | 88.06 | 67 | 41.5 | 42.0 | 47.0 | 11.0 | 1 | 394 | 31.4 |
| Example 129 | PC | 20 | 102.09 | 53 | 40.9 | 47.5 | 42.8 | 9.7 | 1 | 402 | 30.9 |
| Example 130 | NMP | 20 | 99.13 | 40 | 41.3 | 48.0 | 32.8 | 19.2 | 1 | 397 | 31.1 |
| Example 131 | GBL | 20 | 86.08 | 147 | 44.1 | 42.9 | 39.5 | 17.6 | 1 | 491 | 32.9 |
| Example 132 | DMSO | 20 | 78.13 | 13 | 43.6 | 40.9 | 36.4 | 22.7 | 1 | 444 | 33.0 |
| Example 133 | EC | 20 | 88.06 | 67 | 41.5 | 42.0 | 47.0 | 11.0 | 1 | 472 | 32.1 |

TABLE 28

| | Components of chemical liquid Main agent | Components of chemical liquid Surfactant | | Components of chemical liquid Impurity metal | | | | | |
|---|---|---|---|---|---|---|---|---|---|
| | Content | | Content | Total content of impurity metal (mass ppt) | | | | | |
| [Table 1-4-4] | (% by mass) | Type | (mass ppm) | Fe | Cr | Ni | Pb | Others | Total |
| Example 102 | Balance | I | 100 | 0.006 | 0.002 | 0.006 | 0.004 | 0.054 | 0.072 |
| Example 103 | Balance | A | 100 | 0.004 | 0.002 | 0.008 | 0.002 | 0.048 | 0.064 |
| Example 104 | Balance | J | 50 | 0.006 | 0.002 | 0.006 | 0.004 | 0.054 | 0.072 |
| Example 105 | Balance | C | 100 | 0.004 | 0.002 | 0.006 | 0.002 | 0.042 | 0.056 |
| Example 106 | Balance | B | 100 | 0.006 | 0.006 | 0.006 | 0.004 | 0.066 | 0.088 |
| Example 107 | Balance | E | 100 | 0.004 | 0.002 | 0.004 | 0.002 | 0.036 | 0.048 |
| Example 108 | Balance | A | 300 | 0.006 | 0.004 | 0.006 | 0.004 | 0.06 | 0.08 |
| Example 109 | Balance | D | 100 | 0.004 | 0.002 | 0.004 | 0.002 | 0.036 | 0.048 |
| Example 110 | Balance | A | 100 | 0.004 | 0.002 | 0.006 | 0.004 | 0.048 | 0.064 |
| Example 111 | Balance | F | 300 | 0.006 | 0.004 | 0.006 | 0.002 | 0.054 | 0.072 |
| Example 112 | Balance | G | 100 | 0.004 | 0.002 | 0.008 | 0.004 | 0.054 | 0.072 |
| Example 113 | Balance | A | 50 | 0.006 | 0.002 | 0.006 | 0.002 | 0.048 | 0.064 |
| Example 114 | Balance | H | 100 | 0.004 | 0.002 | 0.004 | 0.004 | 0.042 | 0.056 |
| Example 115 | Balance | A | 100 | 0.004 | 0.002 | 0.006 | 0.002 | 0.042 | 0.056 |
| Example 116 | Balance | A | 50 | 0.006 | 0.004 | 0.004 | 0.002 | 0.048 | 0.064 |
| Example 117 | Balance | I | 100 | 0.004 | 0.002 | 0.006 | 0.004 | 0.048 | 0.064 |
| Example 118 | Balance | J | 100 | 0.006 | 0.002 | 0.006 | 0.002 | 0.048 | 0.064 |
| Example 119 | Balance | B | 100 | 0.004 | 0.004 | 0.008 | 0.002 | 0.054 | 0.072 |
| Example 120 | Balance | A | 100 | 0.004 | 0.002 | 0.006 | 0.004 | 0.048 | 0.064 |
| Example 121 | Balance | H | 50 | 0.006 | 0.002 | 0.01 | 0.002 | 0.06 | 0.08 |
| Example 122 | Balance | C | 100 | 0.004 | 0.002 | 0.006 | 0.002 | 0.042 | 0.056 |
| Example 123 | Balance | F | 50 | 0.006 | 0.004 | 0.004 | 0.004 | 0.054 | 0.072 |
| Example 124 | Balance | A | 100 | 0.004 | 0.002 | 0.008 | 0.002 | 0.048 | 0.064 |
| Example 125 | Balance | B | 100 | 0.006 | 0.002 | 0.006 | 0.002 | 0.048 | 0.064 |
| Example 126 | Balance | I | 100 | 0.006 | 0.004 | 0.004 | 0.002 | 0.048 | 0.064 |
| Example 127 | Balance | A | 50 | 0.004 | 0.002 | 0.008 | 0.002 | 0.048 | 0.064 |
| Example 128 | Balance | E | 100 | 0.006 | 0.002 | 0.006 | 0.004 | 0.054 | 0.072 |
| Example 129 | Balance | C | 100 | 0.004 | 0.002 | 0.008 | 0.002 | 0.048 | 0.064 |
| Example 130 | Balance | A | 300 | 0.006 | 0.004 | 0.006 | 0.002 | 0.054 | 0.072 |
| Example 131 | Balance | B | 100 | 0.006 | 0.002 | 0.008 | 0.004 | 0.06 | 0.08 |
| Example 132 | Balance | F | 50 | 0.006 | 0.002 | 0.006 | 0.002 | 0.048 | 0.064 |
| Example 133 | Balance | A | 100 | 0.004 | 0.002 | 0.006 | 0.002 | 0.042 | 0.056 |
| | | E | 50 | | | | | | |

TABLE 29

| | Components of chemical liquid | | | | | | | | |
|---|---|---|---|---|---|---|---|---|---|
| | Impurity metal Content of particles containing following impurity metal (mass ppt) | | | | | | Organic impurity Content (mass ppm) | | Water |
| [Table 1-4-5] | Fe | Cr | Ni | Pb | Others | Total | Total | High-boiling-point component | Content (% by mass) |
| Example 102 | 0.003 | 0.001 | 0.003 | 0.002 | 0.015 | 0.024 | 199 | 0.8 | 0.10% |
| Example 103 | 0.002 | 0.001 | 0.004 | 0.001 | 0.016 | 0.024 | 100 | 0.4 | 0.10% |
| Example 104 | 0.003 | 0.001 | 0.003 | 0.002 | 0.019 | 0.028 | 269 | 1.1 | 0.10% |
| Example 105 | 0.002 | 0.001 | 0.003 | 0.001 | 0.018 | 0.025 | 323 | 1.3 | 0.10% |
| Example 106 | 0.003 | 0.003 | 0.003 | 0.002 | 0.016 | 0.027 | 226 | 0.9 | 0.10% |
| Example 107 | 0.002 | 0.001 | 0.002 | 0.001 | 0.016 | 0.022 | 204 | 0.8 | 0.10% |
| Example 108 | 0.003 | 0.002 | 0.003 | 0.002 | 0.017 | 0.027 | 102 | 0.4 | 0.10% |
| Example 109 | 0.002 | 0.001 | 0.002 | 0.001 | 0.018 | 0.024 | 275 | 1.1 | 0.10% |
| Example 110 | 0.002 | 0.001 | 0.003 | 0.002 | 0.016 | 0.024 | 330 | 1.3 | 0.10% |
| Example 111 | 0.003 | 0.002 | 0.003 | 0.001 | 0.016 | 0.025 | 231 | 0.9 | 0.10% |
| Example 112 | 0.002 | 0.001 | 0.004 | 0.002 | 0.019 | 0.028 | 208 | 0.8 | 0.10% |
| Example 113 | 0.003 | 0.001 | 0.003 | 0.001 | 0.017 | 0.025 | 104 | 0.4 | 0.10% |
| Example 114 | 0.002 | 0.001 | 0.002 | 0.002 | 0.016 | 0.023 | 281 | 1.1 | 0.10% |
| Example 115 | 0.002 | 0.001 | 0.003 | 0.001 | 0.016 | 0.023 | 337 | 1.3 | 0.10% |
| Example 116 | 0.003 | 0.002 | 0.002 | 0.001 | 0.013 | 0.021 | 236 | 0.9 | 0.10% |
| Example 117 | 0.002 | 0.001 | 0.003 | 0.002 | 0.014 | 0.022 | 212 | 0.8 | 0.10% |
| Example 118 | 0.003 | 0.001 | 0.003 | 0.001 | 0.015 | 0.023 | 106 | 0.4 | 0.10% |
| Example 119 | 0.002 | 0.002 | 0.004 | 0.001 | 0.016 | 0.025 | 286 | 1.1 | 0.10% |
| Example 120 | 0.002 | 0.001 | 0.003 | 0.002 | 0.019 | 0.027 | 344 | 1.4 | 0.10% |
| Example 121 | 0.003 | 0.001 | 0.005 | 0.001 | 0.02 | 0.03 | 240 | 1.0 | 0.10% |
| Example 122 | 0.002 | 0.001 | 0.003 | 0.001 | 0.016 | 0.023 | 216 | 0.9 | 0.10% |
| Example 123 | 0.003 | 0.002 | 0.002 | 0.002 | 0.016 | 0.025 | 108 | 0.4 | 0.10% |
| Example 124 | 0.002 | 0.001 | 0.004 | 0.001 | 0.021 | 0.029 | 292 | 1.2 | 0.10% |
| Example 125 | 0.003 | 0.001 | 0.003 | 0.001 | 0.016 | 0.024 | 351 | 1.4 | 0.10% |
| Example 126 | 0.003 | 0.002 | 0.002 | 0.001 | 0.016 | 0.024 | 245 | 1.0 | 0.10% |
| Example 127 | 0.002 | 0.001 | 0.004 | 0.001 | 0.016 | 0.024 | 221 | 0.9 | 0.10% |
| Example 128 | 0.003 | 0.001 | 0.003 | 0.002 | 0.02 | 0.029 | 110 | 0.4 | 0.10% |
| Example 129 | 0.002 | 0.001 | 0.004 | 0.001 | 0.021 | 0.029 | 298 | 1.2 | 0.10% |
| Example 130 | 0.003 | 0.002 | 0.003 | 0.001 | 0.016 | 0.025 | 358 | 1.4 | 0.10% |
| Example 131 | 0.003 | 0.001 | 0.004 | 0.002 | 0.016 | 0.026 | 251 | 1.0 | 0.10% |
| Example 132 | 0.003 | 0.001 | 0.003 | 0.001 | 0.013 | 0.021 | 225 | 0.9 | 0.10% |
| Example 133 | 0.002 | 0.001 | 0.003 | 0.001 | 0.014 | 0.021 | 113 | 0.5 | 0.10% |

TABLE 30

| | Physical properties of chemical liquid Number of coarse particles (number/ml) | Content of surfactant/total content of particles | Content of surfactant/ content of high-boiling-point component | Evaluation | | | | | | |
|---|---|---|---|---|---|---|---|---|---|---|
| | | | | | | Type of resist composition | | | | |
| | | | | Defect inhibition performance | | | Resist saving performance | | | |
| | | | | | Affinity | | | Film thickness | | |
| [Table 1-4-6] | | | | | Rsq1 | SRsq | Uniformity | controllability | Developability | |
| Example 102 | 4 | $4.2 \times 10^9$ | $1.3 \times 10^2$ | A | 1 | A | A | A | A | A |
| Example 103 | 2 | $4.2 \times 10^9$ | $2.5 \times 10^2$ | AA | 1 | A | A | A | A | A |
| Example 104 | 5 | $1.8 \times 10^9$ | $4.6 \times 10^1$ | A | 1 | A | A | A | A | A |
| Example 105 | 6 | $4.0 \times 10^9$ | $7.7 \times 10^1$ | AA | 1 | A | A | A | A | A |
| Example 106 | 5 | $3.7 \times 10^9$ | $1.1 \times 10^2$ | AA | 1 | A | A | A | A | A |
| Example 107 | 4 | $4.5 \times 10^9$ | $1.2 \times 10^2$ | A | 1 | A | A | A | A | A |
| Example 108 | 2 | $1.1 \times 10^{10}$ | $7.4 \times 10^2$ | AA | 1 | A | A | A | A | A |
| Example 109 | 5 | $4.2 \times 10^9$ | $9.1 \times 10^1$ | A | 1 | A | A | A | A | A |
| Example 110 | 7 | $4.2 \times 10^9$ | $7.6 \times 10^1$ | AA | 1 | A | A | A | A | A |
| Example 111 | 5 | $1.2 \times 10^{10}$ | $3.2 \times 10^2$ | A | 1 | A | A | A | A | A |
| Example 112 | 4 | $3.6 \times 10^9$ | $1.2 \times 10^2$ | A | 1 | A | A | A | A | A |
| Example 113 | 2 | $2.0 \times 10^9$ | $1.2 \times 10^2$ | AA | 1 | A | A | A | A | A |
| Example 114 | 6 | $4.3 \times 10^9$ | $8.9 \times 10^1$ | A | 1 | A | A | A | A | A |
| Example 115 | 7 | $4.3 \times 10^9$ | $7.4 \times 10^1$ | AA | 1 | A | A | A | A | A |
| Example 116 | 5 | $2.4 \times 10^9$ | $5.3 \times 10^1$ | AA | 1 | A | A | A | A | A |
| Example 117 | 4 | $4.5 \times 10^9$ | $1.2 \times 10^2$ | A | 1 | A | A | A | A | A |
| Example 118 | 2 | $4.3 \times 10^9$ | $2.4 \times 10^2$ | A | 1 | A | A | A | A | A |
| Example 119 | 6 | $4.0 \times 10^9$ | $8.7 \times 10^1$ | AA | 1 | A | A | A | A | A |
| Example 120 | 7 | $3.7 \times 10^9$ | $7.3 \times 10^1$ | AA | 1 | A | A | A | A | A |
| Example 121 | 5 | $1.7 \times 10^9$ | $5.2 \times 10^1$ | A | 1 | A | A | A | A | A |
| Example 122 | 4 | $4.3 \times 10^9$ | $1.2 \times 10^2$ | AA | 1 | A | A | A | A | A |

TABLE 30-continued

| [Table 1-4-6] | Physical properties of chemical liquid Number of coarse particles (number/ml) | Content of surfactant/total content of particles | Content of surfactant/ content of high-boiling-point component | Evaluation Defect inhibition performance | Type of resist composition | Resist saving performance Affinity Rsq1 | SRsq | Uniformity | Film thickness controllability | Developability |
|---|---|---|---|---|---|---|---|---|---|---|
| Example 123 | 2 | $2.0 \times 10^9$ | $1.2 \times 10^2$ | A | 1 | A | A | A | A | A |
| Example 124 | 6 | $3.4 \times 10^9$ | $8.6 \times 10^1$ | AA | 1 | A | A | A | A | A |
| Example 125 | 7 | $4.2 \times 10^9$ | $7.1 \times 10^1$ | AA | 1 | A | A | A | A | A |
| Example 126 | 5 | $4.2 \times 10^9$ | $1.0 \times 10^2$ | A | 1 | A | A | A | A | A |
| Example 127 | 4 | $2.1 \times 10^9$ | $5.7 \times 10^1$ | AA | 1 | A | A | A | A | A |
| Example 128 | 2 | $3.4 \times 10^9$ | $2.3 \times 10^2$ | A | 1 | A | A | A | A | A |
| Example 129 | 6 | $3.4 \times 10^9$ | $8.4 \times 10^1$ | AA | 1 | A | A | A | A | A |
| Example 130 | 7 | $1.2 \times 10^{10}$ | $2.1 \times 10^2$ | AA | 1 | A | A | A | A | A |
| Example 131 | 5 | $3.8 \times 10^9$ | $1.0 \times 10^2$ | AA | 1 | A | A | A | A | A |
| Example 132 | 5 | $2.4 \times 10^9$ | $5.5 \times 10^1$ | A | 1 | A | A | A | A | A |
| Example 133 | 2 | $7.1 \times 10^9$ | $3.3 \times 10^2$ | A | 1 | A | A | A | A | A |

TABLE 31

| [Table 1-4-7] | | Evaluation | | | | | | | | | |
|---|---|---|---|---|---|---|---|---|---|---|---|
| | | Type of resist composition | | | | | Type of resist composition | | | | |
| | | Resist saving performance | | | | | Resist saving performance | | | | |
| | | Affinity | | Film thickness | | | Affinity | | Film thickness | | |
| | | Rsq1 | SRsq | Uniformity | controllability | Developability | | Rsq1 | SRsq | Uniformity | controllability | Developability |
| Example 102 | 2 | A | A | A | A | A | 3 | A | A | A | A | A |
| Example 103 | 2 | A | A | A | A | A | 3 | A | A | A | A | A |
| Example 104 | 2 | A | A | A | A | A | 3 | A | A | A | A | A |
| Example 105 | 2 | A | A | A | A | A | 3 | A | A | A | A | A |
| Example 106 | 2 | A | A | A | A | A | 3 | A | A | A | A | A |
| Example 107 | 2 | A | A | A | A | A | 3 | A | A | A | A | A |
| Example 108 | 2 | A | A | A | A | A | 3 | A | A | A | A | A |
| Example 109 | 2 | A | A | A | A | A | 3 | A | A | A | A | A |
| Example 110 | 2 | A | A | A | A | A | 3 | A | A | A | A | A |
| Example 111 | 2 | A | A | A | A | A | 3 | A | A | A | A | A |
| Example 112 | 2 | A | A | A | A | A | 3 | A | A | A | A | A |
| Example 113 | 2 | A | A | A | A | A | 3 | A | A | A | A | A |
| Example 114 | 2 | A | A | A | A | A | 3 | A | A | A | A | A |
| Example 115 | 2 | A | A | A | A | A | 3 | A | A | A | A | A |
| Example 116 | 2 | A | A | A | A | A | 3 | A | A | A | A | A |
| Example 117 | 2 | A | A | A | A | A | 3 | A | A | A | A | A |
| Example 118 | 2 | A | A | A | A | A | 3 | A | A | A | A | A |
| Example 119 | 2 | A | A | A | A | A | 3 | A | A | A | A | A |
| Example 120 | 2 | A | A | A | A | A | 3 | A | A | A | A | A |
| Example 121 | 2 | A | A | A | A | A | 3 | A | A | A | A | A |
| Example 122 | 2 | A | A | A | A | A | 3 | A | A | A | A | A |
| Example 123 | 2 | A | A | A | A | A | 3 | A | A | A | A | A |
| Example 124 | 2 | A | A | A | A | A | 3 | A | A | A | A | A |
| Example 125 | 2 | A | A | A | A | A | 3 | A | A | A | A | A |
| Example 126 | 2 | A | A | A | A | A | 3 | A | A | A | A | A |
| Example 127 | 2 | A | A | A | A | A | 3 | A | A | A | A | A |
| Example 128 | 2 | A | A | A | A | A | 3 | A | A | A | A | A |
| Example 129 | 2 | A | A | A | A | A | 3 | A | A | A | A | A |
| Example 130 | 2 | A | A | A | A | A | 3 | A | A | A | A | A |
| Example 131 | 2 | A | A | A | A | A | 3 | A | A | A | A | A |
| Example 132 | 2 | A | A | A | A | A | 3 | A | A | A | A | A |
| Example 133 | 2 | A | A | A | A | A | 3 | A | A | A | A | A |

TABLE 32

| [Table 1-4-8] | | Affinity | | Resist saving performance | | | Evaluation of p-CMP defect inhibition performance | Evaluation of ashing residue removing performance |
|---|---|---|---|---|---|---|---|---|
| | Rsq1 | | SRsq | Uniformity | Film thickness controllability | Developability | | |
| Example 102 | 4 | A | A | A | A | A | A | A |
| Example 103 | 4 | A | A | A | A | A | A | A |
| Example 104 | 4 | A | A | A | A | A | A | A |
| Example 105 | 4 | A | A | A | A | A | A | A |
| Example 106 | 4 | A | A | A | A | A | A | A |
| Example 107 | 4 | A | A | A | A | A | A | A |
| Example 108 | 4 | A | A | A | A | A | A | A |
| Example 109 | 4 | A | A | A | A | A | A | A |
| Example 110 | 4 | A | A | A | A | A | A | A |
| Example 111 | 4 | A | A | A | A | A | A | A |
| Example 112 | 4 | A | A | A | A | A | A | A |
| Example 113 | 4 | A | A | A | A | A | A | A |
| Example 114 | 4 | A | A | A | A | A | A | A |
| Example 115 | 4 | A | A | A | A | A | A | A |
| Example 116 | 4 | A | A | A | A | A | A | A |
| Example 117 | 4 | A | A | A | A | A | A | A |
| Example 118 | 4 | A | A | A | A | A | A | A |
| Example 119 | 4 | A | A | A | A | A | A | A |
| Example 120 | 4 | A | A | A | A | A | A | A |
| Example 121 | 4 | A | A | A | A | A | A | A |
| Example 122 | 4 | A | A | A | A | A | A | A |
| Example 123 | 4 | A | A | A | A | A | A | A |
| Example 124 | 4 | A | A | A | A | A | A | A |
| Example 125 | 4 | A | A | A | A | A | A | A |
| Example 126 | 4 | A | A | A | A | A | A | A |
| Example 127 | 4 | A | A | A | A | A | A | A |
| Example 128 | 4 | A | A | A | A | A | A | A |
| Example 129 | 4 | A | A | A | A | A | A | A |
| Example 130 | 4 | A | A | A | A | A | A | A |
| Example 131 | 4 | A | A | A | A | A | A | A |
| Example 132 | 4 | A | A | A | A | A | A | A |
| Example 133 | 4 | A | A | A | A | A | A | A |

TABLE 33

Components of chemical liquid
Main agent
Organic solvent

| [Table 1-5-1] | Type | Content (% by mass) | Molar mass (g/mol) | Vapor pressure (Pa) | Surface tension (mN/m) | fd | fp | fh | HP |
|---|---|---|---|---|---|---|---|---|---|
| Example 134 | nBA | 20 | 116.2 | 1,200 | 24.8 | 60.5 | 17.2 | 22.2 | 1 |
| Example 135 | nBA | 20 | 116.2 | 1,200 | 24.8 | 60.5 | 17.2 | 22.2 | 1 |
| Example 136 | PGME | 30 | 90.1 | 1,453 | 27.6 | 43.2 | 28.8 | 28.0 | 1 |
| Example 137 | PGME | 30 | 90.1 | 1,453 | 27.6 | 43.2 | 28.8 | 28.0 | 1 |
| Example 138 | PGME | 30 | 90.1 | 1,453 | 27.6 | 43.2 | 28.8 | 28.0 | 1 |
| Example 139 | PGME | 30 | 90.1 | 1,453 | 27.6 | 43.2 | 28.8 | 28.0 | 1 |
| Example 140 | PGME | 30 | 90.1 | 1,453 | 27.6 | 43.2 | 28.8 | 28.0 | 1 |
| Example 141 | PGME | 30 | 90.1 | 1,453 | 27.6 | 43.2 | 28.8 | 28.0 | 1 |
| Example 142 | PGME | 30 | 90.1 | 1,453 | 27.6 | 43.2 | 28.8 | 28.0 | 1 |
| Example 143 | PGME | 30 | 90.1 | 1,453 | 27.6 | 43.2 | 28.8 | 28.0 | 1 |
| Example 144 | PGME | 30 | 90.1 | 1,453 | 27.6 | 43.2 | 28.8 | 28.0 | 1 |
| Example 145 | PGME | 30 | 90.1 | 1,453 | 27.6 | 43.2 | 28.8 | 28.0 | 1 |
| Example 146 | PGME | 30 | 90.1 | 1,453 | 27.6 | 43.2 | 28.8 | 28.0 | 1 |
| Example 147 | PGME | 60 | 90.1 | 1,453 | 27.6 | 43.2 | 28.8 | 28.0 | 1 |
| Example 148 | PGME | 80 | 90.1 | 1,453 | 27.6 | 43.2 | 28.8 | 28.0 | 1 |
| Example 149 | CyHx | 95 | 98.14 | 507 | 34.1 | 61.0 | 21.6 | 17.5 | 1 |
| Example 150 | CyHx | 95 | 98.14 | 507 | 34.1 | 61.0 | 21.6 | 17.5 | 1 |
| Example 151 | CyHx | 95 | 98.14 | 507 | 34.1 | 61.0 | 21.6 | 17.5 | 1 |
| Example 152 | CyHx | 95 | 98.14 | 507 | 34.1 | 61.0 | 21.6 | 17.5 | 1 |
| Example 153 | CyHx | 95 | 98.14 | 507 | 34.1 | 61.0 | 21.6 | 17.5 | 1 |
| Example 154 | CyHx | 95 | 98.14 | 507 | 34.1 | 61.0 | 21.6 | 17.5 | 1 |
| Example 155 | CyHx | 95 | 98.14 | 507 | 34.1 | 61.0 | 21.6 | 17.5 | 1 |
| Example 156 | CyHx | 95 | 98.14 | 507 | 34.1 | 61.0 | 21.6 | 17.5 | 1 |
| Example 157 | CyHx | 20 | 98.14 | 507 | 34.1 | 61.0 | 21.6 | 17.5 | 1 |

TABLE 33-continued

Components of chemical liquid
Main agent
Organic solvent

| [Table 1-5-1] | Type | Content (% by mass) | Molar mass (g/mol) | Vapor pressure (Pa) | Surface tension (mN/m) | fd | fp | fh | HP |
|---|---|---|---|---|---|---|---|---|---|
| Example 158 | CyHx | 10 | 98.14 | 507 | 34.1 | 61.0 | 21.6 | 17.5 | 1 |
| Example 159 | CyHx | 95 | 98.14 | 507 | 34.1 | 61.0 | 21.6 | 17.5 | 1 |
| Example 160 | CyHx | 95 | 98.14 | 507 | 34.1 | 61.0 | 21.6 | 17.5 | 1 |
| Example 161 | CyHx | 95 | 98.14 | 507 | 34.1 | 61.0 | 21.6 | 17.5 | 1 |
| Example 162 | CyHx | 95 | 98.14 | 507 | 34.1 | 61.0 | 21.6 | 17.5 | 1 |
| Example 163 | CyHx | 95 | 98.14 | 507 | 34.1 | 61.0 | 21.6 | 17.5 | 1 |
| Example 164 | CyHx | 95 | 98.14 | 507 | 34.1 | 61.0 | 21.6 | 17.5 | 1 |
| Example 165 | CyHx | 95 | 98.14 | 507 | 34.1 | 61.0 | 21.6 | 17.5 | 1 |
| Example 166 | CyHx | 95 | 98.14 | 507 | 34.1 | 61.0 | 21.6 | 17.5 | 1 |

TABLE 34

Components of chemical liquid
Main agent
Organic solvent

| [Table 1-5-2] | Type | Content (% by mass) | Molar mass (g/mol) | Vapor pressure (Pa) | Surface tension (mN/m) | fd | fp | fh | HP |
|---|---|---|---|---|---|---|---|---|---|
| Example 134 | DBCPN | 60 | 130.18 | 400 | 30.2 | 65.4 | 18.1 | 16.5 | 1 |
| Example 135 | DBCPN | 60 | 130.18 | 400 | 30.2 | 65.4 | 18.1 | 16.5 | 1 |
| Example 136 | PGMEA | 70 | 132.16 | 493 | 27.9 | 56.5 | 19.8 | 23.7 | 1 |
| Example 137 | PGMEA | 70 | 132.16 | 493 | 27.9 | 56.5 | 19.8 | 23.7 | 1 |
| Example 138 | PGMEA | 70 | 132.16 | 493 | 27.9 | 56.5 | 19.8 | 23.7 | 1 |
| Example 139 | PGMEA | 70 | 132.16 | 493 | 27.9 | 56.5 | 19.8 | 23.7 | 1 |
| Example 140 | PGMEA | 70 | 132.16 | 493 | 27.9 | 56.5 | 19.8 | 23.7 | 1 |
| Example 141 | PGMEA | 70 | 132.16 | 493 | 27.9 | 56.5 | 19.8 | 23.7 | 1 |
| Example 142 | PGMEA | 70 | 132.16 | 493 | 27.9 | 56.5 | 19.8 | 23.7 | 1 |
| Example 143 | PGMEA | 70 | 132.16 | 493 | 27.9 | 56.5 | 19.8 | 23.7 | 1 |
| Example 144 | PGMEA | 70 | 132.16 | 493 | 27.9 | 56.5 | 19.8 | 23.7 | 1 |
| Example 145 | PGMEA | 70 | 132.16 | 493 | 27.9 | 56.5 | 19.8 | 23.7 | 1 |
| Example 146 | PGMEA | 70 | 132.16 | 493 | 27.9 | 56.5 | 19.8 | 23.7 | 1 |
| Example 147 | PGMEA | 40 | 132.16 | 493 | 27.9 | 56.5 | 19.8 | 23.7 | 1 |
| Example 148 | PGMEA | 20 | 132.16 | 493 | 27.9 | 56.5 | 19.8 | 23.7 | 1 |
| Example 149 | NMP | 5 | 99.13 | 40 | 41.3 | 48.0 | 32.8 | 19.2 | 1 |
| Example 150 | NMP | 5 | 99.13 | 40 | 41.3 | 48.0 | 32.8 | 19.2 | 1 |
| Example 151 | NMP | 5 | 99.13 | 40 | 41.3 | 48.0 | 32.8 | 19.2 | 1 |
| Example 152 | NMP | 5 | 99.13 | 40 | 41.3 | 48.0 | 32.8 | 19.2 | 1 |
| Example 153 | NMP | 5 | 99.13 | 40 | 41.3 | 48.0 | 32.8 | 19.2 | 1 |
| Example 154 | NMP | 5 | 99.13 | 40 | 41.3 | 48.0 | 32.8 | 19.2 | 1 |
| Example 155 | NMP | 5 | 99.13 | 40 | 41.3 | 48.0 | 32.8 | 19.2 | 1 |
| Example 156 | NMP | 5 | 99.13 | 40 | 41.3 | 48.0 | 32.8 | 19.2 | 1 |
| Example 157 | NMP | 80 | 99.13 | 40 | 41.3 | 48.0 | 32.8 | 19.2 | 1 |
| Example 158 | NMP | 90 | 99.13 | 40 | 41.3 | 48.0 | 32.8 | 19.2 | 1 |
| Example 159 | NMP | 5 | 99.13 | 40 | 41.3 | 48.0 | 32.8 | 19.2 | 1 |
| Example 160 | NMP | 5 | 99.13 | 40 | 41.3 | 48.0 | 32.8 | 19.2 | 1 |
| Example 161 | NMP | 5 | 99.13 | 40 | 41.3 | 48.0 | 32.8 | 19.2 | 1 |
| Example 162 | NMP | 5 | 99.13 | 40 | 41.3 | 48.0 | 32.8 | 19.2 | 1 |
| Example 163 | NMP | 5 | 99.13 | 40 | 41.3 | 48.0 | 32.8 | 19.2 | 1 |
| Example 164 | NMP | 5 | 99.13 | 40 | 41.3 | 48.0 | 32.8 | 19.2 | 1 |
| Example 165 | NMP | 5 | 99.13 | 40 | 41.3 | 48.0 | 32.8 | 19.2 | 1 |
| Example 166 | NMP | 5 | 99.13 | 40 | 41.3 | 48.0 | 32.8 | 19.2 | 1 |

TABLE 35

Components of chemical liquid
Main agent
Organic solvent

| [Table 1-5-3] | Type | Content (% by mass) | Molar mass (g/mol) | Vapor pressure (Pa) | Surface tension (mN/m) | fd | fp | fh | HP | Vapor pressure (Pa) | Surface tension (mN/m) |
|---|---|---|---|---|---|---|---|---|---|---|---|
| Example 134 | PC | 20 | 102.09 | 53 | 40.9 | 47.5 | 42.8 | 9.7 | 1 | 484 | 31.6 |
| Example 135 | NMP | 20 | 99.13 | 40 | 41.3 | 48.0 | 32.8 | 19.2 | 1 | 478 | 31.8 |
| Example 136 | | | | | | | | | | 864 | 27.8 |
| Example 137 | | | | | | | | | | 864 | 27.8 |
| Example 138 | | | | | | | | | | 864 | 27.8 |
| Example 139 | | | | | | | | | | 864 | 27.8 |
| Example 140 | | | | | | | | | | 864 | 27.8 |
| Example 141 | | | | | | | | | | 864 | 27.8 |
| Example 142 | | | | | | | | | | 864 | 27.8 |
| Example 143 | | | | | | | | | | 864 | 27.8 |
| Example 144 | | | | | | | | | | 864 | 27.8 |
| Example 145 | | | | | | | | | | 864 | 27.8 |
| Example 146 | | | | | | | | | | 864 | 27.8 |
| Example 147 | | | | | | | | | | 1,153 | 27.7 |
| Example 148 | | | | | | | | | | 1,313 | 27.6 |
| Example 149 | | | | | | | | | | 484 | 34.5 |
| Example 150 | | | | | | | | | | 484 | 34.5 |
| Example 151 | | | | | | | | | | 484 | 34.5 |
| Example 152 | | | | | | | | | | 484 | 34.5 |
| Example 153 | | | | | | | | | | 484 | 34.5 |
| Example 154 | | | | | | | | | | 484 | 34.5 |
| Example 155 | | | | | | | | | | 484 | 34.5 |
| Example 156 | | | | | | | | | | 484 | 34.5 |
| Example 157 | | | | | | | | | | 134 | 39.8 |
| Example 158 | | | | | | | | | | 87 | 40.6 |
| Example 159 | | | | | | | | | | 484 | 34.5 |
| Example 160 | | | | | | | | | | 484 | 34.5 |
| Example 161 | | | | | | | | | | 484 | 34.5 |
| Example 162 | | | | | | | | | | 484 | 34.5 |
| Example 163 | | | | | | | | | | 484 | 34.5 |
| Example 164 | | | | | | | | | | 484 | 34.5 |
| Example 165 | | | | | | | | | | 484 | 34.5 |
| Example 166 | | | | | | | | | | 484 | 34.5 |

TABLE 36

| | Components of chemical liquid | | Components of chemical liquid | | | | | |
|---|---|---|---|---|---|---|---|---|
| | Main agent | Surfactant | | Impurity metal | | | | |
| | Content | Content | | Total content of impurity metal (mass ppt) | | | | |
| [Table 1-5-4] | (% by mass) | Type | (mass ppm) | Fe | Cr | Ni | Pb | Others | Total |
| Example 134 | Balance | A | 100 | 0.008 | 0.004 | 0.008 | 0.004 | 0.072 | 0.096 |
| Example 135 | Balance | I | 100 | 0.004 | 0.002 | 0.006 | 0.002 | 0.042 | 0.056 |
| Example 136 | Balance | A | 5 | 0.032 | 0.03 | 0.028 | 0.026 | 0.348 | 0.464 |
| Example 137 | Balance | A | 30,000 | 0.006 | 0.002 | 0.006 | 0.004 | 0.054 | 0.072 |
| Example 138 | Balance | A | 5 | 0.032 | 0.03 | 0.028 | 0.026 | 0.348 | 0.464 |
| Example 139 | Balance | A | 30,000 | 0.032 | 0.03 | 0.028 | 0.026 | 0.348 | 0.464 |
| Example 140 | Balance | E | 100 | 0.032 | 0.03 | 0.028 | 0.026 | 0.348 | 0.464 |
| Example 141 | Balance | A | 300 | 0.104 | 0.064 | 0.09 | 0.052 | 0.93 | 1.24 |
| Example 142 | Balance | J | 50 | 0.008 | 0.002 | 0.006 | 0.002 | 0.054 | 0.072 |
| Example 143 | Balance | C | 100 | 0.004 | 0.002 | 0.006 | 0.004 | 0.048 | 0.064 |
| Example 144 | Balance | A | 100 | 0.006 | 0.002 | 0.006 | 0.002 | 0.048 | 0.064 |
| | | B | 50 | | | | | | |
| Example 145 | Balance | A | 100 | 0.008 | 0.002 | 0.007 | 0.002 | 0.057 | 0.076 |
| Example 146 | Balance | I | 50 | 0.004 | 0.002 | 0.005 | 0.004 | 0.045 | 0.06 |
| Example 147 | Balance | D | 100 | 0.004 | 0.002 | 0.004 | 0.004 | 0.042 | 0.056 |
| Example 148 | Balance | A | 50 | 0.004 | 0.002 | 0.005 | 0.004 | 0.045 | 0.06 |
| Example 149 | Balance | J | 100 | 32 | 16 | 45 | 12 | 315 | 420 |
| Example 150 | Balance | A | 100 | 52 | 64 | 90 | 52 | 774 | 1,032 |
| Example 151 | Balance | H | 50 | 6 | 2 | 6 | 2 | 48 | 64 |
| Example 152 | Balance | B | 100 | 0.008 | 0.002 | 0.005 | 0.002 | 0.051 | 0.068 |
| Example 153 | Balance | B | 100 | 0.004 | 0.002 | 0.006 | 0.004 | 0.048 | 0.064 |
| Example 154 | Balance | I | 100 | 0.006 | 0.002 | 0.005 | 0.002 | 0.045 | 0.06 |
| Example 155 | Balance | E | 100 | 0.008 | 0.002 | 0.006 | 0.002 | 0.054 | 0.072 |

TABLE 36-continued

| [Table 1-5-4] | Components of chemical liquid | | | Components of chemical liquid | | | | | |
|---|---|---|---|---|---|---|---|---|---|
| | Main agent | Surfactant | | Impurity metal | | | | | |
| | Content | | Content | Total content of impurity metal (mass ppt) | | | | | |
| | (% by mass) | Type | (mass ppm) | Fe | Cr | Ni | Pb | Others | Total |
| Example 156 | Balance | A | 50 | 0.004 | 0.002 | 0.006 | 0.004 | 0.048 | 0.064 |
| Example 157 | Balance | C | 100 | 52 | 64 | 90 | 52 | 774 | 1,032 |
| Example 158 | Balance | E | 300 | 0.004 | 0.002 | 0.006 | 0.004 | 0.048 | 0.064 |
| Example 159 | Balance | A | 50 | 65 | 45 | 69 | 45 | 672 | 896 |
| Example 160 | Balance | E | 100 | 0.004 | 0.002 | 0.003 | 0.004 | 0.039 | 0.052 |
| Example 161 | Balance | E | 100 | 0.006 | 0.002 | 0.005 | 0.002 | 0.045 | 0.06 |
| Example 162 | Balance | A | 50 | 0.003 | 0.003 | 0.006 | 0.003 | 0.045 | 0.06 |
| Example 163 | Balance | A | 100 | 0.005 | 0.004 | 0.004 | 0.001 | 0.042 | 0.056 |
| Example 164 | Balance | B | 100 | 0.004 | 0.003 | 0.005 | 0.003 | 0.045 | 0.06 |
| Example 165 | Balance | F | 100 | 0.006 | 0.002 | 0.004 | 0.002 | 0.042 | 0.056 |
| Example 166 | Balance | C | 100 | 0.004 | 0.003 | 0.003 | 0.003 | 0.039 | 0.052 |

TABLE 37

| [Table 1-5-5] | Components of chemical liquid | | | | | | | | |
|---|---|---|---|---|---|---|---|---|---|
| | Impurity metal | | | | | | Organic impurity Content (mass ppm) | | Water |
| | Content of particles containing following impurity metal (mass ppt) | | | | | | | High-boiling- | Content |
| | Fe | Cr | Ni | Pb | Others | Total | Total | point component | (% by mass) |
| Example 134 | 0.004 | 0.002 | 0.004 | 0.002 | 0.015 | 0.027 | 304 | 1.2 | 0.10% |
| Example 135 | 0.002 | 0.001 | 0.003 | 0.001 | 0.016 | 0.023 | 365 | 1.5 | 0.10% |
| Example 136 | 0.016 | 0.015 | 0.014 | 0.013 | 0.065 | 0.123 | 256 | 1.0 | 0.10% |
| Example 137 | 0.003 | 0.001 | 0.003 | 0.002 | 0.019 | 0.028 | 230 | 0.9 | 0.10% |
| Example 138 | 0.016 | 0.015 | 0.014 | 0.013 | 0.065 | 0.123 | 115 | 0.5 | 0.10% |
| Example 139 | 0.016 | 0.015 | 0.014 | 0.013 | 0.065 | 0.123 | 311 | 1.2 | 0.10% |
| Example 140 | 0.016 | 0.015 | 0.014 | 0.013 | 0.065 | 0.123 | 373 | 1.5 | 0.10% |
| Example 141 | 0.052 | 0.032 | 0.045 | 0.026 | 0.165 | 0.32 | 261 | 1.0 | 0.10% |
| Example 142 | 0.004 | 0.001 | 0.003 | 0.001 | 0.016 | 0.025 | 235 | 0.9 | 0.10% |
| Example 143 | 0.002 | 0.001 | 0.003 | 0.002 | 0.017 | 0.025 | 117 | 0.5 | 0.10% |
| Example 144 | 0.003 | 0.001 | 0.003 | 0.001 | 0.019 | 0.027 | 317 | 1.3 | <0.010% |
| Example 145 | 0.004 | 0.001 | 0.003 | 0.001 | 0.016 | 0.025 | 380 | 1.5 | 0.10% |
| Example 146 | 0.002 | 0.001 | 0.003 | 0.002 | 0.016 | 0.024 | 266 | 1.1 | 0.10% |
| Example 147 | 0.002 | 0.001 | 0.003 | 0.002 | 0.016 | 0.024 | 240 | 1.0 | 0.10% |
| Example 148 | 0.002 | 0.001 | 0.003 | 0.002 | 0.016 | 0.024 | 120 | 0.5 | 0.10% |
| Example 149 | 16 | 15 | 14 | 13 | 65 | 123 | 324 | 1.3 | 0.10% |
| Example 150 | 24 | 28 | 29 | 18 | 165 | 264 | 388 | 1.6 | 0.10% |
| Example 151 | 3 | 1 | 3 | 1 | 16 | 24 | 272 | 1.1 | 0.10% |
| Example 152 | 0.004 | 0.001 | 0.003 | 0.001 | 0.016 | 0.025 | 245 | 1.0 | 0.10% |
| Example 153 | 0.002 | 0.001 | 0.003 | 0.002 | 0.017 | 0.025 | 122 | 0.5 | 0.10% |
| Example 154 | 0.003 | 0.001 | 0.003 | 0.001 | 0.019 | 0.027 | 330 | 1.3 | 0.10% |
| Example 155 | 0.004 | 0.001 | 0.003 | 0.001 | 0.016 | 0.025 | 396 | 1.6 | 0.10% |
| Example 156 | 0.002 | 0.001 | 0.003 | 0.002 | 0.016 | 0.024 | 277 | 1.1 | 0.10% |
| Example 157 | 24 | 28 | 29 | 18 | 165 | 264 | 250 | 1.0 | 0.10% |
| Example 158 | 0.001 | 0.001 | 0.001 | 0.001 | <0.0005 | 0.004 | 125 | 0.5 | 0.10% |
| Example 159 | 24 | 28 | 29 | 18 | 65 | 164 | 337 | 1.3 | 0.10% |
| Example 160 | 0.001 | 0.001 | 0.001 | 0.001 | <0.0005 | 0.004 | 404 | 1.6 | 0.10% |
| Example 161 | 0.002 | 0.001 | 0.003 | 0.001 | 0.016 | 0.023 | 283 | 1.1 | 0.10% |
| Example 162 | 0.002 | 0.001 | 0.003 | 0.001 | 0.016 | 0.023 | 255 | 1.0 | 0.10% |
| Example 163 | 0.002 | 0.001 | 0.003 | 0.001 | 0.016 | 0.023 | 127 | 0.5 | 0.10% |
| Example 164 | 0.002 | 0.001 | 0.003 | 0.001 | 0.016 | 0.023 | 344 | 1.4 | 1.50% |
| Example 165 | 0.002 | 0.001 | 0.003 | 0.001 | 0.016 | 0.023 | 413 | 1.7 | 0.10% |
| Example 166 | 0.002 | 0.001 | 0.003 | 0.001 | 0.016 | 0.023 | 289 | 1.2 | 0.10% |

TABLE 38

| [Table 1-5-6] | Physical properties of chemical liquid Number of coarse particles (number/ml) | Content of surfactant/total content of particles | Content of surfactant/content of high-boiling-point component | Evaluation Defect inhibition performance | | Type of resist composition Affinity Rsq1 | SRsq | Resist saving performance Uniformity | Film thickness controllability | Developability |
|---|---|---|---|---|---|---|---|---|---|---|
| Example 134 | 6 | $3.7 \times 10^9$ | $8.2 \times 10^1$ | AA | 1 | A | A | A | A | A |
| Example 135 | 7 | $4.3 \times 10^9$ | $6.8 \times 10^1$ | A | 1 | A | A | A | A | A |
| Example 136 | 5 | $4.1 \times 10^7$ | $4.9 \times 10^0$ | A | 1 | A | A | A | A | A |
| Example 137 | 5 | $1.1 \times 10^{12}$ | $3.3 \times 10^4$ | B | 1 | A | A | A | A | A |
| Example 138 | 2 | $4.1 \times 10^7$ | $1.1 \times 10^1$ | A | 1 | A | A | A | A | A |
| Example 139 | 6 | $2.4 \times 10^{11}$ | $2.4 \times 10^4$ | B | 1 | A | A | A | A | A |
| Example 140 | 7 | $8.1 \times 10^8$ | $6.7 \times 10^1$ | A | 1 | A | A | A | A | A |
| Example 141 | 5 | $9.4 \times 10^8$ | $2.9 \times 10^2$ | AA | 1 | A | A | A | A | A |
| Example 142 | 5 | $2.0 \times 10^9$ | $5.3 \times 10^1$ | A | 1 | A | A | A | A | A |
| Example 143 | 2 | $4.0 \times 10^9$ | $2.1 \times 10^2$ | AA | 1 | A | A | A | A | A |
| Example 144 | 6 | $5.6 \times 10^9$ | $1.2 \times 10^2$ | AA | 1 | A | A | A | B | A |
| Example 145 | 8 | $4.0 \times 10^9$ | $6.6 \times 10^1$ | AA | 1 | A | A | A | A | A |
| Example 146 | 5 | $2.1 \times 10^9$ | $4.7 \times 10^1$ | A | 1 | A | A | A | A | A |
| Example 147 | 5 | $4.2 \times 10^9$ | $1.0 \times 10^2$ | A | 1 | A | A | A | A | A |
| Example 148 | 2 | $2.1 \times 10^9$ | $1.0 \times 10^2$ | AA | 1 | A | A | A | A | A |
| Example 149 | 6 | $8.1 \times 10^5$ | $7.7 \times 10^1$ | A | 1 | A | A | A | A | A |
| Example 150 | 8 | $3.8 \times 10^5$ | $6.4 \times 10^1$ | AA | 1 | A | A | A | A | A |
| Example 151 | 5 | $2.1 \times 10^6$ | $4.6 \times 10^1$ | A | 1 | A | A | A | A | A |
| Example 152 | 5 | $4.0 \times 10^9$ | $1.0 \times 10^2$ | AA | 1 | A | A | A | A | A |
| Example 153 | 2 | $4.0 \times 10^9$ | $2.0 \times 10^2$ | AA | 1 | A | A | A | A | A |
| Example 154 | 7 | $3.7 \times 10^9$ | $7.6 \times 10^1$ | A | 1 | A | A | A | A | A |
| Example 155 | 8 | $4.0 \times 10^9$ | $6.3 \times 10^1$ | A | 1 | A | A | A | A | A |
| Example 156 | 6 | $2.1 \times 10^9$ | $4.5 \times 10^1$ | AA | 1 | A | A | A | A | A |
| Example 157 | 5 | $3.8 \times 10^5$ | $1.0 \times 10^2$ | AA | 1 | A | A | A | A | A |
| Example 158 | 2 | $7.5 \times 10^{10}$ | $6.0 \times 10^2$ | A | 1 | A | A | A | C | A |
| Example 159 | 7 | $3.0 \times 10^5$ | $3.7 \times 10^1$ | AA | 1 | A | A | A | A | A |
| Example 160 | 8 | $2.5 \times 10^{10}$ | $6.2 \times 10^1$ | A | 1 | A | A | A | A | A |
| Example 161 | 6 | $4.3 \times 10^9$ | $8.8 \times 10^1$ | A | 1 | A | A | A | A | A |
| Example 162 | 5 | $2.2 \times 10^9$ | $4.9 \times 10^1$ | AA | 1 | A | A | A | A | A |
| Example 163 | 3 | $4.3 \times 10^9$ | $2.0 \times 10^2$ | AA | 1 | A | A | A | A | A |
| Example 164 | 7 | $4.3 \times 10^9$ | $7.3 \times 10^1$ | AA | 1 | A | A | A | B | A |
| Example 165 | 8 | $4.3 \times 10^9$ | $6.1 \times 10^1$ | A | 1 | A | A | A | A | A |
| Example 166 | 6 | $4.3 \times 10^9$ | $8.7 \times 10^1$ | AA | 1 | A | A | A | A | A |

TABLE 39

| [Table 1-5-7] | Evaluation Type of resist composition Resist saving performance Affinity Rsq1 | SRsq | Uniformity | Film thickness controllability | Developability | Type of resist composition Resist saving performance Affinity | Rsq1 | SRsq | Uniformity | Film thickness controllability | Developability |
|---|---|---|---|---|---|---|---|---|---|---|---|
| Example 134 | 2 | A | A | A | A | A | 3 | A | A | A | A | A |
| Example 135 | 2 | A | A | A | A | A | 3 | A | A | A | A | A |
| Example 136 | 2 | A | A | A | A | A | 3 | A | A | A | A | A |
| Example 137 | 2 | A | A | A | A | A | 3 | A | A | A | A | A |
| Example 138 | 2 | A | A | A | A | A | 3 | A | A | A | A | A |
| Example 139 | 2 | A | A | A | A | A | 3 | A | A | A | A | A |
| Example 140 | 2 | A | A | A | A | A | 3 | A | A | A | A | A |
| Example 141 | 2 | A | A | A | A | A | 3 | A | A | A | A | A |
| Example 142 | 2 | A | A | A | A | A | 3 | A | A | A | A | A |
| Example 143 | 2 | A | A | A | A | A | 3 | A | A | A | A | A |
| Example 144 | 2 | A | A | A | B | A | 3 | A | A | A | B | A |
| Example 145 | 2 | A | A | A | A | A | 3 | A | A | A | A | A |
| Example 146 | 2 | A | A | A | A | A | 3 | A | A | A | A | A |
| Example 147 | 2 | A | A | A | A | A | 3 | A | A | A | A | A |
| Example 148 | 2 | A | A | A | A | A | 3 | A | A | A | A | A |
| Example 149 | 2 | A | A | A | A | A | 3 | A | A | A | A | A |

TABLE 39-continued

| | | | Evaluation | | | | | | | | |
|---|---|---|---|---|---|---|---|---|---|---|---|
| | | | Type of resist composition | | | | | Type of resist composition | | | |
| | | | Resist saving performance | | | | | Resist saving performance | | | |
| | | Affinity | | Film thickness | | | | Affinity | | Film thickness | |
| [Table 1-5-7] | | Rsq1 | SRsq | Uniformity | controllability | Developability | | Rsq1 | SRsq | Uniformity | controllability | Developability |
| Example 150 | 2 | A | A | A | A | A | 3 | A | A | A | A | A |
| Example 151 | 2 | A | A | A | A | A | 3 | A | A | A | A | A |
| Example 152 | 2 | A | A | A | A | A | 3 | A | A | A | A | A |
| Example 153 | 2 | A | A | A | A | A | 3 | A | A | A | A | A |
| Example 154 | 2 | A | A | A | A | A | 3 | A | A | A | A | A |
| Example 155 | 2 | A | A | A | A | A | 3 | A | A | A | A | A |
| Example 156 | 2 | A | A | A | A | A | 3 | A | A | A | A | A |
| Example 157 | 2 | A | A | A | A | A | 3 | A | A | A | A | A |
| Example 158 | 2 | A | A | A | C | A | 3 | A | A | A | C | A |
| Example 159 | 2 | A | A | A | A | A | 3 | A | A | A | A | A |
| Example 160 | 2 | A | A | A | A | A | 3 | A | A | A | A | A |
| Example 161 | 2 | A | A | A | A | A | 3 | A | A | A | A | A |
| Example 162 | 2 | A | A | A | A | A | 3 | A | A | A | A | A |
| Example 163 | 2 | A | A | A | A | A | 3 | A | A | A | A | A |
| Example 164 | 2 | A | A | A | B | A | 3 | A | A | A | B | A |
| Example 165 | 2 | A | A | A | A | A | 3 | A | A | A | A | A |
| Example 166 | 2 | A | A | A | A | A | 3 | A | A | A | A | A |

TABLE 40

| | | | Evaluation | | | | |
|---|---|---|---|---|---|---|---|
| | | | Type of resist composition | | | | |
| | | | Resist saving performance | | | | |
| | | Affinity | | Film thickness | | Evaluation of p-CMP defect inhibition | Evaluation of ashing residue removing |
| [Table 1-5-8] | | Rsq1 | SRsq | Uniformity | controllability | Developability | performance | performance |
| Example 134 | 4 | A | A | A | A | A | A | A |
| Example 135 | 4 | A | A | A | A | A | A | A |
| Example 136 | 4 | A | A | A | A | A | C | C |
| Example 137 | 4 | A | A | A | A | A | C | C |
| Example 138 | 4 | A | A | A | A | A | C | C |
| Example 139 | 4 | A | A | A | A | A | A | A |
| Example 140 | 4 | A | A | A | A | A | A | A |
| Example 141 | 4 | A | A | A | A | A | A | A |
| Example 142 | 4 | A | A | A | A | A | A | A |
| Example 143 | 4 | A | A | A | A | A | A | A |
| Example 144 | 4 | A | A | A | B | A | A | A |
| Example 145 | 4 | A | A | A | A | A | A | A |
| Example 146 | 4 | A | A | A | A | A | A | A |
| Example 147 | 4 | A | A | A | A | A | A | A |
| Example 148 | 4 | A | A | A | A | A | A | A |
| Example 149 | 4 | A | A | A | A | A | C | C |
| Example 150 | 4 | A | A | A | A | A | C | C |
| Example 151 | 4 | A | A | A | A | A | C | C |
| Example 152 | 4 | A | A | A | A | A | A | A |
| Example 153 | 4 | A | A | A | A | A | A | A |
| Example 154 | 4 | A | A | A | A | A | A | A |
| Example 155 | 4 | A | A | A | A | A | A | A |
| Example 156 | 4 | A | A | A | A | A | A | A |
| Example 157 | 4 | A | A | A | A | A | C | C |
| Example 158 | 4 | A | A | A | C | A | A | A |
| Example 159 | 4 | A | A | A | A | A | C | C |
| Example 160 | 4 | A | A | A | A | A | A | A |
| Example 161 | 4 | A | A | A | A | A | A | A |
| Example 162 | 4 | A | A | A | A | A | A | A |
| Example 163 | 4 | A | A | A | A | A | A | A |
| Example 164 | 4 | A | A | A | B | A | A | A |
| Example 165 | 4 | A | A | A | A | A | A | A |
| Example 166 | 4 | A | A | A | A | A | A | A |

TABLE 41

Components of chemical liquid
Main agent
Organic solvent

| [Table 1-6-1] | Type | Content (% by mass) | Molar mass (g/mol) | Vapor pressure (Pa) | Surface tension (mN/m) | fd | fp | fh | HP |
|---|---|---|---|---|---|---|---|---|---|
| Example 167 | CyHx | 95 | 98.14 | 507 | 34.1 | 61.0 | 21.6 | 17.5 | 1 |
| Example 168 | CyHx | 95 | 98.14 | 507 | 34.1 | 61.0 | 21.6 | 17.5 | 1 |
| Example 169 | CyHx | 95 | 98.14 | 507 | 34.1 | 61.0 | 21.6 | 17.5 | 1 |
| Example 170 | nBA | 30 | 116.2 | 1,200 | 24.8 | 60.5 | 17.2 | 22.2 | 1 |
| Example 171 | nBA | 30 | 116.2 | 1,200 | 24.8 | 60.5 | 17.2 | 22.2 | 1 |
| Example 172 | nBA | 30 | 116.2 | 1,200 | 24.8 | 60.5 | 17.2 | 22.2 | 1 |
| Example 173 | PGME | 60 | 90.12 | 1,453 | 27.6 | 43.2 | 28.8 | 28.0 | 1 |
| Example 174 | PGME | 60 | 90.12 | 1,453 | 27.6 | 43.2 | 28.8 | 28.0 | 1 |
| Example 175 | PGME | 60 | 90.12 | 1,453 | 27.6 | 43.2 | 28.8 | 28.0 | 1 |
| Example 176 | PGME | 60 | 90.12 | 1,453 | 27.6 | 43.2 | 28.8 | 28.0 | 1 |
| Example 177 | PGME | 60 | 90.12 | 1,453 | 27.6 | 43.2 | 28.8 | 28.0 | 1 |
| Example 178 | PGME | 60 | 90.12 | 1,453 | 27.6 | 43.2 | 28.8 | 28.0 | 1 |
| Example 179 | PGME | 60 | 90.12 | 1,453 | 27.6 | 43.2 | 28.8 | 28.0 | 1 |
| Example 180 | PGME | 60 | 90.12 | 1,453 | 27.6 | 43.2 | 28.8 | 28.0 | 1 |
| Example 181 | PGME | 60 | 90.12 | 1,453 | 27.6 | 43.2 | 28.8 | 28.0 | 1 |
| Example 182 | PGME | 60 | 90.12 | 1,453 | 27.6 | 43.2 | 28.8 | 28.0 | 1 |
| Example 183 | PGME | 60 | 90.12 | 1,453 | 27.6 | 43.2 | 28.8 | 28.0 | 1 |
| Example 184 | PGME | 60 | 90.12 | 1,453 | 27.6 | 43.2 | 28.8 | 28.0 | 1 |
| Example 185 | PGME | 60 | 90.12 | 1,453 | 27.6 | 43.2 | 28.8 | 28.0 | 1 |
| Example 186 | PGME | 60 | 90.12 | 1,453 | 27.6 | 43.2 | 28.8 | 28.0 | 1 |
| Example 187 | PGME | 60 | 90.12 | 1,453 | 27.6 | 43.2 | 28.8 | 28.0 | 1 |
| Example 188 | PGME | 60 | 90.12 | 1,453 | 27.6 | 43.2 | 28.8 | 28.0 | 1 |
| Example 189 | PGME | 60 | 90.12 | 1,453 | 27.6 | 43.2 | 28.8 | 28.0 | 1 |
| Example 190 | CyPn | 60 | 84.1 | 1,520 | 33.8 | 60.0 | 21.8 | 18.2 | 1 |
| Example 191 | CyPn | 60 | 84.1 | 1,520 | 33.8 | 60.0 | 21.8 | 18.2 | 1 |
| Example 192 | CyPn | 60 | 84.1 | 1,520 | 33.8 | 60.0 | 21.8 | 18.2 | 1 |
| Example 193 | CyPn | 60 | 84.1 | 1,520 | 33.8 | 60.0 | 21.8 | 18.2 | 1 |
| Example 194 | CyPn | 60 | 84.1 | 1,520 | 33.8 | 60.0 | 21.8 | 18.2 | 1 |
| Example 195 | CyPn | 60 | 84.1 | 1,520 | 33.8 | 60.0 | 21.8 | 18.2 | 1 |
| Example 196 | CyPn | 60 | 84.1 | 1,520 | 33.8 | 60.0 | 21.8 | 18.2 | 1 |
| Example 197 | CyPn | 60 | 84.1 | 1,520 | 33.8 | 60.0 | 21.8 | 18.2 | 1 |
| Example 198 | CyPn | 60 | 84.1 | 1,520 | 33.8 | 60.0 | 21.8 | 18.2 | 1 |
| Example 199 | CyPn | 60 | 84.1 | 1,520 | 33.8 | 60.0 | 21.8 | 18.2 | 1 |
| Example 200 | CyPn | 60 | 84.1 | 1,520 | 33.8 | 60.0 | 21.8 | 18.2 | 1 |

TABLE 42

Components of chemical liquid
Main agent
Organic solvent

| [Table 1-6-2] | Type | Content (% by mass) | Molar mass (g/mol) | Vapor pressure (Pa) | Surface tension (mN/m) | fd | fp | fh | HP |
|---|---|---|---|---|---|---|---|---|---|
| Example 167 | NMP | 5 | 99.13 | 40 | 41.3 | 48.0 | 32.8 | 19.2 | 1 |
| Example 168 | NMP | 5 | 99.13 | 40 | 41.3 | 48.0 | 32.8 | 19.2 | 1 |
| Example 169 | IPA | 5 | 60.1 | 6,053 | 28.5 | 41.3 | 15.9 | 42.8 | 1 |
| Example 170 | Dodecane | 70 | 170.34 | 0.41 | 54.7 | 100.0 | 0.0 | 0.0 | 1 |
| Example 171 | iAA | 70 | 130.19 | 67 | 25.9 | 63.2 | 15.8 | 21.1 | 1 |
| Example 172 | MIBC | 70 | 102.17 | 84 | 28.3 | 51.5 | 14.5 | 34.0 | 1 |
| Example 173 | DEGME | 40 | 120.15 | 13 | 28.0 | 44.3 | 20.8 | 34.9 | 1 |
| Example 174 | DME | 40 | 90.12 | 693 | 29.0 | 55.9 | 22.8 | 21.3 | 1 |
| Example 175 | DEE | 40 | 118.18 | 627 | 29.0 | 62.2 | 19.9 | 17.8 | 1 |
| Example 176 | DEGIBE | 40 | 162.23 | 133 | 29.0 | 61.9 | 18.7 | 19.4 | 1 |
| Example 177 | DEGDME | 40 | 134.18 | 520 | 28.0 | 56.9 | 21.0 | 22.1 | 1 |
| Example 178 | DEGDEE | 40 | 162.23 | 253 | 29.0 | 60.4 | 19.6 | 20.0 | 1 |
| Example 179 | TriEGDME | 40 | 178.23 | 13 | 28.0 | 56.4 | 20.9 | 22.7 | 1 |
| Example 180 | TetraEGDME | 40 | 222.28 | 13 | 27.0 | 55.6 | 21.1 | 23.2 | 1 |
| Example 181 | TEGMBE | 40 | 220.31 | 13 | 28.0 | 48.5 | 18.7 | 32.8 | 1 |
| Example 182 | DEGMBE | 40 | 162.23 | 117 | 29.0 | 59.4 | 18.1 | 22.5 | 1 |
| Example 183 | Anisole | 40 | 108.14 | 63 | 30.0 | 64.3 | 17.0 | 18.7 | 1 |
| Example 184 | 14-DMB | 40 | 138.17 | 1 | 30.0 | 59.0 | 20.6 | 20.3 | 1 |
| Example 185 | 12-DMB | 40 | 138.17 | 1 | 30.0 | 60.6 | 20.2 | 19.2 | 1 |
| Example 186 | 13-DMB | 40 | 138.17 | 1 | 30.0 | 61.6 | 19.9 | 18.5 | 1 |
| Example 187 | 14-DPB | 40 | 262.31 | 1 | 33.0 | 63.3 | 18.5 | 18.2 | 1 |

TABLE 42-continued

| [Table 1-6-2] | Type | Content (% by mass) | Molar mass (g/mol) | Vapor pressure (Pa) | Surface tension (mN/m) | fd | fp | fh | HP |
|---|---|---|---|---|---|---|---|---|---|
| Example 188 | 4-MTT | 40 | 122.17 | 1 | 32.0 | 64.8 | 17.4 | 17.8 | 1 |
| Example 189 | PNT | 40 | 122.17 | 1 | 31.0 | 66.3 | 16.3 | 17.4 | 1 |
| Example 190 | DEGME | 40 | 120.15 | 13 | 28.0 | 44.3 | 20.8 | 34.9 | 1 |
| Example 191 | DME | 40 | 90.12 | 693 | 29.0 | 55.9 | 22.8 | 21.3 | 1 |
| Example 192 | DEE | 40 | 118.18 | 627 | 29.0 | 62.2 | 19.9 | 17.8 | 1 |
| Example 193 | DEGIBE | 40 | 162.23 | 133 | 29.0 | 61.9 | 18.7 | 19.4 | 1 |
| Example 194 | DEGDME | 40 | 134.18 | 520 | 28.0 | 56.9 | 21.0 | 22.1 | 1 |
| Example 195 | DEGDEE | 40 | 162.23 | 253 | 29.0 | 60.4 | 19.6 | 20.0 | 1 |
| Example 196 | TriEGDME | 40 | 178.23 | 13 | 28.0 | 56.4 | 20.9 | 22.7 | 1 |
| Example 197 | TetraEGDME | 40 | 222.28 | 13 | 27.0 | 55.6 | 21.1 | 23.2 | 1 |
| Example 198 | TEGMBE | 40 | 220.31 | 13 | 28.0 | 48.5 | 18.7 | 32.8 | 1 |
| Example 199 | DEGMBE | 40 | 162.23 | 117 | 29.0 | 59.4 | 18.1 | 22.5 | 1 |
| Example 200 | Anisole | 40 | 108.14 | 63 | 30.0 | 64.3 | 17.0 | 18.7 | 1 |

TABLE 43

| [Table 1-6-3] | Type | Content (% by mass) | Molar mass (g/mol) | Vapor pressure (Pa) | Surface tension (mN/m) | fd | fp | fh | HP | Vapor pressure (Pa) | Surface tension (mN/m) |
|---|---|---|---|---|---|---|---|---|---|---|---|
| Example 167 | | | | | | | | | | 484 | 34.5 |
| Example 168 | | | | | | | | | | 484 | 34.5 |
| Example 169 | | | | | | | | | | 946 | 33.7 |
| Example 170 | | | | | | | | | | 497 | 43.1 |
| Example 171 | | | | | | | | | | 434 | 25.5 |
| Example 172 | | | | | | | | | | 389 | 27.3 |
| Example 173 | | | | | | | | | | 973 | 27.7 |
| Example 174 | | | | | | | | | | 1,149 | 28.2 |
| Example 175 | | | | | | | | | | 1,175 | 28.1 |
| Example 176 | | | | | | | | | | 1,097 | 28.0 |
| Example 177 | | | | | | | | | | 1,165 | 27.7 |
| Example 178 | | | | | | | | | | 1,129 | 28.0 |
| Example 179 | | | | | | | | | | 1,090 | 27.7 |
| Example 180 | | | | | | | | | | 1,147 | 27.5 |
| Example 181 | | | | | | | | | | 1,145 | 27.7 |
| Example 182 | | | | | | | | | | 1,092 | 28.0 |
| Example 183 | | | | | | | | | | 957 | 28.5 |
| Example 184 | | | | | | | | | | 1,013 | 28.3 |
| Example 185 | | | | | | | | | | 1,013 | 28.3 |
| Example 186 | | | | | | | | | | 1,013 | 28.3 |
| Example 187 | | | | | | | | | | 1,183 | 28.6 |
| Example 188 | | | | | | | | | | 975 | 29.1 |
| Example 189 | | | | | | | | | | 975 | 28.7 |
| Example 190 | | | | | | | | | | 1,040 | 32.0 |
| Example 191 | | | | | | | | | | 1,203 | 32.0 |
| Example 192 | | | | | | | | | | 1,232 | 32.3 |
| Example 193 | | | | | | | | | | 1,164 | 32.6 |
| Example 194 | | | | | | | | | | 1,225 | 32.1 |
| Example 195 | | | | | | | | | | 1,195 | 32.6 |
| Example 196 | | | | | | | | | | 1,159 | 32.4 |
| Example 197 | | | | | | | | | | 1,216 | 32.4 |
| Example 198 | | | | | | | | | | 1,214 | 32.6 |
| Example 199 | | | | | | | | | | 1,160 | 32.6 |
| Example 200 | | | | | | | | | | 1,022 | 32.5 |

TABLE 44

| [Table 1-6-4] | Components of chemical liquid Main agent Content (% by mass) | Components of chemical liquid Surfactant Type | Content (mass ppm) | Components of chemical liquid Impurity metal Total content of impurity metal (mass ppt) | | | | | |
|---|---|---|---|---|---|---|---|---|---|
| | | | | Fe | Cr | Ni | Pb | Others | Total |
| Example 167 | Balance | A | 50 | 0.007 | 0.005 | 0.004 | 0.003 | 0.057 | 0.076 |
| Example 168 | Balance | C | 100 | 0.008 | 0.003 | 0.005 | 0.005 | 0.063 | 0.084 |
| Example 169 | Balance | A | 100 | 0.006 | 0.004 | 0.003 | 0.004 | 0.051 | 0.068 |
| Example 170 | Balance | A | 100 | 0.004 | 0.004 | 0.006 | 0.005 | 0.057 | 0.076 |
| Example 171 | Balance | A | 50 | 0.004 | 0.004 | 0.004 | 0.002 | 0.042 | 0.056 |
| Example 172 | Balance | A | 100 | 0.006 | 0.002 | 0.006 | 0.004 | 0.054 | 0.072 |
| Example 173 | Balance | A | 100 | 0.002 | 0.002 | 0.002 | 0.002 | 0.024 | 0.032 |
| Example 174 | Balance | F | 100 | 0.006 | 0.006 | 0.006 | 0.006 | 0.072 | 0.096 |
| Example 175 | Balance | C | 50 | 0.0048 | 0.0048 | 0.0048 | 0.0048 | 0.0576 | 0.0768 |
| Example 176 | Balance | A | 100 | 0.0024 | 0.0024 | 0.0024 | 0.0024 | 0.0288 | 0.0384 |
| Example 177 | Balance | A | 100 | 0.0072 | 0.0072 | 0.0072 | 0.0072 | 0.0864 | 0.1152 |
| Example 178 | Balance | E | 100 | 0.001 | 0.001 | 0.001 | 0.001 | 0.012 | 0.016 |
| Example 179 | Balance | G | 50 | 0.002 | 0.002 | 0.002 | 0.002 | 0.024 | 0.032 |
| Example 180 | Balance | D | 100 | 0.006 | 0.006 | 0.006 | 0.006 | 0.072 | 0.096 |
| Example 181 | Balance | E | 100 | 0.0048 | 0.0048 | 0.0048 | 0.0048 | 0.0576 | 0.0768 |
| Example 182 | Balance | B | 100 | 0.0024 | 0.0024 | 0.0024 | 0.0024 | 0.0288 | 0.0384 |
| Example 183 | Balance | C | 100 | 0.0072 | 0.0072 | 0.0072 | 0.0072 | 0.0864 | 0.1152 |
| Example 184 | Balance | H | 100 | 0.001 | 0.001 | 0.001 | 0.001 | 0.012 | 0.016 |
| Example 185 | Balance | A | 300 | 0.002 | 0.002 | 0.002 | 0.002 | 0.024 | 0.032 |
| Example 186 | Balance | I | 50 | 0.006 | 0.006 | 0.006 | 0.006 | 0.072 | 0.096 |
| Example 187 | Balance | J | 1,000 | 0.0048 | 0.0048 | 0.0048 | 0.0048 | 0.0576 | 0.0768 |
| Example 188 | Balance | D | 100 | 0.0024 | 0.0024 | 0.0024 | 0.0024 | 0.0288 | 0.0384 |
| Example 189 | Balance | B | 100 | 0.0072 | 0.0072 | 0.0072 | 0.0072 | 0.0864 | 0.1152 |
| Example 190 | Balance | A | 100 | 0.001 | 0.001 | 0.001 | 0.001 | 0.012 | 0.016 |
| Example 191 | Balance | J | 300 | 0.002 | 0.002 | 0.002 | 0.002 | 0.024 | 0.032 |
| Example 192 | Balance | E | 100 | 0.006 | 0.006 | 0.006 | 0.006 | 0.072 | 0.096 |
| Example 193 | Balance | A | 100 | 0.0048 | 0.0048 | 0.0048 | 0.0048 | 0.0576 | 0.0768 |
| Example 194 | Balance | A | 1,000 | 0.0024 | 0.0024 | 0.0024 | 0.0024 | 0.0288 | 0.0384 |
| Example 195 | Balance | I | 300 | 0.0072 | 0.0072 | 0.0072 | 0.0072 | 0.0864 | 0.1152 |
| Example 196 | Balance | D | 100 | 0.001 | 0.001 | 0.001 | 0.001 | 0.012 | 0.016 |
| Example 197 | Balance | J | 100 | 0.002 | 0.002 | 0.002 | 0.002 | 0.024 | 0.032 |
| Example 198 | Balance | A | 100 | 0.006 | 0.006 | 0.006 | 0.006 | 0.072 | 0.096 |
| Example 199 | Balance | A | 50 | 0.0048 | 0.0048 | 0.0048 | 0.0048 | 0.0576 | 0.0768 |
| Example 200 | Balance | E | 50 | 0.0024 | 0.0024 | 0.0024 | 0.0024 | 0.0288 | 0.0384 |

TABLE 45

| [Table 1-6-5] | Components of chemical liquid Impurity metal Content of particles containing following impurity metal (mass ppt) | | | | | | Content of organic impurity (mass ppm) Total | High-boiling-point component | Water Content (% by mass) |
|---|---|---|---|---|---|---|---|---|---|
| | Fe | Cr | Ni | Pb | Others | Total | | | |
| Example 167 | 0.002 | 0.001 | 0.003 | 0.001 | 0.016 | 0.023 | 260 | 1.0 | 0.10% |
| Example 168 | 0.002 | 0.001 | 0.003 | 0.001 | 0.016 | 0.023 | 130 | 0.5 | 0.10% |
| Example 169 | 0.002 | 0.001 | 0.003 | 0.001 | 0.016 | 0.023 | 351 | 1.4 | 0.10% |
| Example 170 | 0.002 | 0.002 | 0.003 | 0.002 | 0.016 | 0.025 | 421 | 1.7 | 0.10% |
| Example 171 | 0.001 | 0.001 | 0.003 | 0.001 | 0.018 | 0.024 | 295 | 1.2 | 0.10% |
| Example 172 | 0.003 | 0.001 | 0.004 | 0.001 | 0.027 | 0.036 | 265 | 1.1 | 0.10% |
| Example 173 | 0.001 | 0.001 | 0.001 | 0.001 | 0.006 | 0.01 | 133 | 0.5 | 0.10% |
| Example 174 | 0.003 | 0.003 | 0.003 | 0.003 | 0.036 | 0.048 | 358 | 1.4 | 0.10% |
| Example 175 | 0.0024 | 0.0024 | 0.0024 | 0.0024 | 0.0288 | 0.0384 | 430 | 1.7 | 0.10% |
| Example 176 | 0.0012 | 0.0012 | 0.0012 | 0.0012 | 0.0144 | 0.0192 | 301 | 1.2 | 0.10% |
| Example 177 | 0.0036 | 0.0036 | 0.0036 | 0.0036 | 0.0432 | 0.0576 | 271 | 1.1 | 0.10% |
| Example 178 | 0.001 | 0.001 | 0.001 | 0.001 | 0.012 | 0.016 | 135 | 0.5 | 0.10% |
| Example 179 | 0.001 | 0.001 | 0.001 | 0.001 | 0.012 | 0.016 | 366 | 1.5 | 0.10% |
| Example 180 | 0.003 | 0.003 | 0.003 | 0.003 | 0.036 | 0.048 | 439 | 1.8 | 0.10% |
| Example 181 | 0.0024 | 0.0024 | 0.0024 | 0.0024 | 0.0288 | 0.0384 | 307 | 1.2 | 0.10% |
| Example 182 | 0.0012 | 0.0012 | 0.0012 | 0.0012 | 0.0144 | 0.0192 | 276 | 1.1 | 0.10% |
| Example 183 | 0.0036 | 0.0036 | 0.0036 | 0.0036 | 0.0432 | 0.0576 | 138 | 0.6 | 0.10% |
| Example 184 | 0.001 | 0.001 | 0.001 | 0.001 | 0.012 | 0.016 | 373 | 1.5 | 0.10% |
| Example 185 | 0.001 | 0.001 | 0.001 | 0.001 | 0.012 | 0.016 | 448 | 1.8 | 0.10% |
| Example 186 | 0.003 | 0.003 | 0.003 | 0.003 | 0.036 | 0.048 | 313 | 1.3 | 0.10% |
| Example 187 | 0.0024 | 0.0024 | 0.0024 | 0.0024 | 0.0288 | 0.0384 | 282 | 1.1 | 0.10% |
| Example 188 | 0.0012 | 0.0012 | 0.0012 | 0.0012 | 0.0144 | 0.0192 | 141 | 0.6 | 0.10% |

TABLE 45-continued

| | Components of chemical liquid | | | | | | | | |
|---|---|---|---|---|---|---|---|---|---|
| | Impurity metal | | | | | | Content of organic impurity (mass ppm) | | Water |
| | Content of particles containing following impurity metal (mass ppt) | | | | | | | High-boiling- | Content |
| [Table 1-6-5] | Fe | Cr | Ni | Pb | Others | Total | Total | point component | (% by mass) |
| Example 189 | 0.0036 | 0.0036 | 0.0036 | 0.0036 | 0.0432 | 0.0576 | 381 | 1.5 | 0.10% |
| Example 190 | 0.001 | 0.001 | 0.001 | 0.001 | 0.012 | 0.016 | 457 | 1.8 | 0.10% |
| Example 191 | 0.001 | 0.001 | 0.001 | 0.001 | 0.012 | 0.016 | 320 | 1.3 | 0.10% |
| Example 192 | 0.003 | 0.003 | 0.003 | 0.003 | 0.036 | 0.048 | 288 | 1.2 | 0.10% |
| Example 193 | 0.0024 | 0.0024 | 0.0024 | 0.0024 | 0.0288 | 0.0384 | 144 | 0.6 | 0.10% |
| Example 194 | 0.0012 | 0.0012 | 0.0012 | 0.0012 | 0.0144 | 0.0192 | 389 | 1.6 | 0.10% |
| Example 195 | 0.0036 | 0.0036 | 0.0036 | 0.0036 | 0.0432 | 0.0576 | 466 | 1.9 | 0.10% |
| Example 196 | 0.001 | 0.001 | 0.001 | 0.001 | 0.012 | 0.016 | 327 | 1.3 | 0.10% |
| Example 197 | 0.001 | 0.001 | 0.001 | 0.001 | 0.012 | 0.016 | 294 | 1.2 | 0.10% |
| Example 198 | 0.003 | 0.003 | 0.003 | 0.003 | 0.036 | 0.048 | 147 | 0.6 | 0.10% |
| Example 199 | 0.0024 | 0.0024 | 0.0024 | 0.0024 | 0.0288 | 0.0384 | 397 | 1.6 | 0.10% |
| Example 200 | 0.0012 | 0.0012 | 0.0012 | 0.0012 | 0.0144 | 0.0192 | 476 | 1.9 | 0.10% |

TABLE 46

| | Physical properties of chemical liquid | | | Evaluation | | | | | | |
|---|---|---|---|---|---|---|---|---|---|---|
| | | | | | Type of resist composition | | | | | |
| | | | | | | | | Resist saving performance | | |
| | Number of coarse particles | Content of surfactant/ total content | Content of surfactant/content of high-boiling- | Defect inhibition | | Affinity | | | Film thickness | |
| [Table 1-6-6] | (number/ml) | of particles | point component | performance | | Rsq1 | SRsq | Uniformity | controllability | Developability |
| Example 167 | 5 | $2.2 \times 10^9$ | $4.8 \times 10^1$ | AA | 1 | A | A | A | A | A |
| Example 168 | 3 | $4.3 \times 10^9$ | $1.9 \times 10^2$ | AA | 1 | A | A | A | A | A |
| Example 169 | 7 | $4.3 \times 10^9$ | $7.1 \times 10^1$ | AA | 1 | A | A | A | A | A |
| Example 170 | 8 | $4.0 \times 10^9$ | $5.9 \times 10^1$ | AA | 1 | A | A | A | C | A |
| Example 171 | 6 | $2.1 \times 10^9$ | $4.2 \times 10^1$ | AA | 1 | A | A | A | A | A |
| Example 172 | 5 | $2.8 \times 10^9$ | $9.4 \times 10^1$ | AA | 1 | A | A | A | A | A |
| Example 173 | 3 | $1.0 \times 10^{10}$ | $1.9 \times 10^2$ | AA | 1 | A | A | A | A | A |
| Example 174 | 7 | $2.1 \times 10^9$ | $7.0 \times 10^1$ | A | 1 | A | A | A | A | A |
| Example 175 | 9 | $1.3 \times 10^9$ | $2.9 \times 10^1$ | AA | 1 | A | A | A | A | A |
| Example 176 | 6 | $5.2 \times 10^9$ | $8.3 \times 10^1$ | AA | 1 | A | A | A | A | A |
| Example 177 | 5 | $1.7 \times 10^9$ | $9.2 \times 10^1$ | AA | 1 | A | A | A | A | A |
| Example 178 | 3 | $6.3 \times 10^9$ | $1.8 \times 10^2$ | A | 1 | A | A | A | A | A |
| Example 179 | 7 | $3.1 \times 10^9$ | $3.4 \times 10^1$ | A | 1 | A | A | A | A | A |
| Example 180 | 9 | $2.1 \times 10^9$ | $5.7 \times 10^1$ | A | 1 | A | A | A | A | A |
| Example 181 | 6 | $2.6 \times 10^9$ | $8.1 \times 10^1$ | A | 1 | A | A | A | A | A |
| Example 182 | 6 | $5.2 \times 10^9$ | $9.0 \times 10^1$ | AA | 1 | A | A | A | A | A |
| Example 183 | 3 | $1.7 \times 10^9$ | $1.8 \times 10^2$ | AA | 1 | A | A | A | A | A |
| Example 184 | 7 | $6.3 \times 10^9$ | $6.7 \times 10^1$ | A | 1 | A | A | A | A | A |
| Example 185 | 9 | $1.9 \times 10^{10}$ | $1.7 \times 10^2$ | AA | 1 | A | A | A | A | A |
| Example 186 | 6 | $1.0 \times 10^9$ | $4.0 \times 10^1$ | A | 1 | A | A | A | A | A |
| Example 187 | 6 | $2.6 \times 10^{10}$ | $8.9 \times 10^2$ | A | 1 | A | A | A | A | A |
| Example 188 | 3 | $5.2 \times 10^9$ | $1.8 \times 10^2$ | A | 1 | A | A | A | A | A |
| Example 189 | 8 | $1.7 \times 10^9$ | $6.6 \times 10^1$ | AA | 1 | A | A | A | A | A |
| Example 190 | 9 | $6.3 \times 10^9$ | $5.5 \times 10^1$ | AA | 1 | A | A | A | A | A |
| Example 191 | 6 | $1.9 \times 10^{10}$ | $2.3 \times 10^2$ | A | 1 | A | A | A | A | A |
| Example 192 | 6 | $2.1 \times 10^9$ | $8.7 \times 10^1$ | A | 1 | A | A | A | A | A |
| Example 193 | 3 | $2.6 \times 10^9$ | $1.7 \times 10^2$ | AA | 1 | A | A | A | A | A |
| Example 194 | 8 | $5.2 \times 10^{10}$ | $6.4 \times 10^2$ | AA | 1 | A | A | A | A | A |
| Example 195 | 9 | $5.2 \times 10^9$ | $1.6 \times 10^2$ | A | 1 | A | A | A | A | A |
| Example 196 | 7 | $6.3 \times 10^9$ | $7.7 \times 10^1$ | A | 1 | A | A | A | A | A |
| Example 197 | 6 | $6.3 \times 10^9$ | $8.5 \times 10^1$ | A | 1 | A | A | A | A | A |
| Example 198 | 3 | $2.1 \times 10^9$ | $1.7 \times 10^2$ | AA | 1 | A | A | A | A | A |
| Example 199 | 8 | $1.3 \times 10^9$ | $3.2 \times 10^1$ | AA | 1 | A | A | A | A | A |
| Example 200 | 10 | $2.6 \times 10^9$ | $2.6 \times 10^1$ | A | 1 | A | A | A | A | A |

TABLE 47

| [Table 1-6-7] | | Evaluation | | | | | | | | | | |
|---|---|---|---|---|---|---|---|---|---|---|---|---|
| | | Type of resist composition | | | | | Type of resist composition | | | | | |
| | | Resist saving performance | | | | | Resist saving performance | | | | | |
| | | Affinity | | | Film thickness | | | Affinity | | | Film thickness | |
| | | Rsq1 | SRsq | Uniformity | controllability | Developability | | Rsq1 | SRsq | Uniformity | controllability | Developability |
| Example 167 | 2 | A | A | A | A | A | 3 | A | A | A | A | A |
| Example 168 | 2 | A | A | A | A | A | 3 | A | A | A | A | A |
| Example 169 | 2 | A | A | A | A | A | 3 | A | A | A | A | A |
| Example 170 | 2 | A | A | A | C | A | 3 | A | A | A | C | A |
| Example 171 | 2 | A | A | A | A | A | 3 | A | A | A | A | A |
| Example 172 | 2 | A | A | A | A | A | 3 | A | A | A | A | A |
| Example 173 | 2 | A | A | A | A | A | 3 | A | A | A | A | A |
| Example 174 | 2 | A | A | A | A | A | 3 | A | A | A | A | A |
| Example 175 | 2 | A | A | A | A | A | 3 | A | A | A | A | A |
| Example 176 | 2 | A | A | A | A | A | 3 | A | A | A | A | A |
| Example 177 | 2 | A | A | A | A | A | 3 | A | A | A | A | A |
| Example 178 | 2 | A | A | A | A | A | 3 | A | A | A | A | A |
| Example 179 | 2 | A | A | A | A | A | 3 | A | A | A | A | A |
| Example 180 | 2 | A | A | A | A | A | 3 | A | A | A | A | A |
| Example 181 | 2 | A | A | A | A | A | 3 | A | A | A | A | A |
| Example 182 | 2 | A | A | A | A | A | 3 | A | A | A | A | A |
| Example 183 | 2 | A | A | A | A | A | 3 | A | A | A | A | A |
| Example 184 | 2 | A | A | A | A | A | 3 | A | A | A | A | A |
| Example 185 | 2 | A | A | A | A | A | 3 | A | A | A | A | A |
| Example 186 | 2 | A | A | A | A | A | 3 | A | A | A | A | A |
| Example 187 | 2 | A | A | A | A | A | 3 | A | A | A | A | A |
| Example 188 | 2 | A | A | A | A | A | 3 | A | A | A | A | A |
| Example 189 | 2 | A | A | A | A | A | 3 | A | A | A | A | A |
| Example 190 | 2 | A | A | A | A | A | 3 | A | A | A | A | A |
| Example 191 | 2 | A | A | A | A | A | 3 | A | A | A | A | A |
| Example 192 | 2 | A | A | A | A | A | 3 | A | A | A | A | A |
| Example 193 | 2 | A | A | A | A | A | 3 | A | A | A | A | A |
| Example 194 | 2 | A | A | A | A | A | 3 | A | A | A | A | A |
| Example 195 | 2 | A | A | A | A | A | 3 | A | A | A | A | A |
| Example 196 | 2 | A | A | A | A | A | 3 | A | A | A | A | A |
| Example 197 | 2 | A | A | A | A | A | 3 | A | A | A | A | A |
| Example 198 | 2 | A | A | A | A | A | 3 | A | A | A | A | A |
| Example 199 | 2 | A | A | A | A | A | 3 | A | A | A | A | A |
| Example 200 | 2 | A | A | A | A | A | 3 | A | A | A | A | A |

TABLE 48

| [Table 1-6-8] | | Evaluation | | | | | | |
|---|---|---|---|---|---|---|---|---|
| | | Type of resist composition | | | | | | |
| | | Resist saving performance | | | | | Evaluation of p-CMP defect inhibition | Evaluation of ashing residue removing |
| | | Affinity | | | Film thickness | | | |
| | | Rsq1 | SRsq | Uniformity | controllability | Developability | performance | performance |
| Example 167 | 4 | A | A | A | A | A | A | A |
| Example 168 | 4 | A | A | A | A | A | A | A |
| Example 169 | 4 | A | A | A | A | A | A | A |
| Example 170 | 4 | A | A | A | C | A | A | A |
| Example 171 | 4 | A | A | A | A | A | A | A |
| Example 172 | 4 | A | A | A | A | A | A | A |
| Example 173 | 4 | A | A | A | A | A | A | A |
| Example 174 | 4 | A | A | A | A | A | A | A |
| Example 175 | 4 | A | A | A | A | A | A | A |
| Example 176 | 4 | A | A | A | A | A | A | A |
| Example 177 | 4 | A | A | A | A | A | A | A |
| Example 178 | 4 | A | A | A | A | A | A | A |
| Example 179 | 4 | A | A | A | A | A | A | A |
| Example 180 | 4 | A | A | A | A | A | A | A |
| Example 181 | 4 | A | A | A | A | A | A | A |
| Example 182 | 4 | A | A | A | A | A | A | A |
| Example 183 | 4 | A | A | A | A | A | A | A |
| Example 184 | 4 | A | A | A | A | A | A | A |

TABLE 48-continued

| [Table 1-6-8] | | Evaluation Type of resist composition | | | | | |
|---|---|---|---|---|---|---|---|
| | | Resist saving performance | | | | Evaluation of p-CMP defect inhibition performance | Evaluation of ashing residue removing performance |
| | Affinity | | Film thickness controllability | Developability | | | |
| | Rsq1 | SRsq | Uniformity | | | | |
| Example 185 | 4 | A | A | A | A | A | A | A |
| Example 186 | 4 | A | A | A | A | A | A | A |
| Example 187 | 4 | A | A | A | A | A | A | A |
| Example 188 | 4 | A | A | A | A | A | A | A |
| Example 189 | 4 | A | A | A | A | A | A | A |
| Example 190 | 4 | A | A | A | A | A | A | A |
| Example 191 | 4 | A | A | A | A | A | A | A |
| Example 192 | 4 | A | A | A | A | A | A | A |
| Example 193 | 4 | A | A | A | A | A | A | A |
| Example 194 | 4 | A | A | A | A | A | A | A |
| Example 195 | 4 | A | A | A | A | A | A | A |
| Example 196 | 4 | A | A | A | A | A | A | A |
| Example 197 | 4 | A | A | A | A | A | A | A |
| Example 198 | 4 | A | A | A | A | A | A | A |
| Example 199 | 4 | A | A | A | A | A | A | A |
| Example 200 | 4 | A | A | A | A | A | A | A |

TABLE 49

| [Table 1-7-1] | Type | Components of chemical liquid Main agent Organic solvent | | | | | | | |
|---|---|---|---|---|---|---|---|---|---|
| | | Content (% by mass) | Molar mass (g/mol) | Vapor pressure (Pa) | Surface tension (mN/m) | fd | fp | fh | HP |
| Example 201 | CyPn | 60 | 84.1 | 1,520 | 33.8 | 60.0 | 21.8 | 18.2 | 1 |
| Example 202 | CyPn | 60 | 84.1 | 1,520 | 33.8 | 60.0 | 21.8 | 18.2 | 1 |
| Example 203 | CyPn | 60 | 84.1 | 1,520 | 33.8 | 60.0 | 21.8 | 18.2 | 1 |
| Example 204 | CyPn | 60 | 84.1 | 1,520 | 33.8 | 60.0 | 21.8 | 18.2 | 1 |
| Example 205 | CyPn | 60 | 84.1 | 1,520 | 33.8 | 60.0 | 21.8 | 18.2 | 1 |
| Example 206 | CyPn | 60 | 84.1 | 1,520 | 33.8 | 60.0 | 21.8 | 18.2 | 1 |
| Example 207 | nBA | 60 | 116.16 | 1,200 | 24.8 | 60.5 | 17.2 | 22.2 | 1 |
| Example 208 | nBA | 60 | 116.16 | 1,200 | 24.8 | 60.5 | 17.2 | 22.2 | 1 |
| Example 209 | nBA | 60 | 116.16 | 1,200 | 24.8 | 60.5 | 17.2 | 22.2 | 1 |
| Example 210 | nBA | 60 | 116.16 | 1,200 | 24.8 | 60.5 | 17.2 | 22.2 | 1 |
| Example 211 | nBA | 60 | 116.16 | 1,200 | 24.8 | 60.5 | 17.2 | 22.2 | 1 |
| Example 212 | nBA | 60 | 116.16 | 1,200 | 24.8 | 60.5 | 17.2 | 22.2 | 1 |
| Example 213 | nBA | 60 | 116.16 | 1,200 | 24.8 | 60.5 | 17.2 | 22.2 | 1 |
| Example 214 | nBA | 60 | 116.16 | 1,200 | 24.8 | 60.5 | 17.2 | 22.2 | 1 |
| Example 215 | nBA | 60 | 116.16 | 1,200 | 24.8 | 60.5 | 17.2 | 22.2 | 1 |
| Example 216 | nBA | 60 | 116.16 | 1,200 | 24.8 | 60.5 | 17.2 | 22.2 | 1 |
| Example 217 | nBA | 60 | 116.16 | 1,200 | 24.8 | 60.5 | 17.2 | 22.2 | 1 |
| Example 218 | nBA | 60 | 116.16 | 1,200 | 24.8 | 60.5 | 17.2 | 22.2 | 1 |
| Example 219 | nBA | 60 | 116.16 | 1,200 | 24.8 | 60.5 | 17.2 | 22.2 | 1 |
| Example 220 | nBA | 60 | 116.16 | 1,200 | 24.8 | 60.5 | 17.2 | 22.2 | 1 |
| Example 221 | nBA | 60 | 116.16 | 1,200 | 24.8 | 60.5 | 17.2 | 22.2 | 1 |
| Example 222 | nBA | 60 | 116.16 | 1,200 | 24.8 | 60.5 | 17.2 | 22.2 | 1 |
| Example 223 | nBA | 60 | 116.16 | 1,200 | 24.8 | 60.5 | 17.2 | 22.2 | 1 |
| Example 224 | DEGME | 25 | 120.15 | 13 | 28.0 | 44.3 | 20.8 | 34.9 | 1 |
| Example 225 | DME | 25 | 90.12 | 693 | 29.0 | 55.9 | 22.8 | 21.3 | 1 |
| Example 226 | DEE | 25 | 118.18 | 627 | 29.0 | 62.2 | 19.9 | 17.8 | 1 |
| Example 227 | DEGIBE | 25 | 162.23 | 133 | 29.0 | 61.9 | 18.7 | 19.4 | 1 |
| Example 228 | DEGDME | 25 | 134.18 | 520 | 28.0 | 56.9 | 21.0 | 22.1 | 1 |
| Example 229 | DEGDEE | 25 | 162.23 | 253 | 29.0 | 60.4 | 19.6 | 20.0 | 1 |
| Example 230 | TriEGDME | 25 | 178.23 | 13 | 28.0 | 56.4 | 20.9 | 22.7 | 1 |
| Example 231 | TetraEGDME | 25 | 222.28 | 13 | 27.0 | 55.6 | 21.1 | 23.2 | 1 |
| Example 232 | TEGMBE | 25 | 220.31 | 13 | 28.0 | 48.5 | 18.7 | 32.8 | 1 |
| Example 233 | DEGMBE | 25 | 162.23 | 117 | 29.0 | 59.4 | 18.1 | 22.5 | 1 |

TABLE 50

Components of chemical liquid
Main agent
Organic solvent

| [Table 1-7-2] | Type | Content (% by mass) | Molar mass (g/mol) | Vapor pressure (Pa) | Surface tension (mN/m) | fd | fp | fh | HP |
|---|---|---|---|---|---|---|---|---|---|
| Example 201 | 14-DMB | 40 | 138.17 | 1 | 30.0 | 59.0 | 20.6 | 20.3 | 1 |
| Example 202 | 12-DMB | 40 | 138.17 | 1 | 30.0 | 60.6 | 20.2 | 19.2 | 1 |
| Example 203 | 13-DMB | 40 | 138.17 | 1 | 30.0 | 61.6 | 19.9 | 18.5 | 1 |
| Example 204 | 14-DPB | 40 | 262.31 | 1 | 33.0 | 63.3 | 18.5 | 18.2 | 1 |
| Example 205 | 4-MTT | 40 | 122.17 | 1 | 32.0 | 64.8 | 17.4 | 17.8 | 1 |
| Example 206 | PNT | 40 | 122.17 | 1 | 31.0 | 66.3 | 16.3 | 17.4 | 1 |
| Example 207 | DEGME | 40 | 120.15 | 13 | 28.0 | 44.3 | 20.8 | 34.9 | 1 |
| Example 208 | DME | 40 | 90.12 | 693 | 29.0 | 55.9 | 22.8 | 21.3 | 1 |
| Example 209 | DEE | 40 | 118.18 | 627 | 29.0 | 62.2 | 19.9 | 17.8 | 1 |
| Example 210 | DEGIBE | 40 | 162.23 | 133 | 29.0 | 61.9 | 18.7 | 19.4 | 1 |
| Example 211 | DEGDME | 40 | 134.18 | 520 | 28.0 | 56.9 | 21.0 | 22.1 | 1 |
| Example 212 | DEGDEE | 40 | 162.23 | 253 | 29.0 | 60.4 | 19.6 | 20.0 | 1 |
| Example 213 | TriEGDME | 40 | 178.23 | 13 | 28.0 | 56.4 | 20.9 | 22.7 | 1 |
| Example 214 | TetraEGDME | 40 | 222.28 | 13 | 27.0 | 55.6 | 21.1 | 23.2 | 1 |
| Example 215 | TEGMBE | 40 | 220.31 | 13 | 28.0 | 48.5 | 18.7 | 32.8 | 1 |
| Example 216 | DEGMBE | 40 | 162.23 | 117 | 29.0 | 59.4 | 18.1 | 22.5 | 1 |
| Example 217 | Anisole | 40 | 108.14 | 63 | 30.0 | 64.3 | 17.0 | 18.7 | 1 |
| Example 218 | 14-DMB | 40 | 138.17 | 1 | 30.0 | 59.0 | 20.6 | 20.3 | 1 |
| Example 219 | 12-DMB | 40 | 138.17 | 1 | 30.0 | 60.6 | 20.2 | 19.2 | 1 |
| Example 220 | 13-DMB | 40 | 138.17 | 1 | 30.0 | 61.6 | 19.9 | 18.5 | 1 |
| Example 221 | 14-DPB | 40 | 262.31 | 1 | 33.0 | 63.3 | 18.5 | 18.2 | 1 |
| Example 222 | 4-MTT | 40 | 122.17 | 1 | 32.0 | 64.8 | 17.4 | 17.8 | 1 |
| Example 223 | PNT | 40 | 122.17 | 1 | 31.0 | 66.3 | 16.3 | 17.4 | 1 |
| Example 224 | PGMEA | 75 | 132.16 | 493 | 27.9 | 56.5 | 19.8 | 23.7 | 1 |
| Example 225 | PGMEA | 75 | 132.16 | 493 | 27.9 | 56.5 | 19.8 | 23.7 | 1 |
| Example 226 | PGMEA | 75 | 132.16 | 493 | 27.9 | 56.5 | 19.8 | 23.7 | 1 |
| Example 227 | PGMEA | 75 | 132.16 | 493 | 27.9 | 56.5 | 19.8 | 23.7 | 1 |
| Example 228 | PGMEA | 75 | 132.16 | 493 | 27.9 | 56.5 | 19.8 | 23.7 | 1 |
| Example 229 | PGMEA | 75 | 132.16 | 493 | 27.9 | 56.5 | 19.8 | 23.7 | 1 |
| Example 230 | PGMEA | 75 | 132.16 | 493 | 27.9 | 56.5 | 19.8 | 23.7 | 1 |
| Example 231 | PGMEA | 75 | 132.16 | 493 | 27.9 | 56.5 | 19.8 | 23.7 | 1 |
| Example 232 | PGMEA | 75 | 132.16 | 493 | 27.9 | 56.5 | 19.8 | 23.7 | 1 |
| Example 233 | PGMEA | 75 | 132.16 | 493 | 27.9 | 56.5 | 19.8 | 23.7 | 1 |

TABLE 51

Components of chemical liquid
Main agent
Organic solvent

| [Table 1-7-3] | Type | Content (% by mass) | Molar mass (g/mol) | Vapor pressure (Pa) | Surface tension (mN/m) | fd | fp | fh | HP | Vapor pressure (Pa) | Surface tension (mN/m) |
|---|---|---|---|---|---|---|---|---|---|---|---|
| Example 201 | | | | | | | | | | 1,081 | 32.7 |
| Example 202 | | | | | | | | | | 1,081 | 32.7 |
| Example 203 | | | | | | | | | | 1,081 | 32.7 |
| Example 204 | | | | | | | | | | 1,252 | 33.7 |
| Example 205 | | | | | | | | | | 1,042 | 33.2 |
| Example 206 | | | | | | | | | | 1,042 | 32.9 |
| Example 207 | | | | | | | | | | 735 | 26.1 |
| Example 208 | | | | | | | | | | 966 | 26.7 |
| Example 209 | | | | | | | | | | 973 | 26.5 |
| Example 210 | | | | | | | | | | 855 | 26.2 |
| Example 211 | | | | | | | | | | 951 | 26.0 |
| Example 212 | | | | | | | | | | 894 | 26.2 |
| Example 213 | | | | | | | | | | 841 | 25.8 |
| Example 214 | | | | | | | | | | 893 | 25.4 |
| Example 215 | | | | | | | | | | 891 | 25.6 |
| Example 216 | | | | | | | | | | 850 | 26.2 |
| Example 217 | | | | | | | | | | 725 | 27.0 |
| Example 218 | | | | | | | | | | 769 | 26.7 |
| Example 219 | | | | | | | | | | 769 | 26.7 |
| Example 220 | | | | | | | | | | 769 | 26.7 |
| Example 221 | | | | | | | | | | 927 | 26.7 |
| Example 222 | | | | | | | | | | 735 | 27.6 |
| Example 223 | | | | | | | | | | 735 | 27.2 |

TABLE 51-continued

| [Table 1-7-3] | Type | Content (% by mass) | Molar mass (g/mol) | Vapor pressure (Pa) | Surface tension (mN/m) | fd | fp | fh | HP | Vapor pressure (Pa) | Surface tension (mN/m) |
|---|---|---|---|---|---|---|---|---|---|---|---|
| Example 224 | | | | | | | | | | 365 | 27.9 |
| Example 225 | | | | | | | | | | 559 | 28.3 |
| Example 226 | | | | | | | | | | 529 | 28.2 |
| Example 227 | | | | | | | | | | 416 | 28.1 |
| Example 228 | | | | | | | | | | 500 | 27.9 |
| Example 229 | | | | | | | | | | 442 | 28.1 |
| Example 230 | | | | | | | | | | 398 | 27.9 |
| Example 231 | | | | | | | | | | 414 | 27.8 |
| Example 232 | | | | | | | | | | 413 | 27.9 |
| Example 233 | | | | | | | | | | 413 | 28.1 |

TABLE 97

| | Components of chemical liquid | | | Components of chemical liquid | | | | | |
|---|---|---|---|---|---|---|---|---|---|
| | Main agent | Surfactant | | Impurity metal | | | | | |
| | Content | | Content | Total content of impurity metal (mass ppt) | | | | | |
| [Table 1-7-4] | (% by mass) | Type | (mass ppm) | Fe | Cr | Ni | Pb | Others | Total |
| Example 201 | Balance | A | 100 | 0.0072 | 0.0072 | 0.0072 | 0.0072 | 0.0864 | 0.1152 |
| Example 202 | Balance | C | 1,000 | 0.001 | 0.001 | 0.001 | 0.001 | 0.012 | 0.016 |
| Example 203 | Balance | A | 50 | 0.002 | 0.002 | 0.002 | 0.002 | 0.024 | 0.032 |
| Example 204 | Balance | A | 100 | 0.006 | 0.006 | 0.006 | 0.006 | 0.072 | 0.096 |
| Example 205 | Balance | G | 100 | 0.0048 | 0.0048 | 0.0048 | 0.0048 | 0.0576 | 0.0768 |
| Example 206 | Balance | B | 100 | 0.0024 | 0.0024 | 0.0024 | 0.0024 | 0.0288 | 0.0384 |
| Example 207 | Balance | E | 100 | 0.0072 | 0.0072 | 0.0072 | 0.0072 | 0.0864 | 0.1152 |
| Example 208 | Balance | I | 50 | 0.001 | 0.001 | 0.001 | 0.001 | 0.012 | 0.016 |
| Example 209 | Balance | A | 1,000 | 0.002 | 0.002 | 0.002 | 0.002 | 0.024 | 0.032 |
| Example 210 | Balance | C | 100 | 0.006 | 0.006 | 0.006 | 0.006 | 0.072 | 0.096 |
| Example 211 | Balance | J | 50 | 0.0048 | 0.0048 | 0.0048 | 0.0048 | 0.0576 | 0.0768 |
| Example 212 | Balance | D | 100 | 0.0024 | 0.0024 | 0.0024 | 0.0024 | 0.0288 | 0.0384 |
| Example 213 | Balance | F | 100 | 0.0072 | 0.0072 | 0.0072 | 0.0072 | 0.0864 | 0.1152 |
| Example 214 | Balance | A | 50 | 0.001 | 0.001 | 0.001 | 0.001 | 0.012 | 0.016 |
| Example 215 | Balance | E | 1,000 | 0.002 | 0.002 | 0.002 | 0.002 | 0.024 | 0.032 |
| Example 216 | Balance | A | 300 | 0.006 | 0.006 | 0.006 | 0.006 | 0.072 | 0.096 |
| Example 217 | Balance | J | 100 | 0.0048 | 0.0048 | 0.0048 | 0.0048 | 0.0576 | 0.0768 |
| Example 218 | Balance | B | 100 | 0.0024 | 0.0024 | 0.0024 | 0.0024 | 0.0288 | 0.0384 |
| Example 219 | Balance | I | 100 | 0.0072 | 0.0072 | 0.0072 | 0.0072 | 0.0864 | 0.1152 |
| Example 220 | Balance | A | 50 | 0.001 | 0.001 | 0.001 | 0.001 | 0.012 | 0.016 |
| Example 221 | Balance | A | 1,000 | 0.002 | 0.002 | 0.002 | 0.002 | 0.024 | 0.032 |
| Example 222 | Balance | C | 100 | 0.006 | 0.006 | 0.006 | 0.006 | 0.072 | 0.096 |
| Example 223 | Balance | A | 100 | 0.0048 | 0.0048 | 0.0048 | 0.0048 | 0.0576 | 0.0768 |
| Example 224 | Balance | D | 100 | 0.0024 | 0.0024 | 0.0024 | 0.0024 | 0.0288 | 0.0384 |
| Example 225 | Balance | B | 100 | 0.0072 | 0.0072 | 0.0072 | 0.0072 | 0.0864 | 0.1152 |
| Example 226 | Balance | E | 100 | 0.001 | 0.001 | 0.001 | 0.001 | 0.012 | 0.016 |
| Example 227 | Balance | I | 50 | 0.002 | 0.002 | 0.002 | 0.002 | 0.024 | 0.032 |
| Example 228 | Balance | C | 100 | 0.006 | 0.006 | 0.006 | 0.006 | 0.072 | 0.096 |
| Example 229 | Balance | A | 50 | 0.0048 | 0.0048 | 0.0048 | 0.0048 | 0.0576 | 0.0768 |
| Example 230 | Balance | G | 100 | 0.0024 | 0.0024 | 0.0024 | 0.0024 | 0.0288 | 0.0384 |
| Example 231 | Balance | B | 100 | 0.0072 | 0.0072 | 0.0072 | 0.0072 | 0.0864 | 0.1152 |
| Example 232 | Balance | H | 100 | 0.001 | 0.001 | 0.001 | 0.001 | 0.012 | 0.016 |
| Example 233 | Balance | D | 100 | 0.002 | 0.002 | 0.002 | 0.002 | 0.024 | 0.032 |

TABLE 53

| | Components of chemical liquid | | | | | | | | |
|---|---|---|---|---|---|---|---|---|---|
| | Impurity metal Content of particles containing following impurity metal (mass ppt) | | | | | | Content of organic impurity (mass ppm) | | Water |
| | | | | | | | | High-boiling- | Content |
| [Table 1-7-5] | Fe | Cr | Ni | Pb | Others | Total | Total | point component | (% by mass) |
| Example 201 | 0.0036 | 0.0036 | 0.0036 | 0.0036 | 0.0432 | 0.0576 | 333 | 1.3 | 0.10% |
| Example 202 | 0.001 | 0.001 | 0.001 | 0.001 | 0.012 | 0.016 | 300 | 1.2 | 0.10% |
| Example 203 | 0.001 | 0.001 | 0.001 | 0.001 | 0.012 | 0.016 | 150 | 0.6 | 0.10% |
| Example 204 | 0.003 | 0.003 | 0.003 | 0.003 | 0.036 | 0.048 | 405 | 1.6 | 0.10% |
| Example 205 | 0.0024 | 0.0024 | 0.0024 | 0.0024 | 0.0288 | 0.0384 | 486 | 1.9 | 0.10% |
| Example 206 | 0.0012 | 0.0012 | 0.0012 | 0.0012 | 0.0144 | 0.0192 | 340 | 1.4 | 0.10% |
| Example 207 | 0.0036 | 0.0036 | 0.0036 | 0.0036 | 0.0432 | 0.0576 | 306 | 1.2 | 0.10% |
| Example 208 | 0.001 | 0.001 | 0.001 | 0.001 | 0.012 | 0.016 | 153 | 0.6 | 0.10% |
| Example 209 | 0.001 | 0.001 | 0.001 | 0.001 | 0.012 | 0.016 | 413 | 1.7 | 0.10% |
| Example 210 | 0.003 | 0.003 | 0.003 | 0.003 | 0.036 | 0.048 | 496 | 2.0 | 0.10% |
| Example 211 | 0.0024 | 0.0024 | 0.0024 | 0.0024 | 0.0288 | 0.0384 | 347 | 1.4 | 0.10% |
| Example 212 | 0.0012 | 0.0012 | 0.0012 | 0.0012 | 0.0144 | 0.0192 | 312 | 1.2 | 0.10% |
| Example 213 | 0.0036 | 0.0036 | 0.0036 | 0.0036 | 0.0432 | 0.0576 | 156 | 0.6 | 0.10% |
| Example 214 | 0.001 | 0.001 | 0.001 | 0.001 | 0.012 | 0.016 | 422 | 1.7 | 0.10% |
| Example 215 | 0.001 | 0.001 | 0.001 | 0.001 | 0.012 | 0.016 | 506 | 2.0 | 0.10% |
| Example 216 | 0.003 | 0.003 | 0.003 | 0.003 | 0.036 | 0.048 | 354 | 1.4 | 0.10% |
| Example 217 | 0.0024 | 0.0024 | 0.0024 | 0.0024 | 0.0288 | 0.0384 | 319 | 1.3 | 0.10% |
| Example 218 | 0.0012 | 0.0012 | 0.0012 | 0.0012 | 0.0144 | 0.0192 | 159 | 0.6 | 0.10% |
| Example 219 | 0.0036 | 0.0036 | 0.0036 | 0.0036 | 0.0432 | 0.0576 | 430 | 1.7 | 0.10% |
| Example 220 | 0.001 | 0.001 | 0.001 | 0.001 | 0.012 | 0.016 | 517 | 2.1 | 0.10% |
| Example 221 | 0.001 | 0.001 | 0.001 | 0.001 | 0.012 | 0.016 | 362 | 1.4 | 0.10% |
| Example 222 | 0.003 | 0.003 | 0.003 | 0.003 | 0.036 | 0.048 | 325 | 1.3 | 0.10% |
| Example 223 | 0.0024 | 0.0024 | 0.0024 | 0.0024 | 0.0288 | 0.0384 | 163 | 0.7 | 0.10% |
| Example 224 | 0.0012 | 0.0012 | 0.0012 | 0.0012 | 0.0144 | 0.0192 | 439 | 1.8 | 0.10% |
| Example 225 | 0.0036 | 0.0036 | 0.0036 | 0.0036 | 0.0432 | 0.0576 | 527 | 2.1 | 0.10% |
| Example 226 | 0.001 | 0.001 | 0.001 | 0.001 | 0.012 | 0.016 | 369 | 1.5 | 0.10% |
| Example 227 | 0.001 | 0.001 | 0.001 | 0.001 | 0.012 | 0.016 | 332 | 1.3 | 0.10% |
| Example 228 | 0.003 | 0.003 | 0.003 | 0.003 | 0.036 | 0.048 | 166 | 0.7 | 0.10% |
| Example 229 | 0.0024 | 0.0024 | 0.0024 | 0.0024 | 0.0288 | 0.0384 | 448 | 1.8 | 0.10% |
| Example 230 | 0.0012 | 0.0012 | 0.0012 | 0.0012 | 0.0144 | 0.0192 | 538 | 2.2 | 0.10% |
| Example 231 | 0.0036 | 0.0036 | 0.0036 | 0.0036 | 0.0432 | 0.0576 | 377 | 1.5 | 0.10% |
| Example 232 | 0.001 | 0.001 | 0.001 | 0.001 | 0.012 | 0.016 | 339 | 1.4 | 0.10% |
| Example 233 | 0.001 | 0.001 | 0.001 | 0.001 | 0.012 | 0.016 | 169 | 0.7 | 0.10% |

TABLE 54

| | Physical properties of chemical liquid | | | Evaluation | | | | | | |
|---|---|---|---|---|---|---|---|---|---|---|
| | | | | | | Type of resist composition | | | | |
| | Number of | | Content of | | | Resist saving performance | | | | |
| | coarse particles | Content of surfactant/total | surfactant/content of high-boiling- | Defect inhibition | | Affinity | | | Film thickness | |
| [Table 1-7-6] | (number/ml) | content of particles | point component | performance | | Rsq1 | SRsq | Uniformity | controllability | Developability |
| Example 201 | 7 | $1.7 \times 10^9$ | $7.5 \times 10^1$ | AA | 1 | A | A | A | A | A |
| Example 202 | 6 | $6.3 \times 10^{10}$ | $8.3 \times 10^2$ | AA | 1 | A | A | A | A | A |
| Example 203 | 3 | $3.1 \times 10^9$ | $8.3 \times 10^1$ | AA | 1 | A | A | A | A | A |
| Example 204 | 8 | $2.1 \times 10^9$ | $6.2 \times 10^1$ | AA | 1 | A | A | A | A | A |
| Example 205 | 10 | $2.6 \times 10^9$ | $5.1 \times 10^1$ | A | 1 | A | A | A | A | A |
| Example 206 | 7 | $5.2 \times 10^9$ | $7.3 \times 10^1$ | AA | 1 | A | A | A | A | A |
| Example 207 | 6 | $1.7 \times 10^9$ | $8.2 \times 10^1$ | A | 1 | A | A | A | A | A |
| Example 208 | 3 | $3.1 \times 10^9$ | $8.2 \times 10^1$ | A | 1 | A | A | A | A | A |
| Example 209 | 8 | $6.3 \times 10^{10}$ | $6.0 \times 10^2$ | AA | 1 | A | A | A | A | A |
| Example 210 | 10 | $2.1 \times 10^9$ | $5.0 \times 10^1$ | AA | 1 | A | A | A | A | A |
| Example 211 | 7 | $1.3 \times 10^9$ | $3.6 \times 10^1$ | A | 1 | A | A | A | A | A |
| Example 212 | 6 | $5.2 \times 10^9$ | $8.0 \times 10^1$ | A | 1 | A | A | A | A | A |
| Example 213 | 3 | $1.7 \times 10^9$ | $1.6 \times 10^2$ | A | 1 | A | A | A | A | A |
| Example 214 | 8 | $3.1 \times 10^9$ | $3.0 \times 10^1$ | AA | 1 | A | A | A | A | A |
| Example 215 | 10 | $6.3 \times 10^{10}$ | $4.9 \times 10^2$ | A | 1 | A | A | A | A | A |
| Example 216 | 7 | $6.3 \times 10^9$ | $2.1 \times 10^2$ | AA | 1 | A | A | A | A | A |
| Example 217 | 6 | $2.6 \times 10^9$ | $7.8 \times 10^1$ | A | 1 | A | A | A | A | A |

TABLE 54-continued

| [Table 1-7-6] | Physical properties of chemical liquid Number of coarse particles (number/ml) | Content of surfactant/total content of particles | Content of surfactant/content of high-boiling-point component | Defect inhibition performance | Evaluation Type of resist composition | | | | |
|---|---|---|---|---|---|---|---|---|---|
| | | | | | | Resist saving performance | | | |
| | | | | | | Affinity | | Film thickness | |
| | | | | | | Rsq1 | SRsq | Uniformity | controllability | Developability |
| Example 218 | 3 | $5.2 \times 10^9$ | $1.6 \times 10^2$ | AA | 1 | A | A | A | A | A |
| Example 219 | 9 | $1.7 \times 10^9$ | $5.8 \times 10^1$ | A | 1 | A | A | A | A | A |
| Example 220 | 10 | $3.1 \times 10^9$ | $2.4 \times 10^1$ | AA | 1 | A | A | A | A | A |
| Example 221 | 7 | $6.3 \times 10^{10}$ | $6.9 \times 10^2$ | AA | 1 | A | A | A | A | A |
| Example 222 | 7 | $2.1 \times 10^9$ | $7.7 \times 10^1$ | AA | 1 | A | A | A | A | A |
| Example 223 | 3 | $2.6 \times 10^9$ | $1.5 \times 10^2$ | AA | 1 | A | A | A | A | A |
| Example 224 | 9 | $5.2 \times 10^9$ | $5.7 \times 10^1$ | A | 1 | A | A | A | A | A |
| Example 225 | 11 | $1.7 \times 10^9$ | $4.7 \times 10^1$ | AA | 1 | A | A | A | A | A |
| Example 226 | 7 | $6.3 \times 10^9$ | $6.8 \times 10^1$ | A | 1 | A | A | A | A | A |
| Example 227 | 7 | $3.1 \times 10^9$ | $3.8 \times 10^1$ | A | 1 | A | A | A | A | A |
| Example 228 | 3 | $2.1 \times 10^9$ | $1.5 \times 10^2$ | AA | 1 | A | A | A | A | A |
| Example 229 | 9 | $1.3 \times 10^9$ | $2.8 \times 10^1$ | AA | 1 | A | A | A | A | A |
| Example 230 | 11 | $5.2 \times 10^9$ | $4.6 \times 10^1$ | A | 1 | A | A | A | A | A |
| Example 231 | 8 | $1.7 \times 10^9$ | $6.6 \times 10^1$ | AA | 1 | A | A | A | A | A |
| Example 232 | 7 | $6.3 \times 10^9$ | $7.4 \times 10^1$ | A | 1 | A | A | A | A | A |
| Example 233 | 3 | $6.3 \times 10^9$ | $1.5 \times 10^2$ | A | 1 | A | A | A | A | A |

TABLE 55

| | Evaluation | | | | | | | | | | |
|---|---|---|---|---|---|---|---|---|---|---|---|
| | Type of resist composition | | | | | | Type of resist composition | | | | |
| | Resist saving performance | | | | | | Resist saving performance | | | | |
| | | Affinity | | Film thickness | | | | Affinity | | Film thickness | |
| [Table 1-7-7] | | Rsq1 | SRsq | Uniformity | controllability | Developability | | Rsq1 | SRsq | Uniformity | controllability | Developability |
| Example 201 | 2 | A | A | A | A | A | 3 | A | A | A | A | A |
| Example 202 | 2 | A | A | A | A | A | 3 | A | A | A | A | A |
| Example 203 | 2 | A | A | A | A | A | 3 | A | A | A | A | A |
| Example 204 | 2 | A | A | A | A | A | 3 | A | A | A | A | A |
| Example 205 | 2 | A | A | A | A | A | 3 | A | A | A | A | A |
| Example 206 | 2 | A | A | A | A | A | 3 | A | A | A | A | A |
| Example 207 | 2 | A | A | A | A | A | 3 | A | A | A | A | A |
| Example 208 | 2 | A | A | A | A | A | 3 | A | A | A | A | A |
| Example 209 | 2 | A | A | A | A | A | 3 | A | A | A | A | A |
| Example 210 | 2 | A | A | A | A | A | 3 | A | A | A | A | A |
| Example 211 | 2 | A | A | A | A | A | 3 | A | A | A | A | A |
| Example 212 | 2 | A | A | A | A | A | 3 | A | A | A | A | A |
| Example 213 | 2 | A | A | A | A | A | 3 | A | A | A | A | A |
| Example 214 | 2 | A | A | A | A | A | 3 | A | A | A | A | A |
| Example 215 | 2 | A | A | A | A | A | 3 | A | A | A | A | A |
| Example 216 | 2 | A | A | A | A | A | 3 | A | A | A | A | A |
| Example 217 | 2 | A | A | A | A | A | 3 | A | A | A | A | A |
| Example 218 | 2 | A | A | A | A | A | 3 | A | A | A | A | A |
| Example 219 | 2 | A | A | A | A | A | 3 | A | A | A | A | A |
| Example 220 | 2 | A | A | A | A | A | 3 | A | A | A | A | A |
| Example 221 | 2 | A | A | A | A | A | 3 | A | A | A | A | A |
| Example 222 | 2 | A | A | A | A | A | 3 | A | A | A | A | A |
| Example 223 | 2 | A | A | A | A | A | 3 | A | A | A | A | A |
| Example 224 | 2 | A | A | A | A | A | 3 | A | A | A | A | A |
| Example 225 | 2 | A | A | A | A | A | 3 | A | A | A | A | A |
| Example 226 | 2 | A | A | A | A | A | 3 | A | A | A | A | A |
| Example 227 | 2 | A | A | A | A | A | 3 | A | A | A | A | A |
| Example 228 | 2 | A | A | A | A | A | 3 | A | A | A | A | A |
| Example 229 | 2 | A | A | A | A | A | 3 | A | A | A | A | A |
| Example 230 | 2 | A | A | A | A | A | 3 | A | A | A | A | A |
| Example 231 | 2 | A | A | A | A | A | 3 | A | A | A | A | A |
| Example 232 | 2 | A | A | A | A | A | 3 | A | A | A | A | A |
| Example 233 | 2 | A | A | A | A | A | 3 | A | A | A | A | A |

TABLE 56

| [Table 1-7-8] | Rsq1 | Affinity SRsq | Uniformity | Film thickness controllability | Developability | Evaluation of p-CMP defect inhibition performance | Evaluation of ashing residue removing performance |
|---|---|---|---|---|---|---|---|
| Example 201 | 4 | A A | A | A | A | A | A |
| Example 202 | 4 | A A | A | A | A | A | A |
| Example 203 | 4 | A A | A | A | A | A | A |
| Example 204 | 4 | A A | A | A | A | A | A |
| Example 205 | 4 | A A | A | A | A | A | A |
| Example 206 | 4 | A A | A | A | A | A | A |
| Example 207 | 4 | A A | A | A | A | A | A |
| Example 208 | 4 | A A | A | A | A | A | A |
| Example 209 | 4 | A A | A | A | A | A | A |
| Example 210 | 4 | A A | A | A | A | A | A |
| Example 211 | 4 | A A | A | A | A | A | A |
| Example 212 | 4 | A A | A | A | A | A | A |
| Example 213 | 4 | A A | A | A | A | A | A |
| Example 214 | 4 | A A | A | A | A | A | A |
| Example 215 | 4 | A A | A | A | A | A | A |
| Example 216 | 4 | A A | A | A | A | A | A |
| Example 217 | 4 | A A | A | A | A | A | A |
| Example 218 | 4 | A A | A | A | A | A | A |
| Example 219 | 4 | A A | A | A | A | A | A |
| Example 220 | 4 | A A | A | A | A | A | A |
| Example 221 | 4 | A A | A | A | A | A | A |
| Example 222 | 4 | A A | A | A | A | A | A |
| Example 223 | 4 | A A | A | A | A | A | A |
| Example 224 | 4 | A A | A | A | A | A | A |
| Example 225 | 4 | A A | A | A | A | A | A |
| Example 226 | 4 | A A | A | A | A | A | A |
| Example 227 | 4 | A A | A | A | A | A | A |
| Example 228 | 4 | A A | A | A | A | A | A |
| Example 229 | 4 | A A | A | A | A | A | A |
| Example 230 | 4 | A A | A | A | A | A | A |
| Example 231 | 4 | A A | A | A | A | A | A |
| Example 232 | 4 | A A | A | A | A | A | A |
| Example 233 | 4 | A A | A | A | A | A | A |

TABLE 57

Components of chemical liquid
Main agent
Organic solvent

| [Table 1-8-1] | Type | Content (% by mass) | Molar mass (g/mol) | Vapor pressure (Pa) | Surface tension (mN/m) | fd | fp | fh | HP |
|---|---|---|---|---|---|---|---|---|---|
| Example 234 | Anisole | 25 | 108.14 | 63 | 30.0 | 64.3 | 17.0 | 18.7 | 1 |
| Example 235 | 14-DMB | 25 | 138.17 | 1 | 30.0 | 59.0 | 20.6 | 20.3 | 1 |
| Example 236 | 12-DMB | 25 | 138.17 | 1 | 30.0 | 60.6 | 20.2 | 19.2 | 1 |
| Example 237 | 13-DMB | 25 | 138.17 | 1 | 30.0 | 61.6 | 19.9 | 18.5 | 1 |
| Example 238 | 14-DPB | 25 | 262.31 | 1 | 33.0 | 63.3 | 18.5 | 18.2 | 1 |
| Example 239 | 4-MTT | 25 | 122.17 | 1 | 32.0 | 64.8 | 17.4 | 17.8 | 1 |
| Example 240 | PNT | 25 | 122.17 | 1 | 31.0 | 66.3 | 16.3 | 17.4 | 1 |
| Example 241 | DEGME | 25 | 120.15 | 13 | 28.0 | 44.3 | 20.8 | 34.9 | 1 |
| Example 242 | DME | 25 | 90.12 | 693 | 29.0 | 55.9 | 22.8 | 21.3 | 1 |
| Example 243 | DEE | 25 | 118.18 | 627 | 29.0 | 62.2 | 19.9 | 17.8 | 1 |
| Example 244 | DEGIBE | 25 | 162.23 | 133 | 29.0 | 61.9 | 18.7 | 19.4 | 1 |
| Example 245 | DEGDME | 25 | 134.18 | 520 | 28.0 | 56.9 | 21.0 | 22.1 | 1 |
| Example 246 | DEGDEE | 25 | 162.23 | 253 | 29.0 | 60.4 | 19.6 | 20.0 | 1 |
| Example 247 | TriEGDME | 25 | 178.23 | 13 | 28.0 | 56.4 | 20.9 | 22.7 | 1 |
| Example 248 | TetraEGDME | 25 | 222.28 | 13 | 27.0 | 55.6 | 21.1 | 23.2 | 1 |
| Example 249 | TEGMBE | 25 | 220.31 | 13 | 28.0 | 48.5 | 18.7 | 32.8 | 1 |
| Example 250 | DEGMBE | 25 | 162.23 | 117 | 29.0 | 59.4 | 18.1 | 22.5 | 1 |
| Example 251 | Anisole | 25 | 108.14 | 63 | 30.0 | 64.3 | 17.0 | 18.7 | 1 |
| Example 252 | 14-DMB | 25 | 138.17 | 1 | 30.0 | 59.0 | 20.6 | 20.3 | 1 |
| Example 253 | 12-DMB | 25 | 138.17 | 1 | 30.0 | 60.6 | 20.2 | 19.2 | 1 |
| Example 254 | 13-DMB | 25 | 138.17 | 1 | 30.0 | 61.6 | 19.9 | 18.5 | 1 |
| Example 255 | 14-DPB | 25 | 262.31 | 1 | 33.0 | 63.3 | 18.5 | 18.2 | 1 |

TABLE 57-continued

| | | Components of chemical liquid Main agent Organic solvent | | | | | | | |
|---|---|---|---|---|---|---|---|---|---|
| [Table 1-8-1] | Type | Content (% by mass) | Molar mass (g/mol) | Vapor pressure (Pa) | Surface tension (mN/m) | fd | fp | fh | HP |
| Example 256 | 4-MTT | 25 | 122.17 | 1 | 32.0 | 64.8 | 17.4 | 17.8 | 1 |
| Example 257 | PNT | 25 | 122.17 | 1 | 31.0 | 66.3 | 16.3 | 17.4 | 1 |
| Example 258 | DEGME | 25 | 120.15 | 13 | 28.0 | 44.3 | 20.8 | 34.9 | 1 |
| Example 259 | DME | 25 | 90.12 | 693 | 29.0 | 55.9 | 22.8 | 21.3 | 1 |
| Example 260 | DEE | 25 | 118.18 | 627 | 29.0 | 62.2 | 19.9 | 17.8 | 1 |
| Example 261 | DEGIBE | 25 | 162.23 | 133 | 29.0 | 61.9 | 18.7 | 19.4 | 1 |
| Example 262 | DEGDME | 25 | 134.18 | 520 | 28.0 | 56.9 | 21.0 | 22.1 | 1 |
| Example 263 | DEGDEE | 25 | 162.23 | 253 | 29.0 | 60.4 | 19.6 | 20.0 | 1 |
| Example 264 | TriEGDME | 25 | 178.23 | 13 | 28.0 | 56.4 | 20.9 | 22.7 | 1 |
| Example 265 | TetraEGDME | 25 | 222.28 | 13 | 27.0 | 55.6 | 21.1 | 23.2 | 1 |

TABLE 58

| | | Components of chemical liquid Main agent Organic solvent | | | | | | | |
|---|---|---|---|---|---|---|---|---|---|
| [Table 1-8-2] | Type | Content (% by mass) | Molar mass (g/mol) | Vapor pressure (Pa) | Surface tension (mN/m) | fd | fp | fh | HP |
| Example 234 | PGMEA | 75 | 132.16 | 493 | 27.9 | 56.5 | 19.8 | 23.7 | 1 |
| Example 235 | PGMEA | 75 | 132.16 | 493 | 27.9 | 56.5 | 19.8 | 23.7 | 1 |
| Example 236 | PGMEA | 75 | 132.16 | 493 | 27.9 | 56.5 | 19.8 | 23.7 | 1 |
| Example 237 | PGMEA | 75 | 132.16 | 493 | 27.9 | 56.5 | 19.8 | 23.7 | 1 |
| Example 238 | PGMEA | 75 | 132.16 | 493 | 27.9 | 56.5 | 19.8 | 23.7 | 1 |
| Example 239 | PGMEA | 75 | 132.16 | 493 | 27.9 | 56.5 | 19.8 | 23.7 | 1 |
| Example 240 | PGMEA | 75 | 132.16 | 493 | 27.9 | 56.5 | 19.8 | 23.7 | 1 |
| Example 241 | CyHx | 75 | 98.14 | 507 | 34.1 | 61.0 | 21.6 | 17.5 | 1 |
| Example 242 | CyHx | 75 | 98.14 | 507 | 34.1 | 61.0 | 21.6 | 17.5 | 1 |
| Example 243 | CyHx | 75 | 98.14 | 507 | 34.1 | 61.0 | 21.6 | 17.5 | 1 |
| Example 244 | CyHx | 75 | 98.14 | 507 | 34.1 | 61.0 | 21.6 | 17.5 | 1 |
| Example 245 | CyHx | 75 | 98.14 | 507 | 34.1 | 61.0 | 21.6 | 17.5 | 1 |
| Example 246 | CyHx | 75 | 98.14 | 507 | 34.1 | 61.0 | 21.6 | 17.5 | 1 |
| Example 247 | CyHx | 75 | 98.14 | 507 | 34.1 | 61.0 | 21.6 | 17.5 | 1 |
| Example 248 | CyHx | 75 | 98.14 | 507 | 34.1 | 61.0 | 21.6 | 17.5 | 1 |
| Example 249 | CyHx | 75 | 98.14 | 507 | 34.1 | 61.0 | 21.6 | 17.5 | 1 |
| Example 250 | CyHx | 75 | 98.14 | 507 | 34.1 | 61.0 | 21.6 | 17.5 | 1 |
| Example 251 | CyHx | 75 | 98.14 | 507 | 34.1 | 61.0 | 21.6 | 17.5 | 1 |
| Example 252 | CyHx | 75 | 98.14 | 507 | 34.1 | 61.0 | 21.6 | 17.5 | 1 |
| Example 253 | CyHx | 75 | 98.14 | 507 | 34.1 | 61.0 | 21.6 | 17.5 | 1 |
| Example 254 | CyHx | 75 | 98.14 | 507 | 34.1 | 61.0 | 21.6 | 17.5 | 1 |
| Example 255 | CyHx | 75 | 98.14 | 507 | 34.1 | 61.0 | 21.6 | 17.5 | 1 |
| Example 256 | CyHx | 75 | 98.14 | 507 | 34.1 | 61.0 | 21.6 | 17.5 | 1 |
| Example 257 | CyHx | 75 | 98.14 | 507 | 34.1 | 61.0 | 21.6 | 17.5 | 1 |
| Example 258 | EL | 75 | 118.13 | 187 | 29.8 | 55.5 | 19.8 | 24.7 | 1 |
| Example 259 | EL | 75 | 118.13 | 187 | 29.8 | 55.5 | 19.8 | 24.7 | 1 |
| Example 260 | EL | 75 | 118.13 | 187 | 29.8 | 55.5 | 19.8 | 24.7 | 1 |
| Example 261 | EL | 75 | 118.13 | 187 | 29.8 | 55.5 | 19.8 | 24.7 | 1 |
| Example 262 | EL | 75 | 118.13 | 187 | 29.8 | 55.5 | 19.8 | 24.7 | 1 |
| Example 263 | EL | 75 | 118.13 | 187 | 29.8 | 55.5 | 19.8 | 24.7 | 1 |
| Example 264 | EL | 75 | 118.13 | 187 | 29.8 | 55.5 | 19.8 | 24.7 | 1 |
| Example 265 | EL | 75 | 118.13 | 187 | 29.8 | 55.5 | 19.8 | 24.7 | 1 |

TABLE 59

| [Table 1-8-3] | Type | Content (% by mass) | Molar mass (g/mol) | Vapor pressure (Pa) | Surface tension (mN/m) | fd | fp | fh | HP | Vapor pressure (Pa) | Surface tension (mN/m) |
|---|---|---|---|---|---|---|---|---|---|---|---|
| Example 234 | | | | | | | | | | 369 | 28.5 |
| Example 235 | | | | | | | | | | 374 | 28.4 |
| Example 236 | | | | | | | | | | 374 | 28.4 |
| Example 237 | | | | | | | | | | 374 | 28.4 |
| Example 238 | | | | | | | | | | 423 | 28.6 |
| Example 239 | | | | | | | | | | 363 | 29.0 |
| Example 240 | | | | | | | | | | 363 | 28.7 |
| Example 241 | | | | | | | | | | 401 | 32.8 |
| Example 242 | | | | | | | | | | 556 | 32.7 |
| Example 243 | | | | | | | | | | 533 | 33.0 |
| Example 244 | | | | | | | | | | 444 | 33.2 |
| Example 245 | | | | | | | | | | 509 | 32.9 |
| Example 246 | | | | | | | | | | 464 | 33.2 |
| Example 247 | | | | | | | | | | 430 | 33.2 |
| Example 248 | | | | | | | | | | 443 | 33.2 |
| Example 249 | | | | | | | | | | 443 | 33.3 |
| Example 250 | | | | | | | | | | 441 | 33.2 |
| Example 251 | | | | | | | | | | 404 | 33.1 |
| Example 252 | | | | | | | | | | 410 | 33.3 |
| Example 253 | | | | | | | | | | 410 | 33.3 |
| Example 254 | | | | | | | | | | 410 | 33.3 |
| Example 255 | | | | | | | | | | 451 | 34.0 |
| Example 256 | | | | | | | | | | 400 | 33.7 |
| Example 257 | | | | | | | | | | 400 | 33.4 |
| Example 258 | | | | | | | | | | 144 | 29.4 |
| Example 259 | | | | | | | | | | 341 | 29.6 |
| Example 260 | | | | | | | | | | 297 | 29.6 |
| Example 261 | | | | | | | | | | 176 | 29.6 |
| Example 262 | | | | | | | | | | 262 | 29.4 |
| Example 263 | | | | | | | | | | 200 | 29.6 |
| Example 264 | | | | | | | | | | 155 | 29.5 |
| Example 265 | | | | | | | | | | 161 | 29.4 |

TABLE 60

| | Components of chemical liquid | | Components of chemical liquid | | | | | |
|---|---|---|---|---|---|---|---|---|
| | Main agent | Surfactant | Impurity metal | | | | | |
| | Content | Content | Total content of impurity metal (mass ppt) | | | | | |
| [Table 1-8-4] | (% by mass) | Type | (mass ppm) | Fe | Cr | Ni | Pb | Others | Total |
| Example 234 | Balance | J | 1,000 | 0.006 | 0.006 | 0.006 | 0.006 | 0.072 | 0.096 |
| Example 235 | Balance | A | 300 | 0.0048 | 0.0048 | 0.0048 | 0.0048 | 0.0576 | 0.0768 |
| Example 236 | Balance | E | 100 | 0.0024 | 0.0024 | 0.0024 | 0.0024 | 0.0288 | 0.0384 |
| Example 237 | Balance | B | 100 | 0.0072 | 0.0072 | 0.0072 | 0.0072 | 0.0864 | 0.1152 |
| Example 238 | Balance | I | 100 | 0.001 | 0.001 | 0.001 | 0.001 | 0.012 | 0.016 |
| Example 239 | Balance | A | 50 | 0.002 | 0.002 | 0.002 | 0.002 | 0.024 | 0.032 |
| Example 240 | Balance | B | 100 | 0.006 | 0.006 | 0.006 | 0.006 | 0.072 | 0.096 |
| Example 241 | Balance | D | 100 | 0.0048 | 0.0048 | 0.0048 | 0.0048 | 0.0576 | 0.0768 |
| Example 242 | Balance | C | 100 | 0.0024 | 0.0024 | 0.0024 | 0.0024 | 0.0288 | 0.0384 |
| Example 243 | Balance | A | 100 | 0.0072 | 0.0072 | 0.0072 | 0.0072 | 0.0864 | 0.1152 |
| Example 244 | Balance | E | 50 | 0.001 | 0.001 | 0.001 | 0.001 | 0.012 | 0.016 |
| Example 245 | Balance | A | 100 | 0.002 | 0.002 | 0.002 | 0.002 | 0.024 | 0.032 |
| Example 246 | Balance | E | 50 | 0.006 | 0.006 | 0.006 | 0.006 | 0.072 | 0.096 |
| Example 247 | Balance | E | 100 | 0.0048 | 0.0048 | 0.0048 | 0.0048 | 0.0576 | 0.0768 |
| Example 248 | Balance | A | 100 | 0.0024 | 0.0024 | 0.0024 | 0.0024 | 0.0288 | 0.0384 |
| Example 249 | Balance | G | 50 | 0.0072 | 0.0072 | 0.0072 | 0.0072 | 0.0864 | 0.1152 |
| Example 250 | Balance | D | 100 | 0.001 | 0.001 | 0.001 | 0.001 | 0.012 | 0.016 |
| Example 251 | Balance | H | 1,000 | 0.002 | 0.002 | 0.002 | 0.002 | 0.024 | 0.032 |
| Example 252 | Balance | A | 100 | 0.006 | 0.006 | 0.006 | 0.006 | 0.072 | 0.096 |
| Example 253 | Balance | I | 100 | 0.0048 | 0.0048 | 0.0048 | 0.0048 | 0.0576 | 0.0768 |
| Example 254 | Balance | J | 1,000 | 0.0024 | 0.0024 | 0.0024 | 0.0024 | 0.0288 | 0.0384 |
| Example 255 | Balance | B | 100 | 0.0072 | 0.0072 | 0.0072 | 0.0072 | 0.0864 | 0.1152 |
| Example 256 | Balance | E | 100 | 0.001 | 0.001 | 0.001 | 0.001 | 0.012 | 0.016 |
| Example 257 | Balance | A | 100 | 0.002 | 0.002 | 0.002 | 0.002 | 0.024 | 0.032 |

TABLE 60-continued

| [Table 1-8-4] | Components of chemical liquid Main agent Content (% by mass) | Components of chemical liquid Surfactant Type | Content (mass ppm) | Components of chemical liquid Impurity metal Total content of impurity metal (mass ppt) | | | | | |
|---|---|---|---|---|---|---|---|---|---|
| | | | | Fe | Cr | Ni | Pb | Others | Total |
| Example 258 | Balance | F | 100 | 0.006 | 0.006 | 0.006 | 0.006 | 0.072 | 0.096 |
| Example 259 | Balance | E | 1,000 | 0.0048 | 0.0048 | 0.0048 | 0.0048 | 0.0576 | 0.0768 |
| Example 260 | Balance | A | 100 | 0.0024 | 0.0024 | 0.0024 | 0.0024 | 0.0288 | 0.0384 |
| Example 261 | Balance | C | 50 | 0.0072 | 0.0072 | 0.0072 | 0.0072 | 0.0864 | 0.1152 |
| Example 262 | Balance | B | 100 | 0.001 | 0.001 | 0.001 | 0.001 | 0.012 | 0.016 |
| Example 263 | Balance | I | 100 | 0.002 | 0.002 | 0.002 | 0.002 | 0.024 | 0.032 |
| Example 264 | Balance | A | 100 | 0.006 | 0.006 | 0.006 | 0.006 | 0.072 | 0.096 |
| Example 265 | Balance | J | 50 | 0.0048 | 0.0048 | 0.0048 | 0.0048 | 0.0576 | 0.0768 |

TABLE 61

| [Table 1-8-5] | Components of chemical liquid Impurity metal Content of particles containing following impurity metal (mass ppt) | | | | | | Content of organic impurity (mass ppm) | | Water Content (% by mass) |
|---|---|---|---|---|---|---|---|---|---|
| | Fe | Cr | Ni | Pb | Others | Total | Total | High-boiling-point component | |
| Example 234 | 0.003 | 0.003 | 0.003 | 0.003 | 0.036 | 0.048 | 458 | 1.8 | 0.10% |
| Example 235 | 0.0024 | 0.0024 | 0.0024 | 0.0024 | 0.0288 | 0.0384 | 549 | 2.2 | 0.10% |
| Example 236 | 0.0012 | 0.0012 | 0.0012 | 0.0012 | 0.0144 | 0.0192 | 384 | 1.5 | 0.10% |
| Example 237 | 0.0036 | 0.0036 | 0.0036 | 0.0036 | 0.0432 | 0.0576 | 346 | 1.4 | 0.10% |
| Example 238 | 0.001 | 0.001 | 0.001 | 0.001 | 0.012 | 0.016 | 173 | 0.7 | 0.10% |
| Example 239 | 0.001 | 0.001 | 0.001 | 0.001 | 0.012 | 0.016 | 467 | 1.9 | 0.10% |
| Example 240 | 0.003 | 0.003 | 0.003 | 0.003 | 0.036 | 0.048 | 560 | 2.2 | 0.10% |
| Example 241 | 0.0024 | 0.0024 | 0.0024 | 0.0024 | 0.0288 | 0.0384 | 392 | 1.6 | 0.10% |
| Example 242 | 0.0012 | 0.0012 | 0.0012 | 0.0012 | 0.0144 | 0.0192 | 353 | 1.4 | 0.10% |
| Example 243 | 0.0036 | 0.0036 | 0.0036 | 0.0036 | 0.0432 | 0.0576 | 177 | 0.7 | 0.10% |
| Example 244 | 0.001 | 0.001 | 0.001 | 0.001 | 0.012 | 0.016 | 477 | 1.9 | 0.10% |
| Example 245 | 0.001 | 0.001 | 0.001 | 0.001 | 0.012 | 0.016 | 572 | 2.3 | 0.10% |
| Example 246 | 0.003 | 0.003 | 0.003 | 0.003 | 0.036 | 0.048 | 400 | 1.6 | 0.10% |
| Example 247 | 0.0024 | 0.0024 | 0.0024 | 0.0024 | 0.0288 | 0.0384 | 360 | 1.4 | 0.10% |
| Example 248 | 0.0012 | 0.0012 | 0.0012 | 0.0012 | 0.0144 | 0.0192 | 180 | 0.7 | 0.10% |
| Example 249 | 0.0036 | 0.0036 | 0.0036 | 0.0036 | 0.0432 | 0.0576 | 486 | 1.9 | 0.10% |
| Example 250 | 0.001 | 0.001 | 0.001 | 0.001 | 0.012 | 0.016 | 584 | 2.3 | 0.10% |
| Example 251 | 0.001 | 0.001 | 0.001 | 0.001 | 0.012 | 0.016 | 409 | 1.6 | 0.10% |
| Example 252 | 0.003 | 0.003 | 0.003 | 0.003 | 0.036 | 0.048 | 368 | 1.5 | 0.10% |
| Example 253 | 0.0024 | 0.0024 | 0.0024 | 0.0024 | 0.0288 | 0.0384 | 184 | 0.7 | 0.10% |
| Example 254 | 0.0012 | 0.0012 | 0.0012 | 0.0012 | 0.0144 | 0.0192 | 497 | 2.0 | 0.10% |
| Example 255 | 0.0036 | 0.0036 | 0.0036 | 0.0036 | 0.0432 | 0.0576 | 596 | 2.4 | 0.10% |
| Example 256 | 0.001 | 0.001 | 0.001 | 0.001 | 0.012 | 0.016 | 417 | 1.7 | 0.10% |
| Example 257 | 0.001 | 0.001 | 0.001 | 0.001 | 0.012 | 0.016 | 375 | 1.5 | 0.10% |
| Example 258 | 0.003 | 0.003 | 0.003 | 0.003 | 0.036 | 0.048 | 188 | 0.8 | 0.10% |
| Example 259 | 0.0024 | 0.0024 | 0.0024 | 0.0024 | 0.0288 | 0.0384 | 507 | 2.0 | 0.10% |
| Example 260 | 0.0012 | 0.0012 | 0.0012 | 0.0012 | 0.0144 | 0.0192 | 608 | 2.4 | 0.10% |
| Example 261 | 0.0036 | 0.0036 | 0.0036 | 0.0036 | 0.0432 | 0.0576 | 426 | 1.7 | 0.10% |
| Example 262 | 0.001 | 0.001 | 0.001 | 0.001 | 0.012 | 0.016 | 383 | 1.5 | 0.10% |
| Example 263 | 0.001 | 0.001 | 0.001 | 0.001 | 0.012 | 0.016 | 192 | 0.8 | 0.10% |
| Example 264 | 0.003 | 0.003 | 0.003 | 0.003 | 0.036 | 0.048 | 517 | 2.1 | 0.10% |
| Example 265 | 0.0024 | 0.0024 | 0.0024 | 0.0024 | 0.0288 | 0.0384 | 621 | 2.5 | 0.10% |

TABLE 62

| [Table 1-8-6] | Physical properties of chemical liquid | | | Evaluation | | | | | | |
|---|---|---|---|---|---|---|---|---|---|---|
| | Number of coarse particles (number/ml) | Content of surfactant/total content of particles | Content of surfactant/content of high-boiling-point component | Defect inhibition performance | Type of resist composition | | Resist saving performance | | | |
| | | | | | | Affinity | | | Film thickness | |
| | | | | | | Rsq1 | SRsq | Uniformity | controllability | Developability |
| Example 234 | 9 | $2.1 \times 10^{10}$ | $5.5 \times 10^2$ | A | 1 | A | A | A | A | A |
| Example 235 | 11 | $7.8 \times 10^9$ | $1.4 \times 10^2$ | AA | 1 | A | A | A | A | A |
| Example 236 | 8 | $5.2 \times 10^9$ | $6.5 \times 10^1$ | A | 1 | A | A | A | A | A |
| Example 237 | 7 | $1.7 \times 10^9$ | $7.2 \times 10^1$ | AA | 1 | A | A | A | A | A |
| Example 238 | 3 | $6.3 \times 10^9$ | $1.4 \times 10^2$ | A | 1 | A | A | A | A | A |
| Example 239 | 9 | $3.1 \times 10^9$ | $2.7 \times 10^1$ | AA | 1 | A | A | A | A | A |
| Example 240 | 11 | $2.1 \times 10^9$ | $4.5 \times 10^1$ | AA | 1 | A | A | A | A | A |
| Example 241 | 8 | $2.6 \times 10^9$ | $6.4 \times 10^1$ | A | 1 | A | A | A | A | A |
| Example 242 | 7 | $5.2 \times 10^9$ | $7.1 \times 10^1$ | AA | 1 | A | A | A | A | A |
| Example 243 | 4 | $1.7 \times 10^9$ | $1.4 \times 10^2$ | AA | 1 | A | A | A | A | A |
| Example 244 | 10 | $3.1 \times 10^9$ | $2.6 \times 10^1$ | A | 1 | A | A | A | A | A |
| Example 245 | 11 | $6.3 \times 10^9$ | $4.4 \times 10^1$ | AA | 1 | A | A | A | A | A |
| Example 246 | 8 | $1.0 \times 10^9$ | $3.1 \times 10^1$ | A | 1 | A | A | A | A | A |
| Example 247 | 7 | $2.6 \times 10^9$ | $6.9 \times 10^1$ | A | 1 | A | A | A | A | A |
| Example 248 | 4 | $5.2 \times 10^9$ | $1.4 \times 10^2$ | AA | 1 | A | A | A | A | A |
| Example 249 | 10 | $8.7 \times 10^8$ | $2.6 \times 10^1$ | A | 1 | A | A | A | A | A |
| Example 250 | 12 | $6.3 \times 10^9$ | $4.3 \times 10^1$ | A | 1 | A | A | A | A | A |
| Example 251 | 8 | $6.3 \times 10^{10}$ | $6.1 \times 10^2$ | A | 1 | A | A | A | A | A |
| Example 252 | 7 | $2.1 \times 10^9$ | $6.8 \times 10^1$ | AA | 1 | A | A | A | A | A |
| Example 253 | 4 | $2.6 \times 10^9$ | $1.4 \times 10^2$ | A | 1 | A | A | A | A | A |
| Example 254 | 10 | $5.2 \times 10^{10}$ | $5.0 \times 10^2$ | A | 1 | A | A | A | A | A |
| Example 255 | 12 | $1.7 \times 10^9$ | $4.2 \times 10^1$ | AA | 1 | A | A | A | A | A |
| Example 256 | 8 | $6.3 \times 10^9$ | $6.0 \times 10^1$ | A | 1 | A | A | A | A | A |
| Example 257 | 8 | $6.3 \times 10^9$ | $6.7 \times 10^1$ | AA | 1 | A | A | A | A | A |
| Example 258 | 4 | $2.1 \times 10^9$ | $1.3 \times 10^2$ | A | 1 | A | A | A | A | A |
| Example 259 | 10 | $2.6 \times 10^{10}$ | $4.9 \times 10^2$ | A | 1 | A | A | A | A | A |
| Example 260 | 12 | $5.2 \times 10^9$ | $4.1 \times 10^1$ | AA | 1 | A | A | A | A | A |
| Example 261 | 9 | $8.7 \times 10^8$ | $2.9 \times 10^1$ | AA | 1 | A | A | A | A | A |
| Example 262 | 8 | $6.3 \times 10^9$ | $6.5 \times 10^1$ | AA | 1 | A | A | A | A | A |
| Example 263 | 4 | $6.3 \times 10^9$ | $1.3 \times 10^2$ | A | 1 | A | A | A | A | A |
| Example 264 | 10 | $2.1 \times 10^9$ | $4.8 \times 10^1$ | AA | 1 | A | A | A | A | A |
| Example 265 | 12 | $1.3 \times 10^9$ | $2.0 \times 10^1$ | A | 1 | A | A | A | A | A |

TABLE 63

| [Table 1-8-7] | Evaluation | | | | | | | | | | | |
|---|---|---|---|---|---|---|---|---|---|---|---|---|
| | Type of resist composition | | | | | | Type of resist composition | | | | | |
| | | Resist saving performance | | | | | | Resist saving performance | | | | |
| | | Affinity | | | Film thickness | | | Affinity | | | Film thickness | |
| | | Rsq1 | SRsq | Uniformity | controllability | Developability | | Rsq1 | SRsq | Uniformity | controllability | Developability |
| Example 234 | 2 | A | A | A | A | A | 3 | A | A | A | A | A |
| Example 235 | 2 | A | A | A | A | A | 3 | A | A | A | A | A |
| Example 236 | 2 | A | A | A | A | A | 3 | A | A | A | A | A |
| Example 237 | 2 | A | A | A | A | A | 3 | A | A | A | A | A |
| Example 238 | 2 | A | A | A | A | A | 3 | A | A | A | A | A |
| Example 239 | 2 | A | A | A | A | A | 3 | A | A | A | A | A |
| Example 240 | 2 | A | A | A | A | A | 3 | A | A | A | A | A |
| Example 241 | 2 | A | A | A | A | A | 3 | A | A | A | A | A |
| Example 242 | 2 | A | A | A | A | A | 3 | A | A | A | A | A |
| Example 243 | 2 | A | A | A | A | A | 3 | A | A | A | A | A |
| Example 244 | 2 | A | A | A | A | A | 3 | A | A | A | A | A |
| Example 245 | 2 | A | A | A | A | A | 3 | A | A | A | A | A |
| Example 246 | 2 | A | A | A | A | A | 3 | A | A | A | A | A |
| Example 247 | 2 | A | A | A | A | A | 3 | A | A | A | A | A |
| Example 248 | 2 | A | A | A | A | A | 3 | A | A | A | A | A |
| Example 249 | 2 | A | A | A | A | A | 3 | A | A | A | A | A |
| Example 250 | 2 | A | A | A | A | A | 3 | A | A | A | A | A |

TABLE 63-continued

| [Table 1-8-7] | | Type of resist composition | | | | | Type of resist composition | | | | |
|---|---|---|---|---|---|---|---|---|---|---|---|
| | | Resist saving performance | | | | | Resist saving performance | | | | |
| | | Affinity | | | Film thickness | | Affinity | | | Film thickness | |
| | | Rsq1 | SRsq | Uniformity | controllability | Developability | Rsq1 | SRsq | Uniformity | controllability | Developability |
| Example 251 | 2 | A | A | A | A | A | 3 | A | A | A | A | A |
| Example 252 | 2 | A | A | A | A | A | 3 | A | A | A | A | A |
| Example 253 | 2 | A | A | A | A | A | 3 | A | A | A | A | A |
| Example 254 | 2 | A | A | A | A | A | 3 | A | A | A | A | A |
| Example 255 | 2 | A | A | A | A | A | 3 | A | A | A | A | A |
| Example 256 | 2 | A | A | A | A | A | 3 | A | A | A | A | A |
| Example 257 | 2 | A | A | A | A | A | 3 | A | A | A | A | A |
| Example 258 | 2 | A | A | A | A | A | 3 | A | A | A | A | A |
| Example 259 | 2 | A | A | A | A | A | 3 | A | A | A | A | A |
| Example 260 | 2 | A | A | A | A | A | 3 | A | A | A | A | A |
| Example 261 | 2 | A | A | A | A | A | 3 | A | A | A | A | A |
| Example 262 | 2 | A | A | A | A | A | 3 | A | A | A | A | A |
| Example 263 | 2 | A | A | A | A | A | 3 | A | A | A | A | A |
| Example 264 | 2 | A | A | A | A | A | 3 | A | A | A | A | A |
| Example 265 | 2 | A | A | A | A | A | 3 | A | A | A | A | A |

TABLE 64

| [Table 1-8-8] | | Type of resist composition | | | | | Evaluation of p-CMP defect inhibition | Evaluation of ashing residue removing |
|---|---|---|---|---|---|---|---|---|
| | | Resist saving performance | | | | | | |
| | | Affinity | | | Film thickness | | | |
| | | Rsq1 | SRsq | Uniformity | controllability | Developability | performance | performance |
| Example 234 | 4 | A | A | A | A | A | A | A |
| Example 235 | 4 | A | A | A | A | A | A | A |
| Example 236 | 4 | A | A | A | A | A | A | A |
| Example 237 | 4 | A | A | A | A | A | A | A |
| Example 238 | 4 | A | A | A | A | A | A | A |
| Example 239 | 4 | A | A | A | A | A | A | A |
| Example 240 | 4 | A | A | A | A | A | A | A |
| Example 241 | 4 | A | A | A | A | A | A | A |
| Example 242 | 4 | A | A | A | A | A | A | A |
| Example 243 | 4 | A | A | A | A | A | A | A |
| Example 244 | 4 | A | A | A | A | A | A | A |
| Example 245 | 4 | A | A | A | A | A | A | A |
| Example 246 | 4 | A | A | A | A | A | A | A |
| Example 247 | 4 | A | A | A | A | A | A | A |
| Example 248 | 4 | A | A | A | A | A | A | A |
| Example 249 | 4 | A | A | A | A | A | A | A |
| Example 250 | 4 | A | A | A | A | A | A | A |
| Example 251 | 4 | A | A | A | A | A | A | A |
| Example 252 | 4 | A | A | A | A | A | A | A |
| Example 253 | 4 | A | A | A | A | A | A | A |
| Example 254 | 4 | A | A | A | A | A | A | A |
| Example 255 | 4 | A | A | A | A | A | A | A |
| Example 256 | 4 | A | A | A | A | A | A | A |
| Example 257 | 4 | A | A | A | A | A | A | A |
| Example 258 | 4 | A | A | A | A | A | A | A |
| Example 259 | 4 | A | A | A | A | A | A | A |
| Example 260 | 4 | A | A | A | A | A | A | A |
| Example 261 | 4 | A | A | A | A | A | A | A |
| Example 262 | 4 | A | A | A | A | A | A | A |
| Example 263 | 4 | A | A | A | A | A | A | A |
| Example 264 | 4 | A | A | A | A | A | A | A |
| Example 265 | 4 | A | A | A | A | A | A | A |

TABLE 65

Components of chemical liquid
Main agent
Organic solvent

| [Table 1-9-1] | Type | Content (% by mass) | Molar mass (g/mol) | Vapor pressure (Pa) | Surface tension (mN/m) | fd | fp | fh | HP |
|---|---|---|---|---|---|---|---|---|---|
| Example 266 | TEGMBE | 25 | 220.31 | 13 | 28.0 | 48.5 | 18.7 | 32.8 | 1 |
| Example 267 | DEGMBE | 25 | 162.23 | 117 | 29.0 | 59.4 | 18.1 | 22.5 | 1 |
| Example 268 | Anisole | 25 | 108.14 | 63 | 30.0 | 64.3 | 17.0 | 18.7 | 1 |
| Example 269 | 14-DMB | 25 | 138.17 | 1 | 30.0 | 59.0 | 20.6 | 20.3 | 1 |
| Example 270 | 12-DMB | 25 | 138.17 | 1 | 30.0 | 60.6 | 20.2 | 19.2 | 1 |
| Example 271 | 13-DMB | 25 | 138.17 | 1 | 30.0 | 61.6 | 19.9 | 18.5 | 1 |
| Example 272 | 14-DPB | 25 | 262.31 | 1 | 33.0 | 63.3 | 18.5 | 18.2 | 1 |
| Example 273 | 4-MTT | 25 | 122.17 | 1 | 32.0 | 64.8 | 17.4 | 17.8 | 1 |
| Example 274 | PNT | 25 | 122.17 | 1 | 31.0 | 66.3 | 16.3 | 17.4 | 1 |
| Example 275 | DEGME | 25 | 120.15 | 13 | 28.0 | 44.3 | 20.8 | 34.9 | 1 |
| Example 276 | DME | 25 | 90.12 | 693 | 29.0 | 55.9 | 22.8 | 21.3 | 1 |
| Example 277 | DEE | 25 | 118.18 | 627 | 29.0 | 62.2 | 19.9 | 17.8 | 1 |
| Example 278 | DEGIBE | 25 | 162.23 | 133 | 29.0 | 61.9 | 18.7 | 19.4 | 1 |
| Example 279 | DEGDME | 25 | 134.18 | 520 | 28.0 | 56.9 | 21.0 | 22.1 | 1 |
| Example 280 | DEGDEE | 25 | 162.23 | 253 | 29.0 | 60.4 | 19.6 | 20.0 | 1 |
| Example 281 | TriEGDME | 25 | 178.23 | 13 | 28.0 | 56.4 | 20.9 | 22.7 | 1 |
| Example 282 | TetraEGDME | 25 | 222.28 | 13 | 27.0 | 55.6 | 21.1 | 23.2 | 1 |
| Example 283 | TEGMBE | 25 | 220.31 | 13 | 28.0 | 48.5 | 18.7 | 32.8 | 1 |
| Example 284 | DEGMBE | 25 | 162.23 | 117 | 29.0 | 59.4 | 18.1 | 22.5 | 1 |
| Example 285 | Anisole | 25 | 108.14 | 63 | 30.0 | 64.3 | 17.0 | 18.7 | 1 |
| Example 286 | 14-DMB | 25 | 138.17 | 1 | 30.0 | 59.0 | 20.6 | 20.3 | 1 |
| Example 287 | 12-DMB | 25 | 138.17 | 1 | 30.0 | 60.6 | 20.2 | 19.2 | 1 |
| Example 288 | 13-DMB | 25 | 138.17 | 1 | 30.0 | 61.6 | 19.9 | 18.5 | 1 |
| Example 289 | 14-DPB | 25 | 262.31 | 1 | 33.0 | 63.3 | 18.5 | 18.2 | 1 |
| Example 290 | 4-MTT | 25 | 122.17 | 1 | 32.0 | 64.8 | 17.4 | 17.8 | 1 |
| Example 291 | PNT | 25 | 122.17 | 1 | 31.0 | 66.3 | 16.3 | 17.4 | 1 |
| Example 292 | DEGME | 25 | 120.15 | 13 | 28.0 | 44.3 | 20.8 | 34.9 | 1 |
| Example 293 | DME | 25 | 90.12 | 693 | 29.0 | 55.9 | 22.8 | 21.3 | 1 |
| Example 294 | DEE | 25 | 118.18 | 627 | 29.0 | 62.2 | 19.9 | 17.8 | 1 |
| Example 295 | DEGIBE | 25 | 162.23 | 133 | 29.0 | 61.9 | 18.7 | 19.4 | 1 |
| Example 296 | DEGDME | 25 | 134.18 | 520 | 28.0 | 56.9 | 21.0 | 22.1 | 1 |
| Example 297 | DEGDEE | 25 | 162.23 | 253 | 29.0 | 60.4 | 19.6 | 20.0 | 1 |
| Example 298 | TriEGDME | 25 | 178.23 | 13 | 28.0 | 56.4 | 20.9 | 22.7 | 1 |

TABLE 66

Components of chemical liquid
Main agent
Organic solvent

| [Table 1-9-2] | Type | Content (% by mass) | Molar mass (g/mol) | Vapor pressure (Pa) | Surface tension (mN/m) | fd | fp | fh | HP |
|---|---|---|---|---|---|---|---|---|---|
| Example 266 | EL | 75 | 118.13 | 187 | 29.8 | 55.5 | 19.8 | 24.7 | 1 |
| Example 267 | EL | 75 | 118.13 | 187 | 29.8 | 55.5 | 19.8 | 24.7 | 1 |
| Example 268 | EL | 75 | 118.13 | 187 | 29.8 | 55.5 | 19.8 | 24.7 | 1 |
| Example 269 | EL | 75 | 118.13 | 187 | 29.8 | 55.5 | 19.8 | 24.7 | 1 |
| Example 270 | EL | 75 | 118.13 | 187 | 29.8 | 55.5 | 19.8 | 24.7 | 1 |
| Example 271 | EL | 75 | 118.13 | 187 | 29.8 | 55.5 | 19.8 | 24.7 | 1 |
| Example 272 | EL | 75 | 118.13 | 187 | 29.8 | 55.5 | 19.8 | 24.7 | 1 |
| Example 273 | EL | 75 | 118.13 | 187 | 29.8 | 55.5 | 19.8 | 24.7 | 1 |
| Example 274 | EL | 75 | 118.13 | 187 | 29.8 | 55.5 | 19.8 | 24.7 | 1 |
| Example 275 | HBM | 75 | 118.13 | 267 | 29.1 | 46.0 | 20.1 | 34.0 | 1 |
| Example 276 | HBM | 75 | 118.13 | 267 | 29.1 | 46.0 | 20.1 | 34.0 | 1 |
| Example 277 | HBM | 75 | 118.13 | 267 | 29.1 | 46.0 | 20.1 | 34.0 | 1 |
| Example 278 | HBM | 75 | 118.13 | 267 | 29.1 | 46.0 | 20.1 | 34.0 | 1 |
| Example 279 | HBM | 75 | 118.13 | 267 | 29.1 | 46.0 | 20.1 | 34.0 | 1 |
| Example 280 | HBM | 75 | 118.13 | 267 | 29.1 | 46.0 | 20.1 | 34.0 | 1 |
| Example 281 | HBM | 75 | 118.13 | 267 | 29.1 | 46.0 | 20.1 | 34.0 | 1 |
| Example 282 | HBM | 75 | 118.13 | 267 | 29.1 | 46.0 | 20.1 | 34.0 | 1 |
| Example 283 | HBM | 75 | 118.13 | 267 | 29.1 | 46.0 | 20.1 | 34.0 | 1 |
| Example 284 | HBM | 75 | 118.13 | 267 | 29.1 | 46.0 | 20.1 | 34.0 | 1 |
| Example 285 | HBM | 75 | 118.13 | 267 | 29.1 | 46.0 | 20.1 | 34.0 | 1 |
| Example 286 | HBM | 75 | 118.13 | 267 | 29.1 | 46.0 | 20.1 | 34.0 | 1 |
| Example 287 | HBM | 75 | 118.13 | 267 | 29.1 | 46.0 | 20.1 | 34.0 | 1 |
| Example 288 | HBM | 75 | 118.13 | 267 | 29.1 | 46.0 | 20.1 | 34.0 | 1 |
| Example 289 | HBM | 75 | 118.13 | 267 | 29.1 | 46.0 | 20.1 | 34.0 | 1 |
| Example 290 | HBM | 75 | 118.13 | 267 | 29.1 | 46.0 | 20.1 | 34.0 | 1 |

TABLE 66-continued

| | | Components of chemical liquid Main agent Organic solvent | | | | | | | |
|---|---|---|---|---|---|---|---|---|---|
| [Table 1-9-2] | Type | Content (% by mass) | Molar mass (g/mol) | Vapor pressure (Pa) | Surface tension (mN/m) | fd | fp | fh | HP |
| Example 291 | HBM | 75 | 118.13 | 267 | 29.1 | 46.0 | 20.1 | 34.0 | 1 |
| Example 292 | DBCPN | 75 | 130.18 | 400 | 30.2 | 65.4 | 18.1 | 16.5 | 1 |
| Example 293 | DBCPN | 75 | 130.18 | 400 | 30.2 | 65.4 | 18.1 | 16.5 | 1 |
| Example 294 | DBCPN | 75 | 130.18 | 400 | 30.2 | 65.4 | 18.1 | 16.5 | 1 |
| Example 295 | DBCPN | 75 | 130.18 | 400 | 30.2 | 65.4 | 18.1 | 16.5 | 1 |
| Example 296 | DBCPN | 75 | 130.18 | 400 | 30.2 | 65.4 | 18.1 | 16.5 | 1 |
| Example 297 | DBCPN | 75 | 130.18 | 400 | 30.2 | 65.4 | 18.1 | 16.5 | 1 |
| Example 298 | DBCPN | 75 | 130.18 | 400 | 30.2 | 65.4 | 18.1 | 16.5 | 1 |

TABLE 67

| | | Components of chemical liquid Main agent | | | | | | | | | |
|---|---|---|---|---|---|---|---|---|---|---|---|
| | | Organic solvent | | | | | | | | | |
| [Table 1-9-3] | Type | Content (% by mass) | Molar mass (g/mol) | Vapor pressure (Pa) | Surface tension (mN/m) | fd | fp | fh | HP | Vapor pressure (Pa) | Surface tension (mN/m) |
| Example 266 | | | | | | | | | | 160 | 29.5 |
| Example 267 | | | | | | | | | | 173 | 29.6 |
| Example 268 | | | | | | | | | | 154 | 29.9 |
| Example 269 | | | | | | | | | | 146 | 29.8 |
| Example 270 | | | | | | | | | | 146 | 29.8 |
| Example 271 | | | | | | | | | | 146 | 29.8 |
| Example 272 | | | | | | | | | | 162 | 30.2 |
| Example 273 | | | | | | | | | | 141 | 30.3 |
| Example 274 | | | | | | | | | | 141 | 30.1 |
| Example 275 | | | | | | | | | | 204 | 28.8 |
| Example 276 | | | | | | | | | | 396 | 29.1 |
| Example 277 | | | | | | | | | | 357 | 29.1 |
| Example 278 | | | | | | | | | | 241 | 29.1 |
| Example 279 | | | | | | | | | | 324 | 28.9 |
| Example 280 | | | | | | | | | | 264 | 29.1 |
| Example 281 | | | | | | | | | | 221 | 28.9 |
| Example 282 | | | | | | | | | | 229 | 28.8 |
| Example 283 | | | | | | | | | | 228 | 28.9 |
| Example 284 | | | | | | | | | | 237 | 29.1 |
| Example 285 | | | | | | | | | | 212 | 29.3 |
| Example 286 | | | | | | | | | | 208 | 29.3 |
| Example 287 | | | | | | | | | | 208 | 29.3 |
| Example 288 | | | | | | | | | | 208 | 29.3 |
| Example 289 | | | | | | | | | | 232 | 29.6 |
| Example 290 | | | | | | | | | | 202 | 29.8 |
| Example 291 | | | | | | | | | | 202 | 29.6 |
| Example 292 | | | | | | | | | | 297 | 29.6 |
| Example 293 | | | | | | | | | | 495 | 29.8 |
| Example 294 | | | | | | | | | | 461 | 29.9 |
| Example 295 | | | | | | | | | | 344 | 29.9 |
| Example 296 | | | | | | | | | | 429 | 29.7 |
| Example 297 | | | | | | | | | | 369 | 29.9 |
| Example 298 | | | | | | | | | | 324 | 29.8 |

TABLE 68

| [Table 1-9-4] | Components of chemical liquid Main agent Content (% by mass) | Components of chemical liquid Surfactant Type | Components of chemical liquid Surfactant Content (mass ppm) | Impurity metal Total content of impurity metal (mass ppt) Fe | Cr | Ni | Pb | Others | Total |
|---|---|---|---|---|---|---|---|---|---|
| Example 266 | Balance | C | 100 | 0.0024 | 0.0024 | 0.0024 | 0.0024 | 0.0288 | 0.0384 |
| Example 267 | Balance | B | 100 | 0.0072 | 0.0072 | 0.0072 | 0.0072 | 0.0864 | 0.1152 |
| Example 268 | Balance | E | 100 | 0.001 | 0.001 | 0.001 | 0.001 | 0.012 | 0.016 |
| Example 269 | Balance | A | 300 | 0.002 | 0.002 | 0.002 | 0.002 | 0.024 | 0.032 |
| Example 270 | Balance | D | 100 | 0.006 | 0.006 | 0.006 | 0.006 | 0.072 | 0.096 |
| Example 271 | Balance | A | 100 | 0.0048 | 0.0048 | 0.0048 | 0.0048 | 0.0576 | 0.0768 |
| Example 272 | Balance | G | 100 | 0.0024 | 0.0024 | 0.0024 | 0.0024 | 0.0288 | 0.0384 |
| Example 273 | Balance | A | 50 | 0.0072 | 0.0072 | 0.0072 | 0.0072 | 0.0864 | 0.1152 |
| Example 274 | Balance | H | 100 | 0.001 | 0.001 | 0.001 | 0.001 | 0.012 | 0.016 |
| Example 275 | Balance | A | 100 | 0.002 | 0.002 | 0.002 | 0.002 | 0.024 | 0.032 |
| Example 276 | Balance | A | 50 | 0.006 | 0.006 | 0.006 | 0.006 | 0.072 | 0.096 |
| Example 277 | Balance | I | 100 | 0.0048 | 0.0048 | 0.0048 | 0.0048 | 0.0576 | 0.0768 |
| Example 278 | Balance | J | 100 | 0.0024 | 0.0024 | 0.0024 | 0.0024 | 0.0288 | 0.0384 |
| Example 279 | Balance | A | 100 | 0.0072 | 0.0072 | 0.0072 | 0.0072 | 0.0864 | 0.1152 |
| Example 280 | Balance | H | 50 | 0.001 | 0.001 | 0.001 | 0.001 | 0.012 | 0.016 |
| Example 281 | Balance | C | 100 | 0.002 | 0.002 | 0.002 | 0.002 | 0.024 | 0.032 |
| Example 282 | Balance | F | 50 | 0.006 | 0.006 | 0.006 | 0.006 | 0.072 | 0.096 |
| Example 283 | Balance | A | 100 | 0.0048 | 0.0048 | 0.0048 | 0.0048 | 0.0576 | 0.0768 |
| Example 284 | Balance | B | 100 | 0.0024 | 0.0024 | 0.0024 | 0.0024 | 0.0288 | 0.0384 |
| Example 285 | Balance | I | 100 | 0.0072 | 0.0072 | 0.0072 | 0.0072 | 0.0864 | 0.1152 |
| Example 286 | Balance | A | 50 | 0.001 | 0.001 | 0.001 | 0.001 | 0.012 | 0.016 |
| Example 287 | Balance | E | 100 | 0.002 | 0.002 | 0.002 | 0.002 | 0.024 | 0.032 |
| Example 288 | Balance | C | 100 | 0.006 | 0.006 | 0.006 | 0.006 | 0.072 | 0.096 |
| Example 289 | Balance | B | 100 | 0.0048 | 0.0048 | 0.0048 | 0.0048 | 0.0576 | 0.0768 |
| Example 290 | Balance | F | 50 | 0.0024 | 0.0024 | 0.0024 | 0.0024 | 0.0288 | 0.0384 |
| Example 291 | Balance | A / E | 100 / 50 | 0.0072 | 0.0072 | 0.0072 | 0.0072 | 0.0864 | 0.1152 |
| Example 292 | Balance | A | 100 | 0.001 | 0.001 | 0.001 | 0.001 | 0.012 | 0.016 |
| Example 293 | Balance | I | 100 | 0.002 | 0.002 | 0.002 | 0.002 | 0.024 | 0.032 |
| Example 294 | Balance | A | 5 | 0.006 | 0.006 | 0.006 | 0.006 | 0.072 | 0.096 |
| Example 295 | Balance | A | 30,000 | 0.0048 | 0.0048 | 0.0048 | 0.0048 | 0.0576 | 0.0768 |
| Example 296 | Balance | A | 30,000 | 0.0024 | 0.0024 | 0.0024 | 0.0024 | 0.0288 | 0.0384 |
| Example 297 | Balance | E | 100 | 0.0072 | 0.0072 | 0.0072 | 0.0072 | 0.0864 | 0.1152 |
| Example 298 | Balance | A | 300 | 0.001 | 0.001 | 0.001 | 0.001 | 0.012 | 0.016 |

TABLE 69

| [Table 1-9-5] | Components of chemical liquid Impurity metal Content of particles containing following impurity metal (mass ppt) Fe | Cr | Ni | Pb | Others | Total | Content of organic impurity (mass ppm) Total | Content of organic impurity (mass ppm) High-boiling-point component | Water Content (% by mass) |
|---|---|---|---|---|---|---|---|---|---|
| Example 266 | 0.0012 | 0.0012 | 0.0012 | 0.0012 | 0.0144 | 0.0192 | 434 | 1.7 | 0.10% |
| Example 267 | 0.0036 | 0.0036 | 0.0036 | 0.0036 | 0.0432 | 0.0576 | 391 | 1.6 | 0.10% |
| Example 268 | 0.001 | 0.001 | 0.001 | 0.001 | 0.012 | 0.016 | 195 | 0.8 | 0.10% |
| Example 269 | 0.001 | 0.001 | 0.001 | 0.001 | 0.012 | 0.016 | 528 | 2.1 | 0.10% |
| Example 270 | 0.003 | 0.003 | 0.003 | 0.003 | 0.036 | 0.048 | 633 | 2.5 | 0.10% |
| Example 271 | 0.0024 | 0.0024 | 0.0024 | 0.0024 | 0.0288 | 0.0384 | 443 | 1.8 | 0.10% |
| Example 272 | 0.0012 | 0.0012 | 0.0012 | 0.0012 | 0.0144 | 0.0192 | 399 | 1.6 | 0.10% |
| Example 273 | 0.0036 | 0.0036 | 0.0036 | 0.0036 | 0.0432 | 0.0576 | 200 | 0.8 | 0.10% |
| Example 274 | 0.001 | 0.001 | 0.001 | 0.001 | 0.012 | 0.016 | 539 | 2.2 | 0.10% |
| Example 275 | 0.001 | 0.001 | 0.001 | 0.001 | 0.012 | 0.016 | 646 | 2.6 | 0.10% |
| Example 276 | 0.003 | 0.003 | 0.003 | 0.003 | 0.036 | 0.048 | 453 | 1.8 | 0.10% |
| Example 277 | 0.0024 | 0.0024 | 0.0024 | 0.0024 | 0.0288 | 0.0384 | 407 | 1.6 | 0.10% |
| Example 278 | 0.0012 | 0.0012 | 0.0012 | 0.0012 | 0.0144 | 0.0192 | 204 | 0.8 | 0.10% |
| Example 279 | 0.0036 | 0.0036 | 0.0036 | 0.0036 | 0.0432 | 0.0576 | 122 | 0.5 | 0.10% |
| Example 280 | 0.001 | 0.001 | 0.001 | 0.001 | 0.012 | 0.016 | 147 | 0.6 | 0.10% |
| Example 281 | 0.001 | 0.001 | 0.001 | 0.001 | 0.012 | 0.016 | 132 | 0.5 | 0.10% |
| Example 282 | 0.003 | 0.003 | 0.003 | 0.003 | 0.036 | 0.048 | 66 | 0.3 | 0.10% |
| Example 283 | 0.0024 | 0.0024 | 0.0024 | 0.0024 | 0.0288 | 0.0384 | 178 | 0.7 | 0.10% |
| Example 284 | 0.0012 | 0.0012 | 0.0012 | 0.0012 | 0.0144 | 0.0192 | 214 | 0.9 | 0.10% |
| Example 285 | 0.0036 | 0.0036 | 0.0036 | 0.0036 | 0.0432 | 0.0576 | 150 | 0.6 | 0.10% |
| Example 286 | 0.001 | 0.001 | 0.001 | 0.001 | 0.012 | 0.016 | 135 | 0.5 | 0.10% |
| Example 287 | 0.001 | 0.001 | 0.001 | 0.001 | 0.012 | 0.016 | 404 | 1.6 | 0.10% |

TABLE 69-continued

| | Components of chemical liquid | | | | | | | |
|---|---|---|---|---|---|---|---|---|
| | Impurity metal | | | | | | Content of organic impurity (mass ppm) | Water |
| | Content of particles containing following impurity metal (mass ppt) | | | | | | High-boiling- | Content |
| [Table 1-9-5] | Fe | Cr | Ni | Pb | Others | Total | Total | point component | (% by mass) |
| Example 288 | 0.003 | 0.003 | 0.003 | 0.003 | 0.036 | 0.048 | 485 | 1.9 | 0.10% |
| Example 289 | 0.0024 | 0.0024 | 0.0024 | 0.0024 | 0.0288 | 0.0384 | 291 | 1.2 | 0.10% |
| Example 290 | 0.0012 | 0.0012 | 0.0012 | 0.0012 | 0.0144 | 0.0192 | 204 | 0.8 | 0.10% |
| Example 291 | 0.0036 | 0.0036 | 0.0036 | 0.0036 | 0.0432 | 0.0576 | 183 | 0.7 | 0.10% |
| Example 292 | 0.001 | 0.001 | 0.001 | 0.001 | 0.012 | 0.016 | 92 | 0.4 | 0.10% |
| Example 293 | 0.001 | 0.001 | 0.001 | 0.001 | 0.012 | 0.016 | 247 | 1.0 | 0.10% |
| Example 294 | 0.003 | 0.003 | 0.003 | 0.003 | 0.036 | 0.048 | 297 | 1.2 | 0.10% |
| Example 295 | 0.0024 | 0.0024 | 0.0024 | 0.0024 | 0.0288 | 0.0384 | 208 | 0.8 | 0.10% |
| Example 296 | 0.0012 | 0.0012 | 0.0012 | 0.0012 | 0.0144 | 0.0192 | 187 | 0.7 | 0.10% |
| Example 297 | 0.0036 | 0.0036 | 0.0036 | 0.0036 | 0.0432 | 0.0576 | 374 | 1.5 | 0.10% |
| Example 298 | 0.001 | 0.001 | 0.001 | 0.001 | 0.012 | 0.016 | 449 | 1.8 | 0.10% |

TABLE 70

| | Physical properties of chemical liquid | | | Evaluation | | | | | | |
|---|---|---|---|---|---|---|---|---|---|---|
| | Number of | Content of | Content of | | Type of resist composition | | | | | |
| | | | | | | | | Resist saving performance | | |
| | coarse particles | surfactant/total content of | surfactant/content of high-boiling- | Defect inhibition | Affinity | | | Film thickness | | |
| [Table 1-9-6] | (number/ml) | particles | point component | performance | Rsq1 | SRsq | Uniformity | controllability | Developability |
| Example 266 | 9 | $5.2 \times 10^9$ | $5.8 \times 10^1$ | AA | 1 | A | A | A | A | A |
| Example 267 | 8 | $1.7 \times 10^9$ | $6.4 \times 10^1$ | AA | 1 | A | A | A | A | A |
| Example 268 | 4 | $6.3 \times 10^9$ | $1.3 \times 10^2$ | A | 1 | A | A | A | A | A |
| Example 269 | 11 | $1.9 \times 10^{10}$ | $1.4 \times 10^2$ | AA | 1 | A | A | A | A | A |
| Example 270 | 13 | $2.1 \times 10^9$ | $3.9 \times 10^1$ | A | 1 | A | A | A | A | A |
| Example 271 | 9 | $2.6 \times 10^9$ | $5.6 \times 10^1$ | AA | 1 | A | A | A | A | A |
| Example 272 | 8 | $5.2 \times 10^9$ | $6.3 \times 10^1$ | A | 1 | A | A | A | A | A |
| Example 273 | 4 | $8.7 \times 10^8$ | $6.3 \times 10^1$ | AA | 1 | A | A | A | A | A |
| Example 274 | 11 | $6.3 \times 10^9$ | $4.6 \times 10^1$ | A | 1 | A | A | A | A | A |
| Example 275 | 13 | $6.3 \times 10^9$ | $3.9 \times 10^1$ | AA | 1 | A | A | A | A | A |
| Example 276 | 9 | $1.0 \times 10^9$ | $2.8 \times 10^1$ | AA | 1 | A | A | A | A | A |
| Example 277 | 8 | $2.6 \times 10^9$ | $6.1 \times 10^1$ | A | 1 | A | A | A | A | A |
| Example 278 | 4 | $5.2 \times 10^9$ | $1.2 \times 10^2$ | A | 1 | A | A | A | A | A |
| Example 279 | 2 | $1.7 \times 10^9$ | $2.0 \times 10^2$ | AA | 1 | A | A | A | A | A |
| Example 280 | 3 | $3.1 \times 10^9$ | $8.5 \times 10^1$ | A | 1 | A | A | A | A | A |
| Example 281 | 3 | $6.3 \times 10^9$ | $1.9 \times 10^2$ | AA | 1 | A | A | A | A | A |
| Example 282 | 1 | $1.0 \times 10^9$ | $1.9 \times 10^2$ | A | 1 | A | A | A | A | A |
| Example 283 | 4 | $2.6 \times 10^9$ | $1.4 \times 10^2$ | AA | 1 | A | A | A | A | A |
| Example 284 | 4 | $5.2 \times 10^9$ | $1.2 \times 10^2$ | AA | 1 | A | A | A | A | A |
| Example 285 | 3 | $1.7 \times 10^9$ | $1.7 \times 10^2$ | A | 1 | A | A | A | A | A |
| Example 286 | 3 | $3.1 \times 10^9$ | $9.3 \times 10^1$ | AA | 1 | A | A | A | A | A |
| Example 287 | 8 | $6.3 \times 10^9$ | $6.2 \times 10^1$ | A | 1 | A | A | A | A | A |
| Example 288 | 10 | $2.1 \times 10^9$ | $5.2 \times 10^1$ | AA | 1 | A | A | A | A | A |
| Example 289 | 6 | $2.6 \times 10^9$ | $8.6 \times 10^1$ | AA | 1 | A | A | A | A | A |
| Example 290 | 4 | $2.6 \times 10^9$ | $6.1 \times 10^1$ | A | 1 | A | A | A | A | A |
| Example 291 | 4 | $2.6 \times 10^9$ | $2.0 \times 10^2$ | A | 1 | A | A | A | A | A |
| Example 292 | 2 | $6.3 \times 10^9$ | $2.7 \times 10^2$ | AA | 1 | A | A | A | A | A |
| Example 293 | 5 | $6.3 \times 10^9$ | $1.0 \times 10^2$ | A | 1 | A | A | A | A | A |
| Example 294 | 6 | $1.0 \times 10^8$ | $4.2 \times 10^0$ | A | 1 | A | A | A | A | A |
| Example 295 | 4 | $7.8 \times 10^{11}$ | $3.6 \times 10^4$ | B | 1 | A | A | A | A | A |
| Example 296 | 4 | $1.6 \times 10^{12}$ | $4.0 \times 10^4$ | B | 1 | A | A | A | A | A |
| Example 297 | 7 | $1.7 \times 10^9$ | $6.7 \times 10^1$ | A | 1 | A | A | A | A | A |
| Example 298 | 9 | $1.9 \times 10^{10}$ | $1.7 \times 10^2$ | AA | 1 | A | A | A | A | A |

TABLE 71

| [Table 1-9-7] | | Evaluation Type of resist composition Resist saving performance | | | | | | Evaluation Type of resist composition Resist saving performance | | | | |
|---|---|---|---|---|---|---|---|---|---|---|---|---|
| | | Affinity | | | Film | | | Affinity | | | Film | |
| | | Rsq1 | SRsq | Uniformity | thickness controllability | Developability | | Rsq1 | SRsq | Uniformity | thickness controllability | Developability |
| Example 266 | | 2 | A | A | A | A | A | 3 | A | A | A | A | A |
| Example 267 | | 2 | A | A | A | A | A | 3 | A | A | A | A | A |
| Example 268 | | 2 | A | A | A | A | A | 3 | A | A | A | A | A |
| Example 269 | | 2 | A | A | A | A | A | 3 | A | A | A | A | A |
| Example 270 | | 2 | A | A | A | A | A | 3 | A | A | A | A | A |
| Example 271 | | 2 | A | A | A | A | A | 3 | A | A | A | A | A |
| Example 272 | | 2 | A | A | A | A | A | 3 | A | A | A | A | A |
| Example 273 | | 2 | A | A | A | A | A | 3 | A | A | A | A | A |
| Example 274 | | 2 | A | A | A | A | A | 3 | A | A | A | A | A |
| Example 275 | | 2 | A | A | A | A | A | 3 | A | A | A | A | A |
| Example 276 | | 2 | A | A | A | A | A | 3 | A | A | A | A | A |
| Example 277 | | 2 | A | A | A | A | A | 3 | A | A | A | A | A |
| Example 278 | | 2 | A | A | A | A | A | 3 | A | A | A | A | A |
| Example 279 | | 2 | A | A | A | A | A | 3 | A | A | A | A | A |
| Example 280 | | 2 | A | A | A | A | A | 3 | A | A | A | A | A |
| Example 281 | | 2 | A | A | A | A | A | 3 | A | A | A | A | A |
| Example 282 | | 2 | A | A | A | A | A | 3 | A | A | A | A | A |
| Example 283 | | 2 | A | A | A | A | A | 3 | A | A | A | A | A |
| Example 284 | | 2 | A | A | A | A | A | 3 | A | A | A | A | A |
| Example 285 | | 2 | A | A | A | A | A | 3 | A | A | A | A | A |
| Example 286 | | 2 | A | A | A | A | A | 3 | A | A | A | A | A |
| Example 287 | | 2 | A | A | A | A | A | 3 | A | A | A | A | A |
| Example 288 | | 2 | A | A | A | A | A | 3 | A | A | A | A | A |
| Example 289 | | 2 | A | A | A | A | A | 3 | A | A | A | A | A |
| Example 290 | | 2 | A | A | A | A | A | 3 | A | A | A | A | A |
| Example 291 | | 2 | A | A | A | A | A | 3 | A | A | A | A | A |
| Example 292 | | 2 | A | A | A | A | A | 3 | A | A | A | A | A |
| Example 293 | | 2 | A | A | A | A | A | 3 | A | A | A | A | A |
| Example 294 | | 2 | A | A | A | A | A | 3 | A | A | A | A | A |
| Example 295 | | 2 | A | A | A | A | A | 3 | A | A | A | A | A |
| Example 296 | | 2 | A | A | A | A | A | 3 | A | A | A | A | A |
| Example 297 | | 2 | A | A | A | A | A | 3 | A | A | A | A | A |
| Example 298 | | 2 | A | A | A | A | A | 3 | A | A | A | A | A |

TABLE 72

| [Table 1-9-8] | | Evaluation Type of resist composition Resist saving performance | | | | | Evaluation of p-CMP defect inhibition | Evaluation of ashing residue removing |
|---|---|---|---|---|---|---|---|---|
| | | Affinity | | | Film thickness | | | |
| | | Rsq1 | SRsq | Uniformity | controllability | Developability | performance | performance |
| Example 266 | | 4 | A | A | A | A | A | A | A |
| Example 267 | | 4 | A | A | A | A | A | A | A |
| Example 268 | | 4 | A | A | A | A | A | A | A |
| Example 269 | | 4 | A | A | A | A | A | A | A |
| Example 270 | | 4 | A | A | A | A | A | A | A |
| Example 271 | | 4 | A | A | A | A | A | A | A |
| Example 272 | | 4 | A | A | A | A | A | A | A |
| Example 273 | | 4 | A | A | A | A | A | A | A |
| Example 274 | | 4 | A | A | A | A | A | A | A |
| Example 275 | | 4 | A | A | A | A | A | A | A |
| Example 276 | | 4 | A | A | A | A | A | A | A |
| Example 277 | | 4 | A | A | A | A | A | A | A |
| Example 278 | | 4 | A | A | A | A | A | A | A |
| Example 279 | | 4 | A | A | A | A | A | A | A |
| Example 280 | | 4 | A | A | A | A | A | A | A |
| Example 281 | | 4 | A | A | A | A | A | A | A |
| Example 282 | | 4 | A | A | A | A | A | A | A |
| Example 283 | | 4 | A | A | A | A | A | A | A |
| Example 284 | | 4 | A | A | A | A | A | A | A |

TABLE 72-continued

| [Table 1-9-8] | Rsq1 | Affinity SRsq | Uniformity | Film thickness controllability | Developability | Evaluation of p-CMP defect inhibition performance | Evaluation of ashing residue removing performance |
|---|---|---|---|---|---|---|---|
| Example 285 | 4 | A A | A | A | A | A | A |
| Example 286 | 4 | A A | A | A | A | A | A |
| Example 287 | 4 | A A | A | A | A | A | A |
| Example 288 | 4 | A A | A | A | A | A | A |
| Example 289 | 4 | A A | A | A | A | A | A |
| Example 290 | 4 | A A | A | A | A | A | A |
| Example 291 | 4 | A A | A | A | A | A | A |
| Example 292 | 4 | A A | A | A | A | A | A |
| Example 293 | 4 | A A | A | A | A | A | A |
| Example 294 | 4 | A A | A | A | A | A | A |
| Example 295 | 4 | A A | A | A | A | A | A |
| Example 296 | 4 | A A | A | A | A | C | C |
| Example 297 | 4 | A A | A | A | A | A | A |
| Example 298 | 4 | A A | A | A | A | A | A |

TABLE 73

Components of chemical liquid
Main agent
Organic solvent

| [Table 1-10-1] | Type | Content (% by mass) | Molar mass (g/mol) | Vapor pressure (Pa) | Surface tension (mN/m) | fd | fp | fh | HP |
|---|---|---|---|---|---|---|---|---|---|
| Example 299 | TetraEGDME | 25 | 222.28 | 13 | 27.0 | 55.6 | 21.1 | 23.2 | 1 |
| Example 300 | TEGMBE | 25 | 220.31 | 13 | 28.0 | 48.5 | 18.7 | 32.8 | 1 |
| Example 301 | DEGMBE | 25 | 162.23 | 117 | 29.0 | 59.4 | 18.1 | 22.5 | 1 |
| Example 302 | Anisole | 25 | 108.14 | 63 | 30.0 | 64.3 | 17.0 | 18.7 | 1 |
| Example 303 | 14-DMB | 25 | 138.17 | 1 | 30.0 | 59.0 | 20.6 | 20.3 | 1 |
| Example 304 | 12-DMB | 25 | 138.17 | 1 | 30.0 | 60.6 | 20.2 | 19.2 | 1 |
| Example 305 | 13-DMB | 25 | 138.17 | 1 | 30.0 | 61.6 | 19.9 | 18.5 | 1 |
| Example 306 | 14-DPB | 25 | 262.31 | 1 | 33.0 | 63.3 | 18.5 | 18.2 | 1 |
| Example 307 | 4-MTT | 25 | 122.17 | 1 | 32.0 | 64.8 | 17.4 | 17.8 | 1 |
| Example 308 | PNT | 25 | 122.17 | 1 | 31.0 | 66.3 | 16.3 | 17.4 | 1 |
| Example 309 | DEGME | 10 | 120.15 | 13 | 28.0 | 44.3 | 20.8 | 34.9 | 1 |
| Example 310 | DME | 10 | 90.12 | 693 | 29.0 | 55.9 | 22.8 | 21.3 | 1 |
| Example 311 | DEE | 10 | 118.18 | 627 | 29.0 | 62.2 | 19.9 | 17.8 | 1 |
| Example 312 | DEGIBE | 10 | 162.23 | 133 | 29.0 | 61.9 | 18.7 | 19.4 | 1 |
| Example 313 | DEGDME | 10 | 134.18 | 520 | 28.0 | 56.9 | 21.0 | 22.1 | 1 |
| Example 314 | DEGDEE | 10 | 162.23 | 253 | 29.0 | 60.4 | 19.6 | 20.0 | 1 |
| Example 315 | TriEGDME | 10 | 178.23 | 13 | 28.0 | 56.4 | 20.9 | 22.7 | 1 |
| Example 316 | TetraEGDME | 10 | 222.28 | 13 | 27.0 | 55.6 | 21.1 | 23.2 | 1 |
| Example 317 | TEGMBE | 10 | 220.31 | 13 | 28.0 | 48.5 | 18.7 | 32.8 | 1 |
| Example 318 | DEGMBE | 10 | 162.23 | 117 | 29.0 | 59.4 | 18.1 | 22.5 | 1 |
| Example 319 | Anisole | 10 | 108.14 | 63 | 30.0 | 64.3 | 17.0 | 18.7 | 1 |
| Example 320 | 14-DMB | 10 | 138.17 | 1 | 30.0 | 59.0 | 20.6 | 20.3 | 1 |
| Example 321 | 12-DMB | 10 | 138.17 | 1 | 30.0 | 60.6 | 20.2 | 19.2 | 1 |
| Example 322 | 13-DMB | 10 | 138.17 | 1 | 30.0 | 61.6 | 19.9 | 18.5 | 1 |
| Example 323 | 14-DPB | 10 | 262.31 | 1 | 33.0 | 63.3 | 18.5 | 18.2 | 1 |
| Example 324 | 4-MIT | 10 | 122.17 | 1 | 32.0 | 64.8 | 17.4 | 17.8 | 1 |
| Example 325 | PNT | 10 | 122.17 | 1 | 31.0 | 66.3 | 16.3 | 17.4 | 1 |
| Example 326 | DEGME | 10 | 120.15 | 13 | 28.0 | 44.3 | 20.8 | 34.9 | 1 |
| Example 327 | DME | 10 | 90.12 | 693 | 29.0 | 55.9 | 22.8 | 21.3 | 1 |
| Example 328 | DEE | 10 | 118.18 | 627 | 29.0 | 62.2 | 19.9 | 17.8 | 1 |
| Example 329 | DEGIBE | 10 | 162.23 | 133 | 29.0 | 61.9 | 18.7 | 19.4 | 1 |
| Example 330 | DEGDME | 10 | 134.18 | 520 | 28.0 | 56.9 | 21.0 | 22.1 | 1 |
| Example 331 | DEGDEE | 10 | 162.23 | 253 | 29.0 | 60.4 | 19.6 | 20.0 | 1 |
| Example 332 | TriEGDME | 10 | 178.23 | 13 | 28.0 | 56.4 | 20.9 | 22.7 | 1 |

TABLE 74

Components of chemical liquid
Main agent
Organic solvent

| [Table 1-10-2] | Type | Content (% by mass) | Molar mass (g/mol) | Vapor pressure (Pa) | Surface tension (mN/m) | fd | fp | fh | HP |
|---|---|---|---|---|---|---|---|---|---|
| Example 299 | DBCPN | 75 | 130.18 | 400 | 30.2 | 65.4 | 18.1 | 16.5 | 1 |
| Example 300 | DBCPN | 75 | 130.18 | 400 | 30.2 | 65.4 | 18.1 | 16.5 | 1 |
| Example 301 | DBCPN | 75 | 130.18 | 400 | 30.2 | 65.4 | 18.1 | 16.5 | 1 |
| Example 302 | DBCPN | 75 | 130.18 | 400 | 30.2 | 65.4 | 18.1 | 16.5 | 1 |
| Example 303 | DBCPN | 75 | 130.18 | 400 | 30.2 | 65.4 | 18.1 | 16.5 | 1 |
| Example 304 | DBCPN | 75 | 130.18 | 400 | 30.2 | 65.4 | 18.1 | 16.5 | 1 |
| Example 305 | DBCPN | 75 | 130.18 | 400 | 30.2 | 65.4 | 18.1 | 16.5 | 1 |
| Example 306 | DBCPN | 75 | 130.18 | 400 | 30.2 | 65.4 | 18.1 | 16.5 | 1 |
| Example 307 | DBCPN | 75 | 130.18 | 400 | 30.2 | 65.4 | 18.1 | 16.5 | 1 |
| Example 308 | DBCPN | 75 | 130.18 | 400 | 30.2 | 65.4 | 18.1 | 16.5 | 1 |
| Example 309 | PGMEA | 30 | 132.16 | 493 | 27.9 | 56.5 | 19.8 | 23.7 | 1 |
| Example 310 | PGMEA | 30 | 132.16 | 493 | 27.9 | 56.5 | 19.8 | 23.7 | 1 |
| Example 311 | PGMEA | 30 | 132.16 | 493 | 27.9 | 56.5 | 19.8 | 23.7 | 1 |
| Example 312 | PGMEA | 30 | 132.16 | 493 | 27.9 | 56.5 | 19.8 | 23.7 | 1 |
| Example 313 | PGMEA | 30 | 132.16 | 493 | 27.9 | 56.5 | 19.8 | 23.7 | 1 |
| Example 314 | PGMEA | 30 | 132.16 | 493 | 27.9 | 56.5 | 19.8 | 23.7 | 1 |
| Example 315 | PGMEA | 30 | 132.16 | 493 | 27.9 | 56.5 | 19.8 | 23.7 | 1 |
| Example 316 | PGMEA | 30 | 132.16 | 493 | 27.9 | 56.5 | 19.8 | 23.7 | 1 |
| Example 317 | PGMEA | 30 | 132.16 | 493 | 27.9 | 56.5 | 19.8 | 23.7 | 1 |
| Example 318 | PGMEA | 30 | 132.16 | 493 | 27.9 | 56.5 | 19.8 | 23.7 | 1 |
| Example 319 | PGMEA | 30 | 132.16 | 493 | 27.9 | 56.5 | 19.8 | 23.7 | 1 |
| Example 320 | PGMEA | 30 | 132.16 | 493 | 27.9 | 56.5 | 19.8 | 23.7 | 1 |
| Example 321 | PGMEA | 30 | 132.16 | 493 | 27.9 | 56.5 | 19.8 | 23.7 | 1 |
| Example 322 | PGMEA | 30 | 132.16 | 493 | 27.9 | 56.5 | 19.8 | 23.7 | 1 |
| Example 323 | PGMEA | 30 | 132.16 | 493 | 27.9 | 56.5 | 19.8 | 23.7 | 1 |
| Example 324 | PGMEA | 30 | 132.16 | 493 | 27.9 | 56.5 | 19.8 | 23.7 | 1 |
| Example 325 | PGMEA | 30 | 132.16 | 493 | 27.9 | 56.5 | 19.8 | 23.7 | 1 |
| Example 326 | PGMEA | 30 | 132.16 | 493 | 27.9 | 56.5 | 19.8 | 23.7 | 1 |
| Example 327 | PGMEA | 30 | 132.16 | 493 | 27.9 | 56.5 | 19.8 | 23.7 | 1 |
| Example 328 | PGMEA | 30 | 132.16 | 493 | 27.9 | 56.5 | 19.8 | 23.7 | 1 |
| Example 329 | PGMEA | 30 | 132.16 | 493 | 27.9 | 56.5 | 19.8 | 23.7 | 1 |
| Example 330 | PGMEA | 30 | 132.16 | 493 | 27.9 | 56.5 | 19.8 | 23.7 | 1 |
| Example 331 | PGMEA | 30 | 132.16 | 493 | 27.9 | 56.5 | 19.8 | 23.7 | 1 |
| Example 332 | PGMEA | 30 | 132.16 | 493 | 27.9 | 56.5 | 19.8 | 23.7 | 1 |

TABLE 75

Components of chemical liquid
Main agent

Organic solvent

| [Table 1-10-3] | Type | Content (% by mass) | Molar mass (g/mol) | Vapor pressure (Pa) | Surface tension (mN/m) | fd | fp | fh | HP | Vapor pressure (Pa) | Surface tension (mN/m) |
|---|---|---|---|---|---|---|---|---|---|---|---|
| Example 299 | | | | | | | | | | 337 | 29.7 |
| Example 300 | | | | | | | | | | 336 | 29.8 |
| Example 301 | | | | | | | | | | 340 | 29.9 |
| Example 302 | | | | | | | | | | 303 | 30.1 |
| Example 303 | | | | | | | | | | 305 | 30.2 |
| Example 304 | | | | | | | | | | 305 | 30.2 |
| Example 305 | | | | | | | | | | 305 | 30.2 |
| Example 306 | | | | | | | | | | 343 | 30.6 |
| Example 307 | | | | | | | | | | 295 | 30.7 |
| Example 308 | | | | | | | | | | 295 | 30.4 |
| Example 309 | GBL | 60 | 86.08 | 147 | 44.1 | 42.9 | 39.5 | 17.6 | 1 | 214 | 39.1 |
| Example 310 | GBL | 60 | 86.08 | 147 | 44.1 | 42.9 | 39.5 | 17.6 | 1 | 281 | 38.9 |
| Example 311 | GBL | 60 | 86.08 | 147 | 44.1 | 42.9 | 39.5 | 17.6 | 1 | 265 | 39.2 |
| Example 312 | GBL | 60 | 86.08 | 147 | 44.1 | 42.9 | 39.5 | 17.6 | 1 | 226 | 39.4 |
| Example 313 | GBL | 60 | 86.08 | 147 | 44.1 | 42.9 | 39.5 | 17.6 | 1 | 253 | 39.2 |
| Example 314 | GBL | 60 | 86.08 | 147 | 44.1 | 42.9 | 39.5 | 17.6 | 1 | 233 | 39.4 |
| Example 315 | GBL | 60 | 86.08 | 147 | 44.1 | 42.9 | 39.5 | 17.6 | 1 | 219 | 39.4 |
| Example 316 | GBL | 60 | 86.08 | 147 | 44.1 | 42.9 | 39.5 | 17.6 | 1 | 222 | 39.5 |
| Example 317 | GBL | 60 | 86.08 | 147 | 44.1 | 42.9 | 39.5 | 17.6 | 1 | 222 | 39.6 |
| Example 318 | GBL | 60 | 86.08 | 147 | 44.1 | 42.9 | 39.5 | 17.6 | 1 | 225 | 39.4 |
| Example 319 | GBL | 60 | 86.08 | 147 | 44.1 | 42.9 | 39.5 | 17.6 | 1 | 216 | 39.2 |
| Example 320 | GBL | 60 | 86.08 | 147 | 44.1 | 42.9 | 39.5 | 17.6 | 1 | 215 | 39.4 |

TABLE 75-continued

| [Table 1-10-3] | Type | Content (% by mass) | Molar mass (g/mol) | Vapor pressure (Pa) | Surface tension (mN/m) | fd | fp | fh | HP | Vapor pressure (Pa) | Surface tension (mN/m) |
|---|---|---|---|---|---|---|---|---|---|---|---|
| Example 321 | GBL | 60 | 86.08 | 147 | 44.1 | 42.9 | 39.5 | 17.6 | 1 | 215 | 39.4 |
| Example 322 | GBL | 60 | 86.08 | 147 | 44.1 | 42.9 | 39.5 | 17.6 | 1 | 215 | 39.4 |
| Example 323 | GBL | 60 | 86.08 | 147 | 44.1 | 42.9 | 39.5 | 17.6 | 1 | 223 | 39.8 |
| Example 324 | GBL | 60 | 86.08 | 147 | 44.1 | 42.9 | 39.5 | 17.6 | 1 | 213 | 39.5 |
| Example 325 | GBL | 60 | 86.08 | 147 | 44.1 | 42.9 | 39.5 | 17.6 | 1 | 213 | 39.4 |
| Example 326 | DMSO | 60 | 78.13 | 13 | 43.6 | 40.9 | 36.4 | 22.7 | 1 | 114 | 39.1 |
| Example 327 | DMSO | 60 | 78.13 | 13 | 43.6 | 40.9 | 36.4 | 22.7 | 1 | 180 | 38.9 |
| Example 328 | DMSO | 60 | 78.13 | 13 | 43.6 | 40.9 | 36.4 | 22.7 | 1 | 162 | 39.2 |
| Example 329 | DMSO | 60 | 78.13 | 13 | 43.6 | 40.9 | 36.4 | 22.7 | 1 | 123 | 39.4 |
| Example 330 | DMSO | 60 | 78.13 | 13 | 43.6 | 40.9 | 36.4 | 22.7 | 1 | 151 | 39.2 |
| Example 331 | DMSO | 60 | 78.13 | 13 | 43.6 | 40.9 | 36.4 | 22.7 | 1 | 130 | 39.4 |
| Example 332 | DMSO | 60 | 78.13 | 13 | 43.6 | 40.9 | 36.4 | 22.7 | 1 | 117 | 39.4 |

TABLE 76

| | Components of chemical liquid | | | Components of chemical liquid | | | | | |
|---|---|---|---|---|---|---|---|---|---|
| | Main agent | Surfactant | | Impurity metal | | | | | |
| | Content | | Content | Total content of impurity metal (mass ppt) | | | | | |
| [Table 1-10-4] | (% by mass) | Type | (mass ppm) | Fe | Cr | Ni | Pb | Others | Total |
| Example 299 | Balance | J | 50 | 0.002 | 0.002 | 0.002 | 0.002 | 0.024 | 0.032 |
| Example 300 | Balance | C | 100 | 0.006 | 0.006 | 0.006 | 0.006 | 0.072 | 0.096 |
| Example 301 | Balance | A | 100 | 0.0048 | 0.0048 | 0.0048 | 0.0048 | 0.0576 | 0.0768 |
| | | B | 50 | | | | | | |
| Example 302 | Balance | A | 100 | 0.0024 | 0.0024 | 0.0024 | 0.0024 | 0.0288 | 0.0384 |
| Example 303 | Balance | I | 50 | 0.0072 | 0.0072 | 0.0072 | 0.0072 | 0.0864 | 0.1152 |
| Example 304 | Balance | D | 100 | 0.001 | 0.001 | 0.001 | 0.001 | 0.012 | 0.016 |
| Example 305 | Balance | A | 50 | 0.002 | 0.002 | 0.002 | 0.002 | 0.024 | 0.032 |
| Example 306 | Balance | A | 100 | 0.006 | 0.006 | 0.006 | 0.006 | 0.072 | 0.096 |
| Example 307 | Balance | H | 50 | 0.0048 | 0.0048 | 0.0048 | 0.0048 | 0.0576 | 0.0768 |
| Example 308 | Balance | B | 100 | 0.0024 | 0.0024 | 0.0024 | 0.0024 | 0.0288 | 0.0384 |
| Example 309 | Balance | B | 100 | 0.0072 | 0.0072 | 0.0072 | 0.0072 | 0.0864 | 0.1152 |
| Example 310 | Balance | I | 100 | 0.001 | 0.001 | 0.001 | 0.001 | 0.012 | 0.016 |
| Example 311 | Balance | E | 100 | 0.002 | 0.002 | 0.002 | 0.002 | 0.024 | 0.032 |
| Example 312 | Balance | A | 50 | 0.006 | 0.006 | 0.006 | 0.006 | 0.072 | 0.096 |
| Example 313 | Balance | E | 300 | 0.0048 | 0.0048 | 0.0048 | 0.0048 | 0.0576 | 0.0768 |
| Example 314 | Balance | A | 50 | 0.0024 | 0.0024 | 0.0024 | 0.0024 | 0.0288 | 0.0384 |
| Example 315 | Balance | E | 100 | 0.0072 | 0.0072 | 0.0072 | 0.0072 | 0.0864 | 0.1152 |
| Example 316 | Balance | E | 100 | 0.001 | 0.001 | 0.001 | 0.001 | 0.012 | 0.016 |
| Example 317 | Balance | A | 50 | 0.002 | 0.002 | 0.002 | 0.002 | 0.024 | 0.032 |
| Example 318 | Balance | A | 100 | 0.006 | 0.006 | 0.006 | 0.006 | 0.072 | 0.096 |
| Example 319 | Balance | B | 100 | 0.0048 | 0.0048 | 0.0048 | 0.0048 | 0.0576 | 0.0768 |
| Example 320 | Balance | F | 100 | 0.0024 | 0.0024 | 0.0024 | 0.0024 | 0.0288 | 0.0384 |
| Example 321 | Balance | C | 100 | 0.0072 | 0.0072 | 0.0072 | 0.0072 | 0.0864 | 0.1152 |
| Example 322 | Balance | A | 50 | 0.001 | 0.001 | 0.001 | 0.001 | 0.012 | 0.016 |
| Example 323 | Balance | A | 100 | 0.002 | 0.002 | 0.002 | 0.002 | 0.024 | 0.032 |
| Example 324 | Balance | A | 100 | 0.006 | 0.006 | 0.006 | 0.006 | 0.072 | 0.096 |
| Example 325 | Balance | A | 50 | 0.0048 | 0.0048 | 0.0048 | 0.0048 | 0.0576 | 0.0768 |
| Example 326 | Balance | A | 100 | 0.0024 | 0.0024 | 0.0024 | 0.0024 | 0.0288 | 0.0384 |
| Example 327 | Balance | I | 100 | 0.0072 | 0.0072 | 0.0072 | 0.0072 | 0.0864 | 0.1152 |
| Example 328 | Balance | A | 50 | 0.004 | 0.002 | 0.001 | 0.001 | 0.024 | 0.032 |
| Example 329 | Balance | E | 100 | 0.002 | 0.002 | 0.002 | 0.002 | 0.024 | 0.032 |
| Example 330 | Balance | A | 300 | 0.006 | 0.006 | 0.006 | 0.006 | 0.072 | 0.096 |
| Example 331 | Balance | B | 100 | 0.0048 | 0.0048 | 0.0048 | 0.0048 | 0.0576 | 0.0768 |
| Example 332 | Balance | F | 50 | 0.0024 | 0.0024 | 0.0024 | 0.0024 | 0.0288 | 0.0384 |

TABLE 77

Components of chemical liquid

| [Table 1-10-5] | Impurity metal Content of particles containing following impurity metal (mass ppt) | | | | | | Content of organic impurity (mass ppm) | | Water Content |
|---|---|---|---|---|---|---|---|---|---|
| | Fe | Cr | Ni | Pb | Others | Total | Total | High-boiling-point component | (% by mass) |
| Example 299 | 0.001 | 0.001 | 0.001 | 0.001 | 0.012 | 0.016 | 539 | 2.2 | 0.10% |
| Example 300 | 0.003 | 0.003 | 0.003 | 0.003 | 0.036 | 0.048 | 377 | 1.5 | 0.10% |
| Example 301 | 0.0024 | 0.0024 | 0.0024 | 0.0024 | 0.0288 | 0.0384 | 339 | 1.4 | 0.10% |
| Example 302 | 0.0012 | 0.0012 | 0.0012 | 0.0012 | 0.0144 | 0.0192 | 170 | 0.7 | 0.10% |
| Example 303 | 0.0036 | 0.0036 | 0.0036 | 0.0036 | 0.0432 | 0.0576 | 458 | 1.8 | 0.10% |
| Example 304 | 0.001 | 0.001 | 0.001 | 0.001 | 0.012 | 0.016 | 550 | 2.2 | 0.10% |
| Example 305 | 0.001 | 0.001 | 0.001 | 0.001 | 0.012 | 0.016 | 385 | 1.5 | 0.10% |
| Example 306 | 0.003 | 0.003 | 0.003 | 0.003 | 0.036 | 0.048 | 346 | 1.4 | 0.10% |
| Example 307 | 0.0024 | 0.0024 | 0.0024 | 0.0024 | 0.0288 | 0.0384 | 416 | 1.7 | 0.10% |
| Example 308 | 0.0012 | 0.0012 | 0.0012 | 0.0012 | 0.0144 | 0.0192 | 291 | 1.2 | 0.10% |
| Example 309 | 0.0036 | 0.0036 | 0.0036 | 0.0036 | 0.0432 | 0.0576 | 262 | 1.0 | 0.10% |
| Example 310 | 0.001 | 0.001 | 0.001 | 0.001 | 0.012 | 0.016 | 383 | 1.5 | 0.10% |
| Example 311 | 0.001 | 0.001 | 0.001 | 0.001 | 0.012 | 0.016 | 192 | 0.8 | 0.10% |
| Example 312 | 0.003 | 0.003 | 0.003 | 0.003 | 0.036 | 0.048 | 517 | 2.1 | 0.10% |
| Example 313 | 0.0024 | 0.0024 | 0.0024 | 0.0024 | 0.0288 | 0.0384 | 621 | 2.5 | 0.10% |
| Example 314 | 0.0012 | 0.0012 | 0.0012 | 0.0012 | 0.0144 | 0.0192 | 434 | 1.7 | 0.10% |
| Example 315 | 0.0036 | 0.0036 | 0.0036 | 0.0036 | 0.0432 | 0.0576 | 391 | 1.6 | 0.10% |
| Example 316 | 0.001 | 0.001 | 0.001 | 0.001 | 0.012 | 0.016 | 195 | 0.8 | 0.10% |
| Example 317 | 0.001 | 0.001 | 0.001 | 0.001 | 0.012 | 0.016 | 528 | 2.1 | 0.10% |
| Example 318 | 0.003 | 0.003 | 0.003 | 0.003 | 0.036 | 0.048 | 633 | 2.5 | 0.10% |
| Example 319 | 0.0024 | 0.0024 | 0.0024 | 0.0024 | 0.0288 | 0.0384 | 443 | 1.8 | 0.10% |
| Example 320 | 0.0012 | 0.0012 | 0.0012 | 0.0012 | 0.0144 | 0.0192 | 399 | 1.6 | 0.10% |
| Example 321 | 0.0036 | 0.0036 | 0.0036 | 0.0036 | 0.0432 | 0.0576 | 200 | 0.8 | 0.10% |
| Example 322 | 0.001 | 0.001 | 0.001 | 0.001 | 0.012 | 0.016 | 539 | 2.2 | 0.10% |
| Example 323 | 0.001 | 0.001 | 0.001 | 0.001 | 0.012 | 0.016 | 646 | 2.6 | 0.10% |
| Example 324 | 0.003 | 0.003 | 0.003 | 0.003 | 0.036 | 0.048 | 453 | 1.8 | 0.10% |
| Example 325 | 0.0024 | 0.0024 | 0.0024 | 0.0024 | 0.0288 | 0.0384 | 407 | 1.6 | 0.10% |
| Example 326 | 0.0012 | 0.0012 | 0.0012 | 0.0012 | 0.0144 | 0.0192 | 204 | 0.8 | 0.10% |
| Example 327 | 0.0036 | 0.0036 | 0.0036 | 0.0036 | 0.0432 | 0.0576 | 122 | 0.5 | 0.10% |
| Example 328 | 0.002 | 0.001 | 0.001 | 0.001 | 0.015 | 0.02 | 147 | 0.6 | 0.10% |
| Example 329 | 0.001 | 0.001 | 0.001 | 0.001 | 0.012 | 0.016 | 132 | 0.5 | 0.10% |
| Example 330 | 0.003 | 0.003 | 0.003 | 0.003 | 0.036 | 0.048 | 66 | 0.3 | 0.10% |
| Example 331 | 0.0024 | 0.0024 | 0.0024 | 0.0024 | 0.0288 | 0.0384 | 178 | 0.7 | 0.10% |
| Example 332 | 0.0012 | 0.0012 | 0.0012 | 0.0012 | 0.0144 | 0.0192 | 214 | 0.9 | 0.10% |

TABLE 78

| [Table 1-10-6] | Physical properties of chemical liquid Number of coarse particles (number/ml) | Content of surfactant/total content of particles | Content of surfactant/content of high-boiling-point component | Evaluation Defect inhibition performance | Type of resist composition | Affinity Rsq1 | SRsq | Resist saving performance Uniformity | Film thickness controllability | Developability |
|---|---|---|---|---|---|---|---|---|---|---|
| Example 299 | 11 | $3.1 \times 10^9$ | $2.3 \times 10^1$ | A | 1 | A | A | A | A | A |
| Example 300 | 8 | $2.1 \times 10^9$ | $6.6 \times 10^1$ | AA | 1 | A | A | A | A | A |
| Example 301 | 7 | $3.9 \times 10^9$ | $1.1 \times 10^2$ | AA | 1 | A | A | A | A | A |
| Example 302 | 3 | $5.2 \times 10^9$ | $1.5 \times 10^2$ | AA | 1 | A | A | A | A | A |
| Example 303 | 9 | $8.7 \times 10^8$ | $2.7 \times 10^1$ | A | 1 | A | A | A | A | A |
| Example 304 | 11 | $6.3 \times 10^9$ | $4.5 \times 10^1$ | A | 1 | A | A | A | A | A |
| Example 305 | 8 | $3.1 \times 10^9$ | $3.2 \times 10^1$ | AA | 1 | A | A | A | A | A |
| Example 306 | 7 | $2.1 \times 10^9$ | $7.2 \times 10^1$ | AA | 1 | A | A | A | A | A |
| Example 307 | 8 | $1.3 \times 10^9$ | $3.0 \times 10^1$ | A | 1 | A | A | A | A | A |
| Example 308 | 6 | $5.2 \times 10^9$ | $8.6 \times 10^1$ | AA | 1 | A | A | A | A | A |
| Example 309 | 5 | $1.7 \times 10^9$ | $9.5 \times 10^1$ | AA | 1 | A | A | A | A | A |
| Example 310 | 8 | $6.3 \times 10^9$ | $6.5 \times 10^1$ | A | 1 | A | A | A | A | A |
| Example 311 | 4 | $6.3 \times 10^9$ | $1.3 \times 10^2$ | A | 1 | A | A | A | A | A |
| Example 312 | 10 | $1.0 \times 10^9$ | $2.4 \times 10^1$ | AA | 1 | A | A | A | A | A |
| Example 313 | 12 | $7.8 \times 10^9$ | $1.2 \times 10^2$ | A | 1 | A | A | A | A | A |
| Example 314 | 9 | $2.6 \times 10^9$ | $2.9 \times 10^1$ | AA | 1 | A | A | A | A | A |
| Example 315 | 8 | $1.7 \times 10^9$ | $6.4 \times 10^1$ | A | 1 | A | A | A | A | A |

TABLE 78-continued

| [Table 1-10-6] | Physical properties of chemical liquid | | | Evaluation | | | | | | |
|---|---|---|---|---|---|---|---|---|---|---|
| | | | | | | Type of resist composition | | | | |
| | | | | | | Resist saving performance | | | | |
| | Number of coarse particles (number/ml) | Content of surfactant/total content of particles | Content of surfactant/content of high-boiling-point component | Defect inhibition performance | | Affinity | | Uniformity | Film thickness controllability | Developability |
| | | | | | | Rsq1 | SRsq | | | |
| Example 316 | 4 | $6.3 \times 10^9$ | $1.3 \times 10^2$ | A | 1 | A | A | A | A | A |
| Example 317 | 11 | $3.1 \times 10^9$ | $2.4 \times 10^1$ | AA | 1 | A | A | A | A | A |
| Example 318 | 13 | $2.1 \times 10^9$ | $3.9 \times 10^1$ | AA | 1 | A | A | A | A | A |
| Example 319 | 9 | $2.6 \times 10^9$ | $5.6 \times 10^1$ | AA | 1 | A | A | A | A | A |
| Example 320 | 8 | $5.2 \times 10^9$ | $6.3 \times 10^1$ | A | 1 | A | A | A | A | A |
| Example 321 | 4 | $1.7 \times 10^9$ | $1.3 \times 10^2$ | AA | 1 | A | A | A | A | A |
| Example 322 | 11 | $3.1 \times 10^9$ | $2.3 \times 10^1$ | AA | 1 | A | A | A | A | A |
| Example 323 | 13 | $6.3 \times 10^9$ | $3.9 \times 10^1$ | AA | 1 | A | A | A | A | A |
| Example 324 | 9 | $2.1 \times 10^9$ | $5.5 \times 10^1$ | AA | 1 | A | A | A | A | A |
| Example 325 | 8 | $1.3 \times 10^9$ | $3.1 \times 10^1$ | AA | 1 | A | A | A | A | A |
| Example 326 | 4 | $5.2 \times 10^9$ | $1.2 \times 10^2$ | AA | 1 | A | A | A | A | A |
| Example 327 | 2 | $1.7 \times 10^9$ | $2.0 \times 10^2$ | A | 1 | A | A | A | A | A |
| Example 328 | 3 | $2.5 \times 10^9$ | $8.5 \times 10^1$ | AA | 1 | A | A | A | A | A |
| Example 329 | 3 | $6.3 \times 10^9$ | $1.9 \times 10^2$ | A | 1 | A | A | A | A | A |
| Example 330 | 1 | $6.3 \times 10^9$ | $1.1 \times 10^3$ | AA | 1 | A | A | A | A | A |
| Example 331 | 4 | $2.6 \times 10^9$ | $1.4 \times 10^2$ | AA | 1 | A | A | A | A | A |
| Example 332 | 4 | $2.6 \times 10^9$ | $5.8 \times 10^1$ | A | 1 | A | A | A | A | A |

TABLE 79

| [Table 1-10-7] | Evaluation | | | | | | | | | | |
|---|---|---|---|---|---|---|---|---|---|---|---|
| | Type of resist composition | | | | | | Type of resist composition | | | | |
| | Resist saving performance | | | | | | Resist saving performance | | | | |
| | | Affinity | | | Film thickness | | | Affinity | | | Film thickness |
| | | Rsq1 | SRsq | Uniformity | controllability | Developability | | Rsq1 | SRsq | Uniformity | controllability | Developability |
| Example 299 | 2 | A | A | A | A | A | 3 | A | A | A | A | A |
| Example 300 | 2 | A | A | A | A | A | 3 | A | A | A | A | A |
| Example 301 | 2 | A | A | A | A | A | 3 | A | A | A | A | A |
| Example 302 | 2 | A | A | A | A | A | 3 | A | A | A | A | A |
| Example 303 | 2 | A | A | A | A | A | 3 | A | A | A | A | A |
| Example 304 | 2 | A | A | A | A | A | 3 | A | A | A | A | A |
| Example 305 | 2 | A | A | A | A | A | 3 | A | A | A | A | A |
| Example 306 | 2 | A | A | A | A | A | 3 | A | A | A | A | A |
| Example 307 | 2 | A | A | A | A | A | 3 | A | A | A | A | A |
| Example 308 | 2 | A | A | A | A | A | 3 | A | A | A | A | A |
| Example 309 | 2 | A | A | A | A | A | 3 | A | A | A | A | A |
| Example 310 | 2 | A | A | A | A | A | 3 | A | A | A | A | A |
| Example 311 | 2 | A | A | A | A | A | 3 | A | A | A | A | A |
| Example 312 | 2 | A | A | A | A | A | 3 | A | A | A | A | A |
| Example 313 | 2 | A | A | A | A | A | 3 | A | A | A | A | A |
| Example 314 | 2 | A | A | A | A | A | 3 | A | A | A | A | A |
| Example 315 | 2 | A | A | A | A | A | 3 | A | A | A | A | A |
| Example 316 | 2 | A | A | A | A | A | 3 | A | A | A | A | A |
| Example 317 | 2 | A | A | A | A | A | 3 | A | A | A | A | A |
| Example 318 | 2 | A | A | A | A | A | 3 | A | A | A | A | A |
| Example 319 | 2 | A | A | A | A | A | 3 | A | A | A | A | A |
| Example 320 | 2 | A | A | A | A | A | 3 | A | A | A | A | A |
| Example 321 | 2 | A | A | A | A | A | 3 | A | A | A | A | A |
| Example 322 | 2 | A | A | A | A | A | 3 | A | A | A | A | A |
| Example 323 | 2 | A | A | A | A | A | 3 | A | A | A | A | A |
| Example 324 | 2 | A | A | A | A | A | 3 | A | A | A | A | A |
| Example 325 | 2 | A | A | A | A | A | 3 | A | A | A | A | A |
| Example 326 | 2 | A | A | A | A | A | 3 | A | A | A | A | A |
| Example 327 | 2 | A | A | A | A | A | 3 | A | A | A | A | A |
| Example 328 | 2 | A | A | A | A | A | 3 | A | A | A | A | A |
| Example 329 | 2 | A | A | A | A | A | 3 | A | A | A | A | A |
| Example 330 | 2 | A | A | A | A | A | 3 | A | A | A | A | A |

TABLE 79-continued

| [Table 1-10-7] | | Evaluation Type of resist composition Resist saving performance | | | | | | Evaluation Type of resist composition Resist saving performance | | | | |
|---|---|---|---|---|---|---|---|---|---|---|---|---|
| | | Affinity | | | Film | | | Affinity | | | Film | |
| | | Rsq1 | SRsq | Uniformity | thickness controllability | Developability | | Rsq1 | SRsq | Uniformity | thickness controllability | Developability |
| Example 331 | | 2 | A | A | A | A | A | 3 | A | A | A | A | A |
| Example 332 | | 2 | A | A | A | A | A | 3 | A | A | A | A | A |

TABLE 80

| [Table 1-10-8] | | Evaluation Type of resist composition Resist saving performance | | | | | Evaluation of p-CMP defect inhibition | Evaluation of ashing residue removing |
|---|---|---|---|---|---|---|---|---|
| | | Affinity | | | Film thickness | | | |
| | | Rsq1 | SRsq | Uniformity | controllability | Developability | performance | performance |
| Example 299 | 4 | A | A | A | A | A | A | A |
| Example 300 | 4 | A | A | A | A | A | A | A |
| Example 301 | 4 | A | A | A | A | A | A | A |
| Example 302 | 4 | A | A | A | A | A | A | A |
| Example 303 | 4 | A | A | A | A | A | A | A |
| Example 304 | 4 | A | A | A | A | A | A | A |
| Example 305 | 4 | A | A | A | A | A | A | A |
| Example 306 | 4 | A | A | A | A | A | A | A |
| Example 307 | 4 | A | A | A | A | A | A | A |
| Example 308 | 4 | A | A | A | A | A | A | A |
| Example 309 | 4 | A | A | A | A | A | A | A |
| Example 310 | 4 | A | A | A | A | A | A | A |
| Example 311 | 4 | A | A | A | A | A | A | A |
| Example 312 | 4 | A | A | A | A | A | A | A |
| Example 313 | 4 | A | A | A | A | A | A | A |
| Example 314 | 4 | A | A | A | A | A | A | A |
| Example 315 | 4 | A | A | A | A | A | A | A |
| Example 316 | 4 | A | A | A | A | A | A | A |
| Example 317 | 4 | A | A | A | A | A | A | A |
| Example 318 | 4 | A | A | A | A | A | A | A |
| Example 319 | 4 | A | A | A | A | A | A | A |
| Example 320 | 4 | A | A | A | A | A | A | A |
| Example 321 | 4 | A | A | A | A | A | A | A |
| Example 322 | 4 | A | A | A | A | A | A | A |
| Example 323 | 4 | A | A | A | A | A | A | A |
| Example 324 | 4 | A | A | A | A | A | A | A |
| Example 325 | 4 | A | A | A | A | A | A | A |
| Example 326 | 4 | A | A | A | A | A | A | A |
| Example 327 | 4 | A | A | A | A | A | A | A |
| Example 328 | 4 | A | A | A | A | A | A | A |
| Example 329 | 4 | A | A | A | A | A | A | A |
| Example 330 | 4 | A | A | A | A | A | A | A |
| Example 331 | 4 | A | A | A | A | A | A | A |
| Example 332 | 4 | A | A | A | A | A | A | A |

TABLE 81

Components of chemical liquid
Main agent
Organic solvent

| [Table 1-11-1] | Type | Content (% by mass) | Molar mass (g/mol) | Vapor pressure (Pa) | Surface tension (mN/m) | fd | fp | fh | HP |
|---|---|---|---|---|---|---|---|---|---|
| Example 333 | TetraEGDME | 10 | 222.28 | 13 | 27.0 | 55.6 | 21.1 | 23.2 | 1 |
| Example 334 | TEGMBE | 10 | 220.31 | 13 | 28.0 | 48.5 | 18.7 | 32.8 | 1 |
| Example 335 | DEGMBE | 10 | 162.23 | 117 | 29.0 | 59.4 | 18.1 | 22.5 | 1 |
| Example 336 | Anisole | 10 | 108.14 | 63 | 30.0 | 64.3 | 17.0 | 18.7 | 1 |
| Example 337 | 14-DMB | 10 | 138.17 | 1 | 30.0 | 59.0 | 20.6 | 20.3 | 1 |
| Example 338 | 12-DMB | 10 | 138.17 | 1 | 30.0 | 60.6 | 20.2 | 19.2 | 1 |
| Example 339 | 13-DMB | 10 | 138.17 | 1 | 30.0 | 61.6 | 19.9 | 18.5 | 1 |
| Example 340 | 14-DPB | 10 | 262.31 | 1 | 33.0 | 63.3 | 18.5 | 18.2 | 1 |
| Example 341 | 4-MTT | 10 | 122.17 | 1 | 32.0 | 64.8 | 17.4 | 17.8 | 1 |
| Example 342 | PNT | 10 | 122.17 | 1 | 31.0 | 66.3 | 16.3 | 17.4 | 1 |
| Example 343 | DEGME | 10 | 120.15 | 13 | 28.0 | 44.3 | 20.8 | 34.9 | 1 |
| Example 344 | DME | 10 | 90.12 | 693 | 29.0 | 55.9 | 22.8 | 21.3 | 1 |
| Example 345 | DEE | 10 | 118.18 | 627 | 29.0 | 62.2 | 19.9 | 17.8 | 1 |
| Example 346 | DEGIBE | 10 | 162.23 | 133 | 29.0 | 61.9 | 18.7 | 19.4 | 1 |
| Example 347 | DEGDME | 10 | 134.18 | 520 | 28.0 | 56.9 | 21.0 | 22.1 | 1 |
| Example 348 | DEGDEE | 10 | 162.23 | 253 | 29.0 | 60.4 | 19.6 | 20.0 | 1 |
| Example 349 | TriEGDME | 10 | 178.23 | 13 | 28.0 | 56.4 | 20.9 | 22.7 | 1 |
| Example 350 | TetraEGDME | 10 | 222.28 | 13 | 27.0 | 55.6 | 21.1 | 23.2 | 1 |
| Example 351 | TEGMBE | 10 | 220.31 | 13 | 28.0 | 48.5 | 18.7 | 32.8 | 1 |
| Example 352 | DEGMBE | 10 | 162.23 | 117 | 29.0 | 59.4 | 18.1 | 22.5 | 1 |
| Example 353 | Anisole | 10 | 108.14 | 63 | 30.0 | 64.3 | 17.0 | 18.7 | 1 |
| Example 354 | 14-DMB | 10 | 138.17 | 1 | 30.0 | 59.0 | 20.6 | 20.3 | 1 |
| Example 355 | 12-DMB | 10 | 138.17 | 1 | 30.0 | 60.6 | 20.2 | 19.2 | 1 |
| Example 356 | 13-DMB | 10 | 138.17 | 1 | 30.0 | 61.6 | 19.9 | 18.5 | 1 |
| Example 357 | 14-DPB | 10 | 262.31 | 1 | 33.0 | 63.3 | 18.5 | 18.2 | 1 |
| Example 358 | 4-MTT | 10 | 122.17 | 1 | 32.0 | 64.8 | 17.4 | 17.8 | 1 |
| Example 359 | PNT | 10 | 122.17 | 1 | 31.0 | 66.3 | 16.3 | 17.4 | 1 |
| Example 360 | DEGME | 10 | 120.15 | 13 | 28.0 | 44.3 | 20.8 | 34.9 | 1 |
| Example 361 | DME | 10 | 90.12 | 693 | 29.0 | 55.9 | 22.8 | 21.3 | 1 |
| Example 362 | DEE | 10 | 118.18 | 627 | 29.0 | 62.2 | 19.9 | 17.8 | 1 |
| Example 363 | DEGIBE | 10 | 162.23 | 133 | 29.0 | 61.9 | 18.7 | 19.4 | 1 |

TABLE 82

Components of chemical liquid
Main agent
Organic solvent

| [Table 1-11-2] | Type | Content (% by mass) | Molar mass (g/mol) | Vapor pressure (Pa) | Surface tension (mN/m) | fd | fp | fh | HP |
|---|---|---|---|---|---|---|---|---|---|
| Example 333 | PGMEA | 30 | 132.16 | 493 | 27.9 | 56.5 | 19.8 | 23.7 | 1 |
| Example 334 | PGMEA | 30 | 132.16 | 493 | 27.9 | 56.5 | 19.8 | 23.7 | 1 |
| Example 335 | PGMEA | 30 | 132.16 | 493 | 27.9 | 56.5 | 19.8 | 23.7 | 1 |
| Example 336 | PGMEA | 30 | 132.16 | 493 | 27.9 | 56.5 | 19.8 | 23.7 | 1 |
| Example 337 | PGMEA | 30 | 132.16 | 493 | 27.9 | 56.5 | 19.8 | 23.7 | 1 |
| Example 338 | PGMEA | 30 | 132.16 | 493 | 27.9 | 56.5 | 19.8 | 23.7 | 1 |
| Example 339 | PGMEA | 30 | 132.16 | 493 | 27.9 | 56.5 | 19.8 | 23.7 | 1 |
| Example 340 | PGMEA | 30 | 132.16 | 493 | 27.9 | 56.5 | 19.8 | 23.7 | 1 |
| Example 341 | PGMEA | 30 | 132.16 | 493 | 27.9 | 56.5 | 19.8 | 23.7 | 1 |
| Example 342 | PGMEA | 30 | 132.16 | 493 | 27.9 | 56.5 | 19.8 | 23.7 | 1 |
| Example 343 | PGMEA | 30 | 132.16 | 493 | 27.9 | 56.5 | 19.8 | 23.7 | 1 |
| Example 344 | PGMEA | 30 | 132.16 | 493 | 27.9 | 56.5 | 19.8 | 23.7 | 1 |
| Example 345 | PGMEA | 30 | 132.16 | 493 | 27.9 | 56.5 | 19.8 | 23.7 | 1 |
| Example 346 | PGMEA | 30 | 132.16 | 493 | 27.9 | 56.5 | 19.8 | 23.7 | 1 |
| Example 347 | PGMEA | 30 | 132.16 | 493 | 27.9 | 56.5 | 19.8 | 23.7 | 1 |
| Example 348 | PGMEA | 30 | 132.16 | 493 | 27.9 | 56.5 | 19.8 | 23.7 | 1 |
| Example 349 | PGMEA | 30 | 132.16 | 493 | 27.9 | 56.5 | 19.8 | 23.7 | 1 |
| Example 350 | PGMEA | 30 | 132.16 | 493 | 27.9 | 56.5 | 19.8 | 23.7 | 1 |
| Example 351 | PGMEA | 30 | 132.16 | 493 | 27.9 | 56.5 | 19.8 | 23.7 | 1 |
| Example 352 | PGMEA | 30 | 132.16 | 493 | 27.9 | 56.5 | 19.8 | 23.7 | 1 |
| Example 353 | PGMEA | 30 | 132.16 | 493 | 27.9 | 56.5 | 19.8 | 23.7 | 1 |
| Example 354 | PGMEA | 30 | 132.16 | 493 | 27.9 | 56.5 | 19.8 | 23.7 | 1 |
| Example 355 | PGMEA | 30 | 132.16 | 493 | 27.9 | 56.5 | 19.8 | 23.7 | 1 |
| Example 356 | PGMEA | 30 | 132.16 | 493 | 27.9 | 56.5 | 19.8 | 23.7 | 1 |
| Example 357 | PGMEA | 30 | 132.16 | 493 | 27.9 | 56.5 | 19.8 | 23.7 | 1 |
| Example 358 | PGMEA | 30 | 132.16 | 493 | 27.9 | 56.5 | 19.8 | 23.7 | 1 |

TABLE 82-continued

| [Table 1-11-2] | Type | Content (% by mass) | Molar mass (g/mol) | Vapor pressure (Pa) | Surface tension (mN/m) | fd | fp | fh | HP |
|---|---|---|---|---|---|---|---|---|---|
| | | | | | Components of chemical liquid Main agent Organic solvent | | | | |
| Example 359 | PGMEA | 30 | 132.16 | 493 | 27.9 | 56.5 | 19.8 | 23.7 | 1 |
| Example 360 | PGMEA | 30 | 132.16 | 493 | 27.9 | 56.5 | 19.8 | 23.7 | 1 |
| Example 361 | PGMEA | 30 | 132.16 | 493 | 27.9 | 56.5 | 19.8 | 23.7 | 1 |
| Example 362 | PGMEA | 30 | 132.16 | 493 | 27.9 | 56.5 | 19.8 | 23.7 | 1 |
| Example 363 | PGMEA | 30 | 132.16 | 493 | 27.9 | 56.5 | 19.8 | 23.7 | 1 |

TABLE 83

| [Table 1-11-3] | Type | Content (% by mass) | Molar mass (g/mol) | Vapor pressure (Pa) | Surface tension (mN/m) | fd | fp | fh | HP | Vapor pressure (Pa) | Surface tension (mN/m) |
|---|---|---|---|---|---|---|---|---|---|---|---|
| | | | | | Components of chemical liquid Main agent Organic solvent | | | | | | |
| Example 333 | DMSO | 60 | 78.13 | 13 | 43.6 | 40.9 | 36.4 | 22.7 | 1 | 118 | 39.5 |
| Example 334 | DMSO | 60 | 78.13 | 13 | 43.6 | 40.9 | 36.4 | 22.7 | 1 | 118 | 39.5 |
| Example 335 | DMSO | 60 | 78.13 | 13 | 43.6 | 40.9 | 36.4 | 22.7 | 1 | 123 | 39.4 |
| Example 336 | DMSO | 60 | 78.13 | 13 | 43.6 | 40.9 | 36.4 | 22.7 | 1 | 118 | 39.2 |
| Example 337 | DMSO | 60 | 78.13 | 13 | 43.6 | 40.9 | 36.4 | 22.7 | 1 | 115 | 39.3 |
| Example 338 | DMSO | 60 | 78.13 | 13 | 43.6 | 40.9 | 36.4 | 22.7 | 1 | 115 | 39.3 |
| Example 339 | DMSO | 60 | 78.13 | 13 | 43.6 | 40.9 | 36.4 | 22.7 | 1 | 115 | 39.3 |
| Example 340 | DMSO | 60 | 78.13 | 13 | 43.6 | 40.9 | 36.4 | 22.7 | 1 | 118 | 39.8 |
| Example 341 | DMSO | 60 | 78.13 | 13 | 43.6 | 40.9 | 36.4 | 22.7 | 1 | 114 | 39.4 |
| Example 342 | DMSO | 60 | 78.13 | 13 | 43.6 | 40.9 | 36.4 | 22.7 | 1 | 114 | 39.3 |
| Example 343 | DMSO | 60 | 78.13 | 13 | 43.6 | 40.9 | 36.4 | 22.7 | 1 | 114 | 39.1 |
| Example 344 | DMSO | 60 | 78.13 | 13 | 43.6 | 40.9 | 36.4 | 22.7 | 1 | 180 | 38.9 |
| Example 345 | DMSO | 60 | 78.13 | 13 | 43.6 | 40.9 | 36.4 | 22.7 | 1 | 162 | 39.2 |
| Example 346 | EC | 60 | 88.06 | 67 | 41.5 | 42.0 | 47.0 | 11.0 | 1 | 171 | 37.5 |
| Example 347 | EC | 60 | 88.06 | 67 | 41.5 | 42.0 | 47.0 | 11.0 | 1 | 200 | 37.3 |
| Example 348 | EC | 60 | 88.06 | 67 | 41.5 | 42.0 | 47.0 | 11.0 | 1 | 178 | 37.5 |
| Example 349 | EC | 60 | 88.06 | 67 | 41.5 | 42.0 | 47.0 | 11.0 | 1 | 164 | 37.5 |
| Example 350 | EC | 60 | 88.06 | 67 | 41.5 | 42.0 | 47.0 | 11.0 | 1 | 166 | 37.6 |
| Example 351 | EC | 60 | 88.06 | 67 | 41.5 | 42.0 | 47.0 | 11.0 | 1 | 166 | 37.6 |
| Example 352 | EC | 60 | 88.06 | 67 | 41.5 | 42.0 | 47.0 | 11.0 | 1 | 170 | 37.5 |
| Example 353 | EC | 60 | 88.06 | 67 | 41.5 | 42.0 | 47.0 | 11.0 | 1 | 163 | 37.4 |
| Example 354 | EC | 60 | 88.06 | 67 | 41.5 | 42.0 | 47.0 | 11.0 | 1 | 161 | 37.5 |
| Example 355 | EC | 60 | 88.06 | 67 | 41.5 | 42.0 | 47.0 | 11.0 | 1 | 161 | 37.5 |
| Example 356 | EC | 60 | 88.06 | 67 | 41.5 | 42.0 | 47.0 | 11.0 | 1 | 161 | 37.5 |
| Example 357 | EC | 60 | 88.06 | 67 | 41.5 | 42.0 | 47.0 | 11.0 | 1 | 166 | 37.9 |
| Example 358 | EC | 60 | 88.06 | 67 | 41.5 | 42.0 | 47.0 | 11.0 | 1 | 159 | 37.6 |
| Example 359 | EC | 60 | 88.06 | 67 | 41.5 | 42.0 | 47.0 | 11.0 | 1 | 159 | 37.5 |
| Example 360 | PC | 60 | 102.09 | 53 | 40.9 | 47.5 | 42.8 | 9.7 | 1 | 161 | 36.4 |
| Example 361 | PC | 60 | 102.09 | 53 | 40.9 | 47.5 | 42.8 | 9.7 | 1 | 238 | 36.3 |
| Example 362 | PC | 60 | 102.09 | 53 | 40.9 | 47.5 | 42.8 | 9.7 | 1 | 218 | 36.5 |
| Example 363 | PC | 60 | 102.09 | 53 | 40.9 | 47.5 | 42.8 | 9.7 | 1 | 173 | 36.7 |

TABLE 84

| [Table 1-11-4] | Main agent Content (% by mass) | Surfactant Type | Surfactant Content (mass ppm) | Fe | Cr | Ni | Pb | Others | Total |
|---|---|---|---|---|---|---|---|---|---|
| | Components of chemical liquid | | | Components of chemical liquid Impurity metal Total content of impurity metal (mass ppt) | | | | | |
| Example 333 | Balance | A | 100 | 0.0072 | 0.0072 | 0.0072 | 0.0072 | 0.0864 | 0.1152 |
| | | E | 50 | | | | | | |
| Example 334 | Balance | A | 100 | 0.001 | 0.001 | 0.001 | 0.001 | 0.012 | 0.016 |
| Example 335 | Balance | I | 100 | 0.002 | 0.002 | 0.002 | 0.002 | 0.024 | 0.032 |

TABLE 84-continued

| | Components of chemical liquid | | | Components of chemical liquid | | | | | |
|---|---|---|---|---|---|---|---|---|---|
| | Main agent | Surfactant | | Impurity metal | | | | | |
| | Content | | Content | Total content of impurity metal (mass ppt) | | | | | |
| [Table 1-11-4] | (% by mass) | Type | (mass ppm) | Fe | Cr | Ni | Pb | Others | Total |
| Example 336 | Balance | A | 5 | 0.006 | 0.006 | 0.006 | 0.006 | 0.072 | 0.096 |
| Example 337 | Balance | A | 30,000 | 0.0048 | 0.0048 | 0.0048 | 0.0048 | 0.0576 | 0.0768 |
| Example 338 | Balance | A | 5 | 0.0024 | 0.0024 | 0.0024 | 0.0024 | 0.0288 | 0.0384 |
| Example 339 | Balance | A | 30,000 | 0.0072 | 0.0072 | 0.0072 | 0.0072 | 0.0864 | 0.1152 |
| Example 340 | Balance | A | 300 | 0.003 | 0.001 | 0.003 | 0.001 | 0.024 | 0.032 |
| Example 341 | Balance | J | 50 | 0.002 | 0.002 | 0.002 | 0.002 | 0.024 | 0.032 |
| Example 342 | Balance | C | 100 | 0.006 | 0.006 | 0.006 | 0.006 | 0.072 | 0.096 |
| Example 343 | Balance | A | 100 | 0.0048 | 0.0048 | 0.0048 | 0.0048 | 0.0576 | 0.0768 |
| | | B | 50 | | | | | | |
| Example 344 | Balance | A | 100 | 0.0024 | 0.0024 | 0.0024 | 0.0024 | 0.0288 | 0.0384 |
| Example 345 | Balance | I | 50 | 0.0072 | 0.0072 | 0.0072 | 0.0072 | 0.0864 | 0.1152 |
| Example 346 | Balance | D | 100 | 0.001 | 0.001 | 0.001 | 0.001 | 0.012 | 0.016 |
| Example 347 | Balance | J | 100 | 0.002 | 0.002 | 0.002 | 0.002 | 0.024 | 0.032 |
| Example 348 | Balance | A | 100 | 0.006 | 0.006 | 0.006 | 0.006 | 0.072 | 0.096 |
| Example 349 | Balance | H | 50 | 0.0048 | 0.0048 | 0.0048 | 0.0048 | 0.0576 | 0.0768 |
| Example 350 | Balance | B | 100 | 0.0024 | 0.0024 | 0.0024 | 0.0024 | 0.0288 | 0.0384 |
| Example 351 | Balance | B | 100 | 0.0072 | 0.0072 | 0.0072 | 0.0072 | 0.0864 | 0.1152 |
| Example 352 | Balance | I | 100 | 0.001 | 0.001 | 0.001 | 0.001 | 0.012 | 0.016 |
| Example 353 | Balance | E | 100 | 0.002 | 0.002 | 0.002 | 0.002 | 0.024 | 0.032 |
| Example 354 | Balance | A | 50 | 0.006 | 0.006 | 0.006 | 0.006 | 0.072 | 0.096 |
| Example 355 | Balance | C | 100 | 0.0048 | 0.0048 | 0.0048 | 0.0048 | 0.0576 | 0.0768 |
| Example 356 | Balance | E | 300 | 0.0024 | 0.0024 | 0.0024 | 0.0024 | 0.0288 | 0.0384 |
| Example 357 | Balance | E | 100 | 0.0072 | 0.0072 | 0.0072 | 0.0072 | 0.0864 | 0.1152 |
| Example 358 | Balance | E | 100 | 0.001 | 0.001 | 0.001 | 0.001 | 0.012 | 0.016 |
| Example 359 | Balance | A | 50 | 0.002 | 0.002 | 0.002 | 0.002 | 0.024 | 0.032 |
| Example 360 | Balance | A | 100 | 0.006 | 0.006 | 0.006 | 0.006 | 0.072 | 0.096 |
| Example 361 | Balance | B | 100 | 0.0048 | 0.0048 | 0.0048 | 0.0048 | 0.0576 | 0.0768 |
| Example 362 | Balance | F | 100 | 0.0024 | 0.0024 | 0.0024 | 0.0024 | 0.0288 | 0.0384 |
| Example 363 | Balance | C | 100 | 0.0072 | 0.0072 | 0.0072 | 0.0072 | 0.0864 | 0.1152 |

TABLE 85

| | Components of chemical liquid | | | | | | | | |
|---|---|---|---|---|---|---|---|---|---|
| | Impurity metal | | | | | | Content of organic impurity (mass ppm) | | Water |
| | Content of particles containing following impurity metal (mass ppt) | | | | | | | High-boiling- | Content |
| [Table 1-11-5] | Fe | Cr | Ni | Pb | Others | Total | Total | point component | (% by mass) |
| Example 333 | 0.0036 | 0.0036 | 0.0036 | 0.0036 | 0.0432 | 0.0576 | 150 | 0.6 | 0.10% |
| Example 334 | 0.001 | 0.001 | 0.001 | 0.001 | 0.012 | 0.016 | 135 | 0.5 | 0.10% |
| Example 335 | 0.001 | 0.001 | 0.001 | 0.001 | 0.012 | 0.016 | 404 | 1.6 | 0.10% |
| Example 336 | 0.003 | 0.003 | 0.003 | 0.003 | 0.036 | 0.048 | 485 | 1.9 | 0.10% |
| Example 337 | 0.0024 | 0.0024 | 0.0024 | 0.0024 | 0.0288 | 0.0384 | 291 | 1.2 | 0.10% |
| Example 338 | 0.0012 | 0.0012 | 0.0012 | 0.0012 | 0.0144 | 0.0192 | 204 | 0.8 | 0.10% |
| Example 339 | 0.0036 | 0.0036 | 0.0036 | 0.0036 | 0.0432 | 0.0576 | 183 | 0.7 | 0.10% |
| Example 340 | 0.0015 | 0.001 | 0.0015 | 0.001 | 0.015 | 0.02 | 92 | 0.4 | 0.10% |
| Example 341 | 0.001 | 0.001 | 0.001 | 0.001 | 0.012 | 0.016 | 247 | 1.0 | 0.10% |
| Example 342 | 0.003 | 0.003 | 0.003 | 0.003 | 0.036 | 0.048 | 297 | 1.2 | 0.10% |
| Example 343 | 0.0024 | 0.0024 | 0.0024 | 0.0024 | 0.0288 | 0.0384 | 208 | 0.8 | 0.10% |
| Example 344 | 0.0012 | 0.0012 | 0.0012 | 0.0012 | 0.0144 | 0.0192 | 187 | 0.7 | 0.10% |
| Example 345 | 0.0036 | 0.0036 | 0.0036 | 0.0036 | 0.0432 | 0.0576 | 374 | 1.5 | 0.10% |
| Example 346 | 0.001 | 0.001 | 0.001 | 0.001 | 0.012 | 0.016 | 449 | 1.8 | 0.10% |
| Example 347 | 0.001 | 0.001 | 0.001 | 0.001 | 0.012 | 0.016 | 539 | 2.2 | 0.10% |
| Example 348 | 0.003 | 0.003 | 0.003 | 0.003 | 0.036 | 0.048 | 377 | 1.5 | 0.10% |
| Example 349 | 0.0024 | 0.0024 | 0.0024 | 0.0024 | 0.0288 | 0.0384 | 339 | 1.4 | 0.10% |
| Example 350 | 0.0012 | 0.0012 | 0.0012 | 0.0012 | 0.0144 | 0.0192 | 170 | 0.7 | 0.10% |
| Example 351 | 0.0036 | 0.0036 | 0.0036 | 0.0036 | 0.0432 | 0.0576 | 458 | 1.8 | 0.10% |
| Example 352 | 0.001 | 0.001 | 0.001 | 0.001 | 0.012 | 0.016 | 550 | 2.2 | 0.10% |
| Example 353 | 0.001 | 0.001 | 0.001 | 0.001 | 0.012 | 0.016 | 385 | 1.5 | 0.10% |
| Example 354 | 0.003 | 0.003 | 0.003 | 0.003 | 0.036 | 0.048 | 346 | 1.4 | 0.10% |
| Example 355 | 0.0024 | 0.0024 | 0.0024 | 0.0024 | 0.0288 | 0.0384 | 416 | 1.7 | 0.10% |
| Example 356 | 0.0012 | 0.0012 | 0.0012 | 0.0012 | 0.0144 | 0.0192 | 291 | 1.2 | 0.10% |
| Example 357 | 0.0036 | 0.0036 | 0.0036 | 0.0036 | 0.0432 | 0.0576 | 262 | 1.0 | 0.10% |
| Example 358 | 0.001 | 0.001 | 0.001 | 0.001 | 0.012 | 0.016 | 236 | 0.9 | 0.10% |
| Example 359 | 0.001 | 0.001 | 0.001 | 0.001 | 0.012 | 0.016 | 118 | 0.5 | 0.10% |

TABLE 85-continued

| | Components of chemical liquid | | | | | | | |
|---|---|---|---|---|---|---|---|---|
| | Impurity metal | | | | | | Content of organic impurity (mass ppm) | | Water |
| | Content of particles containing following impurity metal (mass ppt) | | | | | | High-boiling- | Content |
| [Table 1-11-5] | Fe | Cr | Ni | Pb | Others | Total | Total | point component | (% by mass) |
| Example 360 | 0.003 | 0.003 | 0.003 | 0.003 | 0.036 | 0.048 | 318 | 1.3 | 0.10% |
| Example 361 | 0.0024 | 0.0024 | 0.0024 | 0.0024 | 0.0288 | 0.0384 | 382 | 1.5 | 0.10% |
| Example 362 | 0.0012 | 0.0012 | 0.0012 | 0.0012 | 0.0144 | 0.0192 | 267 | 1.1 | 0.10% |
| Example 363 | 0.0036 | 0.0036 | 0.0036 | 0.0036 | 0.0432 | 0.0576 | 241 | 1.0 | 0.10% |

TABLE 86

| | Physical properties of chemical liquid | | | Evaluation | | | | | |
|---|---|---|---|---|---|---|---|---|---|
| | | | | | | | Type of resist composition | | |
| | | | | | | | Resist saving performance | | |
| | Number of coarse particles | Content of surfactant/total content of | Content of surfactant/content of high-boiling- | Defect inhibition | Affinity | | | Film thickness | |
| [Table 1-11-6] | (number/ml) | particles | point component | performance | Rsq1 | SRsq | Uniformity | controllability | Developability |
| Example 333 | 3 | $2.6 \times 10^9$ | $2.5 \times 10^2$ | A | 1 | A | A | A | A | A |
| Example 334 | 3 | $6.3 \times 10^9$ | $1.9 \times 10^2$ | AA | 1 | A | A | A | A | A |
| Example 335 | 8 | $6.3 \times 10^9$ | $6.2 \times 10^1$ | A | 1 | A | A | A | A | A |
| Example 336 | 10 | $1.0 \times 10^8$ | $2.6 \times 10^0$ | A | 1 | A | A | A | A | A |
| Example 337 | 6 | $7.8 \times 10^{11}$ | $2.6 \times 10^4$ | B | 1 | A | A | A | A | A |
| Example 338 | 4 | $2.6 \times 10^8$ | $6.1 \times 10^0$ | A | 1 | A | A | A | A | A |
| Example 339 | 4 | $5.2 \times 10^{11}$ | $4.1 \times 10^4$ | B | 1 | A | A | A | A | A |
| Example 340 | 2 | $1.5 \times 10^{10}$ | $8.2 \times 10^2$ | AA | 1 | A | A | A | A | A |
| Example 341 | 5 | $3.1 \times 10^9$ | $5.1 \times 10^1$ | A | 1 | A | A | A | A | A |
| Example 342 | 6 | $2.1 \times 10^9$ | $8.4 \times 10^1$ | AA | 1 | A | A | A | A | A |
| Example 343 | 4 | $3.9 \times 10^9$ | $1.8 \times 10^2$ | AA | 1 | A | A | A | A | A |
| Example 344 | 4 | $5.2 \times 10^9$ | $1.3 \times 10^2$ | AA | 1 | A | A | A | A | A |
| Example 345 | 7 | $8.7 \times 10^8$ | $3.3 \times 10^1$ | A | 1 | A | A | A | A | A |
| Example 346 | 9 | $6.3 \times 10^9$ | $5.6 \times 10^1$ | A | 1 | A | A | A | A | A |
| Example 347 | 11 | $6.3 \times 10^9$ | $4.6 \times 10^1$ | A | 1 | A | A | A | A | A |
| Example 348 | 8 | $2.1 \times 10^9$ | $6.6 \times 10^1$ | AA | 1 | A | A | A | A | A |
| Example 349 | 7 | $1.3 \times 10^9$ | $3.7 \times 10^1$ | A | 1 | A | A | A | A | A |
| Example 350 | 3 | $5.2 \times 10^9$ | $1.5 \times 10^2$ | AA | 1 | A | A | A | A | A |
| Example 351 | 9 | $1.7 \times 10^9$ | $5.5 \times 10^1$ | AA | 1 | A | A | A | A | A |
| Example 352 | 11 | $6.3 \times 10^9$ | $4.5 \times 10^1$ | A | 1 | A | A | A | A | A |
| Example 353 | 8 | $6.3 \times 10^9$ | $6.5 \times 10^1$ | A | 1 | A | A | A | A | A |
| Example 354 | 7 | $1.0 \times 10^9$ | $3.6 \times 10^1$ | AA | 1 | A | A | A | A | A |
| Example 355 | 8 | $2.6 \times 10^9$ | $6.0 \times 10^1$ | AA | 1 | A | A | A | A | A |
| Example 356 | 6 | $1.6 \times 10^{10}$ | $2.6 \times 10^2$ | A | 1 | A | A | A | A | A |
| Example 357 | 5 | $1.7 \times 10^9$ | $9.5 \times 10^1$ | A | 1 | A | A | A | A | A |
| Example 358 | 5 | $6.3 \times 10^9$ | $1.1 \times 10^2$ | A | 1 | A | A | A | A | A |
| Example 359 | 2 | $3.1 \times 10^9$ | $1.1 \times 10^2$ | AA | 1 | A | A | A | A | A |
| Example 360 | 6 | $2.1 \times 10^9$ | $7.9 \times 10^1$ | AA | 1 | A | A | A | A | A |
| Example 361 | 8 | $2.6 \times 10^9$ | $6.5 \times 10^1$ | AA | 1 | A | A | A | A | A |
| Example 362 | 5 | $5.2 \times 10^9$ | $9.4 \times 10^1$ | A | 1 | A | A | A | A | A |
| Example 363 | 5 | $1.7 \times 10^9$ | $1.0 \times 10^2$ | AA | 1 | A | A | A | A | A |

TABLE 87

| [Table 1-11-7] | | Evaluation | | | | | | | | | |
|---|---|---|---|---|---|---|---|---|---|---|---|
| | | Type of resist composition | | | | | Type of resist composition | | | | |
| | | Resist saving performance | | | | | Resist saving performance | | | | |
| | | Affinity | | | Film thickness | | | Affinity | | | Film thickness |
| | Rsq1 | SRsq | Uniformity | controllability | Developability | | Rsq1 | SRsq | Uniformity | controllability | Developability |
| Example 333 | 2 | A | A | A | A | A | 3 | A | A | A | A | A |
| Example 334 | 2 | A | A | A | A | A | 3 | A | A | A | A | A |
| Example 335 | 2 | A | A | A | A | A | 3 | A | A | A | A | A |
| Example 336 | 2 | A | A | A | A | A | 3 | A | A | A | A | A |
| Example 337 | 2 | A | A | A | A | A | 3 | A | A | A | A | A |
| Example 338 | 2 | A | A | A | A | A | 3 | A | A | A | A | A |
| Example 339 | 2 | A | A | A | A | A | 3 | A | A | A | A | A |
| Example 340 | 2 | A | A | A | A | A | 3 | A | A | A | A | A |
| Example 341 | 2 | A | A | A | A | A | 3 | A | A | A | A | A |
| Example 342 | 2 | A | A | A | A | A | 3 | A | A | A | A | A |
| Example 343 | 2 | A | A | A | A | A | 3 | A | A | A | A | A |
| Example 344 | 2 | A | A | A | A | A | 3 | A | A | A | A | A |
| Example 345 | 2 | A | A | A | A | A | 3 | A | A | A | A | A |
| Example 346 | 2 | A | A | A | A | A | 3 | A | A | A | A | A |
| Example 347 | 2 | A | A | A | A | A | 3 | A | A | A | A | A |
| Example 348 | 2 | A | A | A | A | A | 3 | A | A | A | A | A |
| Example 349 | 2 | A | A | A | A | A | 3 | A | A | A | A | A |
| Example 350 | 2 | A | A | A | A | A | 3 | A | A | A | A | A |
| Example 351 | 2 | A | A | A | A | A | 3 | A | A | A | A | A |
| Example 352 | 2 | A | A | A | A | A | 3 | A | A | A | A | A |
| Example 353 | 2 | A | A | A | A | A | 3 | A | A | A | A | A |
| Example 354 | 2 | A | A | A | A | A | 3 | A | A | A | A | A |
| Example 355 | 2 | A | A | A | A | A | 3 | A | A | A | A | A |
| Example 356 | 2 | A | A | A | A | A | 3 | A | A | A | A | A |
| Example 357 | 2 | A | A | A | A | A | 3 | A | A | A | A | A |
| Example 358 | 2 | A | A | A | A | A | 3 | A | A | A | A | A |
| Example 359 | 2 | A | A | A | A | A | 3 | A | A | A | A | A |
| Example 360 | 2 | A | A | A | A | A | 3 | A | A | A | A | A |
| Example 361 | 2 | A | A | A | A | A | 3 | A | A | A | A | A |
| Example 362 | 2 | A | A | A | A | A | 3 | A | A | A | A | A |
| Example 363 | 2 | A | A | A | A | A | 3 | A | A | A | A | A |

TABLE 88

| [Table 1-11-8] | | Evaluation | | | | | | |
|---|---|---|---|---|---|---|---|---|
| | | Type of resist composition | | | | | | |
| | | Resist saving performance | | | | | Evaluation of p-CMP defect inhibition performance | Evaluation of ashing residue removing performance |
| | | Affinity | | | Film thickness | | | |
| | Rsq1 | SRsq | Uniformity | controllability | Developability | | | |
| Example 333 | 4 | A | A | A | A | A | A | A |
| Example 334 | 4 | A | A | A | A | A | A | A |
| Example 335 | 4 | A | A | A | A | A | A | A |
| Example 336 | 4 | A | A | A | A | A | A | A |
| Example 337 | 4 | A | A | A | A | A | A | A |
| Example 338 | 4 | A | A | A | A | A | A | A |
| Example 339 | 4 | A | A | A | A | A | A | A |
| Example 340 | 4 | A | A | A | A | A | A | A |
| Example 341 | 4 | A | A | A | A | A | A | A |
| Example 342 | 4 | A | A | A | A | A | A | A |
| Example 343 | 4 | A | A | A | A | A | A | A |
| Example 344 | 4 | A | A | A | A | A | A | A |
| Example 345 | 4 | A | A | A | A | A | A | A |
| Example 346 | 4 | A | A | A | A | A | A | A |
| Example 347 | 4 | A | A | A | A | A | A | A |
| Example 348 | 4 | A | A | A | A | A | A | A |
| Example 349 | 4 | A | A | A | A | A | A | A |
| Example 350 | 4 | A | A | A | A | A | A | A |
| Example 351 | 4 | A | A | A | A | A | A | A |
| Example 352 | 4 | A | A | A | A | A | A | A |
| Example 353 | 4 | A | A | A | A | A | A | A |

TABLE 88-continued

| [Table 1-11-8] | Evaluation Type of resist composition | | | | | | |
|---|---|---|---|---|---|---|---|
| | Resist saving performance | | | | | Evaluation of p-CMP defect inhibition performance | Evaluation of ashing residue removing performance |
| | Affinity | | | Film thickness | | | |
| | Rsq1 | SRsq | Uniformity | controllability | Developability | | |
| Example 354 | 4 | A | A | A | A | A | A | A |
| Example 355 | 4 | A | A | A | A | A | A | A |
| Example 356 | 4 | A | A | A | A | A | A | A |
| Example 357 | 4 | A | A | A | A | A | A | A |
| Example 358 | 4 | A | A | A | A | A | A | A |
| Example 359 | 4 | A | A | A | A | A | A | A |
| Example 360 | 4 | A | A | A | A | A | A | A |
| Example 361 | 4 | A | A | A | A | A | A | A |
| Example 362 | 4 | A | A | A | A | A | A | A |
| Example 363 | 4 | A | A | A | A | A | A | A |

TABLE 89

| [Table 1-12-1] | Components of chemical liquid Main agent Organic solvent | | | | | | | | |
|---|---|---|---|---|---|---|---|---|---|
| | Type | Content (% by mass) | Molar mass (g/mol) | Vapor pressure (Pa) | Surface tension (mN/m) | fd | fp | fh | HP |
| Example 364 | DEGDME | 10 | 134.18 | 520 | 28.0 | 56.9 | 21.0 | 22.1 | 1 |
| Example 365 | DEGDEE | 10 | 162.23 | 253 | 29.0 | 60.4 | 19.6 | 20.0 | 1 |
| Example 366 | TriEGDME | 10 | 178.23 | 13 | 28.0 | 56.4 | 20.9 | 22.7 | 1 |
| Example 367 | TetraEGDME | 10 | 222.28 | 13 | 27.0 | 55.6 | 21.1 | 23.2 | 1 |
| Example 368 | TEGMBE | 10 | 220.31 | 13 | 28.0 | 48.5 | 18.7 | 32.8 | 1 |
| Example 369 | DEGMBE | 10 | 162.23 | 117 | 29.0 | 59.4 | 18.1 | 22.5 | 1 |
| Example 370 | Anisole | 10 | 108.14 | 63 | 30.0 | 64.3 | 17.0 | 18.7 | 1 |
| Example 371 | 14-DMB | 10 | 138.17 | 1 | 30.0 | 59.0 | 20.6 | 20.3 | 1 |
| Example 372 | 12-DMB | 10 | 138.17 | 1 | 30.0 | 60.6 | 20.2 | 19.2 | 1 |
| Example 373 | 13-DMB | 10 | 138.17 | 1 | 30.0 | 61.6 | 19.9 | 18.5 | 1 |
| Example 374 | 14-DPB | 10 | 262.31 | 1 | 33.0 | 63.3 | 18.5 | 18.2 | 1 |
| Example 375 | 4-MTT | 10 | 122.17 | 1 | 32.0 | 64.8 | 17.4 | 17.8 | 1 |
| Example 376 | PNT | 10 | 122.17 | 1 | 31.0 | 66.3 | 16.3 | 17.4 | 1 |
| Example 377 | DEGME | 10 | 120.15 | 13 | 28.0 | 44.3 | 20.8 | 34.9 | 1 |
| Example 378 | DME | 10 | 90.12 | 693 | 29.0 | 55.9 | 22.8 | 21.3 | 1 |
| Example 379 | DEE | 10 | 118.18 | 627 | 29.0 | 62.2 | 19.9 | 17.8 | 1 |
| Example 380 | DEGIBE | 10 | 162.23 | 133 | 29.0 | 61.9 | 18.7 | 19.4 | 1 |
| Example 381 | DEGDME | 10 | 134.18 | 520 | 28.0 | 56.9 | 21.0 | 22.1 | 1 |
| Example 382 | DEGDEE | 10 | 162.23 | 253 | 29.0 | 60.4 | 19.6 | 20.0 | 1 |
| Example 383 | TriEGDME | 10 | 178.23 | 13 | 28.0 | 56.4 | 20.9 | 22.7 | 1 |
| Example 384 | TetraEGDME | 10 | 222.28 | 13 | 27.0 | 55.6 | 21.1 | 23.2 | 1 |
| Example 385 | TEGMBE | 10 | 220.31 | 13 | 28.0 | 48.5 | 18.7 | 32.8 | 1 |
| Example 386 | DEGMBE | 10 | 162.23 | 117 | 29.0 | 59.4 | 18.1 | 22.5 | 1 |
| Example 387 | Anisole | 10 | 108.14 | 63 | 30.0 | 64.3 | 17.0 | 18.7 | 1 |
| Example 388 | 14-DMB | 10 | 138.17 | 1 | 30.0 | 59.0 | 20.6 | 20.3 | 1 |
| Example 389 | 12-DMB | 10 | 138.17 | 1 | 30.0 | 60.6 | 20.2 | 19.2 | 1 |
| Example 390 | 13-DMB | 10 | 138.17 | 1 | 30.0 | 61.6 | 19.9 | 18.5 | 1 |
| Example 391 | 14-DPB | 10 | 262.31 | 1 | 33.0 | 63.3 | 18.5 | 18.2 | 1 |
| Example 392 | 4-MTT | 10 | 122.17 | 1 | 32.0 | 64.8 | 17.4 | 17.8 | 1 |
| Example 393 | PNT | 10 | 122.17 | 1 | 31.0 | 66.3 | 16.3 | 17.4 | 1 |
| Example 394 | DEGME | 10 | 120.15 | 13 | 28.0 | 44 | 21 | 35 | 1 |
| Example 395 | DME | 10 | 90.12 | 693 | 29.0 | 56 | 23 | 21 | 1 |
| Example 396 | DEE | 10 | 118.18 | 627 | 29.0 | 62 | 20 | 18 | 1 |
| Example 397 | DEGIBE | 10 | 162.23 | 133 | 29.0 | 62 | 19 | 19 | 1 |

TABLE 90

Components of chemical liquid
Main agent
Organic solvent

| [Table 1-12-2] | Type | Content (% by mass) | Molar mass (g/mol) | Vapor pressure (Pa) | Surface tension (mN/m) | fd | fp | fh | HP |
| --- | --- | --- | --- | --- | --- | --- | --- | --- | --- |
| Example 364 | PGMEA | 30 | 132.16 | 493 | 27.9 | 56.5 | 19.8 | 23.7 | 1 |
| Example 365 | PGMEA | 30 | 132.16 | 493 | 27.9 | 56.5 | 19.8 | 23.7 | 1 |
| Example 366 | PGMEA | 30 | 132.16 | 493 | 27.9 | 56.5 | 19.8 | 23.7 | 1 |
| Example 367 | PGMEA | 30 | 132.16 | 493 | 27.9 | 56.5 | 19.8 | 23.7 | 1 |
| Example 368 | PGMEA | 30 | 132.16 | 493 | 27.9 | 56.5 | 19.8 | 23.7 | 1 |
| Example 369 | PGMEA | 30 | 132.16 | 493 | 27.9 | 56.5 | 19.8 | 23.7 | 1 |
| Example 370 | PGMEA | 30 | 132.16 | 493 | 27.9 | 56.5 | 19.8 | 23.7 | 1 |
| Example 371 | PGMEA | 30 | 132.16 | 493 | 27.9 | 56.5 | 19.8 | 23.7 | 1 |
| Example 372 | PGMEA | 30 | 132.16 | 493 | 27.9 | 56.5 | 19.8 | 23.7 | 1 |
| Example 373 | PGMEA | 30 | 132.16 | 493 | 27.9 | 56.5 | 19.8 | 23.7 | 1 |
| Example 374 | PGMEA | 30 | 132.16 | 493 | 27.9 | 56.5 | 19.8 | 23.7 | 1 |
| Example 375 | PGMEA | 30 | 132.16 | 493 | 27.9 | 56.5 | 19.8 | 23.7 | 1 |
| Example 376 | PGMEA | 30 | 132.16 | 493 | 27.9 | 56.5 | 19.8 | 23.7 | 1 |
| Example 377 | PGMEA | 30 | 132.16 | 493 | 27.9 | 56.5 | 19.8 | 23.7 | 1 |
| Example 378 | PGMEA | 30 | 132.16 | 493 | 27.9 | 56.5 | 19.8 | 23.7 | 1 |
| Example 379 | PGMEA | 30 | 132.16 | 493 | 27.9 | 56.5 | 19.8 | 23.7 | 1 |
| Example 380 | PGMEA | 30 | 132.16 | 493 | 27.9 | 56.5 | 19.8 | 23.7 | 1 |
| Example 381 | PGMEA | 30 | 132.16 | 493 | 27.9 | 56.5 | 19.8 | 23.7 | 1 |
| Example 382 | PGMEA | 30 | 132.16 | 493 | 27.9 | 56.5 | 19.8 | 23.7 | 1 |
| Example 383 | PGMEA | 30 | 132.16 | 493 | 27.9 | 56.5 | 19.8 | 23.7 | 1 |
| Example 384 | PGMEA | 30 | 132.16 | 493 | 27.9 | 56.5 | 19.8 | 23.7 | 1 |
| Example 385 | PGMEA | 30 | 132.16 | 493 | 27.9 | 56.5 | 19.8 | 23.7 | 1 |
| Example 386 | PGMEA | 30 | 132.16 | 493 | 27.9 | 56.5 | 19.8 | 23.7 | 1 |
| Example 387 | PGMEA | 30 | 132.16 | 493 | 27.9 | 56.5 | 19.8 | 23.7 | 1 |
| Example 388 | PGMEA | 30 | 132.16 | 493 | 27.9 | 56.5 | 19.8 | 23.7 | 1 |
| Example 389 | PGMEA | 30 | 132.16 | 493 | 27.9 | 56.5 | 19.8 | 23.7 | 1 |
| Example 390 | PGMEA | 30 | 132.16 | 493 | 27.9 | 56.5 | 19.8 | 23.7 | 1 |
| Example 391 | PGMEA | 30 | 132.16 | 493 | 27.9 | 56.5 | 19.8 | 23.7 | 1 |
| Example 392 | PGMEA | 30 | 132.16 | 493 | 27.9 | 56.5 | 19.8 | 23.7 | 1 |
| Example 393 | PGMEA | 30 | 132.16 | 493 | 27.9 | 56.5 | 19.8 | 23.7 | 1 |
| Example 394 | Anisole | 10 | 108.14 | 63 | 30.0 | 64.3 | 17.0 | 18.7 | 1 |
| Example 395 | Anisole | 10 | 108.14 | 63 | 30.0 | 64.3 | 17.0 | 18.7 | 1 |
| Example 396 | Anisole | 10 | 108.14 | 63 | 30.0 | 64.3 | 17.0 | 18.7 | 1 |
| Example 397 | Anisole | 10 | 108.14 | 63 | 30.0 | 64.3 | 17.0 | 18.7 | 1 |

TABLE 91

Components of chemical liquid
Main agent

Organic solvent

| [Table 1-12-3] | Type | Content (% by mass) | Molar mass (g/mol) | Vapor pressure (Pa) | Surface tension (mN/m) | fd | fp | fh | HP | Vapor pressure (Pa) | Surface tension (mN/m) |
| --- | --- | --- | --- | --- | --- | --- | --- | --- | --- | --- | --- |
| Example 364 | PC | 60 | 102.09 | 53 | 40.9 | 47.5 | 42.8 | 9.7 | 1 | 205 | 36.5 |
| Example 365 | PC | 60 | 102.09 | 53 | 40.9 | 47.5 | 42.8 | 9.7 | 1 | 181 | 36.7 |
| Example 366 | PC | 60 | 102.09 | 53 | 40.9 | 47.5 | 42.8 | 9.7 | 1 | 165 | 36.7 |
| Example 367 | PC | 60 | 102.09 | 53 | 40.9 | 47.5 | 42.8 | 9.7 | 1 | 167 | 36.7 |
| Example 368 | PC | 60 | 102.09 | 53 | 40.9 | 47.5 | 42.8 | 9.7 | 1 | 167 | 36.8 |
| Example 369 | PC | 60 | 102.09 | 53 | 40.9 | 47.5 | 42.8 | 9.7 | 1 | 172 | 36.7 |
| Example 370 | PC | 60 | 102.09 | 53 | 40.9 | 47.5 | 42.8 | 9.7 | 1 | 164 | 36.5 |
| Example 371 | PC | 60 | 102.09 | 53 | 40.9 | 47.5 | 42.8 | 9.7 | 1 | 162 | 36.7 |
| Example 372 | PC | 60 | 102.09 | 53 | 40.9 | 47.5 | 42.8 | 9.7 | 1 | 162 | 36.7 |
| Example 373 | PC | 60 | 102.09 | 53 | 40.9 | 47.5 | 42.8 | 9.7 | 1 | 162 | 36.7 |
| Example 374 | PC | 60 | 102.09 | 53 | 40.9 | 47.5 | 42.8 | 9.7 | 1 | 168 | 37.1 |
| Example 375 | PC | 60 | 102.09 | 53 | 40.9 | 47.5 | 42.8 | 9.7 | 1 | 160 | 36.8 |
| Example 376 | PC | 60 | 102.09 | 53 | 40.9 | 47.5 | 42.8 | 9.7 | 1 | 160 | 36.7 |
| Example 377 | NMP | 60 | 99.13 | 40 | 41.3 | 48.0 | 32.8 | 19.2 | 1 | 150 | 36.8 |
| Example 378 | NMP | 60 | 99.13 | 40 | 41.3 | 48.0 | 32.8 | 19.2 | 1 | 226 | 36.6 |
| Example 379 | NMP | 60 | 99.13 | 40 | 41.3 | 48.0 | 32.8 | 19.2 | 1 | 206 | 36.8 |
| Example 380 | NMP | 60 | 99.13 | 40 | 41.3 | 48.0 | 32.8 | 19.2 | 1 | 162 | 37.0 |
| Example 381 | NMP | 60 | 99.13 | 40 | 41.3 | 48.0 | 32.8 | 19.2 | 1 | 193 | 36.9 |
| Example 382 | NMP | 60 | 99.13 | 40 | 41.3 | 48.0 | 32.8 | 19.2 | 1 | 170 | 37.0 |
| Example 383 | NMP | 60 | 99.13 | 40 | 41.3 | 48.0 | 32.8 | 19.2 | 1 | 154 | 37.0 |
| Example 384 | NMP | 60 | 99.13 | 40 | 41.3 | 48.0 | 32.8 | 19.2 | 1 | 156 | 37.1 |
| Example 385 | NMP | 60 | 99.13 | 40 | 41.3 | 48.0 | 32.8 | 19.2 | 1 | 156 | 37.1 |

TABLE 91-continued

| [Table 1-12-3] | Type | Content (% by mass) | Molar mass (g/mol) | Vapor pressure (Pa) | Surface tension (mN/m) | fd | fp | fh | HP | Vapor pressure (Pa) | Surface tension (mN/m) |
|---|---|---|---|---|---|---|---|---|---|---|---|
| Example 386 | NMP | 60 | 99.13 | 40 | 41.3 | 48.0 | 32.8 | 19.2 | 1 | 160 | 37.0 |
| Example 387 | NMP | 60 | 99.13 | 40 | 41.3 | 48.0 | 32.8 | 19.2 | 1 | 154 | 36.9 |
| Example 388 | NMP | 60 | 99.13 | 40 | 41.3 | 48.0 | 32.8 | 19.2 | 1 | 151 | 37.0 |
| Example 389 | NMP | 60 | 99.13 | 40 | 41.3 | 48.0 | 32.8 | 19.2 | 1 | 151 | 37.0 |
| Example 390 | NMP | 60 | 99.13 | 40 | 41.3 | 48.0 | 32.8 | 19.2 | 1 | 151 | 37.0 |
| Example 391 | NMP | 60 | 99.13 | 40 | 41.3 | 48.0 | 32.8 | 19.2 | 1 | 157 | 37.4 |
| Example 392 | NMP | 60 | 99.13 | 40 | 41.3 | 48.0 | 32.8 | 19.2 | 1 | 149 | 37.1 |
| Example 393 | NMP | 60 | 99.13 | 40 | 41.3 | 48.0 | 32.8 | 19.2 | 1 | 149 | 37.1 |
| Example 394 | nBA | 80 | 116.16 | 1,200 | 24.8 | 60.5 | 17.2 | 22.2 | 1.00 | 964 | 25.7 |
| Example 395 | nBA | 80 | 116.16 | 1,200 | 24.8 | 60.5 | 17.2 | 22.2 | 1.00 | 1,019 | 25.9 |
| Example 396 | nBA | 80 | 116.16 | 1,200 | 24.8 | 60.5 | 17.2 | 22.2 | 1.00 | 1,022 | 25.8 |
| Example 397 | nBA | 80 | 116.16 | 1,200 | 24.8 | 60.5 | 17.2 | 22.2 | 1.00 | 997 | 25.7 |

TABLE 92

| | Components of chemical liquid Main agent | Surfactant | | Components of chemical liquid Impurity metal | | | | | |
|---|---|---|---|---|---|---|---|---|---|
| | Content | | Content | Total content of impurity metal (mass ppt) | | | | | |
| [Table 1-12-4] | (% by mass) | Type | (mass ppm) | Fe | Cr | Ni | Pb | Others | Total |
| Example 364 | Balance | C | 100 | 0.005 | 0.001 | 0.003 | 0.001 | 0.03 | 0.04 |
| Example 365 | Balance | A | 100 | 0.002 | 0.002 | 0.002 | 0.002 | 0.024 | 0.032 |
| Example 366 | Balance | A | 100 | 0.006 | 0.006 | 0.006 | 0.006 | 0.072 | 0.096 |
| Example 367 | Balance | A | 50 | 0.0048 | 0.0048 | 0.0048 | 0.0048 | 0.0576 | 0.0768 |
| Example 368 | Balance | A | 100 | 0.0024 | 0.0024 | 0.0024 | 0.0024 | 0.0288 | 0.0384 |
| Example 369 | Balance | I | 100 | 0.0072 | 0.0072 | 0.0072 | 0.0072 | 0.0864 | 0.1152 |
| Example 370 | Balance | A | 50 | 0.001 | 0.001 | 0.001 | 0.001 | 0.012 | 0.016 |
| Example 371 | Balance | E | 100 | 0.002 | 0.002 | 0.002 | 0.002 | 0.024 | 0.032 |
| Example 372 | Balance | C | 100 | 0.006 | 0.006 | 0.006 | 0.006 | 0.072 | 0.096 |
| Example 373 | Balance | A | 300 | 0.0048 | 0.0048 | 0.0048 | 0.0048 | 0.0576 | 0.0768 |
| Example 374 | Balance | F | 50 | 0.0024 | 0.0024 | 0.0024 | 0.0024 | 0.0288 | 0.0384 |
| Example 375 | Balance | A | 100 | 0.0072 | 0.0072 | 0.0072 | 0.0072 | 0.0864 | 0.1152 |
| | | E | 50 | | | | | | |
| Example 376 | Balance | A | 100 | 0.004 | 0.001 | 0.001 | 0.001 | 0.021 | 0.028 |
| Example 377 | Balance | I | 100 | 0.002 | 0.002 | 0.002 | 0.002 | 0.024 | 0.032 |
| Example 378 | Balance | A | 5 | 0.006 | 0.006 | 0.006 | 0.006 | 0.072 | 0.096 |
| Example 379 | Balance | A | 30,000 | 0.0048 | 0.0048 | 0.0048 | 0.0048 | 0.0576 | 0.0768 |
| Example 380 | Balance | A | 5 | 0.0024 | 0.0024 | 0.0024 | 0.0024 | 0.0288 | 0.0384 |
| Example 381 | Balance | E | 100 | 0.0072 | 0.0072 | 0.0072 | 0.0072 | 0.0864 | 0.1152 |
| Example 382 | Balance | A | 300 | 0.001 | 0.001 | 0.001 | 0.001 | 0.012 | 0.016 |
| Example 383 | Balance | J | 50 | 0.002 | 0.002 | 0.002 | 0.002 | 0.024 | 0.032 |
| Example 384 | Balance | C | 100 | 0.006 | 0.006 | 0.006 | 0.006 | 0.072 | 0.096 |
| Example 385 | Balance | A | 100 | 0.0048 | 0.0048 | 0.0048 | 0.0048 | 0.0576 | 0.0768 |
| | | B | 50 | | | | | | |
| Example 386 | Balance | A | 100 | 0.0024 | 0.0024 | 0.0024 | 0.0024 | 0.0288 | 0.0384 |
| Example 387 | Balance | I | 50 | 0.0072 | 0.0072 | 0.0072 | 0.0072 | 0.0864 | 0.1152 |
| Example 388 | Balance | D | 100 | 0.001 | 0.001 | 0.001 | 0.001 | 0.012 | 0.016 |
| Example 389 | Balance | A | 50 | 0.002 | 0.002 | 0.002 | 0.002 | 0.024 | 0.032 |
| Example 390 | Balance | J | 100 | 0.006 | 0.006 | 0.006 | 0.006 | 0.072 | 0.096 |
| Example 391 | Balance | H | 50 | 0.0048 | 0.0048 | 0.0048 | 0.0048 | 0.0576 | 0.0768 |
| Example 392 | Balance | B | 100 | 0.0024 | 0.0024 | 0.0024 | 0.0024 | 0.0288 | 0.0384 |
| Example 393 | Balance | B | 100 | 0.0072 | 0.0072 | 0.0072 | 0.0072 | 0.0864 | 0.1152 |
| Example 394 | Balance | I | 100 | 0.001 | 0.001 | 0.001 | 0.001 | 0.012 | 0.016 |
| Example 395 | Balance | E | 100 | 0.002 | 0.002 | 0.002 | 0.002 | 0.024 | 0.032 |
| Example 396 | Balance | A | 50 | 0.006 | 0.006 | 0.006 | 0.006 | 0.072 | 0.096 |
| Example 397 | Balance | C | 100 | 0.0048 | 0.0048 | 0.0048 | 0.0048 | 0.0576 | 0.0768 |

TABLE 93

Components of chemical liquid

| [Table 1-12-5] | Impurity metal Content of particles containing following impurity metal (mass ppt) | | | | | | Content of organic impurity (mass ppm) | | Water Content |
|---|---|---|---|---|---|---|---|---|---|
| | Fe | Cr | Ni | Pb | Others | Total | Total | High-boiling-point component | (% by mass) |
| Example 364 | 0.0025 | 0.001 | 0.0015 | 0.001 | 0.018 | 0.024 | 120 | 0.5 | 0.10% |
| Example 365 | 0.001 | 0.001 | 0.001 | 0.001 | 0.012 | 0.016 | 325 | 1.3 | 0.10% |
| Example 366 | 0.003 | 0.003 | 0.003 | 0.003 | 0.036 | 0.048 | 390 | 1.6 | 0.10% |
| Example 367 | 0.0024 | 0.0024 | 0.0024 | 0.0024 | 0.0288 | 0.0384 | 273 | 1.1 | 0.10% |
| Example 368 | 0.0012 | 0.0012 | 0.0012 | 0.0012 | 0.0144 | 0.0192 | 245 | 1.0 | 0.10% |
| Example 369 | 0.0036 | 0.0036 | 0.0036 | 0.0036 | 0.0432 | 0.0576 | 123 | 0.5 | 0.10% |
| Example 370 | 0.001 | 0.001 | 0.001 | 0.001 | 0.012 | 0.016 | 331 | 1.3 | 0.10% |
| Example 371 | 0.001 | 0.001 | 0.001 | 0.001 | 0.012 | 0.016 | 398 | 1.6 | 0.10% |
| Example 372 | 0.003 | 0.003 | 0.003 | 0.003 | 0.036 | 0.048 | 278 | 1.1 | 0.10% |
| Example 373 | 0.0024 | 0.0024 | 0.0024 | 0.0024 | 0.0288 | 0.0384 | 251 | 1.0 | 0.10% |
| Example 374 | 0.0012 | 0.0012 | 0.0012 | 0.0012 | 0.0144 | 0.0192 | 125 | 0.5 | 0.10% |
| Example 375 | 0.0036 | 0.0036 | 0.0036 | 0.0036 | 0.0432 | 0.0576 | 75 | 0.3 | 0.10% |
| Example 376 | 0.002 | 0.001 | 0.001 | 0.001 | 0.015 | 0.02 | 90 | 0.4 | 0.10% |
| Example 377 | 0.001 | 0.001 | 0.001 | 0.001 | 0.012 | 0.016 | 81 | 0.3 | 0.10% |
| Example 378 | 0.003 | 0.003 | 0.003 | 0.003 | 0.036 | 0.048 | 41 | 0.2 | 0.10% |
| Example 379 | 0.0024 | 0.0024 | 0.0024 | 0.0024 | 0.0288 | 0.0384 | 110 | 0.4 | 0.10% |
| Example 380 | 0.0012 | 0.0012 | 0.0012 | 0.0012 | 0.0144 | 0.0192 | 131 | 0.5 | 0.10% |
| Example 381 | 0.0036 | 0.0036 | 0.0036 | 0.0036 | 0.0432 | 0.0576 | 92 | 0.4 | 0.10% |
| Example 382 | 0.001 | 0.001 | 0.001 | 0.001 | 0.012 | 0.016 | 83 | 0.3 | 0.10% |
| Example 383 | 0.001 | 0.001 | 0.001 | 0.001 | 0.012 | 0.016 | 249 | 1.0 | 0.10% |
| Example 384 | 0.003 | 0.003 | 0.003 | 0.003 | 0.036 | 0.048 | 298 | 1.2 | 0.10% |
| Example 385 | 0.0024 | 0.0024 | 0.0024 | 0.0024 | 0.0288 | 0.0384 | 179 | 0.7 | 0.10% |
| Example 386 | 0.0012 | 0.0012 | 0.0012 | 0.0012 | 0.0144 | 0.0192 | 125 | 0.5 | 0.10% |
| Example 387 | 0.0036 | 0.0036 | 0.0036 | 0.0036 | 0.0432 | 0.0576 | 113 | 0.5 | 0.10% |
| Example 388 | 0.001 | 0.001 | 0.001 | 0.001 | 0.012 | 0.016 | 56 | 0.2 | 0.10% |
| Example 389 | 0.001 | 0.001 | 0.001 | 0.001 | 0.012 | 0.016 | 152 | 0.6 | 0.10% |
| Example 390 | 0.003 | 0.003 | 0.003 | 0.003 | 0.036 | 0.048 | 183 | 0.7 | 0.10% |
| Example 391 | 0.0024 | 0.0024 | 0.0024 | 0.0024 | 0.0288 | 0.0384 | 128 | 0.5 | 0.10% |
| Example 392 | 0.0012 | 0.0012 | 0.0012 | 0.0012 | 0.0144 | 0.0192 | 115 | 0.5 | 0.10% |
| Example 393 | 0.0036 | 0.0036 | 0.0036 | 0.0036 | 0.0432 | 0.0576 | 230 | 0.9 | 0.10% |
| Example 394 | 0.001 | 0.001 | 0.001 | 0.001 | 0.012 | 0.016 | 276 | 1.1 | 0.10% |
| Example 395 | 0.001 | 0.001 | 0.001 | 0.001 | 0.012 | 0.016 | 331 | 1.3 | 0.10% |
| Example 396 | 0.003 | 0.003 | 0.003 | 0.003 | 0.036 | 0.048 | 232 | 0.9 | 0.10% |
| Example 397 | 0.0024 | 0.0024 | 0.0024 | 0.0024 | 0.0288 | 0.0384 | 209 | 0.8 | 0.10% |

TABLE 94

| [Table 1-12-6] | Physical properties of chemical liquid | | | Evaluation | | | | | | |
|---|---|---|---|---|---|---|---|---|---|---|
| | Number of coarse particles (number/ml) | Content of surfactant/total content of particles | Content of surfactant/content of high-boiling-point component | Defect inhibition performance | Type of resist composition Resist saving performance | | | | | |
| | | | | | | Affinity | | | Film thickness controllability | Developability |
| | | | | | | Rsq1 | SRsq | Uniformity | | |
| Example 364 | 2 | $4.2 \times 10^9$ | $2.1 \times 10^2$ | AA | 1 | A | A | A | A | A |
| Example 365 | 6 | $6.3 \times 10^9$ | $7.7 \times 10^1$ | AA | 1 | A | A | A | A | A |
| Example 366 | 8 | $2.1 \times 10^9$ | $6.4 \times 10^1$ | AA | 1 | A | A | A | A | A |
| Example 367 | 5 | $1.3 \times 10^9$ | $4.6 \times 10^1$ | AA | 1 | A | A | A | A | A |
| Example 368 | 5 | $5.2 \times 10^9$ | $1.0 \times 10^2$ | AA | 1 | A | A | A | A | A |
| Example 369 | 2 | $1.7 \times 10^9$ | $2.0 \times 10^2$ | A | 1 | A | A | A | A | A |
| Example 370 | 7 | $3.1 \times 10^9$ | $3.8 \times 10^1$ | AA | 1 | A | A | A | A | A |
| Example 371 | 8 | $6.3 \times 10^9$ | $6.3 \times 10^1$ | A | 1 | A | A | A | A | A |
| Example 372 | 6 | $2.1 \times 10^9$ | $9.0 \times 10^1$ | AA | 1 | A | A | A | A | A |
| Example 373 | 5 | $7.8 \times 10^9$ | $3.0 \times 10^2$ | AA | 1 | A | A | A | A | A |
| Example 374 | 3 | $2.6 \times 10^9$ | $1.0 \times 10^2$ | A | 1 | A | A | A | A | A |
| Example 375 | 2 | $2.6 \times 10^9$ | $5.0 \times 10^2$ | A | 1 | A | A | A | A | A |
| Example 376 | 2 | $5.0 \times 10^9$ | $2.8 \times 10^2$ | AA | 1 | A | A | A | A | A |
| Example 377 | 2 | $6.3 \times 10^9$ | $3.1 \times 10^2$ | A | 1 | A | A | A | A | A |
| Example 378 | 0.8 | $1.0 \times 10^8$ | $3.1 \times 10^1$ | A | 1 | A | A | B | A | A |
| Example 379 | 2 | $7.8 \times 10^{11}$ | $6.8 \times 10^4$ | B | 1 | A | A | A | A | A |
| Example 380 | 3 | $2.6 \times 10^8$ | $9.5 \times 10^0$ | A | 1 | A | A | A | A | A |

TABLE 94-continued

| [Table 1-12-6] | Physical properties of chemical liquid | | | Evaluation | | | | | | |
|---|---|---|---|---|---|---|---|---|---|---|
| | Number of coarse particles (number/ml) | Content of surfactant/total content of particles | Content of surfactant/content of high-boiling-point component | Defect inhibition performance | Type of resist composition | | | Resist saving performance | | |
| | | | | | | Affinity | | | Film thickness | |
| | | | | | | Rsq1 | SRsq | Uniformity | controllability | Developability |
| Example 381 | 2 | $1.7 \times 10^9$ | $2.7 \times 10^2$ | A | 1 | A | A | A | A | A |
| Example 382 | 2 | $1.9 \times 10^{10}$ | $9.1 \times 10^2$ | AA | 1 | A | A | A | A | A |
| Example 383 | 5 | $3.1 \times 10^9$ | $5.0 \times 10^1$ | A | 1 | A | A | A | A | A |
| Example 384 | 6 | $2.1 \times 10^9$ | $8.4 \times 10^1$ | AA | 1 | A | A | A | A | A |
| Example 385 | 4 | $3.9 \times 10^9$ | $2.1 \times 10^2$ | AA | 1 | A | A | A | A | A |
| Example 386 | 3 | $5.2 \times 10^9$ | $2.0 \times 10^2$ | AA | 1 | A | A | A | A | A |
| Example 387 | 2 | $8.7 \times 10^8$ | $1.1 \times 10^2$ | A | 1 | A | A | A | A | A |
| Example 388 | 1 | $6.3 \times 10^9$ | $4.4 \times 10^2$ | A | 1 | A | A | A | A | A |
| Example 389 | 3 | $3.1 \times 10^9$ | $8.2 \times 10^1$ | AA | 1 | A | A | A | A | A |
| Example 390 | 4 | $2.1 \times 10^9$ | $1.4 \times 10^2$ | A | 1 | A | A | A | A | A |
| Example 391 | 3 | $1.3 \times 10^9$ | $9.8 \times 10^1$ | A | 1 | A | A | A | A | A |
| Example 392 | 2 | $5.2 \times 10^9$ | $2.2 \times 10^2$ | AA | 1 | A | A | A | A | A |
| Example 393 | 5 | $1.7 \times 10^9$ | $1.1 \times 10^2$ | AA | 1 | A | A | A | A | A |
| Example 394 | 6 | $6.3 \times 10^9$ | $9.1 \times 10^1$ | A | 1 | A | A | A | A | A |
| Example 395 | 7 | $6.3 \times 10^9$ | $7.5 \times 10^1$ | A | 1 | A | A | A | A | A |
| Example 396 | 5 | $1.0 \times 10^9$ | $5.4 \times 10^1$ | AA | 1 | A | A | A | A | A |
| Example 397 | 4 | $2.6 \times 10^9$ | $1.2 \times 10^2$ | AA | 1 | A | A | A | A | A |

TABLE 95

| [Table 1-12-7] | Evaluation | | | | | | | | | | |
|---|---|---|---|---|---|---|---|---|---|---|---|
| | Type of resist composition | | | | | Type of resist composition | | | | | |
| | Resist saving performance | | | | | Resist saving performance | | | | | |
| | | Affinity | | | Film thickness | | | Affinity | | | Film thickness |
| | | Rsq1 | SRsq | Uniformity | controllability | Developability | | Rsq1 | SRsq | Uniformity | controllability | Developability |
| Example 364 | 2 | A | A | A | A | A | 3 | A | A | A | A | A |
| Example 365 | 2 | A | A | A | A | A | 3 | A | A | A | A | A |
| Example 366 | 2 | A | A | A | A | A | 3 | A | A | A | A | A |
| Example 367 | 2 | A | A | A | A | A | 3 | A | A | A | A | A |
| Example 368 | 2 | A | A | A | A | A | 3 | A | A | A | A | A |
| Example 369 | 2 | A | A | A | A | A | 3 | A | A | A | A | A |
| Example 370 | 2 | A | A | A | A | A | 3 | A | A | A | A | A |
| Example 371 | 2 | A | A | A | A | A | 3 | A | A | A | A | A |
| Example 372 | 2 | A | A | A | A | A | 3 | A | A | A | A | A |
| Example 373 | 2 | A | A | A | A | A | 3 | A | A | A | A | A |
| Example 374 | 2 | A | A | A | A | A | 3 | A | A | A | A | A |
| Example 375 | 2 | A | A | A | A | A | 3 | A | A | A | A | A |
| Example 376 | 2 | A | A | A | A | A | 3 | A | A | A | A | A |
| Example 377 | 2 | A | A | A | A | A | 3 | A | A | A | A | A |
| Example 378 | 2 | A | A | B | A | A | 3 | A | A | B | A | A |
| Example 379 | 2 | A | A | A | A | A | 3 | A | A | A | A | A |
| Example 380 | 2 | A | A | A | A | A | 3 | A | A | A | A | A |
| Example 381 | 2 | A | A | A | A | A | 3 | A | A | A | A | A |
| Example 382 | 2 | A | A | A | A | A | 3 | A | A | A | A | A |
| Example 383 | 2 | A | A | A | A | A | 3 | A | A | A | A | A |
| Example 384 | 2 | A | A | A | A | A | 3 | A | A | A | A | A |
| Example 385 | 2 | A | A | A | A | A | 3 | A | A | A | A | A |
| Example 386 | 2 | A | A | A | A | A | 3 | A | A | A | A | A |
| Example 387 | 2 | A | A | A | A | A | 3 | A | A | A | A | A |
| Example 388 | 2 | A | A | A | A | A | 3 | A | A | A | A | A |
| Example 389 | 2 | A | A | A | A | A | 3 | A | A | A | A | A |
| Example 390 | 2 | A | A | A | A | A | 3 | A | A | A | A | A |
| Example 391 | 2 | A | A | A | A | A | 3 | A | A | A | A | A |
| Example 392 | 2 | A | A | A | A | A | 3 | A | A | A | A | A |
| Example 393 | 2 | A | A | A | A | A | 3 | A | A | A | A | A |
| Example 394 | 2 | A | A | A | A | A | 3 | A | A | A | A | A |
| Example 395 | 2 | A | A | A | A | A | 3 | A | A | A | A | A |

TABLE 95-continued

| | | Evaluation | | | | | | | | | |
|---|---|---|---|---|---|---|---|---|---|---|---|
| | | Type of resist composition | | | | | Type of resist composition | | | | |
| | | Resist saving performance | | | | | Resist saving performance | | | | |
| | | Affinity | | | Film thickness | | | Affinity | | | Film thickness |
| [Table 1-12-7] | | Rsq1 | SRsq | Uniformity | controllability | Developability | | Rsq1 | SRsq | Uniformity | controllability | Developability |
| Example 396 | 2 | A | A | A | A | A | 3 | A | A | A | A | A |
| Example 397 | 2 | A | A | A | A | A | 3 | A | A | A | A | A |

TABLE 96

| | | Evaluation | | | | | | |
|---|---|---|---|---|---|---|---|---|
| | | Type of resist composition | | | | | | |
| | | Resist saving performance | | | | | Evaluation of p-CMP defect inhibition | Evaluation of ashing residue removing |
| | | Affinity | | | Film thickness | | | |
| [Table 1-12-8] | | Rsq1 | SRsq | Uniformity | controllability | Developability | performance | performance |
| Example 364 | 4 | A | A | A | A | A | A | A |
| Example 365 | 4 | A | A | A | A | A | A | A |
| Example 366 | 4 | A | A | A | A | A | A | A |
| Example 367 | 4 | A | A | A | A | A | A | A |
| Example 368 | 4 | A | A | A | A | A | A | A |
| Example 369 | 4 | A | A | A | A | A | A | A |
| Example 370 | 4 | A | A | A | A | A | A | A |
| Example 371 | 4 | A | A | A | A | A | A | A |
| Example 372 | 4 | A | A | A | A | A | A | A |
| Example 373 | 4 | A | A | A | A | A | A | A |
| Example 374 | 4 | A | A | A | A | A | A | A |
| Example 375 | 4 | A | A | A | A | A | A | A |
| Example 376 | 4 | A | A | A | A | A | A | A |
| Example 377 | 4 | A | A | A | A | A | A | A |
| Example 378 | 4 | A | A | B | A | A | A | A |
| Example 379 | 4 | A | A | A | A | A | A | A |
| Example 380 | 4 | A | A | A | A | A | A | A |
| Example 381 | 4 | A | A | A | A | A | A | A |
| Example 382 | 4 | A | A | A | A | A | A | A |
| Example 383 | 4 | A | A | A | A | A | A | A |
| Example 384 | 4 | A | A | A | A | A | A | A |
| Example 385 | 4 | A | A | A | A | A | A | A |
| Example 386 | 4 | A | A | A | A | A | A | A |
| Example 387 | 4 | A | A | A | A | A | A | A |
| Example 388 | 4 | A | A | A | A | A | A | A |
| Example 389 | 4 | A | A | A | A | A | A | A |
| Example 390 | 4 | A | A | A | A | A | A | A |
| Example 391 | 4 | A | A | A | A | A | A | A |
| Example 392 | 4 | A | A | A | A | A | A | A |
| Example 393 | 4 | A | A | A | A | A | A | A |
| Example 394 | 4 | A | A | A | A | A | A | A |
| Example 395 | 4 | A | A | A | A | A | A | A |
| Example 396 | 4 | A | A | A | A | A | A | A |
| Example 397 | 4 | A | A | A | A | A | A | A |

TABLE 97

Components of chemical liquid
Main agent
Organic solvent

| [Table 1-13-1] | Type | Content (% by mass) | Molar mass (g/mol) | Vapor pressure (Pa) | Surface tension (mN/m) | fd | fp | fh | HP |
|---|---|---|---|---|---|---|---|---|---|
| Example 398 | DEGDME | 10 | 134.18 | 520 | 28.0 | 57 | 21 | 22 | 1 |
| Example 399 | DEGDEE | 10 | 162.23 | 253 | 29.0 | 60 | 20 | 20 | 1 |
| Example 400 | TriEGDME | 10 | 178.23 | 13 | 28.0 | 56 | 21 | 23 | 1 |
| Example 401 | TetraEGDME | 10 | 222.28 | 13 | 27.0 | 56 | 21 | 23 | 1 |
| Example 402 | TEGMBE | 10 | 220.31 | 13 | 28.0 | 48 | 19 | 33 | 1 |
| Example 403 | DEGMBE | 10 | 162.23 | 117 | 29.0 | 59 | 18 | 23 | 1 |
| Example 404 | DEGME | 10 | 120.15 | 13 | 28.0 | 44.3 | 20.8 | 34.9 | 1 |
| Example 405 | DME | 10 | 90.12 | 693 | 29.0 | 55.9 | 22.8 | 21.3 | 1 |
| Example 406 | DEE | 10 | 118.18 | 627 | 29.0 | 62.2 | 19.9 | 17.8 | 1 |
| Example 407 | DEGIBE | 10 | 162.23 | 133 | 29.0 | 61.9 | 18.7 | 19.4 | 1 |
| Example 408 | DEGDME | 10 | 134.18 | 520 | 28.0 | 56.9 | 21.0 | 22.1 | 1 |
| Example 409 | DEGDEE | 10 | 162.23 | 253 | 29.0 | 60.4 | 19.6 | 20.0 | 1 |
| Example 410 | TriEGDME | 10 | 178.23 | 13 | 28.0 | 56.4 | 20.9 | 22.7 | 1 |
| Example 411 | TetraEGDME | 10 | 222.28 | 13 | 27.0 | 55.6 | 21.1 | 23.2 | 1 |
| Example 412 | TEGMBE | 10 | 220.31 | 13 | 28.0 | 48.5 | 18.7 | 32.8 | 1 |
| Example 413 | DEGMBE | 10 | 162.23 | 117 | 29.0 | 59.4 | 18.1 | 22.5 | 1 |
| Example 414 | DEGME | 10 | 120.15 | 13 | 28.0 | 44.3 | 20.8 | 34.9 | 1 |
| Example 415 | DME | 10 | 90.12 | 693 | 29.0 | 55.9 | 22.8 | 21.3 | 1 |
| Example 416 | DEE | 10 | 118.18 | 627 | 29.0 | 62.2 | 19.9 | 17.8 | 1 |
| Example 417 | DEGIBE | 10 | 162.23 | 133 | 29.0 | 61.9 | 18.7 | 19.4 | 1 |
| Example 418 | DEGDME | 10 | 134.18 | 520 | 28.0 | 56.9 | 21.0 | 22.1 | 1 |
| Example 419 | DEGDEE | 10 | 162.23 | 253 | 29.0 | 60.4 | 19.6 | 20.0 | 1 |
| Example 420 | TriEGDME | 10 | 178.23 | 13 | 28.0 | 56.4 | 20.9 | 22.7 | 1 |
| Example 421 | TetraEGDME | 10 | 222.28 | 13 | 27.0 | 55.6 | 21.1 | 23.2 | 1 |
| Example 422 | TEGMBE | 10 | 220.31 | 13 | 28.0 | 48.5 | 18.7 | 32.8 | 1 |
| Example 423 | DEGMBE | 10 | 162.23 | 117 | 29.0 | 59.4 | 18.1 | 22.5 | 1 |
| Example 424 | DEGME | 10 | 120.15 | 13 | 28.0 | 44.3 | 20.8 | 34.9 | 1 |
| Example 425 | DME | 10 | 90.12 | 693 | 29.0 | 55.9 | 22.8 | 21.3 | 1 |
| Example 426 | DEE | 10 | 118.18 | 627 | 29.0 | 62.2 | 19.9 | 17.8 | 1 |
| Example 427 | DEGIBE | 10 | 162.23 | 133 | 29.0 | 61.9 | 18.7 | 19.4 | 1 |
| Example 428 | DEGDME | 10 | 134.18 | 520 | 28.0 | 56.9 | 21.0 | 22.1 | 1 |
| Example 429 | DEGDEE | 10 | 162.23 | 253 | 29.0 | 60.4 | 19.6 | 20.0 | 1 |
| Example 430 | TriEGDME | 10 | 178.23 | 13 | 28.0 | 56.4 | 20.9 | 22.7 | 1 |

TABLE 98

Components of chemical liquid
Main agent
Organic solvent

| [Table 1-13-2] | Type | Content (% by mass) | Molar mass (g/mol) | Vapor pressure (Pa) | Surface tension (mN/m) | fd | fp | fh | HP |
|---|---|---|---|---|---|---|---|---|---|
| Example 398 | Anisole | 10 | 108.14 | 63 | 30.0 | 64.3 | 17.0 | 18.7 | 1 |
| Example 399 | Anisole | 10 | 108.14 | 63 | 30.0 | 64.3 | 17.0 | 18.7 | 1 |
| Example 400 | Anisole | 10 | 108.14 | 63 | 30.0 | 64.3 | 17.0 | 18.7 | 1 |
| Example 401 | Anisole | 10 | 108.14 | 63 | 30.0 | 64.3 | 17.0 | 18.7 | 1 |
| Example 402 | Anisole | 10 | 108.14 | 63 | 30.0 | 64.3 | 17.0 | 18.7 | 1 |
| Example 403 | Anisole | 10 | 108.14 | 63 | 30.0 | 64.3 | 17.0 | 18.7 | 1 |
| Example 404 | 14-DMB | 10 | 138.17 | 1 | 30.0 | 59.0 | 20.6 | 20.3 | 1 |
| Example 405 | 14-DMB | 10 | 138.17 | 1 | 30.0 | 59.0 | 20.6 | 20.3 | 1 |
| Example 406 | 14-DMB | 10 | 138.17 | 1 | 30.0 | 59.0 | 20.6 | 20.3 | 1 |
| Example 407 | 14-DMB | 10 | 138.17 | 1 | 30.0 | 59.0 | 20.6 | 20.3 | 1 |
| Example 408 | 14-DMB | 10 | 138.17 | 1 | 30.0 | 59.0 | 20.6 | 20.3 | 1 |
| Example 409 | 14-DMB | 10 | 138.17 | 1 | 30.0 | 59.0 | 20.6 | 20.3 | 1 |
| Example 410 | 14-DMB | 10 | 138.17 | 1 | 30.0 | 59.0 | 20.6 | 20.3 | 1 |
| Example 411 | 14-DMB | 10 | 138.17 | 1 | 30.0 | 59.0 | 20.6 | 20.3 | 1 |
| Example 412 | 14-DMB | 10 | 138.17 | 1 | 30.0 | 59.0 | 20.6 | 20.3 | 1 |
| Example 413 | 14-DMB | 10 | 138.17 | 1 | 30.0 | 59.0 | 20.6 | 20.3 | 1 |
| Example 414 | 12-DMB | 10 | 138.17 | 1 | 30.0 | 60.6 | 20.2 | 19.2 | 1 |
| Example 415 | 12-DMB | 10 | 138.17 | 1 | 30.0 | 60.6 | 20.2 | 19.2 | 1 |
| Example 416 | 12-DMB | 10 | 138.17 | 1 | 30.0 | 60.6 | 20.2 | 19.2 | 1 |
| Example 417 | 12-DMB | 10 | 138.17 | 1 | 30.0 | 60.6 | 20.2 | 19.2 | 1 |
| Example 418 | 12-DMB | 10 | 138.17 | 1 | 30.0 | 60.6 | 20.2 | 19.2 | 1 |
| Example 419 | 12-DMB | 10 | 138.17 | 1 | 30.0 | 60.6 | 20.2 | 19.2 | 1 |
| Example 420 | 12-DMB | 10 | 138.17 | 1 | 30.0 | 60.6 | 20.2 | 19.2 | 1 |
| Example 421 | 12-DMB | 10 | 138.17 | 1 | 30.0 | 60.6 | 20.2 | 19.2 | 1 |

TABLE 98-continued

| [Table 1-13-2] | Type | Components of chemical liquid Main agent Organic solvent | | | | | | | |
|---|---|---|---|---|---|---|---|---|---|
| | | Content (% by mass) | Molar mass (g/mol) | Vapor pressure (Pa) | Surface tension (mN/m) | fd | fp | fh | HP |
| Example 422 | 12-DMB | 10 | 138.17 | 1 | 30.0 | 60.6 | 20.2 | 19.2 | 1 |
| Example 423 | 12-DMB | 10 | 138.17 | 1 | 30.0 | 60.6 | 20.2 | 19.2 | 1 |
| Example 424 | 13-DMB | 10 | 138.17 | 1 | 30.0 | 61.6 | 19.9 | 18.5 | 1 |
| Example 425 | 13-DMB | 10 | 138.17 | 1 | 30.0 | 61.6 | 19.9 | 18.5 | 1 |
| Example 426 | 13-DMB | 10 | 138.17 | 1 | 30.0 | 61.6 | 19.9 | 18.5 | 1 |
| Example 427 | 13-DMB | 10 | 138.17 | 1 | 30.0 | 61.6 | 19.9 | 18.5 | 1 |
| Example 428 | 13-DMB | 10 | 138.17 | 1 | 30.0 | 61.6 | 19.9 | 18.5 | 1 |
| Example 429 | 13-DMB | 10 | 138.17 | 1 | 30.0 | 61.6 | 19.9 | 18.5 | 1 |
| Example 430 | 13-DMB | 10 | 138.17 | 1 | 30.0 | 61.6 | 19.9 | 18.5 | 1 |

TABLE 99

| [Table 1-13-3] | Type | Components of chemical liquid Main agent Organic solvent | | | | | | | | | |
|---|---|---|---|---|---|---|---|---|---|---|---|
| | | Content (% by mass) | Molar mass (g/mol) | Vapor pressure (Pa) | Surface tension (mN/m) | fd | fp | fh | HP | Vapor pressure (Pa) | Surface tension (mN/m) |
| Example 398 | nBA | 80 | 116.16 | 1,200 | 24.8 | 60.5 | 17.2 | 22.2 | 1.00 | 1,018 | 25.6 |
| Example 399 | nBA | 80 | 116.16 | 1,200 | 24.8 | 60.5 | 17.2 | 22.2 | 1.00 | 1,006 | 25.7 |
| Example 400 | nBA | 80 | 116.16 | 1,200 | 24.8 | 60.5 | 17.2 | 22.2 | 1.00 | 995 | 25.6 |
| Example 401 | nBA | 80 | 116.16 | 1,200 | 24.8 | 60.5 | 17.2 | 22.2 | 1.00 | 1,008 | 25.5 |
| Example 402 | nBA | 80 | 116.16 | 1,200 | 24.8 | 60.5 | 17.2 | 22.2 | 1.00 | 1,008 | 25.6 |
| Example 403 | nBA | 80 | 116.16 | 1,200 | 24.8 | 60.5 | 17.2 | 22.2 | 1.00 | 996 | 25.7 |
| Example 404 | nBA | 80 | 116.16 | 1,200 | 24.8 | 60.5 | 17.2 | 22.2 | 1.00 | 980 | 25.6 |
| Example 405 | nBA | 80 | 116.16 | 1,200 | 24.8 | 60.5 | 17.2 | 22.2 | 1.00 | 1,036 | 25.8 |
| Example 406 | nBA | 80 | 116.16 | 1,200 | 24.8 | 60.5 | 17.2 | 22.2 | 1.00 | 1,040 | 25.7 |
| Example 407 | nBA | 80 | 116.16 | 1,200 | 24.8 | 60.5 | 17.2 | 22.2 | 1.00 | 1,015 | 25.6 |
| Example 408 | nBA | 80 | 116.16 | 1,200 | 24.8 | 60.5 | 17.2 | 22.2 | 1.00 | 1,035 | 25.5 |
| Example 409 | nBA | 80 | 116.16 | 1,200 | 24.8 | 60.5 | 17.2 | 22.2 | 1.00 | 1,024 | 25.6 |
| Example 410 | nBA | 80 | 116.16 | 1,200 | 24.8 | 60.5 | 17.2 | 22.2 | 1.00 | 1,012 | 25.5 |
| Example 411 | nBA | 80 | 116.16 | 1,200 | 24.8 | 60.5 | 17.2 | 22.2 | 1.00 | 1,026 | 25.4 |
| Example 412 | nBA | 80 | 116.16 | 1,200 | 24.8 | 60.5 | 17.2 | 22.2 | 1.00 | 1,026 | 25.4 |
| Example 413 | nBA | 80 | 116.16 | 1,200 | 24.8 | 60.5 | 17.2 | 22.2 | 1.00 | 1,013 | 25.6 |
| Example 414 | nBA | 80 | 116.16 | 1,200 | 24.8 | 60.5 | 17.2 | 22.2 | 1.00 | 980 | 25.6 |
| Example 415 | nBA | 80 | 116.16 | 1,200 | 24.8 | 60.5 | 17.2 | 22.2 | 1.00 | 1,036 | 25.8 |
| Example 416 | nBA | 80 | 116.16 | 1,200 | 24.8 | 60.5 | 17.2 | 22.2 | 1.00 | 1,040 | 25.7 |
| Example 417 | nBA | 80 | 116.16 | 1,200 | 24.8 | 60.5 | 17.2 | 22.2 | 1.00 | 1,015 | 25.6 |
| Example 418 | nBA | 80 | 116.16 | 1,200 | 24.8 | 60.5 | 17.2 | 22.2 | 1.00 | 1,035 | 25.5 |
| Example 419 | nBA | 80 | 116.16 | 1,200 | 24.8 | 60.5 | 17.2 | 22.2 | 1.00 | 1,024 | 25.6 |
| Example 420 | nBA | 80 | 116.16 | 1,200 | 24.8 | 60.5 | 17.2 | 22.2 | 1.00 | 1,012 | 25.5 |
| Example 421 | nBA | 80 | 116.16 | 1,200 | 24.8 | 60.5 | 17.2 | 22.2 | 1.00 | 1,026 | 25.4 |
| Example 422 | nBA | 80 | 116.16 | 1,200 | 24.8 | 60.5 | 17.2 | 22.2 | 1.00 | 1,026 | 25.4 |
| Example 423 | nBA | 80 | 116.16 | 1,200 | 24.8 | 60.5 | 17.2 | 22.2 | 1.00 | 1,013 | 25.6 |
| Example 424 | nBA | 80 | 116.16 | 1,200 | 24.8 | 60.5 | 17.2 | 22.2 | 1.00 | 980 | 25.6 |
| Example 425 | nBA | 80 | 116.16 | 1,200 | 24.8 | 60.5 | 17.2 | 22.2 | 1.00 | 1,036 | 25.8 |
| Example 426 | nBA | 80 | 116.16 | 1,200 | 24.8 | 60.5 | 17.2 | 22.2 | 1.00 | 1,040 | 25.7 |
| Example 427 | nBA | 80 | 116.16 | 1,200 | 24.8 | 60.5 | 17.2 | 22.2 | 1.00 | 1,015 | 25.6 |
| Example 428 | nBA | 80 | 116.16 | 1,200 | 24.8 | 60.5 | 17.2 | 22.2 | 1.00 | 1,035 | 25.5 |
| Example 429 | nBA | 80 | 116.16 | 1,200 | 24.8 | 60.5 | 17.2 | 22.2 | 1.00 | 1,024 | 25.6 |
| Example 430 | nBA | 80 | 116.16 | 1,200 | 24.8 | 60.5 | 17.2 | 22.2 | 1.00 | 1,012 | 25.5 |

TABLE 100

| [Table 1-13-4] | Components of chemical liquid | | | Components of chemical liquid | | | | | |
|---|---|---|---|---|---|---|---|---|---|
| | Main agent | Surfactant | | Impurity metal | | | | | |
| | Content | Content | | Total content of impurity metal (mass ppt) | | | | | |
| | (% by mass) | Type | (mass ppm) | Fe | Cr | Ni | Pb | Others | Total |
| Example 398 | Balance | A | 50 | 0.0024 | 0.0024 | 0.0024 | 0.0024 | 0.0288 | 0.0384 |
| Example 399 | Balance | E | 100 | 0.0072 | 0.0072 | 0.0072 | 0.0072 | 0.0864 | 0.1152 |
| Example 400 | Balance | E | 100 | 0.002 | 0.001 | 0.001 | 0.002 | 0.018 | 0.024 |
| Example 401 | Balance | A | 50 | 0.002 | 0.002 | 0.002 | 0.002 | 0.024 | 0.032 |
| Example 402 | Balance | A | 100 | 0.006 | 0.006 | 0.006 | 0.006 | 0.072 | 0.096 |
| Example 403 | Balance | B | 100 | 0.0048 | 0.0048 | 0.0048 | 0.0048 | 0.0576 | 0.0768 |
| Example 404 | Balance | F | 100 | 0.0024 | 0.0024 | 0.0024 | 0.0024 | 0.0288 | 0.0384 |
| Example 405 | Balance | C | 100 | 0.0072 | 0.0072 | 0.0072 | 0.0072 | 0.0864 | 0.1152 |
| Example 406 | Balance | A | 50 | 0.001 | 0.001 | 0.001 | 0.001 | 0.012 | 0.016 |
| Example 407 | Balance | C | 100 | 0.002 | 0.002 | 0.002 | 0.002 | 0.024 | 0.032 |
| Example 408 | Balance | A | 100 | 0.006 | 0.006 | 0.006 | 0.006 | 0.072 | 0.096 |
| Example 409 | Balance | A | 50 | 0.0048 | 0.0048 | 0.0048 | 0.0048 | 0.0576 | 0.0768 |
| Example 410 | Balance | A | 100 | 0.0024 | 0.0024 | 0.0024 | 0.0024 | 0.0288 | 0.0384 |
| Example 411 | Balance | I | 100 | 0.0072 | 0.0072 | 0.0072 | 0.0072 | 0.0864 | 0.1152 |
| Example 412 | Balance | A | 50 | 0.001 | 0.001 | 0.001 | 0.001 | 0.012 | 0.016 |
| Example 413 | Balance | E | 100 | 0.002 | 0.002 | 0.002 | 0.002 | 0.024 | 0.032 |
| Example 414 | Balance | C | 100 | 0.006 | 0.006 | 0.006 | 0.006 | 0.072 | 0.096 |
| Example 415 | Balance | A | 300 | 0.0048 | 0.0048 | 0.0048 | 0.0048 | 0.0576 | 0.0768 |
| Example 416 | Balance | B | 100 | 0.0024 | 0.0024 | 0.0024 | 0.0024 | 0.0288 | 0.0384 |
| Example 417 | Balance | F | 50 | 0.0072 | 0.0072 | 0.0072 | 0.0072 | 0.0864 | 0.1152 |
| Example 418 | Balance | A | 100 | 0.001 | 0.001 | 0.001 | 0.001 | 0.012 | 0.016 |
| Example 419 | Balance | I | 100 | 0.002 | 0.002 | 0.002 | 0.002 | 0.024 | 0.032 |
| Example 420 | Balance | A | 5 | 0.006 | 0.006 | 0.006 | 0.006 | 0.072 | 0.096 |
| Example 421 | Balance | A | 30,000 | 0.0048 | 0.0048 | 0.0048 | 0.0048 | 0.0576 | 0.0768 |
| Example 422 | Balance | A | 5 | 0.0024 | 0.0024 | 0.0024 | 0.0024 | 0.0288 | 0.0384 |
| Example 423 | Balance | A | 30,000 | 0.0072 | 0.0072 | 0.0072 | 0.0072 | 0.0864 | 0.1152 |
| Example 424 | Balance | E | 100 | 0.002 | 0.001 | 0.002 | 0.001 | 0.018 | 0.024 |
| Example 425 | Balance | A | 300 | 0.002 | 0.002 | 0.002 | 0.002 | 0.024 | 0.032 |
| Example 426 | Balance | J | 50 | 0.006 | 0.006 | 0.006 | 0.006 | 0.072 | 0.096 |
| Example 427 | Balance | C | 100 | 0.0048 | 0.0048 | 0.0048 | 0.0048 | 0.0576 | 0.0768 |
| Example 428 | Balance | A | 100 | 0.0024 | 0.0024 | 0.0024 | 0.0024 | 0.0288 | 0.0384 |
| Example 429 | Balance | I | 50 | 0.0072 | 0.0072 | 0.0072 | 0.0072 | 0.0864 | 0.1152 |
| Example 430 | Balance | D | 100 | 0.004 | 0.002 | 0.003 | 0.001 | 0.03 | 0.04 |

TABLE 101

| [Table 1-13-5] | Components of chemical liquid | | | | | | | | |
|---|---|---|---|---|---|---|---|---|---|
| | Impurity metal | | | | | | Content of organic impurity (mass ppm) | | Water Content |
| | Content of particles containing following impurity metal (mass ppt) | | | | | | | High-boiling- | |
| | Fe | Cr | Ni | Pb | Others | Total | Total | point component | (% by mass) |
| Example 398 | 0.0012 | 0.0012 | 0.0012 | 0.0012 | 0.0144 | 0.0192 | 104 | 0.4 | 0.10% |
| Example 399 | 0.0036 | 0.0036 | 0.0036 | 0.0036 | 0.0432 | 0.0576 | 282 | 1.1 | 0.10% |
| Example 400 | 0.001 | 0.001 | 0.001 | 0.001 | 0.012 | 0.016 | 338 | 1.4 | 0.10% |
| Example 401 | 0.001 | 0.001 | 0.001 | 0.001 | 0.012 | 0.016 | 237 | 0.9 | 0.10% |
| Example 402 | 0.003 | 0.003 | 0.003 | 0.003 | 0.036 | 0.048 | 213 | 0.9 | 0.10% |
| Example 403 | 0.0024 | 0.0024 | 0.0024 | 0.0024 | 0.0288 | 0.0384 | 256 | 1.0 | 0.10% |
| Example 404 | 0.0012 | 0.0012 | 0.0012 | 0.0012 | 0.0144 | 0.0192 | 179 | 0.7 | 0.10% |
| Example 405 | 0.0036 | 0.0036 | 0.0036 | 0.0036 | 0.0432 | 0.0576 | 161 | 0.6 | 0.10% |
| Example 406 | 0.001 | 0.001 | 0.001 | 0.001 | 0.012 | 0.016 | 145 | 0.6 | 0.10% |
| Example 407 | 0.001 | 0.001 | 0.001 | 0.001 | 0.012 | 0.016 | 72 | 0.3 | 0.10% |
| Example 408 | 0.003 | 0.003 | 0.003 | 0.003 | 0.036 | 0.048 | 196 | 0.8 | 0.10% |
| Example 409 | 0.0024 | 0.0024 | 0.0024 | 0.0024 | 0.0288 | 0.0384 | 235 | 0.9 | 0.10% |
| Example 410 | 0.0012 | 0.0012 | 0.0012 | 0.0012 | 0.0144 | 0.0192 | 164 | 0.7 | 0.10% |
| Example 411 | 0.0036 | 0.0036 | 0.0036 | 0.0036 | 0.0432 | 0.0576 | 148 | 0.6 | 0.10% |
| Example 412 | 0.001 | 0.001 | 0.001 | 0.001 | 0.012 | 0.016 | 74 | 0.3 | 0.10% |
| Example 413 | 0.001 | 0.001 | 0.001 | 0.001 | 0.012 | 0.016 | 200 | 0.8 | 0.10% |
| Example 414 | 0.003 | 0.003 | 0.003 | 0.003 | 0.036 | 0.048 | 240 | 1.0 | 0.10% |
| Example 415 | 0.0024 | 0.0024 | 0.0024 | 0.0024 | 0.0288 | 0.0384 | 168 | 0.7 | 0.10% |
| Example 416 | 0.0012 | 0.0012 | 0.0012 | 0.0012 | 0.0144 | 0.0192 | 151 | 0.6 | 0.10% |
| Example 417 | 0.0036 | 0.0036 | 0.0036 | 0.0036 | 0.0432 | 0.0576 | 75 | 0.3 | 0.10% |
| Example 418 | 0.001 | 0.001 | 0.001 | 0.001 | 0.012 | 0.016 | 204 | 0.8 | 0.10% |
| Example 419 | 0.001 | 0.001 | 0.001 | 0.001 | 0.012 | 0.016 | 245 | 1.0 | 0.10% |
| Example 420 | 0.003 | 0.003 | 0.003 | 0.003 | 0.036 | 0.048 | 171 | 0.7 | 0.10% |

TABLE 101-continued

| | Components of chemical liquid | | | | | | | | |
|---|---|---|---|---|---|---|---|---|---|
| | Impurity metal | | | | | | Content of organic impurity (mass ppm) | | Water |
| | Content of particles containing following impurity metal (mass ppt) | | | | | | | High-boiling- | Content |
| [Table 1-13-5] | Fe | Cr | Ni | Pb | Others | Total | Total | point component | (% by mass) |
| Example 421 | 0.0024 | 0.0024 | 0.0024 | 0.0024 | 0.0288 | 0.0384 | 154 | 0.6 | 0.10% |
| Example 422 | 0.0012 | 0.0012 | 0.0012 | 0.0012 | 0.0144 | 0.0192 | 77 | 0.3 | 0.10% |
| Example 423 | 0.0036 | 0.0036 | 0.0036 | 0.0036 | 0.0432 | 0.0576 | 46 | 0.2 | 0.10% |
| Example 424 | 0.001 | 0.001 | 0.001 | 0.001 | 0.012 | 0.016 | 55 | 0.2 | 0.10% |
| Example 425 | 0.001 | 0.001 | 0.001 | 0.001 | 0.012 | 0.016 | 50 | 0.2 | 0.10% |
| Example 426 | 0.003 | 0.003 | 0.003 | 0.003 | 0.036 | 0.048 | 25 | 0.1 | 0.10% |
| Example 427 | 0.0024 | 0.0024 | 0.0024 | 0.0024 | 0.0288 | 0.0384 | 67 | 0.3 | 0.10% |
| Example 428 | 0.0012 | 0.0012 | 0.0012 | 0.0012 | 0.0144 | 0.0192 | 81 | 0.3 | 0.10% |
| Example 429 | 0.0036 | 0.0036 | 0.0036 | 0.0036 | 0.0432 | 0.0576 | 57 | 0.2 | 0.10% |
| Example 430 | 0.002 | 0.001 | 0.0015 | 0.001 | 0.0165 | 0.022 | 51 | 0.2 | 0.10% |

TABLE 102

| | Physical properties of chemical liquid | | | Evaluation | | | | | | |
|---|---|---|---|---|---|---|---|---|---|---|
| | | | | | | Type of resist composition | | | | |
| | Number of | Content of | Content of | | | | Resist saving performance | | | |
| | coarse particles | surfactant/total content of | surfactant/content of high-boiling- | Defect inhibition | | Affinity | | Film thickness | | |
| [Table 1-13-6] | (number/ml) | particles | point component | performance | Rsq1 | | SRsq | Uniformity | controllability | Developability |
| Example 398 | 2 | $2.6 \times 10^9$ | $1.2 \times 10^2$ | AA | 1 | A | A | A | A | A |
| Example 399 | 6 | $1.7 \times 10^9$ | $8.9 \times 10^1$ | A | 1 | A | A | A | A | A |
| Example 400 | 7 | $6.3 \times 10^9$ | $7.4 \times 10^1$ | A | 1 | A | A | A | A | A |
| Example 401 | 5 | $3.1 \times 10^9$ | $5.3 \times 10^1$ | AA | 1 | A | A | A | A | A |
| Example 402 | 4 | $2.1 \times 10^9$ | $1.2 \times 10^2$ | AA | 1 | A | A | A | A | A |
| Example 403 | 5 | $2.6 \times 10^9$ | $9.8 \times 10^1$ | AA | 1 | A | A | A | A | A |
| Example 404 | 4 | $5.2 \times 10^9$ | $1.4 \times 10^2$ | A | 1 | A | A | A | A | A |
| Example 405 | 3 | $1.7 \times 10^9$ | $1.6 \times 10^2$ | AA | 1 | A | A | A | A | A |
| Example 406 | 3 | $3.1 \times 10^9$ | $8.6 \times 10^1$ | AA | 1 | A | A | A | A | A |
| Example 407 | 1 | $6.3 \times 10^9$ | $3.4 \times 10^2$ | AA | 1 | A | A | A | A | A |
| Example 408 | 4 | $2.1 \times 10^9$ | $1.3 \times 10^2$ | AA | 1 | A | A | A | A | A |
| Example 409 | 5 | $1.3 \times 10^9$ | $5.3 \times 10^1$ | AA | 1 | A | A | A | A | A |
| Example 410 | 3 | $5.2 \times 10^9$ | $1.5 \times 10^2$ | AA | 1 | A | A | A | A | A |
| Example 411 | 3 | $1.7 \times 10^9$ | $1.7 \times 10^2$ | A | 1 | A | A | A | A | A |
| Example 412 | 1 | $3.1 \times 10^9$ | $1.7 \times 10^2$ | AA | 1 | A | A | A | A | A |
| Example 413 | 4 | $6.3 \times 10^9$ | $1.3 \times 10^2$ | A | 1 | A | A | A | A | A |
| Example 414 | 5 | $2.1 \times 10^9$ | $1.0 \times 10^2$ | AA | 1 | A | A | A | A | A |
| Example 415 | 3 | $7.8 \times 10^9$ | $4.5 \times 10^2$ | AA | 1 | A | A | A | A | A |
| Example 416 | 3 | $5.2 \times 10^9$ | $1.7 \times 10^2$ | AA | 1 | A | A | A | A | A |
| Example 417 | 2 | $8.7 \times 10^8$ | $1.7 \times 10^2$ | A | 1 | A | A | A | A | A |
| Example 418 | 4 | $6.3 \times 10^9$ | $1.2 \times 10^2$ | AA | 1 | A | A | A | A | A |
| Example 419 | 5 | $6.3 \times 10^9$ | $1.0 \times 10^2$ | A | 1 | A | A | A | A | A |
| Example 420 | 3 | $1.0 \times 10^8$ | $7.3 \times 10^0$ | A | 1 | A | A | A | A | A |
| Example 421 | 3 | $7.8 \times 10^{11}$ | $4.9 \times 10^4$ | B | 1 | A | A | A | A | A |
| Example 422 | 2 | $2.6 \times 10^8$ | $1.6 \times 10^1$ | A | 1 | A | A | A | A | A |
| Example 423 | 0.9 | $5.2 \times 10^{11}$ | $1.6 \times 10^5$ | B | 1 | A | A | B | A | A |
| Example 424 | 1 | $6.3 \times 10^9$ | $4.5 \times 10^2$ | A | 1 | A | A | A | A | A |
| Example 425 | 1 | $1.9 \times 10^{10}$ | $1.5 \times 10^3$ | AA | 1 | A | A | A | A | A |
| Example 426 | 0.5 | $1.0 \times 10^9$ | $5.0 \times 10^2$ | C | 1 | A | A | B | A | A |
| Example 427 | 1 | $2.6 \times 10^9$ | $3.7 \times 10^2$ | AA | 1 | A | A | A | A | A |
| Example 428 | 2 | $5.2 \times 10^9$ | $3.1 \times 10^2$ | AA | 1 | A | A | A | A | A |
| Example 429 | 1 | $8.7 \times 10^8$ | $2.2 \times 10^2$ | A | 1 | A | A | A | A | A |
| Example 430 | 1 | $4.5 \times 10^9$ | $4.9 \times 10^2$ | A | 1 | A | A | A | A | A |

TABLE 103

| [Table 1-13-7] | | Type of resist composition | | | | | | Type of resist composition | | | | |
|---|---|---|---|---|---|---|---|---|---|---|---|---|
| | | Resist saving performance | | | | | | Resist saving performance | | | | |
| | | Affinity | | | Film thickness | | | Affinity | | | Film thickness | |
| | | Rsq1 | SRsq | Uniformity | controllability | Developability | | Rsq1 | SRsq | Uniformity | controllability | Developability |
| Example 398 | 2 | A | A | A | A | A | 3 | A | A | A | A | A |
| Example 399 | 2 | A | A | A | A | A | 3 | A | A | A | A | A |
| Example 400 | 2 | A | A | A | A | A | 3 | A | A | A | A | A |
| Example 401 | 2 | A | A | A | A | A | 3 | A | A | A | A | A |
| Example 402 | 2 | A | A | A | A | A | 3 | A | A | A | A | A |
| Example 403 | 2 | A | A | A | A | A | 3 | A | A | A | A | A |
| Example 404 | 2 | A | A | A | A | A | 3 | A | A | A | A | A |
| Example 405 | 2 | A | A | A | A | A | 3 | A | A | A | A | A |
| Example 406 | 2 | A | A | A | A | A | 3 | A | A | A | A | A |
| Example 407 | 2 | A | A | A | A | A | 3 | A | A | A | A | A |
| Example 408 | 2 | A | A | A | A | A | 3 | A | A | A | A | A |
| Example 409 | 2 | A | A | A | A | A | 3 | A | A | A | A | A |
| Example 410 | 2 | A | A | A | A | A | 3 | A | A | A | A | A |
| Example 411 | 2 | A | A | A | A | A | 3 | A | A | A | A | A |
| Example 412 | 2 | A | A | A | A | A | 3 | A | A | A | A | A |
| Example 413 | 2 | A | A | A | A | A | 3 | A | A | A | A | A |
| Example 414 | 2 | A | A | A | A | A | 3 | A | A | A | A | A |
| Example 415 | 2 | A | A | A | A | A | 3 | A | A | A | A | A |
| Example 416 | 2 | A | A | A | A | A | 3 | A | A | A | A | A |
| Example 417 | 2 | A | A | A | A | A | 3 | A | A | A | A | A |
| Example 418 | 2 | A | A | A | A | A | 3 | A | A | A | A | A |
| Example 419 | 2 | A | A | A | A | A | 3 | A | A | A | A | A |
| Example 420 | 2 | A | A | A | A | A | 3 | A | A | A | A | A |
| Example 421 | 2 | A | A | A | A | A | 3 | A | A | A | A | A |
| Example 422 | 2 | A | A | A | A | A | 3 | A | A | A | A | A |
| Example 423 | 2 | A | A | B | A | A | 3 | A | A | B | A | A |
| Example 424 | 2 | A | A | A | A | A | 3 | A | A | A | A | A |
| Example 425 | 2 | A | A | A | A | A | 3 | A | A | A | A | A |
| Example 426 | 2 | A | A | B | A | A | 3 | A | A | B | A | A |
| Example 427 | 2 | A | A | A | A | A | 3 | A | A | A | A | A |
| Example 428 | 2 | A | A | A | A | A | 3 | A | A | A | A | A |
| Example 429 | 2 | A | A | A | A | A | 3 | A | A | A | A | A |
| Example 430 | 2 | A | A | A | A | A | 3 | A | A | A | A | A |

TABLE 104

| [Table 1-13-8] | | Type of resist composition | | | | | Evaluation of p-CMP defect inhibition | Evaluation of ashing residue removing |
|---|---|---|---|---|---|---|---|---|
| | | Resist saving performance | | | | | | |
| | | Affinity | | | Film thickness | | | |
| | | Rsq1 | SRsq | Uniformity | controllability | Developability | performance | performance |
| Example 398 | 4 | A | A | A | A | A | A | A |
| Example 399 | 4 | A | A | A | A | A | A | A |
| Example 400 | 4 | A | A | A | A | A | A | A |
| Example 401 | 4 | A | A | A | A | A | A | A |
| Example 402 | 4 | A | A | A | A | A | A | A |
| Example 403 | 4 | A | A | A | A | A | A | A |
| Example 404 | 4 | A | A | A | A | A | A | A |
| Example 405 | 4 | A | A | A | A | A | A | A |
| Example 406 | 4 | A | A | A | A | A | A | A |
| Example 407 | 4 | A | A | A | A | A | A | A |
| Example 408 | 4 | A | A | A | A | A | A | A |
| Example 409 | 4 | A | A | A | A | A | A | A |
| Example 410 | 4 | A | A | A | A | A | A | A |
| Example 411 | 4 | A | A | A | A | A | A | A |
| Example 412 | 4 | A | A | A | A | A | A | A |
| Example 413 | 4 | A | A | A | A | A | A | A |
| Example 414 | 4 | A | A | A | A | A | A | A |
| Example 415 | 4 | A | A | A | A | A | A | A |
| Example 416 | 4 | A | A | A | A | A | A | A |

TABLE 104-continued

| [Table 1-13-8] | Rsq1 | SRsq | Affinity Uniformity | Film thickness controllability | Developability | Evaluation of p-CMP defect inhibition performance | Evaluation of ashing residue removing performance |
|---|---|---|---|---|---|---|---|
| Example 417 | 4 | A | A | A | A | A | A | A |
| Example 418 | 4 | A | A | A | A | A | A | A |
| Example 419 | 4 | A | A | A | A | A | A | A |
| Example 420 | 4 | A | A | A | A | A | A | A |
| Example 421 | 4 | A | A | A | A | A | A | A |
| Example 422 | 4 | A | A | A | A | A | A | A |
| Example 423 | 4 | A | A | B | A | A | A | A |
| Example 424 | 4 | A | A | A | A | A | A | A |
| Example 425 | 4 | A | A | A | A | A | A | A |
| Example 426 | 4 | A | A | B | A | A | A | A |
| Example 427 | 4 | A | A | A | A | A | A | A |
| Example 428 | 4 | A | A | A | A | A | A | A |
| Example 429 | 4 | A | A | A | A | A | A | A |
| Example 430 | 4 | A | A | A | A | A | A | A |

TABLE 105

| | | Components of chemical liquid Main agent Organic solvent | | | | | | | |
|---|---|---|---|---|---|---|---|---|---|
| [Table 1-14-1] | Type | Content (% by mass) | Molar mass (g/mol) | Vapor pressure (Pa) | Surface tension (mN/m) | fd | fp | fh | HP |
| Example 431 | TetraEGDME | 10 | 222.28 | 13 | 27.0 | 55.6 | 21.1 | 23.2 | 1 |
| Example 432 | TEGMBE | 10 | 220.31 | 13 | 28.0 | 48.5 | 18.7 | 32.8 | 1 |
| Example 433 | DEGMBE | 10 | 162.23 | 117 | 29.0 | 59.4 | 18.1 | 22.5 | 1 |
| Example 434 | DEGME | 10 | 222.28 | 13 | 27.0 | 44.3 | 20.8 | 34.9 | 1 |
| Example 435 | DME | 10 | 220.31 | 13 | 28.0 | 55.9 | 22.8 | 21.3 | 1 |
| Example 436 | DEE | 10 | 176.21 | 117 | 29.0 | 62.2 | 19.9 | 17.8 | 1 |
| Example 437 | DEGIBE | 10 | 120.15 | 13 | 28.0 | 61.9 | 18.7 | 19.4 | 1 |
| Example 438 | DEGDME | 10 | 118.18 | 627 | 29.0 | 56.9 | 21.0 | 22.1 | 1 |
| Example 439 | DEGDEE | 10 | 162.23 | 133 | 29.0 | 60.4 | 19.6 | 20.0 | 1 |
| Example 440 | TriEGDME | 10 | 148.2 | 280 | 28.0 | 56.4 | 20.9 | 22.7 | 1 |
| Example 441 | TetraEGDME | 10 | 134.18 | 520 | 28.0 | 55.6 | 21.1 | 23.2 | 1 |
| Example 442 | TEGMBE | 10 | 220.31 | 253 | 29.0 | 48.5 | 18.7 | 32.8 | 1 |
| Example 443 | DEGMBE | 10 | 162.23 | 13 | 28.0 | 59.4 | 18.1 | 22.5 | 1 |
| Example 444 | DEGME | 10 | 222.28 | 13 | 27.0 | 44.3 | 20.8 | 34.9 | 1 |
| Example 445 | DME | 10 | 220.31 | 13 | 28.0 | 55.9 | 22.8 | 21.3 | 1 |
| Example 446 | DEE | 10 | 176.21 | 117 | 29.0 | 62.2 | 19.9 | 17.8 | 1 |
| Example 447 | DEGIBE | 10 | 120.15 | 13 | 28.0 | 61.9 | 18.7 | 19.4 | 1 |
| Example 448 | DEGDME | 10 | 118.18 | 627 | 29.0 | 56.9 | 21.0 | 22.1 | 1 |
| Example 449 | DEGDEE | 10 | 162.23 | 133 | 29.0 | 60.4 | 19.6 | 20.0 | 1 |
| Example 450 | TriEGDME | 10 | 148.2 | 280 | 28.0 | 56.4 | 20.9 | 22.7 | 1 |
| Example 451 | TetraEGDME | 10 | 134.18 | 520 | 28.0 | 55.6 | 21.1 | 23.2 | 1 |
| Example 452 | TEGMBE | 10 | 220.31 | 253 | 29.0 | 48.5 | 18.7 | 32.8 | 1 |
| Example 453 | DEGMBE | 10 | 162.23 | 13 | 28.0 | 59.4 | 18.1 | 22.5 | 1 |
| Example 454 | DEGME | 10 | 222.28 | 13 | 27.0 | 44.3 | 20.8 | 34.9 | 1 |
| Example 455 | DME | 10 | 220.31 | 13 | 28.0 | 55.9 | 22.8 | 21.3 | 1 |
| Example 456 | DEE | 10 | 176.21 | 117 | 29.0 | 62.2 | 19.9 | 17.8 | 1 |
| Example 457 | DEGIBE | 10 | 120.15 | 13 | 28.0 | 61.9 | 18.7 | 19.4 | 1 |
| Example 458 | DEGDME | 10 | 118.18 | 627 | 29.0 | 56.9 | 21.0 | 22.1 | 1 |
| Example 459 | DEGDEE | 10 | 162.23 | 133 | 29.0 | 60.4 | 19.6 | 20.0 | 1 |
| Example 460 | TriEGDME | 10 | 148.2 | 280 | 28.0 | 56.4 | 20.9 | 22.7 | 1 |
| Example 461 | TetraEGDME | 10 | 134.18 | 520 | 28.0 | 55.6 | 21.1 | 23.2 | 1 |
| Example 462 | TEGMBE | 10 | 220.31 | 253 | 29.0 | 48.5 | 18.7 | 32.8 | 1 |
| Example 463 | DEGMBE | 10 | 162.23 | 13 | 28.0 | 59.4 | 18.1 | 22.5 | 1 |

TABLE 106

Components of chemical liquid
Main agent
Organic solvent

| [Table 1-14-2] | Type | Content (% by mass) | Molar mass (g/mol) | Vapor pressure (Pa) | Surface tension (mN/m) | fd | fp | fh | HP |
|---|---|---|---|---|---|---|---|---|---|
| Example 431 | 13-DMB | 10 | 138.17 | 1 | 30.0 | 61.6 | 19.9 | 18.5 | 1 |
| Example 432 | 13-DMB | 10 | 138.17 | 1 | 30.0 | 61.6 | 19.9 | 18.5 | 1 |
| Example 433 | 13-DMB | 10 | 138.17 | 1 | 30.0 | 61.6 | 19.9 | 18.5 | 1 |
| Example 434 | 14-DPB | 10 | 262.31 | 1 | 33.0 | 63.3 | 18.5 | 18.2 | 1 |
| Example 435 | 14-DPB | 10 | 262.31 | 1 | 33.0 | 63.3 | 18.5 | 18.2 | 1 |
| Example 436 | 14-DPB | 10 | 262.31 | 1 | 33.0 | 63.3 | 18.5 | 18.2 | 1 |
| Example 437 | 14-DPB | 10 | 262.31 | 1 | 33.0 | 63.3 | 18.5 | 18.2 | 1 |
| Example 438 | 14-DPB | 10 | 262.31 | 1 | 33.0 | 63.3 | 18.5 | 18.2 | 1 |
| Example 439 | 14-DPB | 10 | 262.31 | 1 | 33.0 | 63.3 | 18.5 | 18.2 | 1 |
| Example 440 | 14-DPB | 10 | 262.31 | 1 | 33.0 | 63.3 | 18.5 | 18.2 | 1 |
| Example 441 | 14-DPB | 10 | 262.31 | 1 | 33.0 | 63.3 | 18.5 | 18.2 | 1 |
| Example 442 | 14-DPB | 10 | 262.31 | 1 | 33.0 | 63.3 | 18.5 | 18.2 | 1 |
| Example 443 | 14-DPB | 10 | 262.31 | 1 | 33.0 | 63.3 | 18.5 | 18.2 | 1 |
| Example 444 | 4-MTT | 10 | 122.17 | 1 | 32.0 | 64.8 | 17.4 | 17.8 | 1 |
| Example 445 | 4-MTT | 10 | 122.17 | 1 | 32.0 | 64.8 | 17.4 | 17.8 | 1 |
| Example 446 | 4-MTT | 10 | 122.17 | 1 | 32.0 | 64.8 | 17.4 | 17.8 | 1 |
| Example 447 | 4-MTT | 10 | 122.17 | 1 | 32.0 | 64.8 | 17.4 | 17.8 | 1 |
| Example 448 | 4-MTT | 10 | 122.17 | 1 | 32.0 | 64.8 | 17.4 | 17.8 | 1 |
| Example 449 | 4-MTT | 10 | 122.17 | 1 | 32.0 | 64.8 | 17.4 | 17.8 | 1 |
| Example 450 | 4-MTT | 10 | 122.17 | 1 | 32.0 | 64.8 | 17.4 | 17.8 | 1 |
| Example 451 | 4-MTT | 10 | 122.17 | 1 | 32.0 | 64.8 | 17.4 | 17.8 | 1 |
| Example 452 | 4-MTT | 10 | 122.17 | 1 | 32.0 | 64.8 | 17.4 | 17.8 | 1 |
| Example 453 | 4-MTT | 10 | 122.17 | 1 | 32.0 | 64.8 | 17.4 | 17.8 | 1 |
| Example 454 | PNT | 10 | 122.17 | 1 | 31.0 | 66.3 | 16.3 | 17.4 | 1 |
| Example 455 | PNT | 10 | 122.17 | 1 | 31.0 | 66.3 | 16.3 | 17.4 | 1 |
| Example 456 | PNT | 10 | 122.17 | 1 | 31.0 | 66.3 | 16.3 | 17.4 | 1 |
| Example 457 | PNT | 10 | 122.17 | 1 | 31.0 | 66.3 | 16.3 | 17.4 | 1 |
| Example 458 | PNT | 10 | 122.17 | 1 | 31.0 | 66.3 | 16.3 | 17.4 | 1 |
| Example 459 | PNT | 10 | 122.17 | 1 | 31.0 | 66.3 | 16.3 | 17.4 | 1 |
| Example 460 | PNT | 10 | 122.17 | 1 | 31.0 | 66.3 | 16.3 | 17.4 | 1 |
| Example 461 | PNT | 10 | 122.17 | 1 | 31.0 | 66.3 | 16.3 | 17.4 | 1 |
| Example 462 | PNT | 10 | 122.17 | 1 | 31.0 | 66.3 | 16.3 | 17.4 | 1 |
| Example 463 | PNT | 10 | 122.17 | 1 | 31.0 | 66.3 | 16.3 | 17.4 | 1 |

TABLE 107

Components of chemical liquid
Main agent

Organic solvent

| [Table 1-14-3] | Type | Content (% by mass) | Molar mass (g/mol) | Vapor pressure (Pa) | Surface tension (mN/m) | fd | fp | fh | HP | Vapor pressure (Pa) | Surface tension (mN/m) |
|---|---|---|---|---|---|---|---|---|---|---|---|
| Example 431 | nBA | 80 | 116.16 | 1,200 | 24.8 | 60.5 | 17.2 | 22.2 | 1.00 | 1,026 | 25.4 |
| Example 432 | nBA | 80 | 116.16 | 1,200 | 24.8 | 60.5 | 17.2 | 22.2 | 1.00 | 1,026 | 25.4 |
| Example 433 | nBA | 80 | 116.16 | 1,200 | 24.8 | 60.5 | 17.2 | 22.2 | 1.00 | 1,013 | 25.6 |
| Example 434 | nBA | 80 | 116.16 | 1,200 | 24.8 | 60.5 | 17.2 | 22.2 | 1.00 | 1,072 | 25.3 |
| Example 435 | nBA | 80 | 116.16 | 1,200 | 24.8 | 60.5 | 17.2 | 22.2 | 1.00 | 1,071 | 25.4 |
| Example 436 | nBA | 80 | 116.16 | 1,200 | 24.8 | 60.5 | 17.2 | 22.2 | 1.00 | 1,063 | 25.5 |
| Example 437 | nBA | 80 | 116.16 | 1,200 | 24.8 | 60.5 | 17.2 | 22.2 | 1.00 | 1,022 | 25.5 |
| Example 438 | nBA | 80 | 116.16 | 1,200 | 24.8 | 60.5 | 17.2 | 22.2 | 1.00 | 1,084 | 25.6 |
| Example 439 | nBA | 80 | 116.16 | 1,200 | 24.8 | 60.5 | 17.2 | 22.2 | 1.00 | 1,059 | 25.5 |
| Example 440 | nBA | 80 | 116.16 | 1,200 | 24.8 | 60.5 | 17.2 | 22.2 | 1.00 | 1,064 | 25.5 |
| Example 441 | nBA | 80 | 116.16 | 1,200 | 24.8 | 60.5 | 17.2 | 22.2 | 1.00 | 1,080 | 25.5 |
| Example 442 | nBA | 80 | 116.16 | 1,200 | 24.8 | 60.5 | 17.2 | 22.2 | 1.00 | 1,085 | 25.5 |
| Example 443 | nBA | 80 | 116.16 | 1,200 | 24.8 | 60.5 | 17.2 | 22.2 | 1.00 | 1,049 | 25.4 |
| Example 444 | nBA | 80 | 116.16 | 1,200 | 24.8 | 60.5 | 17.2 | 22.2 | 1.00 | 1,014 | 25.6 |
| Example 445 | nBA | 80 | 116.16 | 1,200 | 24.8 | 60.5 | 17.2 | 22.2 | 1.00 | 1,014 | 25.7 |
| Example 446 | nBA | 80 | 116.16 | 1,200 | 24.8 | 60.5 | 17.2 | 22.2 | 1.00 | 1,007 | 25.8 |
| Example 447 | nBA | 80 | 116.16 | 1,200 | 24.8 | 60.5 | 17.2 | 22.2 | 1.00 | 969 | 25.8 |
| Example 448 | nBA | 80 | 116.16 | 1,200 | 24.8 | 60.5 | 17.2 | 22.2 | 1.00 | 1,028 | 25.9 |
| Example 449 | nBA | 80 | 116.16 | 1,200 | 24.8 | 60.5 | 17.2 | 22.2 | 1.00 | 1,003 | 25.8 |
| Example 450 | nBA | 80 | 116.16 | 1,200 | 24.8 | 60.5 | 17.2 | 22.2 | 1.00 | 1,009 | 25.8 |
| Example 451 | nBA | 80 | 116.16 | 1,200 | 24.8 | 60.5 | 17.2 | 22.2 | 1.00 | 1,024 | 25.8 |
| Example 452 | nBA | 80 | 116.16 | 1,200 | 24.8 | 60.5 | 17.2 | 22.2 | 1.00 | 1,027 | 25.8 |
| Example 453 | nBA | 80 | 116.16 | 1,200 | 24.8 | 60.5 | 17.2 | 22.2 | 1.00 | 994 | 25.7 |

TABLE 107-continued

| [Table 1-14-3] | Type | Content (% by mass) | Molar mass (g/mol) | Vapor pressure (Pa) | Surface tension (mN/m) | fd | fp | fh | HP | Vapor pressure (Pa) | Surface tension (mN/m) |
|---|---|---|---|---|---|---|---|---|---|---|---|
| Example 454 | nBA | 80 | 116.16 | 1,200 | 24.8 | 60.5 | 17.2 | 22.2 | 1.00 | 1,014 | 25.5 |
| Example 455 | nBA | 80 | 116.16 | 1,200 | 24.8 | 60.5 | 17.2 | 22.2 | 1.00 | 1,014 | 25.6 |
| Example 456 | nBA | 80 | 116.16 | 1,200 | 24.8 | 60.5 | 17.2 | 22.2 | 1.00 | 1,007 | 25.7 |
| Example 457 | nBA | 80 | 116.16 | 1,200 | 24.8 | 60.5 | 17.2 | 22.2 | 1.00 | 969 | 25.7 |
| Example 458 | nBA | 80 | 116.16 | 1,200 | 24.8 | 60.5 | 17.2 | 22.2 | 1.00 | 1,028 | 25.8 |
| Example 459 | nBA | 80 | 116.16 | 1,200 | 24.8 | 60.5 | 17.2 | 22.2 | 1.00 | 1,003 | 25.7 |
| Example 460 | nBA | 80 | 116.16 | 1,200 | 24.8 | 60.5 | 17.2 | 22.2 | 1.00 | 1,009 | 25.7 |
| Example 461 | nBA | 80 | 116.16 | 1,200 | 24.8 | 60.5 | 17.2 | 22.2 | 1.00 | 1,024 | 25.7 |
| Example 462 | nBA | 80 | 116.16 | 1,200 | 24.8 | 60.5 | 17.2 | 22.2 | 1.00 | 1,027 | 25.7 |
| Example 463 | nBA | 80 | 116.16 | 1,200 | 24.8 | 60.5 | 17.2 | 22.2 | 1.00 | 994 | 25.6 |

TABLE 108

| | Components of chemical liquid Main agent | Components of chemical liquid Surfactant | | Components of chemical liquid Impurity metal Total content of impurity metal (mass ppt) | | | | | |
|---|---|---|---|---|---|---|---|---|---|
| | Content | | Content | | | | | | |
| [Table 1-14-4] | (% by mass) | Type | (mass ppm) | Fe | Cr | Ni | Pb | Others | Total |
| Example 431 | Balance | A | 50 | 0.002 | 0.002 | 0.002 | 0.002 | 0.024 | 0.032 |
| Example 432 | Balance | J | 100 | 0.006 | 0.006 | 0.006 | 0.006 | 0.072 | 0.096 |
| Example 433 | Balance | A | 100 | 0.0048 | 0.0048 | 0.0048 | 0.0048 | 0.0576 | 0.0768 |
| Example 434 | Balance | A | 50 | 0.0024 | 0.0024 | 0.0024 | 0.0024 | 0.0288 | 0.0384 |
| Example 435 | Balance | E | 100 | 0.0072 | 0.0072 | 0.0072 | 0.0072 | 0.0864 | 0.1152 |
| Example 436 | Balance | E | 100 | 0.003 | 0.003 | 0.002 | 0.001 | 0.027 | 0.036 |
| Example 437 | Balance | A | 50 | 0.002 | 0.002 | 0.002 | 0.002 | 0.024 | 0.032 |
| Example 438 | Balance | B | 100 | 0.006 | 0.006 | 0.006 | 0.006 | 0.072 | 0.096 |
| Example 439 | Balance | F | 100 | 0.0048 | 0.0048 | 0.0048 | 0.0048 | 0.0576 | 0.0768 |
| Example 440 | Balance | C | 100 | 0.0024 | 0.0024 | 0.0024 | 0.0024 | 0.0288 | 0.0384 |
| Example 441 | Balance | A | 50 | 0.0072 | 0.0072 | 0.0072 | 0.0072 | 0.0864 | 0.1152 |
| Example 442 | Balance | C | 100 | 0.002 | 0.002 | 0.001 | 0.001 | 0.018 | 0.024 |
| Example 443 | Balance | A | 100 | 0.002 | 0.002 | 0.002 | 0.002 | 0.024 | 0.032 |
| Example 444 | Balance | A | 100 | 0.006 | 0.006 | 0.006 | 0.006 | 0.072 | 0.096 |
| Example 445 | Balance | A | 50 | 0.0048 | 0.0048 | 0.0048 | 0.0048 | 0.0576 | 0.0768 |
| Example 446 | Balance | A | 100 | 0.0024 | 0.0024 | 0.0024 | 0.0024 | 0.0288 | 0.0384 |
| Example 447 | Balance | A | 100 | 0.0072 | 0.0072 | 0.0072 | 0.0072 | 0.0864 | 0.1152 |
| Example 448 | Balance | A | 100 | 0.001 | 0.001 | 0.001 | 0.001 | 0.012 | 0.016 |
| Example 449 | Balance | A | 100 | 0.002 | 0.002 | 0.002 | 0.002 | 0.024 | 0.032 |
| Example 450 | Balance | A | 100 | 0.006 | 0.006 | 0.006 | 0.006 | 0.072 | 0.096 |
| Example 451 | Balance | A | 100 | 0.0048 | 0.0048 | 0.0048 | 0.0048 | 0.0576 | 0.0768 |
| Example 452 | Balance | A | 100 | 0.0024 | 0.0024 | 0.0024 | 0.0024 | 0.0288 | 0.0384 |
| Example 453 | Balance | A | 100 | 0.0072 | 0.0072 | 0.0072 | 0.0072 | 0.0864 | 0.1152 |
| Example 454 | Balance | A | 100 | 0.005 | 0.001 | 0.002 | 0.001 | 0.027 | 0.036 |
| Example 455 | Balance | A | 100 | 0.002 | 0.002 | 0.002 | 0.002 | 0.024 | 0.032 |
| Example 456 | Balance | A | 100 | 0.006 | 0.006 | 0.006 | 0.006 | 0.072 | 0.096 |
| Example 457 | Balance | A | 100 | 0.0048 | 0.0048 | 0.0048 | 0.0048 | 0.0576 | 0.0768 |
| Example 458 | Balance | A | 100 | 0.0024 | 0.0024 | 0.0024 | 0.0024 | 0.0288 | 0.0384 |
| Example 459 | Balance | A | 100 | 0.0072 | 0.0072 | 0.0072 | 0.0072 | 0.0864 | 0.1152 |
| Example 460 | Balance | A | 100 | 0.001 | 0.001 | 0.001 | 0.002 | 0.015 | 0.02 |
| Example 461 | Balance | A | 100 | 0.002 | 0.002 | 0.002 | 0.002 | 0.024 | 0.032 |
| Example 462 | Balance | A | 100 | 0.006 | 0.006 | 0.006 | 0.006 | 0.072 | 0.096 |
| Example 463 | Balance | A | 100 | 0.0048 | 0.0048 | 0.0048 | 0.0048 | 0.0576 | 0.0768 |

TABLE 109

Components of chemical liquid

| [Table 1-14-5] | Impurity metal Content of particles containing following impurity metal (mass ppt) | | | | | | Content of organic impurity (mass ppm) | | Water Content |
|---|---|---|---|---|---|---|---|---|---|
| | Fe | Cr | Ni | Pb | Others | Total | Total | High-boiling-point component | (% by mass) |
| Example 431 | 0.001 | 0.001 | 0.001 | 0.001 | 0.012 | 0.016 | 153 | 0.6 | 0.10% |
| Example 432 | 0.003 | 0.003 | 0.003 | 0.003 | 0.036 | 0.048 | 183 | 0.7 | 0.10% |
| Example 433 | 0.0024 | 0.0024 | 0.0024 | 0.0024 | 0.0288 | 0.0384 | 110 | 0.4 | 0.10% |
| Example 434 | 0.0012 | 0.0012 | 0.0012 | 0.0012 | 0.0144 | 0.0192 | 77 | 0.3 | 0.10% |
| Example 435 | 0.0036 | 0.0036 | 0.0036 | 0.0036 | 0.0432 | 0.0576 | 69 | 0.3 | 0.10% |
| Example 436 | 0.0015 | 0.0015 | 0.001 | 0.001 | 0.015 | 0.02 | 35 | 0.1 | 0.10% |
| Example 437 | 0.001 | 0.001 | 0.001 | 0.001 | 0.012 | 0.016 | 94 | 0.4 | 0.10% |
| Example 438 | 0.003 | 0.003 | 0.003 | 0.003 | 0.036 | 0.048 | 112 | 0.4 | 0.10% |
| Example 439 | 0.0024 | 0.0024 | 0.0024 | 0.0024 | 0.0288 | 0.0384 | 79 | 0.3 | 0.10% |
| Example 440 | 0.0012 | 0.0012 | 0.0012 | 0.0012 | 0.0144 | 0.0192 | 71 | 0.3 | 0.10% |
| Example 441 | 0.0036 | 0.0036 | 0.0036 | 0.0036 | 0.0432 | 0.0576 | 142 | 0.6 | 0.10% |
| Example 442 | 0.001 | 0.001 | 0.001 | 0.001 | 0.012 | 0.016 | 170 | 0.7 | 0.10% |
| Example 443 | 0.001 | 0.001 | 0.001 | 0.001 | 0.012 | 0.016 | 204 | 0.8 | 0.10% |
| Example 444 | 0.003 | 0.003 | 0.003 | 0.003 | 0.036 | 0.048 | 143 | 0.6 | 0.10% |
| Example 445 | 0.0024 | 0.0024 | 0.0024 | 0.0024 | 0.0288 | 0.0384 | 128 | 0.5 | 0.10% |
| Example 446 | 0.0012 | 0.0012 | 0.0012 | 0.0012 | 0.0144 | 0.0192 | 64 | 0.3 | 0.10% |
| Example 447 | 0.0036 | 0.0036 | 0.0036 | 0.0036 | 0.0432 | 0.0576 | 173 | 0.7 | 0.10% |
| Example 448 | 0.001 | 0.001 | 0.001 | 0.001 | 0.012 | 0.016 | 208 | 0.8 | 0.10% |
| Example 449 | 0.001 | 0.001 | 0.001 | 0.001 | 0.012 | 0.016 | 146 | 0.6 | 0.10% |
| Example 450 | 0.003 | 0.003 | 0.003 | 0.003 | 0.036 | 0.048 | 131 | 0.5 | 0.10% |
| Example 451 | 0.0024 | 0.0024 | 0.0024 | 0.0024 | 0.0288 | 0.0384 | 157 | 0.6 | 0.10% |
| Example 452 | 0.0012 | 0.0012 | 0.0012 | 0.0012 | 0.0144 | 0.0192 | 472 | 1.9 | 0.10% |
| Example 453 | 0.0036 | 0.0036 | 0.0036 | 0.0036 | 0.0432 | 0.0576 | 566 | 2.3 | 0.10% |
| Example 454 | 0.0025 | 0.001 | 0.001 | 0.001 | 0.0165 | 0.022 | 340 | 1.4 | 0.10% |
| Example 455 | 0.001 | 0.001 | 0.001 | 0.001 | 0.012 | 0.016 | 238 | 1.0 | 0.10% |
| Example 456 | 0.003 | 0.003 | 0.003 | 0.003 | 0.036 | 0.048 | 214 | 0.9 | 0.10% |
| Example 457 | 0.0024 | 0.0024 | 0.0024 | 0.0024 | 0.0288 | 0.0384 | 107 | 0.4 | 0.10% |
| Example 458 | 0.0012 | 0.0012 | 0.0012 | 0.0012 | 0.0144 | 0.0192 | 289 | 1.2 | 0.10% |
| Example 459 | 0.0036 | 0.0036 | 0.0036 | 0.0036 | 0.0432 | 0.0576 | 347 | 1.4 | 0.10% |
| Example 460 | 0.001 | 0.001 | 0.001 | 0.001 | 0.012 | 0.016 | 243 | 1.0 | 0.10% |
| Example 461 | 0.001 | 0.001 | 0.001 | 0.001 | 0.012 | 0.016 | 218 | 0.9 | 0.10% |
| Example 462 | 0.003 | 0.003 | 0.003 | 0.003 | 0.036 | 0.048 | 437 | 1.7 | 0.10% |
| Example 463 | 0.0024 | 0.0024 | 0.0024 | 0.0024 | 0.0288 | 0.0384 | 524 | 2.1 | 0.10% |

TABLE 110

| [Table 1-14-6] | Physical properties of chemical liquid | | | Evaluation | | | | | | |
|---|---|---|---|---|---|---|---|---|---|---|
| | | | | | | | Type of resist composition | | | |
| | Number of coarse particles (number/ml) | Content of surfactant/total content of particles | Content of surfactant/content of high-boiling-point component | Defect inhibition performance | Affinity | | | Resist saving performance | | |
| | | | | | Rsq1 | SRsq | Uniformity | Film thickness controllability | Developability | |
| Example 431 | 3 | $3.1 \times 10^9$ | $8.2 \times 10^1$ | AA | 1 | A | A | A | A | A |
| Example 432 | 4 | $2.1 \times 10^9$ | $1.4 \times 10^2$ | A | 1 | A | A | A | A | A |
| Example 433 | 2 | $2.6 \times 10^9$ | $2.3 \times 10^2$ | AA | 1 | A | A | A | A | A |
| Example 434 | 2 | $2.6 \times 10^9$ | $1.6 \times 10^2$ | AA | 1 | A | A | A | A | A |
| Example 435 | 1 | $1.7 \times 10^9$ | $3.6 \times 10^2$ | A | 1 | A | A | A | A | A |
| Example 436 | 0.7 | $5.0 \times 10^9$ | $7.2 \times 10^2$ | A | 1 | A | A | B | A | A |
| Example 437 | 2 | $3.1 \times 10^9$ | $1.3 \times 10^2$ | AA | 1 | A | A | A | A | A |
| Example 438 | 2 | $2.1 \times 10^9$ | $2.2 \times 10^2$ | AA | 1 | A | A | A | A | A |
| Example 439 | 2 | $2.6 \times 10^9$ | $3.2 \times 10^2$ | A | 1 | A | A | A | A | A |
| Example 440 | 1 | $5.2 \times 10^9$ | $3.5 \times 10^2$ | AA | 1 | A | A | A | A | A |
| Example 441 | 3 | $8.7 \times 10^8$ | $8.8 \times 10^1$ | AA | 1 | A | A | A | A | A |
| Example 442 | 3 | $6.3 \times 10^9$ | $1.5 \times 10^2$ | AA | 1 | A | A | A | A | A |
| Example 443 | 4 | $6.3 \times 10^9$ | $1.2 \times 10^2$ | AA | 1 | A | A | A | A | A |
| Example 444 | 3 | $2.1 \times 10^9$ | $1.8 \times 10^2$ | AA | 1 | A | A | A | A | A |
| Example 445 | 3 | $1.3 \times 10^9$ | $9.7 \times 10^1$ | AA | 1 | A | A | A | A | A |
| Example 446 | 1 | $5.2 \times 10^9$ | $3.9 \times 10^2$ | AA | 1 | A | A | A | A | A |
| Example 447 | 3 | $1.7 \times 10^9$ | $1.4 \times 10^2$ | AA | 1 | A | A | A | A | A |
| Example 448 | 4 | $6.3 \times 10^9$ | $1.2 \times 10^2$ | AA | 1 | A | A | A | A | A |

TABLE 110-continued

| [Table 1-14-6] | Physical properties of chemical liquid | | | Evaluation | | | | | | |
|---|---|---|---|---|---|---|---|---|---|---|
| | | | | | Type of resist composition | | | | | |
| | | | | | | Resist saving performance | | | | |
| | Number of coarse particles (number/ml) | Content of surfactant/total content of particles | Content of surfactant/content of high-boiling-point component | Defect inhibition performance | | Affinity | | Uniformity | Film thickness controllability | Developability |
| | | | | | | Rsq1 | SRsq | | | |
| Example 449 | 3 | $6.3 \times 10^9$ | $1.7 \times 10^2$ | AA | 1 | A | A | A | A | A |
| Example 450 | 3 | $2.1 \times 10^9$ | $1.9 \times 10^2$ | AA | 1 | A | A | A | A | A |
| Example 451 | 3 | $2.6 \times 10^9$ | $1.6 \times 10^2$ | AA | 1 | A | A | A | A | A |
| Example 452 | 9 | $5.2 \times 10^9$ | $5.3 \times 10^1$ | AA | 1 | A | A | A | A | A |
| Example 453 | 11 | $1.7 \times 10^9$ | $4.4 \times 10^1$ | AA | 1 | A | A | A | A | A |
| Example 454 | 7 | $4.5 \times 10^9$ | $7.4 \times 10^1$ | AA | 1 | A | A | A | A | A |
| Example 455 | 5 | $6.3 \times 10^9$ | $1.1 \times 10^2$ | AA | 1 | A | A | A | A | A |
| Example 456 | 4 | $2.1 \times 10^9$ | $1.2 \times 10^2$ | AA | 1 | A | A | A | A | A |
| Example 457 | 2 | $2.6 \times 10^9$ | $2.3 \times 10^2$ | AA | 1 | A | A | A | A | A |
| Example 458 | 6 | $5.2 \times 10^9$ | $8.7 \times 10^1$ | AA | 1 | A | A | A | A | A |
| Example 459 | 7 | $1.7 \times 10^9$ | $7.2 \times 10^1$ | AA | 1 | A | A | A | A | A |
| Example 460 | 5 | $6.3 \times 10^9$ | $1.0 \times 10^2$ | AA | 1 | A | A | A | A | A |
| Example 461 | 4 | $6.3 \times 10^9$ | $1.1 \times 10^2$ | AA | 1 | A | A | A | A | A |
| Example 462 | 9 | $2.1 \times 10^9$ | $5.7 \times 10^1$ | AA | 1 | A | A | A | A | A |
| Example 463 | 10 | $2.6 \times 10^9$ | $4.8 \times 10^1$ | AA | 1 | A | A | A | A | A |

TABLE 111

| [Table 1-14-7] | Evaluation | | | | | | | | | | |
|---|---|---|---|---|---|---|---|---|---|---|---|
| | Type of resist composition | | | | | | Type of resist composition | | | | |
| | Resist saving performance | | | | | | Resist saving performance | | | | |
| | | Affinity | | | Film thickness | | | Affinity | | | Film thickness |
| | | Rsq1 | SRsq | Uniformity | controllability | Developability | | Rsq1 | SRsq | Uniformity | controllability | Developability |
| Example 431 | 2 | A | A | A | A | A | 3 | A | A | A | A | A |
| Example 432 | 2 | A | A | A | A | A | 3 | A | A | A | A | A |
| Example 433 | 2 | A | A | A | A | A | 3 | A | A | A | A | A |
| Example 434 | 2 | A | A | A | A | A | 3 | A | A | A | A | A |
| Example 435 | 2 | A | A | A | A | A | 3 | A | A | A | A | A |
| Example 436 | 2 | A | A | B | A | A | 3 | A | A | B | A | A |
| Example 437 | 2 | A | A | A | A | A | 3 | A | A | A | A | A |
| Example 438 | 2 | A | A | A | A | A | 3 | A | A | A | A | A |
| Example 439 | 2 | A | A | A | A | A | 3 | A | A | A | A | A |
| Example 440 | 2 | A | A | A | A | A | 3 | A | A | A | A | A |
| Example 441 | 2 | A | A | A | A | A | 3 | A | A | A | A | A |
| Example 442 | 2 | A | A | A | A | A | 3 | A | A | A | A | A |
| Example 443 | 2 | A | A | A | A | A | 3 | A | A | A | A | A |
| Example 444 | 2 | A | A | A | A | A | 3 | A | A | A | A | A |
| Example 445 | 2 | A | A | A | A | A | 3 | A | A | A | A | A |
| Example 446 | 2 | A | A | A | A | A | 3 | A | A | A | A | A |
| Example 447 | 2 | A | A | A | A | A | 3 | A | A | A | A | A |
| Example 448 | 2 | A | A | A | A | A | 3 | A | A | A | A | A |
| Example 449 | 2 | A | A | A | A | A | 3 | A | A | A | A | A |
| Example 450 | 2 | A | A | A | A | A | 3 | A | A | A | A | A |
| Example 451 | 2 | A | A | A | A | A | 3 | A | A | A | A | A |
| Example 452 | 2 | A | A | A | A | A | 3 | A | A | A | A | A |
| Example 453 | 2 | A | A | A | A | A | 3 | A | A | A | A | A |
| Example 454 | 2 | A | A | A | A | A | 3 | A | A | A | A | A |
| Example 455 | 2 | A | A | A | A | A | 3 | A | A | A | A | A |
| Example 456 | 2 | A | A | A | A | A | 3 | A | A | A | A | A |
| Example 457 | 2 | A | A | A | A | A | 3 | A | A | A | A | A |
| Example 458 | 2 | A | A | A | A | A | 3 | A | A | A | A | A |
| Example 459 | 2 | A | A | A | A | A | 3 | A | A | A | A | A |
| Example 460 | 2 | A | A | A | A | A | 3 | A | A | A | A | A |
| Example 461 | 2 | A | A | A | A | A | 3 | A | A | A | A | A |
| Example 462 | 2 | A | A | A | A | A | 3 | A | A | A | A | A |
| Example 463 | 2 | A | A | A | A | A | 3 | A | A | A | A | A |

TABLE 112

| [Table 1-14-8] | Rsq1 | Affinity SRsq | Uniformity | Resist saving performance Film thickness controllability | Developability | Evaluation of p-CMP defect inhibition performance | Evaluation of ashing residue removing performance |
|---|---|---|---|---|---|---|---|
| Example 431 | 4 | A A | A | A | A | A | A |
| Example 432 | 4 | A A | A | A | A | A | A |
| Example 433 | 4 | A A | A | A | A | A | A |
| Example 434 | 4 | A A | A | A | A | A | A |
| Example 435 | 4 | A A | A | A | A | A | A |
| Example 436 | 4 | A A | B | A | A | A | A |
| Example 437 | 4 | A A | A | A | A | A | A |
| Example 438 | 4 | A A | A | A | A | A | A |
| Example 439 | 4 | A A | A | A | A | A | A |
| Example 440 | 4 | A A | A | A | A | A | A |
| Example 441 | 4 | A A | A | A | A | A | A |
| Example 442 | 4 | A A | A | A | A | A | A |
| Example 443 | 4 | A A | A | A | A | A | A |
| Example 444 | 4 | A A | A | A | A | A | A |
| Example 445 | 4 | A A | A | A | A | A | A |
| Example 446 | 4 | A A | A | A | A | A | A |
| Example 447 | 4 | A A | A | A | A | A | A |
| Example 448 | 4 | A A | A | A | A | A | A |
| Example 449 | 4 | A A | A | A | A | A | A |
| Example 450 | 4 | A A | A | A | A | A | A |
| Example 451 | 4 | A A | A | A | A | A | A |
| Example 452 | 4 | A A | A | A | A | A | A |
| Example 453 | 4 | A A | A | A | A | A | A |
| Example 454 | 4 | A A | A | A | A | A | A |
| Example 455 | 4 | A A | A | A | A | A | A |
| Example 456 | 4 | A A | A | A | A | A | A |
| Example 457 | 4 | A A | A | A | A | A | A |
| Example 458 | 4 | A A | A | A | A | A | A |
| Example 459 | 4 | A A | A | A | A | A | A |
| Example 460 | 4 | A A | A | A | A | A | A |
| Example 461 | 4 | A A | A | A | A | A | A |
| Example 462 | 4 | A A | A | A | A | A | A |
| Example 463 | 4 | A A | A | A | A | A | A |

TABLE 113

| [Table 1-15-1] | Type | Content (% by mass) | Molar mass (g/mol) | Vapor pressure (Pa) | Surface tension (mN/m) | fd | fp | fh | HP |
|---|---|---|---|---|---|---|---|---|---|
| Example 464 | MMP | 15 | 118.13 | 320 | 33.6 | 53.0 | 22.0 | 25.0 | 1 |
| Example 465 | MMP | 10 | 118.13 | 320 | 33.6 | 53.0 | 22.0 | 25.0 | 1 |
| Example 466 | MMP | 10 | 118.13 | 320 | 33.6 | 53.0 | 22.0 | 25.0 | 1 |
| Example 467 | MMP | 10 | 118.13 | 320 | 33.6 | 53.0 | 22.0 | 25.0 | 1 |
| Example 468 | MMP | 10 | 118.13 | 320 | 33.6 | 53.0 | 22.0 | 25.0 | 1 |
| Example 469 | MMP | 30 | 118.13 | 320 | 33.6 | 53.0 | 22.0 | 25.0 | 1 |
| Example 470 | MMP | 10 | 118.13 | 320 | 33.6 | 53.0 | 22.0 | 25.0 | 1 |
| Comparative Example 1 | PGME | 30 | 90.1 | 1,453 | 27.6 | 43.2 | 28.8 | 28.0 | 1 |
| Comparative Example 2 | PGME | 30 | 90.1 | 1,453 | 27.6 | 43.2 | 28.8 | 28.0 | 1 |
| Comparative Example 3 | PGME | 30 | 90.1 | 1,453 | 27.6 | 43.2 | 28.8 | 28.0 | 1 |
| Comparative Example 4 | Dodecane | 100 | 170.34 | 0.41 | 54.7 | 100.0 | 0.0 | 0.0 | 0 |
| Example 471 | CyPn | 50 | 84.1 | 1,520 | 33.8 | 60.0 | 21.8 | 18.2 | 1 |
| Example 472 | CyPn | 50 | 84.1 | 1,520 | 33.8 | 60.0 | 21.8 | 18.2 | 1 |
| Example 473 | CyPn | 50 | 84.1 | 1,520 | 33.8 | 60.0 | 21.8 | 18.2 | 1 |
| Comparative Example 5 | PGME | 100 | 90.1 | 1,453 | 27.6 | 43.2 | 28.8 | 28.0 | 1 |

TABLE 114

| [Table 1-15-2] | Type | Content (% by mass) | Molar mass (g/mol) | Vapor pressure (Pa) | Surface tension (mN/m) | fd | fp | fh | HP |
|---|---|---|---|---|---|---|---|---|---|
| Example 464 | PGME | 85 | 90.12 | 1,453 | 27.6 | 43.2 | 28.8 | 28.0 | 1 |
| Example 465 | nBA | 90 | 116.16 | 1,200 | 24.8 | 60.5 | 17.2 | 22.2 | 1 |
| Example 466 | PGMEA | 90 | 132.16 | 493 | 27.9 | 56.5 | 19.8 | 23.7 | 1 |
| Example 467 | EL | 90 | 118.13 | 187 | 29.8 | 55.5 | 19.8 | 24.7 | 1 |
| Example 468 | GBL | 90 | 86.08 | 147 | 44.1 | 42.9 | 39.5 | 17.6 | 1 |
| Example 469 | DMSO | 70 | 78.13 | 13 | 43.6 | 40.9 | 36.4 | 22.7 | 1 |
| Example 470 | PC | 90 | 102.09 | 53 | 40.9 | 47.5 | 42.8 | 9.7 | 1 |
| Comparative Example 1 | PGMEA | 70 | 132.16 | 493 | 27.9 | 56.5 | 19.8 | 23.7 | 1 |
| Comparative Example 2 | PGMEA | 70 | 132.16 | 493 | 27.9 | 56.5 | 19.8 | 23.7 | 1 |
| Comparative Example 3 | PGMEA | 70 | 132.16 | 493 | 27.9 | 56.5 | 19.8 | 23.7 | 1 |
| Comparative Example 4 | | | | | | | | | |
| Example 471 | NMP | 50 | 99.13 | 40 | 41.3 | 48.0 | 32.8 | 19.2 | 1 |
| Example 472 | NMP | 50 | 99.13 | 40 | 41.3 | 48.0 | 32.8 | 19.2 | 1 |
| Example 473 | NMP | 50 | 99.13 | 40 | 41.3 | 48.0 | 32.8 | 19.2 | 1 |
| Comparative Example 5 | | | | | | | | | |

TABLE 115

| [Table 1-15-3] | Type | Content (% by mass) | Molar mass (g/mol) | Vapor pressure (Pa) | Surface tension (mN/m) | fd | fp | fh | HP | Vapor pressure (Pa) | Surface tension (mN/m) |
|---|---|---|---|---|---|---|---|---|---|---|---|
| Example 464 | | | | | | | | | | 1,319 | 28.3 |
| Example 465 | | | | | | | | | | 1,113 | 25.7 |
| Example 466 | | | | | | | | | | 474 | 28.5 |
| Example 467 | | | | | | | | | | 200 | 30.2 |
| Example 468 | | | | | | | | | | 160 | 43.3 |
| Example 469 | | | | | | | | | | 81 | 41.4 |
| Example 470 | | | | | | | | | | 77 | 40.3 |
| Comparative Example 1 | | | | | | | | | | 864 | 27.8 |
| Comparative Example 2 | | | | | | | | | | 864 | 27.8 |
| Comparative Example 3 | | | | | | | | | | 864 | 27.8 |
| Comparative Example 4 | | | | | | | | | | 55 | 54.7 |
| Example 471 | | | | | | | | | | 841 | 37.2 |
| Example 472 | | | | | | | | | | 841 | 37.2 |
| Example 473 | | | | | | | | | | 841 | 37.2 |
| Comparative Example 5 | | | | | | | | | | 1,453 | 27.6 |

TABLE 116

| [Table 1-15-4] | Components of chemical liquid | | | Components of chemical liquid | | | | | |
|---|---|---|---|---|---|---|---|---|---|
| | Main agent | Surfactant | | Impurity metal | | | | | |
| | Content | | Content | Total content of impurity metal (mass ppt) | | | | | |
| | (% by mass) | Type | (mass ppm) | Fe | Cr | Ni | Pb | Others | Total |
| Example 464 | Balance | A | 100 | 0.0024 | 0.0024 | 0.0024 | 0.0024 | 0.0288 | 0.0384 |
| Example 465 | Balance | A | 100 | 0.0072 | 0.0072 | 0.0072 | 0.0072 | 0.0864 | 0.1152 |
| Example 466 | Balance | A | 100 | 0.003 | 0.001 | 0.002 | 0.001 | 0.021 | 0.028 |
| Example 467 | Balance | A | 100 | 0.002 | 0.002 | 0.002 | 0.002 | 0.024 | 0.032 |
| Example 468 | Balance | A | 100 | 0.006 | 0.006 | 0.006 | 0.006 | 0.072 | 0.096 |
| Example 469 | Balance | A | 100 | 0.0048 | 0.0048 | 0.0048 | 0.0048 | 0.0576 | 0.0768 |
| Example 470 | Balance | A | 100 | 0.0024 | 0.0024 | 0.0024 | 0.0024 | 0.0288 | 0.0384 |
| Comparative Example 1 | Balance | F | 100 | 206 | 168 | 197 | 145 | 2,148 | 2,864 |
| Comparative Example 2 | Balance | A | 300 | <0.0005 | <0.0005 | <0.0005 | <0.0005 | <0.0005 | 0.001 |
| Comparative Example 3 | Balance | — | 0 | 0.003 | 0.004 | 0.005 | 0.004 | 0.048 | 0.064 |
| Comparative Example 4 | Balance | A | 100 | 0.002 | 0.002 | 0.006 | 0.001 | 0.033 | 0.044 |
| Example 471 | Balance | A | 100 | 0.001 | 0.002 | 0.006 | 0.002 | 0.033 | 0.044 |
| Example 472 | Balance | A | 10 | 0.004 | 0.002 | 0.006 | 0.002 | 0.042 | 0.056 |
| Example 473 | Balance | A | 100 | 180 | 180 | 180 | 180 | 2,160 | 2,880 |
| Comparative Example 5 | Balance | A | 100 | 0.004 | 0.002 | 0.006 | 0.002 | 0.042 | 0.056 |

TABLE 117

| [Table 1-15-5] | Components of chemical liquid | | | | | | Content of organic impurity (mass ppm) | | Water |
|---|---|---|---|---|---|---|---|---|---|
| | Impurity metal | | | | | | | | |
| | Content of particles containing ffollowing impurity metal (mass ppt) | | | | | | | High-boiling- | Content |
| | Fe | Cr | Ni | Pb | Others | Total | Total | point component | (% by mass) |
| Example 464 | 0.0012 | 0.0012 | 0.0012 | 0.0012 | 0.0144 | 0.0192 | 629 | 2.5 | 0.10% |
| Example 465 | 0.0036 | 0.0036 | 0.0036 | 0.0036 | 0.0432 | 0.0576 | 440 | 1.8 | 0.10% |
| Example 466 | 0.0015 | 0.001 | 0.001 | 0.001 | 0.0135 | 0.018 | 396 | 1.6 | 0.10% |
| Example 467 | 0.001 | 0.001 | 0.001 | 0.001 | 0.012 | 0.016 | 198 | 0.8 | 0.10% |
| Example 468 | 0.003 | 0.003 | 0.003 | 0.003 | 0.036 | 0.048 | 535 | 2.1 | 0.10% |
| Example 469 | 0.0024 | 0.0024 | 0.0024 | 0.0024 | 0.0288 | 0.0384 | 642 | 2.6 | 0.10% |
| Example 470 | 0.0012 | 0.0012 | 0.0012 | 0.0012 | 0.0144 | 0.0192 | 449 | 1.8 | 0.10% |
| Comparative Example 1 | 126 | 108 | 123 | 106 | 1389 | 1852 | 404 | 1.6 | 0.10% |
| Comparative Example 2 | <0.0005 | <0.0005 | <0.0005 | <0.0005 | <0.0005 | 0.001 | 485 | 1.9 | 0.10% |
| Comparative Example 3 | 0.0015 | 0.002 | 0.0025 | 0.002 | 0.024 | 0.032 | 437 | 1.7 | 0.10% |
| Comparative Example 4 | 0.001 | 0.001 | 0.003 | 0.001 | 0.018 | 0.024 | 393 | 1.6 | 0.10% |
| Example 471 | 0.001 | 0.001 | 0.003 | 0.001 | 0.018 | 0.024 | 0.5 | 0.002 | 0.10% |
| Example 472 | 0.002 | 0.001 | 0.003 | 0.001 | 0.021 | 0.028 | 30 | 20 | 0.10% |
| Example 473 | 3 | 3 | 3 | 3 | 36 | 48 | 413 | 20 | 0.10% |
| Comparative Example 5 | 0.002 | 0.001 | 0.003 | 0.001 | 0.021 | 0.028 | 496 | 20 | 0.10% |

TABLE 118

| [Table 1-15-6] | Physical properties of chemical liquid | | | Evaluation | | | | | | |
|---|---|---|---|---|---|---|---|---|---|---|
| | | | | | Type of resist composition | | | | | |
| | Number of coarse particles (number/ml) | Content of surfactant/total content of particles | Content of surfactant/content of high-boiling-point component | Defect inhibition performance | | Resist saving performance | | | | |
| | | | | | | Affinity | | | Film thickness | |
| | | | | | | Rsq1 | SRsq | Uniformity | controllability | Developability |
| Example 464 | 13 | $5.2 \times 10^9$ | $4.0 \times 10^1$ | AA | 1 | A | A | A | A | A |
| Example 465 | 9 | $1.7 \times 10^9$ | $5.7 \times 10^1$ | AA | 1 | A | A | A | A | A |
| Example 466 | 8 | $5.6 \times 10^9$ | $6.3 \times 10^1$ | AA | 1 | A | A | A | A | A |
| Example 467 | 4 | $6.3 \times 10^9$ | $1.3 \times 10^2$ | AA | 1 | A | A | A | A | A |
| Example 468 | 11 | $2.1 \times 10^9$ | $4.7 \times 10^1$ | AA | 1 | A | A | A | C | A |
| Example 469 | 13 | $2.6 \times 10^9$ | $3.9 \times 10^1$ | AA | 1 | A | A | A | C | A |
| Example 470 | 9 | $5.2 \times 10^9$ | $5.6 \times 10^1$ | AA | 1 | A | A | A | C | A |
| Comparative Example 1 | 8 | $5.4 \times 10^4$ | $6.2 \times 10^1$ | D | 1 | B | B | B | A | A |
| Comparative Example 2 | 10 | $3.0 \times 10^{11}$ | $1.5 \times 10^2$ | D | 1 | B | B | B | A | A |
| Comparative Example 3 | 9 | 0 | 0 | D | 1 | B | B | A | A | A |
| Comparative Example 4 | 8 | $4.2 \times 10^9$ | $6.4 \times 10^1$ | D | 1 | B | B | B | C | A |
| Example 471 | 0 | $4.2 \times 10^9$ | $5.0 \times 10^4$ | C | 1 | A | A | B | A | A |
| Example 472 | 100 | $3.6 \times 10^8$ | $5.0 \times 10^{-1}$ | A | 1 | A | A | A | A | A |
| Example 473 | 100 | $2.1 \times 10^6$ | $5.0 \times 10^0$ | AA | 1 | A | A | B | A | A |
| Comparative Example 5 | 100 | $3.6 \times 10^9$ | $5.0 \times 10^0$ | D | 1 | C | C | B | B | B |

TABLE 119

| [Table 1-15-7] | Evaluation | | | | | | | | | | |
|---|---|---|---|---|---|---|---|---|---|---|---|
| | Type of resist composition | | | | | Type of resist composition | | | | | |
| | | Resist saving performance | | | | | Resist saving performance | | | | |
| | | Affinity | | | Film thickness | | | Affinity | | | Film thickness | |
| | | Rsq1 | SRsq | Uniformity | controllability | Developability | | Rsq1 | SRsq | Uniformity | controllability | Developability |
| Example 464 | 2 | A | A | A | A | A | 3 | A | A | A | A | A |
| Example 465 | 2 | A | A | A | A | A | 3 | A | A | A | A | A |
| Example 466 | 2 | A | A | A | A | A | 3 | A | A | A | A | A |
| Example 467 | 2 | A | A | A | A | A | 3 | A | A | A | A | A |
| Example 468 | 2 | A | A | A | C | A | 3 | A | A | A | C | A |
| Example 469 | 2 | A | A | A | C | A | 3 | A | A | A | C | A |
| Example 470 | 2 | A | A | A | C | A | 3 | A | A | A | C | A |
| Comparative Example 1 | 2 | B | B | B | A | A | 3 | B | B | B | A | A |
| Comparative Example 2 | 2 | B | B | B | A | A | 3 | B | B | B | A | A |
| Comparative Example 3 | 2 | B | B | A | A | A | 3 | B | B | A | A | A |
| Comparative Example 4 | 2 | B | B | B | C | A | 3 | B | B | B | C | A |
| Example 471 | 2 | A | A | B | A | A | 3 | A | A | B | A | A |
| Example 472 | 2 | A | A | A | A | A | 3 | A | A | A | A | A |
| Example 473 | 2 | A | A | B | A | A | 3 | A | A | B | A | A |
| Comparative Example 5 | 2 | C | C | B | B | B | 3 | C | C | B | B | B |

TABLE 120

Evaluation
Type of resist composition

| [Table 1-15-8] | | Affinity Rsq1 | SRsq | Uniformity | Film thickness controllability | Developability | Evaluation of p-CMP defect inhibition performance | Evaluation of ashing residue removing performance |
|---|---|---|---|---|---|---|---|---|
| Example 464 | 4 | A | A | A | A | A | A | A |
| Example 465 | 4 | A | A | A | A | A | A | A |
| Example 466 | 4 | A | A | A | A | A | A | A |
| Example 467 | 4 | A | A | A | A | A | A | A |
| Example 468 | 4 | A | A | A | C | A | A | A |
| Example 469 | 4 | A | A | A | C | A | A | A |
| Example 470 | 4 | A | A | A | C | A | A | A |
| Comparative Example 1 | 4 | B | B | B | A | A | C | C |
| Comparative Example 2 | 4 | B | B | B | A | A | A | A |
| Comparative Example 3 | 4 | B | B | A | A | A | C | C |
| Comparative Example 4 | 4 | B | B | B | C | A | A | A |
| Example 471 | 4 | A | A | B | A | A | A | A |
| Example 472 | 4 | A | A | A | A | A | A | A |
| Example 473 | 4 | A | A | B | A | A | C | C |
| Comparative Example 5 | 4 | C | C | B | B | B | A | A |

In Table 1, the components and the evaluation results of the chemical liquid of Example 1 are described in Table 1-1-1 to Table 1-1-8. The same is true for Examples 2 to 33.

The components and the evaluation results of the chemical liquid of Example 34 are described in Table 1-2-1 to Table 1-2-8. The same is true for Examples 35 to 67.

The components and the evaluation results of the chemical liquid of Example 68 are described in Table 1-3-1 to Table 1-3-8. The same is true for Examples 69 to 101.

The components and the evaluation results of the chemical liquid of Example 102 are described in Table 1-4-1 to Table 1-4-8. The same is true for Examples 103 to 133.

The components and the evaluation results of the chemical liquid of Example 134 are described in Table 1-5-1 to Table 1-5-8. The same is true for Examples 135 to 166.

The components and the evaluation results of the chemical liquid of Example 167 are described in Table 1-6-1 to Table 1-6-8. The same is true for Examples 168 to 200.

The components and the evaluation results of the chemical liquid of Example 201 are described in Table 1-7-1 to Table 1-7-8. The same is true for Examples 202 to 233.

The components and the evaluation results of the chemical liquid of Example 234 are described in Table 1-8-1 to Table 1-8-8. The same is true for Examples 235 to 265.

The components and the evaluation results of the chemical liquid of Example 266 are described in Table 1-9-1 to Table 1-9-8. The same is true for Examples 267 to 298.

The components and the evaluation results of the chemical liquid of Example 299 are described in Table 1-10-1 to Table 1-10-8. The same is true for Examples 300 to 332.

The components and the evaluation results of the chemical liquid of Example 333 are described in Table 1-11-1 to Table 1-11-8. The same is true for Examples 334 to 363.

The components and the evaluation results of the chemical liquid of Example 364 are described in Table 1-12-1 to Table 1-12-8. The same is true for Examples 365 to 397.

The components and the evaluation results of the chemical liquid of Example 398 are described in Table 1-13-1 to Table 1-13-8. The same is true for Examples 399 to 430.

The components and the evaluation results of the chemical liquid of Example 431 are described in Table 1-14-1 to Table 1-14-8. The same is true for Examples 432 to 463.

The components and the evaluation results of the chemical liquid of Example 464 are described in Table 1-15-1 to Table 1-15-8. The same is true for Examples 465 to 473 and Comparative Examples 1 to 5.

For example, the chemical liquid of Example 6 contains, as a main agent, PGME in an amount of 30% by mass and PGMEA in an amount of 70% by mass and contains A (100 mass ppm) as a surfactant, in which the total content of the impurity metal is 0.056 mass ppt, the (total) content of particles in the impurity metal is 0.022 mass ppt, the content of the organic impurity is 204 mass ppm, the content of the high-boiling-point component in the organic impurity is 0.8 mass ppm, the content of water is 0.1%, the number of coarse particles is 4/mL, the defect inhibition performance is evaluated as "AA", the p-CMP defect inhibition performance is evaluated as "A", and the ashing residue removing performance is evaluated as "A".

In Table 1, "Content" of each organic solvent represents the content of each organic solvent in the main agent contained in the chemical liquid.

In Table 1, "-" shows that the chemical liquid does not contain the corresponding component or the corresponding numerical value is not calculable.

In Table 1, "<(numerical value)" shows that the corresponding item is less than the listed numerical value, ">(numerical value)" shows that the corresponding item is greater than the listed numerical value.

As is evident from the results shown in Table 1, the chemical liquid according to the embodiment of the present invention had an excellent defect inhibition performance provided that the chemical liquid contains a main agent formed of one kind of organic solvent or a mixture of two or more kinds of organic solvents, an impurity metal, and a surfactant, in which a vapor pressure of the main agent is 60 to 1,340 Pa at 25° C., the impurity metal contains particles containing one kind of metal selected from the group consisting of Fe, Cr, Ni, and Pb, in a case where the chemical liquid contains one kind of the particles, a content of the particles in the chemical liquid is 0.001 to 30 mass ppt with respect to the total mass of the chemical liquid, and in a case where the chemical liquid contains two or more kinds of the particles, a content of each kind of the particles in the chemical liquid is 0.001 to 30 mass ppt with respect to the total mass of the chemical liquid. In contrast, the chemical liquid of each of the comparative examples did not have desired effects.

The chemical liquid of Example 6, in which the surface tension of the main agent was 25 to 40 mM/m, had film thickness controllability better than that of the chemical liquid of Example 468.

The chemical liquid of Example 6, in which the content mass ratio of the content of the surfactant to the total content of the particles in the chemical liquid was $1\times10^8$ to $1\times10^{12}$, had an ashing residue removing performance and a p-CMP defect inhibition performance better than those of the chemical liquid of Example 150.

The chemical liquid of Example 6, in which the number of objects to be counted having a size equal to or greater than 100 nm that are counted by a light scattering-type liquid-borne particle counter was 1 to 100/mL, had a resist saving performance (uniformity) better than that of the chemical liquid of Example 25.

The chemical liquid of Example 6, in which the content of water in the chemical liquid was 0.01% to 1.0% by mass, had resist saving performance (film thickness controllability) better than those of the chemical liquid of Example 164.

The chemical liquid of Example 6, in which the content mass ratio of the content of the surfactant to the content of the high-boiling-point component was 1 to $1\times10^4$ in the chemical liquid, had a defect inhibition performance better than that of the chemical liquid of Example 472.

The chemical liquid of Example 6, in which the surfactant contained in the chemical liquid was at least one kind of compound selected from the group consisting of acetylene glycol, polyoxyethylene alkyl ether, and polyoxyethylene alkyl amine, had a defect inhibition performance better than that of the chemical liquid of Example 140.

What is claimed is:

1. A chemical liquid comprising:
   a main agent which is formed of one kind of organic solvent or formed of a mixture of two or more kinds of organic solvents;
   an impurity metal; and
   a surfactant,
   wherein a vapor pressure of the main agent is 60 to 1,340 Pa at 25° C.,
   the impurity metal contains particles containing one kind of metal selected from the group consisting of Fe, Cr, Ni, and Pb,
   in a case where the chemical liquid contains one kind of particles, a content of the particles in the chemical liquid is 0.001 to 30 mass ppt with respect to a total mass of the chemical liquid, and
   in a case where the chemical liquid contains two or more kinds of particles, a content of each kind of the particles in the chemical liquid is 0.001 to 30 mass ppt with respect to the total mass of the chemical liquid.

2. The chemical liquid according to claim 1,
   wherein the impurity metal contains one kind of metal selected from the group consisting of Fe, Cr, Ni, and Pb,
   in a case where the chemical liquid contains one kind of metal, a content of the metal in the chemical liquid is 0.001 to 100 mass ppt with respect to the total mass of the chemical liquid, and
   in a case where the chemical liquid contains two or more kinds of the metals, a content of each of the metals in the chemical liquid is 0.001 to 100 mass ppt with respect to the total mass of the chemical liquid.

3. The chemical liquid according to claim 2,
   wherein a surface tension of the main agent is 25 to 40 mN/m at 25° C.

4. The chemical liquid according to claim 2,
   wherein the organic solvent in the main agent is in an area surrounded by the following 4 points in a ternary diagram with apexes each showing a contribution rate of a dispersion element in Hansen solubility parameters of organic solvents, a contribution rate of a dipole-dipole force element in Hansen solubility parameters of organic solvents, and a contribution rate of a hydrogen bond element in Hansen solubility parameters of organic solvents,
   first point: a contribution rate of a dispersion element=40%, a contribution rate of a dipole-dipole force element=60%, and a contribution rate of a hydrogen bond element=0%,
   second point: a contribution rate of a dispersion element=40%, a contribution rate of a dipole-dipole force element=0%, and a contribution rate of a hydrogen bond element=60%,
   third point: a contribution rate of a dispersion element=80%, a contribution rate of a dipole-dipole force element=0%, and a contribution rate of a hydrogen bond element=20%,
   fourth point: a contribution rate of a dispersion element=80%, a contribution rate of a dipole-dipole force element=20%, and a contribution rate of a hydrogen bond element=0%.

5. The chemical liquid according to claim 1,
   wherein a surface tension of the main agent is 25 to 40 mN/m at 25° C.

6. The chemical liquid according to claim 1,
   wherein the organic solvent in the main agent is in an area surrounded by the following 4 points in a ternary diagram with apexes each showing a contribution rate of a dispersion element in Hansen solubility parameters of organic solvents, a contribution rate of a dipole-dipole force element in Hansen solubility parameters of organic solvents, and a contribution rate of a hydrogen bond element in Hansen solubility parameters of organic solvents,
   first point: a contribution rate of a dispersion element=40%, a contribution rate of a dipole-dipole force element=60%, and a contribution rate of a hydrogen bond element=0%,
   second point: a contribution rate of a dispersion element=40%, a contribution rate of a dipole-dipole force element=0%, and a contribution rate of a hydrogen bond element=60%,
   third point: a contribution rate of a dispersion element=80%, a contribution rate of a dipole-dipole force element=0%, and a contribution rate of a hydrogen bond element=20%,
   fourth point: a contribution rate of a dispersion element=80%, a contribution rate of a dipole-dipole force element=20%, and a contribution rate of a hydrogen bond element=0%.

7. The chemical liquid according to claim 1,
wherein the organic solvent contains at least one kind of compound selected from the group consisting of propylene glycol monomethyl ether, cyclopentanone, butyl acetate, propylene glycol monomethyl ether acetate, cyclohexanone, ethyl lactate, 2-hydroxymethyl isobutyrate, cyclopentanone dimethyl acetal, γ-butyrolactone, dimethyl sulfoxide, ethylene carbonate, propylene carbonate, 1-methyl-2-pyrrolidone, isoamyl acetate, 4-methyl-2-pentanol, diethylene glycol monomethyl ether, dimethyl ether, diethyl ether, diethylene glycol monoisobutyl ether, diglyme, diethylene glycol diethyl ether, triethylene glycol dimethyl ether, tetraethylene glycol dimethyl ether, triethylene glycol butyl methyl ether, diethylene glycol monobutyl ether, anisole, 1,4-dimethoxybenzene, 1,2-dimethoxybenzene, 1,3-dimethoxybenzene, 1,4-diphenoxybenzene, 4-methoxytoluene, phenetole, and 3-methoxymethyl propionate.

8. The chemical liquid according to claim 1,
wherein a content mass ratio of a content of the surfactant to a total content of the particles of the impurity metal is $1 \times 10^8$ to $1 \times 10^{12}$.

9. The chemical liquid according to claim 1,
wherein the number of objects to be counted having a size equal to or greater than 100 nm that are counted by a light scattering-type liquid-borne particle counter is 1 to 100/mL.

10. The chemical liquid according to claim 1, further comprising:
water,
wherein a content of the water in the chemical liquid is 0.01% to 1.0% by mass.

11. The chemical liquid according to claim 1, further comprising:
an organic impurity,
wherein a content of the organic impurity in the chemical liquid is 1 to 10,000 mass ppm.

12. The chemical liquid according to claim 11,
wherein the organic impurity contains a high-boiling-point component having a boiling point equal to or higher than 300° C., and
a total content of the high-boiling-point component is 0.1 to 30 mass ppm with respect to the total mass of the chemical liquid.

13. The chemical liquid according to claim 12,
wherein a content mass ratio of a content of the surfactant to a content of the high-boiling-point component is 1 to $1 \times 10^4$.

14. The chemical liquid according to claim 1,
wherein the surfactant is at least one kind of compound selected from the group consisting of acetylene glycol, polyoxyethylene alkyl ether, polyoxyethylene alkyl amine, a glycerin fatty acid ester, a sorbitan fatty acid ester, alkyl betaine, a quaternary ammonium salt, polyoxyethylene allyl phenyl ether phosphate, and polyoxyethylene allyl phenyl ether sulfate.

15. The chemical liquid according to claim 14,
wherein the surfactant is at least one kind of compound selected from the group consisting of acetylene glycol, polyoxyethylene alkyl ether, and polyoxyethylene alkyl amine.

16. The chemical liquid according to claim 1 that is used in at least one kind of chemical agent selected from the group consisting of a prewet solution and a developer.

17. A chemical liquid storage body comprising:
a container; and
the chemical liquid according to claim 1 that is stored in the container,
wherein a liquid contact portion contacting the chemical liquid in the container is formed of a nonmetallic material or stainless steel.

18. The chemical liquid storage body according to claim 17,
wherein the nonmetallic material is at least one kind of material selected from the group consisting of a polyethylene resin, a polypropylene resin, a polyethylene-polypropylene resin, polytetrafluoroethylene, a polytetrafluoroethylene-perfluoroalkyl vinyl ether copolymer, a polytetrafluoroethylene-hexafluoropropylene copolymer resin, a polytetrafluoroethylene-ethylene copolymer resin, a chlorotrifluoro ethylene-ethylene copolymer resin, a vinylidene fluoride resin, a chlorotrifluoroethylene copolymer resin, and a vinyl fluoride resin.

19. A pattern forming method comprising:
a pre-wetting step of coating a substrate with the chemical liquid according to claim 1 so as to obtain a pre-wetted substrate;
a resist film forming step of forming a resist film on the pre-wetted substrate by using an actinic ray-sensitive or radiation-sensitive resin composition;
an exposure step of exposing the resist film; and
a development step of developing the exposed resist film by using a developer,
wherein the actinic ray-sensitive or radiation-sensitive resin composition contains a resin including at least one kind of repeating unit selected from the group consisting of a repeating unit represented by Formula (a), a repeating unit represented by Formula (b), a repeating unit represented by Formula (c), a repeating unit represented by Formula (d), and a repeating unit represented by Formula (e),

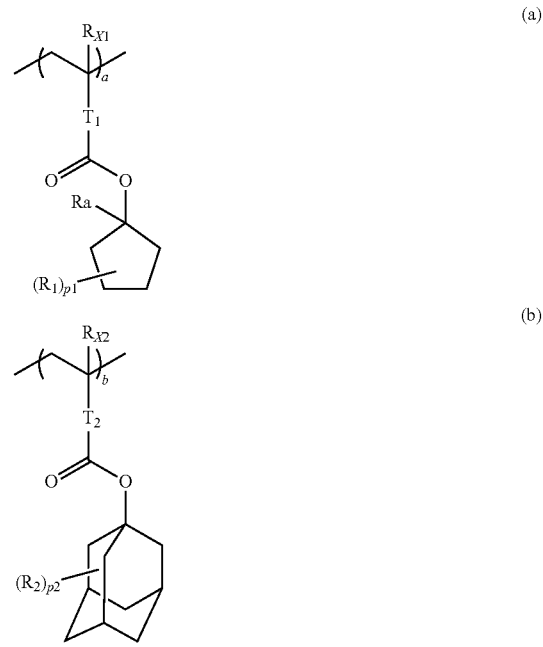

-continued

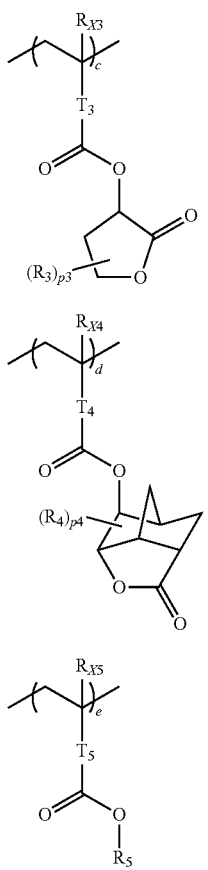

$R_{X1}$ to $R_{X5}$ each independently represent a hydrogen atom or an alkyl group which may have a substituent, $R_1$ to $R_4$ each independently represent a monovalent substituent, p1 to p4 each independently represent 0 or a positive integer, Ra represents a linear or branched alkyl group, $T_1$ to $T_5$ each independently represent a single bond or a divalent linking group, $R_5$ represents a monovalent organic group, a to e represent mol % and each independently represent a number included in a range of 0≤a≤100, 0≤b≤100, 0≤c<100, 0≤d<100, and 0≤e<100, provided that a+b+c+d+e=100 and a+b≠0, and the repeating unit represented by Formula (e) is different from all of the repeating units represented by Formula (a) to Formula (d).

20. The pattern forming method according to claim 19, wherein the chemical liquid with which the substrate is coated in the pre-wetting step satisfies the following conditions 1 and 2 at 25° C., condition 1: Rsq1 calculated by Equation 1 based on a proton spin-spin relaxation time measured for a chemical liquid and a first test solution formed of a resin and the chemical liquid by using a pulsed nuclear magnetic resonance-type particle interface characteristic evaluator is higher than 0.001, $Rsq1=(\tau 0/\tau 1)-1$ (Equation 1)

in Equation 1, τ0 represents a spin-spin relaxation time of the chemical liquid, and τ1 represents a spin-spin relaxation time of the first test solution, condition 2: SRsq calculated by Equation 2 based on a proton spin-spin relaxation time measured for a second test solution, which is formed of the resin and the chemical liquid and in which the content of the resin is different from the content of the resin in the first test solution, and the first test solution by using a pulsed nuclear magnetic resonance-type particle interface characteristic evaluator is higher than −1, $SRsq=(Rsq2-Rsq1)/(c2-c1)$ (Equation 2)

in Equation 2, Rsq1 represents a value calculated by Equation 1, and Rsq2 represents a value calculated by Equation 3, c1 and c2 represent a mass-based content of the resin in the first test solution and the second test solution respectively, the unit of the mass-based content is % by mass, and c2>c1, $Rsq2=(\tau 0/\tau 2)-1$ (Equation 3)

in Equation 3, τ0 has the same definition as τ0 in Equation 1, and τ2 represents a spin-spin relaxation time of the second test solution.

* * * * *